(12) United States Patent
Lee et al.

(10) Patent No.: US 11,788,000 B2
(45) Date of Patent: *Oct. 17, 2023

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Ga-Won Lee, Gyeonggi-do (KR); Sang-Hee Cho, Gyeonggi-do (KR); Hee-Ryong Kang, Gyeonggi-do (KR); Hong-Se Oh, Gyeonggi-do (KR); Jeong-Eun Yang, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 587 days.

This patent is subject to a terminal disclaimer.

(21) Appl. No.: 16/962,257

(22) PCT Filed: Jan. 18, 2019

(86) PCT No.: PCT/KR2019/000768
§ 371 (c)(1),
(2) Date: Jul. 15, 2020

(87) PCT Pub. No.: WO2019/143184
PCT Pub. Date: Jul. 25, 2019

(65) Prior Publication Data
US 2021/0062080 A1    Mar. 4, 2021

(30) Foreign Application Priority Data

Jan. 19, 2018  (KR) .................. 10-2018-0006973
Jan. 17, 2019  (KR) .................. 10-2019-0006233

(51) Int. Cl.
*C09K 11/06* (2006.01)
*H10K 101/10* (2023.01)
*H10K 50/11* (2023.01)
*H10K 85/30* (2023.01)
*H10K 85/60* (2023.01)

(52) U.S. Cl.
CPC .......... *C09K 11/06* (2013.01); *H10K 85/6572* (2023.02); *H10K 85/6574* (2023.02); *H10K 85/6576* (2023.02); *C09K 2211/1029* (2013.01); *H10K 50/11* (2023.02)

(58) Field of Classification Search
CPC . H01L 51/0071; H01L 51/0072; C09K 11/06; C09K 2211/1029; C09K 2211/1033; C09K 2211/1044; C09K 2211/1048; C09K 2211/1051; C09K 2211/1059; C09K 2211/1062; H10K 85/6572; H10K 85/6574; H10K 50/11; H10K 85/342; H10K 2101/10; H10K 85/654; H10K 85/657–6576

See application file for complete search history.

(56) References Cited

U.S. PATENT DOCUMENTS

| | | | |
|---|---|---|---|
| 2016/0163998 A1 | 6/2016 | Saito et al. | |
| 2017/0179416 A1* | 6/2017 | Lim | H10K 85/6572 |
| 2017/0324037 A1 | 11/2017 | Itoi et al. | |
| 2019/0296249 A1 | 9/2019 | Moon et al. | |

FOREIGN PATENT DOCUMENTS

| | | |
|---|---|---|
| CN | 107325103 A | 11/2017 |
| KR | 20150121337 A | 10/2015 |
| WO | 2016080791 A1 | 5/2016 |
| WO | 2017043770 A1 | 3/2017 |
| WO | 2017095156 A1 | 6/2017 |

* cited by examiner

*Primary Examiner* — Sean M DeGuire
*Assistant Examiner* — Rachel Simbana
(74) *Attorney, Agent, or Firm* — G. Creston Campbell

(57) ABSTRACT

The present disclosure relates to an organic electroluminescent compound and an organic electroluminescent device comprising the same. By comprising the organic electroluminescent compound of the present disclosure, it is possible to provide an organic electroluminescent device with improved driving voltage, luminous efficiency, lifespan properties and/or power efficiency.

9 Claims, No Drawings

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

An electroluminescent (EL) device is a self-light-emitting device which has advantages in that it provides a wider viewing angle, a greater contrast ratio, and a faster response time. An organic EL device was first developed by Eastman Kodak in 1987, by using small aromatic diamine molecules and aluminum complexes as materials for forming a light-emitting layer [Appl. Phys. Lett. 51, 913, 1987].

The most important factor determining luminous efficiency in the organic electroluminescent device is light-emitting materials. Until now, fluorescent materials have been widely used as light-emitting materials. However, in view of electroluminescent mechanisms, since phosphorescent light-emitting materials theoretically enhance luminous efficiency by four (4) times compared to fluorescent light-emitting materials, phosphorescent light-emitting materials have been widely researched. Iridium(III) complexes have been widely known as phosphorescent light-emitting materials, including bis(2-(2'-benzothienyl)-pyridinato-N,C-3') iridium(acetylacetonate) ((acac)Ir(btp)$_2$), tris(2-phenylpyridine)iridium (Ir(ppy)$_3$) and bis(4,6-difluorophenylpyridinato-N,C2)picolinate iridium (Firpic) as red-, green-, and blue-emitting materials, respectively.

At present, 4,4'-N,N'-dicarbazol-biphenyl (CBP) is the most widely known phosphorescent host material. Recently, Pioneer (Japan) et al., developed a high performance organic electroluminescent device using bathocuproine (BCP) and aluminum(III) bis(2-methyl-8-quinolinate)(4-phenylphenolate) (BAlq), etc., as host materials, which were known as hole blocking materials.

Although these materials provide good luminous characteristics, they have the following disadvantages: (1) Due to their low glass transition temperature and poor thermal stability, their degradation may occur during a high-temperature deposition process in a vacuum, and the lifespan of the device decreases. (2) The power efficiency of the organic electroluminescent device is given by [(π/voltage)×current efficiency], and the power efficiency is inversely proportional to the voltage. Although the organic electroluminescent device comprising phosphorescent host materials provides higher current efficiency (cd/A) than one comprising fluorescent materials, a significantly high driving voltage is necessary. Thus, there is no merit in terms of power efficiency (lm/W). (3) Further, when these materials are used in an organic electroluminescent device, the operational lifespan of an organic electroluminescent device is short and luminous efficiency is still required to be improved.

In order to enhance luminous efficiency, driving voltage and/or lifespan, various materials or concepts for an organic layer of an organic electroluminescent device have been proposed, but they have not been satisfactory in practical use.

DISCLOSURE OF INVENTION

Technical Problem

The objective of the present disclosure is firstly, to provide an organic electroluminescent compound effective for producing an organic electroluminescent device having improved driving voltage, luminous efficiency, lifespan property and/or power efficiency, and secondly, to provide an organic electroluminescent device comprising the organic electroluminescent compound.

Solution to Problem

The present disclosure solves the above problems by providing novel azabenzo azulenofluorene and the derivatives of the moieties similar thereto, and an organic electroluminescent device using the same. The introduction of an aza-type moiety into the HOMO molecule results in a bipolar property of the HOMO molecule. It is related to the intermolecular or intramolecular flow of holes and electrons, which affects the bonding force of holes and electrons and the formation of excitons.

Meanwhile, a compound having a low glass transition temperature (Tg) may reduce the charge mobility in the thin film and deteriorate the performance of the OLED device. The structure of the present disclosure has a high glass transition temperature despite its low molecular weight, and may have excellent morphological stability. In addition, the structure of the present disclosure has a main core in a planar shape to help pi-pi stacking in the vacuum deposition layer, which results in fast charge mobility.

Specifically, the present inventors have found that the above objective can be achieved by the organic electroluminescent compound represented by the following formula 1:

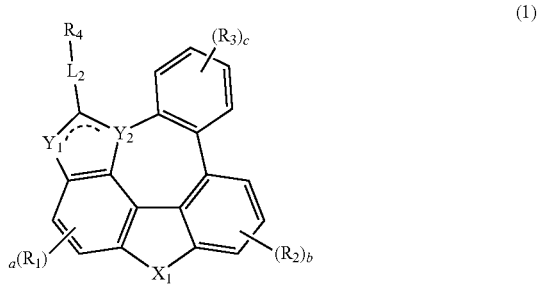

(1)

wherein $X_1$ represents —N($L_1$-$R_5$)—, —O—, —S— or —C($R_6$)($R_7$)—;

$Y_1$ represents —N=, —N($R_8$)—, —O—, —S—, —C($R_9$)= or —C($R_{10}$)($R_{11}$)—;

$Y_2$ represents —N— or —C=;

$L_1$ and $L_2$, each independently, represent a single bond, a substituted or unsubstituted (C6-C30)arylene, a substituted or unsubstituted (3- to 30-membered)heteroarylene, or a substituted or unsubstituted (C3-C30)cycloalkylene;

$R_1$ to $R_3$ and $R_6$ to $R_{11}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring;

$R_4$ and $R_5$, each independently, represent a substituted or unsubstituted (C6-C30)aryl, a substituted or unsubstituted (3- to 30-membered)heteroaryl, or a substituted or unsubstituted mono- or di-(C6-C30)arylamino; and a represents an integer of 1 or 2; b represents an integer of 1 to 3; c represents an integer of 1 to 4; where if a to c, each independently, are an integer of 2 or more, each of $R_1$, each of $R_2$, and each of $R_3$ may be the same or different.

Advantageous Effects of Invention

By using the organic electroluminescent compound according to the present disclosure, it is possible to produce an organic electroluminescent device having a driving voltage equal or superior in performance, high luminescent efficiency, an excellent lifespan property and/or high power efficiency.

MODE FOR THE INVENTION

Hereinafter, the present disclosure will be described in detail. However, the following description is intended to explain the invention, and is not meant in any way to restrict the scope of the invention.

The term "organic electroluminescent compound" in the present disclosure means a compound that may be used in an organic electroluminescent device, and may be comprised in any layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material, an electron buffer material, a hole blocking material, an electron transport material, an electron injection material, etc.

The organic electroluminescent material of the present disclosure may comprise at least one compound represented by formula 1. The compound represented by formula 1 may be comprised in a light-emitting layer, an electron transport layer, and/or an electron buffer layer, but is not limited thereto. When comprised in the light-emitting layer, the compound represented by formula 1 may be comprised as a host material. Herein, the host material may be a host material of a green or red light-emitting organic electroluminescent device. In addition, when comprised in the electron transport layer, the compound represented by formula 1 may be comprised as an electron transport material. Further, when comprised in the electron buffer layer, the compound represented by formula 1 may be comprised as an electron buffer material.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, iso-propyl, n-butyl, iso-butyl, tert-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl(ene)" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30)aryl(ene)" is meant to be a monocyclic or fused ring radical derived from an aromatic hydrocarbon having 6 to 30 ring backbone carbon atoms, in which the number of the ring backbone carbon atoms is preferably 6 to 25, more preferably 6 to 18. The above aryl may be partially saturated, and may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, azulenyl, etc. More specifically, the aryl may include a phenyl group, a 1-naphthyl group, a 2-naphthyl group, a 1-anthryl group, a 2-anthryl group, a 9-anthryl group, a benzanthryl group, a 1-phenanthryl group, a 2-phenanthryl group, a 3-phenanthryl group, a 4-phenanthryl group, a 9-phenanthryl group, a naphthacenyl group, a pyrenyl group, a 1-chrysenyl group, a 2-chrysenyl group, a 3-chrysenyl group, a 4-chrysenyl group, a 5-chrysenyl group, a 6-chrysenyl group, a benzo[c]phenanthryl group, a benzo[g]chrysenyl group, a 1-triphenylenyl group, a 2-triphenylenyl group, a 3-triphenylenyl group, a 4-triphenylenyl group, a 1-fluorenyl group, a 2-fluorenyl group, a 3-fluorenyl group, a 4-fluorenyl group, a 9-fluorenyl group, a benzofluorenyl group, a dibenzofluorenyl group, a 2-biphenylyl group, a 3-biphenylyl group, a 4-biphenylyl group, an o-terphenyl group, an m-terphenyl-4-yl group, an m-terphenyl-3-yl group, an m-terphenyl-2-yl group, a p-terphenyl-4-yl group, a p-terphenyl-3-yl group, a p-terphenyl-2-yl group, an m-quaterphenyl group, a 3-fluoranthenyl group, a 4-fluoranthenyl group, an 8-fluoranthenyl group, a 9-fluoranthenyl group, a benzofluoranthenyl group, an o-tolyl group, an m-tolyl group, a p-tolyl group, a 2,3-xylyl group, a 3,4-xylyl group, a 2,5-xylyl group, a mesityl group, an o-cumenyl group, an m-cumenyl group, a p-cumenyl group, a p-t-butylphenyl group, a p-(2-phenylpropyl)phenyl group, a 4'-methylbiphenylyl group, a 4"-t-butyl-p-terphenyl-4-yl group, a 9,9-dimethyl-1-fluorenyl group, a 9,9-dimethyl-2-fluorenyl group, a 9,9-dimethyl-3-fluorenyl group, a 9,9- dimethyl-4-fluorenyl group, a 9,9-diphenyl-1-fluorenyl group, a 9,9-diphenyl-2-fluorenyl group, a 9,9-diphenyl-3-fluorenyl group, a 9,9-diphenyl-4-fluorenyl group, etc.

Herein, the term "(3- to 30-membered)heteroaryl(ene)" is an aryl group having 3 to 30 ring backbone atoms, and including at least one, preferably 1 to 4 heteroatoms selected from the group consisting of B, N, O, S, Si, and P. The above heteroaryl may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, carbazolyl, benzocarbazolyl, dibenzocarbazolyl, phenoxazinyl, phenothiazinyl, phenanthridinyl, benzodioxolyl, dihydroacridinyl, etc. More specifically, the heteroaryl may include a 1-pyrrolyl group, a 2-pyrrolyl group, a 3-pyrrolyl group, a pyrazinyl group, a 2-pyridinyl group, a 2-pyrimidinyl group, a 4-pyrimidinyl group, a 5-pyrimidinyl group, a 6-pyrimidinyl group, a 1,2,3-triazin-4-yl group, a 1,2,4-triazin-3-yl group, a 1,3,5-triazin-2-yl group, a 1-imidazolyl group, a 2-imidazolyl group, a 1-pyrazolyl group, a 1-indolidinyl group, a 2-indolidinyl group, a 3-indolidinyl group, a 5-indolidinyl group, a 6-indolidinyl group, a 7-indolidinyl group, an 8-indolidinyl group, a 2-imidazopyridinyl group, a 3-imidazopyridinyl group, a 5-imidazopyridinyl group, a 6-imidazopyridinyl group, a 7-imidazopyridinyl group, an 8-imidazopyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, an azacarbazolyl-1-yl group, an azacarbazolyl-2-yl group, an azacarbazolyl-3-yl group, an azacarbazolyl-4-yl group, an azacarbazolyl-5-yl group, an azacarbazolyl-6-yl group, an azacarbazolyl-7-yl group, an azacarbazolyl-8-yl group, an azacarbazolyl-9-yl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a 1-silafluorenyl group, a 2-silafluorenyl group, a 3-silafluorenyl group, a 4-silafluorenyl group, a 1-germafluorenyl group, a 2-germafluorenyl group, a 3-germafluorenyl group, a 4-germafluorenyl group, etc. "Halogen" includes F, Cl, Br, and I.

In addition, "ortho (o-)", "meta (m-)", and "para (p-)" are prefixes, which represent the relative positions of substituents, respectively. Ortho indicates that two substituents are adjacent to each other, and for example, when two substituents in a benzene derivative occupy positions 1 and 2, it is called as an ortho position. Meta indicates that two substituents are at positions 1 and 3, and for example, two substituents in a benzene derivative occupy positions 1 and 3, it is called as a meta position. Para indicates that two substituents are at positions 1 and 4, and for example, two substituents in a benzene derivative occupy positions 1 and 4, it is called as a para position.

Herein, "substituted" in the expression "substituted or unsubstituted" means that a hydrogen atom in a certain functional group is replaced with another atom or another functional group, i.e., a substituent. The substituents of the substituted (C1-C30)alkyl, the substituted (C6-C30)aryl (ene), the substituted (3- to 30-membered)heteroaryl(ene), the substituted (C3-C30)cycloalkyl(ene), the substituted (C1-C30)alkoxy, the substituted tri(C1-C30)alkylsilyl, the substituted di(C1-C30)alkyl(C6-C30)arylsilyl, the substituted (C1-C30)alkyldi(C6-C30)arylsilyl, the substituted tri (C6-C30)arylsilyl, the substituted mono- or di-(C1-C30) alkylamino, the substituted mono- or di-(C6-C30)arylamino, and the substituted (C1-C30)alkyl(C6-C30)arylamino in $L_1$, $L_2$, and $R_1$ to $R_{11}$, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (5- to 30-membered)heteroaryl unsubstituted or substituted with a (C6-C30)aryl; a (C6-C30)aryl unsubstituted or substituted with a (5- to 30-membered)heteroaryl; a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30) arylamino unsubstituted or substituted with a (C1-C30) alkyl; a (C1-C30)alkyl(C6-C30)arylamino; a (C1-C30)alkylcarbonyl; a (C1-C30)alkoxycarbonyl; a (C6-C30) arylcarbonyl; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl.

According to one embodiment of the present disclosure, the substituents, each independently, are at least one selected from the group consisting of a (C1-C6)alkyl, (C6-C15)aryl and (5- to 15-membered)heteroaryl. Specifically, the substituents, each independently, may be at least one selected from the group consisting of a methyl, a phenyl and a naphthyl.

Hereinafter, the compound represented by formula 1 will be described in more detail.

In formula 1, $X_1$ represents —N(L$_1$-R$_5$)—, —O—, —S— or —C(R$_6$)(R$_7$)—; $Y_1$ represents —N═, —N(R$_8$)—, —O—, —S—, —C(R$_9$)═ or —C(R$_{10}$)(R$_{11}$)—; and $Y_2$ represents —N═ or —C═.

$L_1$ and $L_2$, each independently, represent a single bond, a substituted or unsubstituted (C6-C30)arylene, a substituted or unsubstituted (3- to 30-membered)heteroarylene, or a substituted or unsubstituted (C3-C30)cycloalkylene. According to one embodiment of the present disclosure, $L_1$ and $L_2$, each independently, represent a single bond, a substituted or unsubstituted (C6-C15)arylene, or a substituted or unsubstituted (5- to 15-membered)heteroarylene. According to another embodiment of the present disclosure, $L_1$ and $L_2$, each independently, represent a single bond, or an unsubstituted (C6-C15)arylene. Specifically, $L_1$ and $L_2$, each independently, may represent a single bond, a phenylene, a naphthylene, a biphenylene, etc.

In addition, $L_1$ and $L_2$, each independently, represent a single bond, or any one of the following R-1 to R-4.

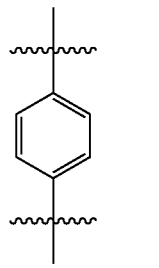
R-1

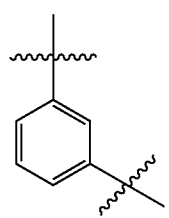
R-2

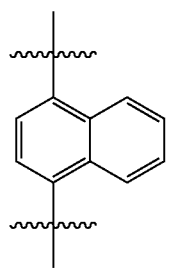
R-3

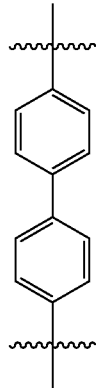
R-4

$R_1$ to $R_3$ and $R_6$ to $R_{11}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino; or may be linked to an adjacent substituent to form a ring.

According to one embodiment of the present disclosure, $R_1$ to $R_3$, each independently, represent hydrogen, a substituted or unsubstituted (C6-C15)aryl, or a substituted or unsubstituted (5- to 15-membered)heteroaryl; or may be linked to an adjacent substituent to form a ring. According to another embodiment of the present disclosure, $R_1$ to $R_3$, each independently, represent hydrogen, an unsubstituted (C6-C15)aryl, or an unsubstituted (5- to 15-membered) heteroaryl; or may be linked to an adjacent substituent to form a ring. Specifically, $R_1$ to $R_3$, each independently, represent hydrogen, phenyl, pyridyl, etc.; or may be linked to an adjacent substituent to form a benzene ring.

According to one embodiment of the present disclosure, $R_6$ to $R_{11}$, each independently, represent a substituted or unsubstituted (C1-C6)alkyl, or a substituted or unsubstituted (C6-C15)aryl. According to another embodiment of the present disclosure, $R_6$ to $R_{11}$, each independently, represent an unsubstituted (C1-C6)alkyl, or an unsubstituted (C6-C15) aryl. Specifically, $R_6$ to $R_{11}$, each independently, represent methyl, phenyl, etc.

$R_4$ and $R_5$, each independently, represent a substituted or unsubstituted (C6-C30)aryl, a substituted or unsubstituted (3- to 30-membered)heteroaryl, or a substituted or unsubstituted mono- or di-(C6-C30)arylamino. According to one embodiment of the present disclosure, $R_4$ and $R_5$, each independently, represent a substituted or unsubstituted (C6-C15)aryl, a substituted or unsubstituted (5- to 15-membered) heteroaryl, or a substituted or unsubstituted mono- or di-(C6-C15)arylamino. According to another embodiment of the present disclosure, $R_4$ and $R_5$, each independently, represent an unsubstituted (C6-C15)aryl; a (5- to 15-membered) heteroaryl unsubstituted or substituted with a (C6-C15)aryl; a (5- to 15-membered)heteroaryl unsubstituted or substituted with a (C6-C15)aryl and a (5- to 15-membered)

heteroaryl; or a mono- or di(C6-C15)arylamino unsubstituted or substituted with a (C1-C6)alkyl. Specifically, $R_4$ and $R_5$, each independently, represent phenyl; naphthyl; biphenyl; pyridyl; pyridyl substituted with phenyl; pyrimidinyl substituted with phenyl, naphthyl, dibenzofuranyl and/or dibenzothiophenyl; triazinyl substituted with phenyl, naphthyl, biphenyl, dibenzofuranyl and/or dibenzothiophenyl; quinazolinyl substituted with phenyl; quinoxalinyl substituted with phenyl and/or naphthyl; benzoquinazolinyl substituted with phenyl and/or naphthyl; benzoquinoxalinyl substituted with phenyl, naphthyl and/or pyridyl; carbazolyl; diphenylamino; phenyldimethylfluorenylamino, etc.

a represents an integer of 1 or 2; b represents an integer of 1 to 3; c represents an integer of 1 to 4; where if a to c, each independently, are an integer of 2 or more, each of $R_1$, each of $R_2$, and each of $R_3$ may be the same or different. According to one embodiment of the present disclosure, a, b and c, each independently, represent an integer of 1 or 2.

According to one embodiment of the present disclosure, in formula 1, $X_1$ represents —N($L_1$-$R_5$)—, —O—, —S—, —C($R_9$)= or —C($R_{10}$)($R_{11}$)—; $Y_2$ represents —N— or —C=; $L_1$ and $L_2$, each independently, represent a single bond, a substituted or unsubstituted (C6-C15)arylene, or a substituted or unsubstituted (5- to 15-membered)heteroarylene; $R_1$ to $R_3$, each independently, represent hydrogen, a substituted or unsubstituted (C6-C15)aryl, or a substituted or unsubstituted (5- to 15-membered)heteroaryl; or may be linked to an adjacent substituent to form a ring; $R_4$ and $R_5$, each independently, represent a substituted or unsubstituted (C6-C15)aryl, a substituted or unsubstituted (5- to 15-membered)heteroaryl, or a substituted or unsubstituted mono- or di-(C6-C15)arylamino; $R_6$ to $R_{11}$, each independently, represent a substituted or unsubstituted (C1-C6)alkyl, or a substituted or unsubstituted (C6-C15)aryl; and a, b and c, each independently, represent 1 or 2.

According to one embodiment of the present disclosure, in formula 1, $X_1$ represents —N($L_1$-$R_5$)—, —O—, —S— or —C($R_6$)($R_7$)—; $Y_1$ represents —N=, —N($R_8$)—, —O—, —S—, —C($R_9$)= or —C($R_{10}$)($R_{11}$)—; $Y_2$ represents —N— or —C=; $L_1$ and $L_2$, each independently, represent a single bond, or an unsubstituted (C6-C15)arylene; $R_1$ to $R_3$, each independently, represent hydrogen, an unsubstituted (C6-C15)aryl, or an unsubstituted (5- to 15-membered) heteroaryl; or may be linked to an adjacent substituent to form a ring; $R_4$ and $R_5$, each independently, represent an unsubstituted (C6-C15)aryl; a (5- to 15-membered)heteroaryl unsubstituted or substituted with a (C6-C15)aryl; or a mono- or di-(C6-C15)arylamino unsubstituted or substituted with a (C1-C6)alkyl; $R_6$ to $R_{11}$, each independently, represent an unsubstituted (C1-C6)alkyl, or an unsubstituted (C6-C15)aryl; and a, b and c, each independently, represent 1 or 2.

In the formulas of the present disclosure, if adjacent substituents are linked to each other to form a ring, the ring may be a substituted or unsubstituted mono- or polycyclic (3- to 30-membered) alicyclic or aromatic ring, or the combination thereof, in which the formed ring may contain at least one heteroatom selected from nitrogen, oxygen, and sulfur. For example, the fused ring may be a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring.

Herein, the heteroaryl(ene) may contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

The compound represented by formula 1 includes the following compounds, but is not limited thereto.

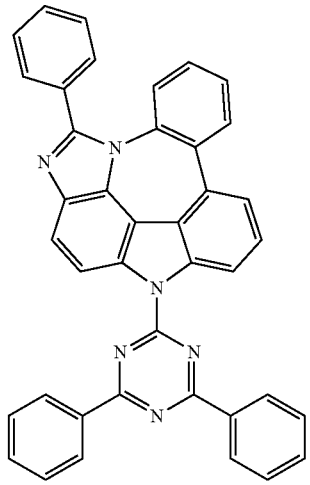

C-1

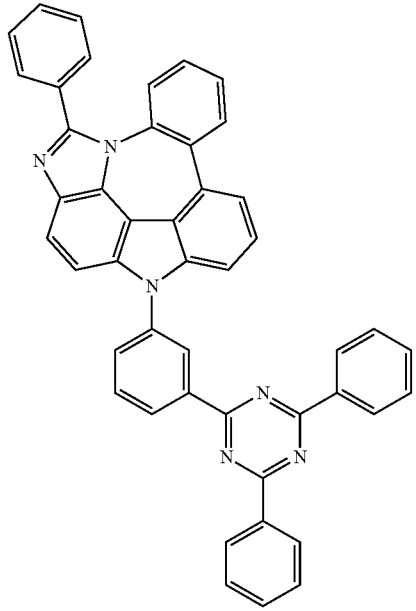

C-2

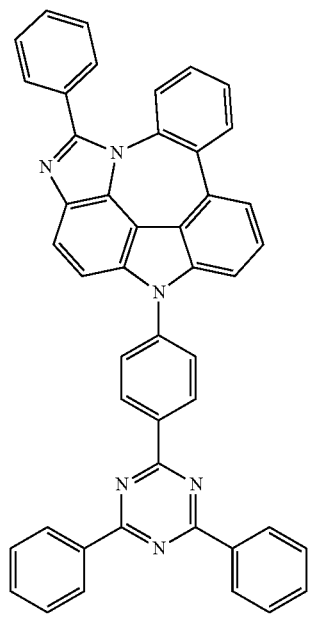
C-3
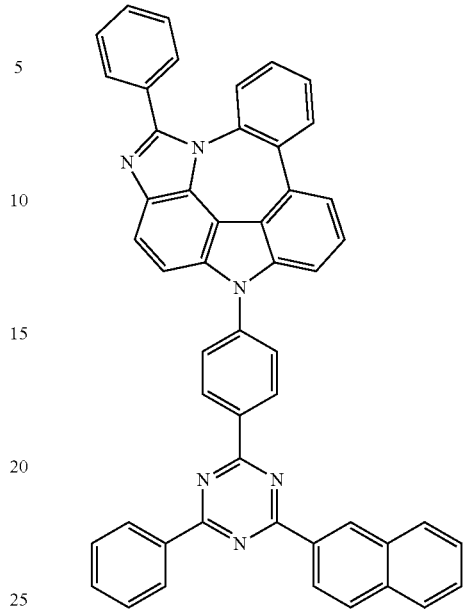
C-5
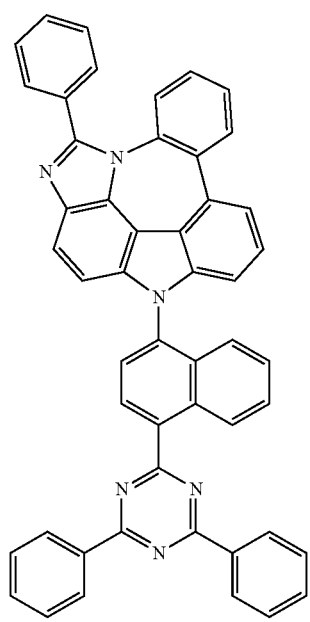
C-4

C-7
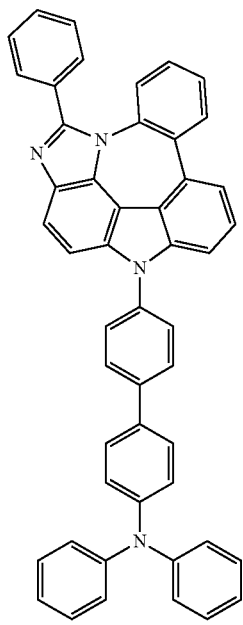
C-8
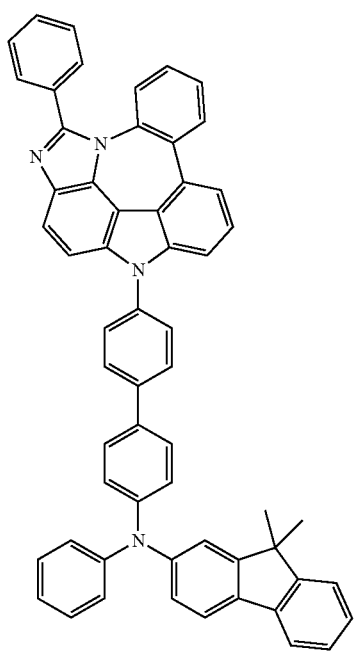
C-9
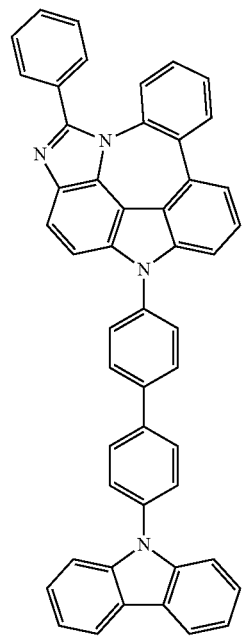
C-10
C-11
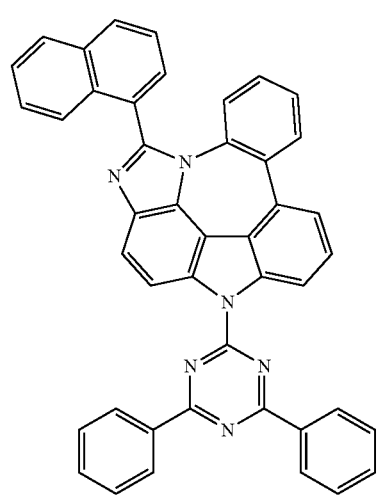

-continued
C-12
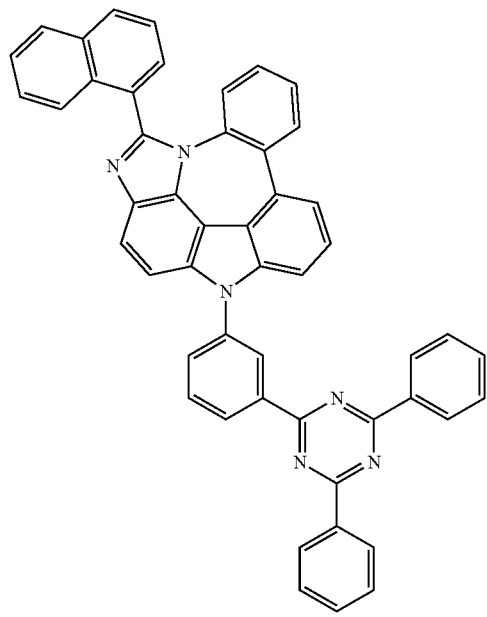
C-13
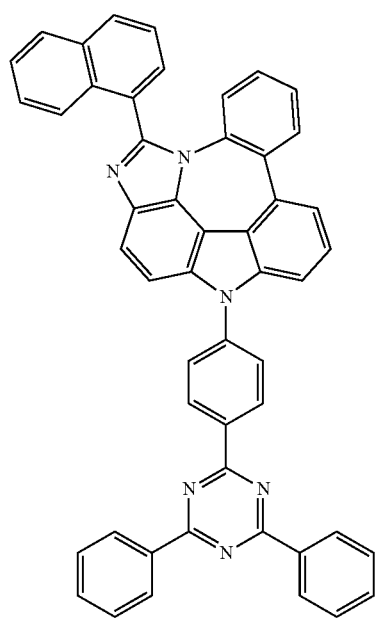
C-14
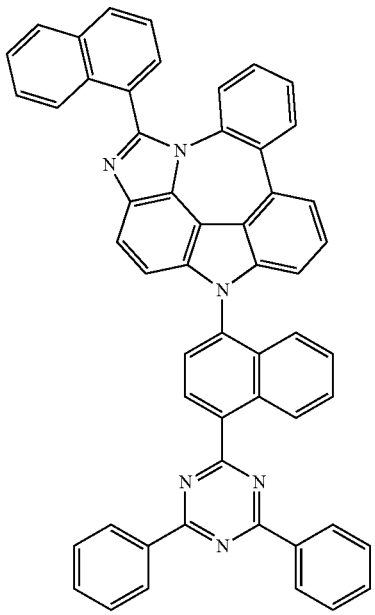
C-15
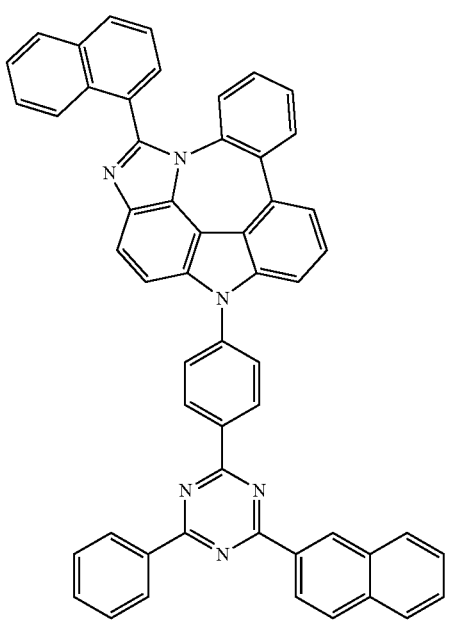

C-16
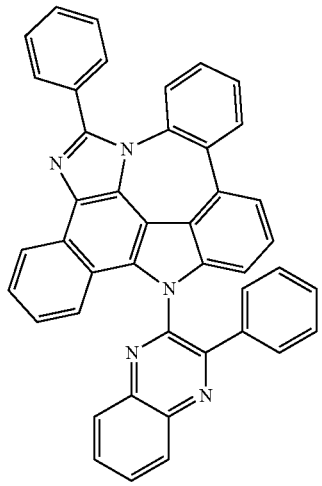
C-17
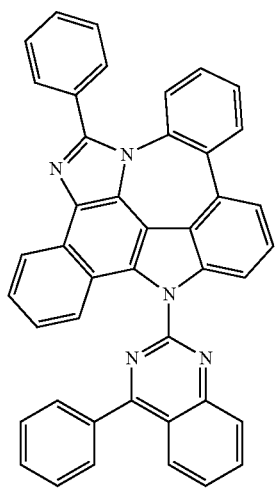
C-18
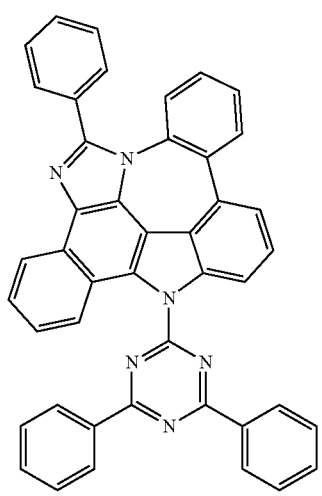
C-19
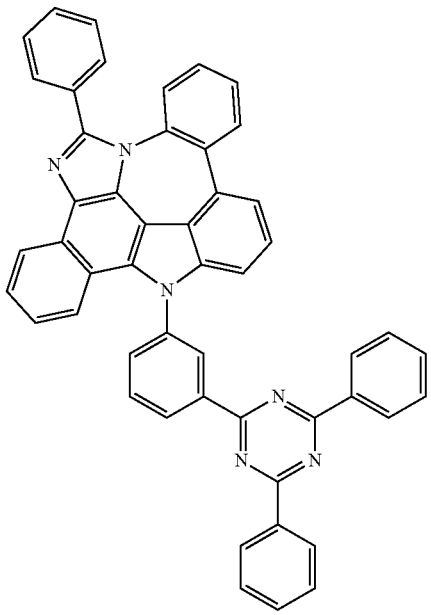
C-20
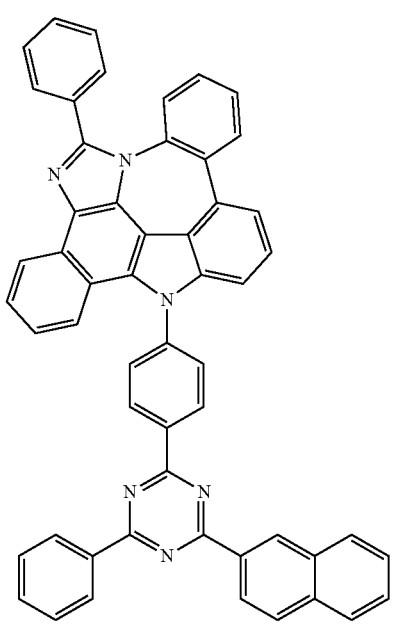
C-21
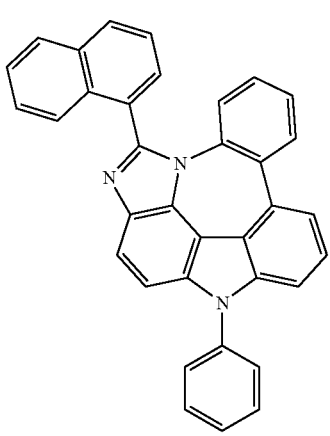

C-22 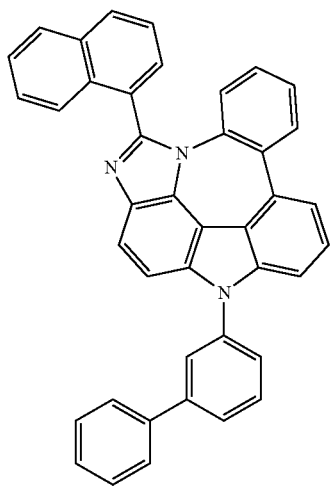
C-23 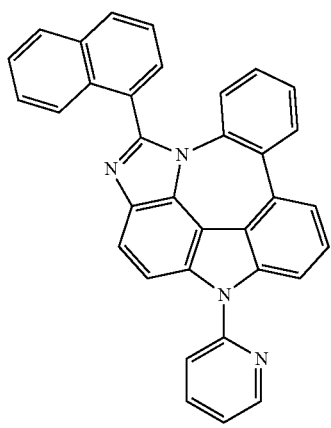
C-24 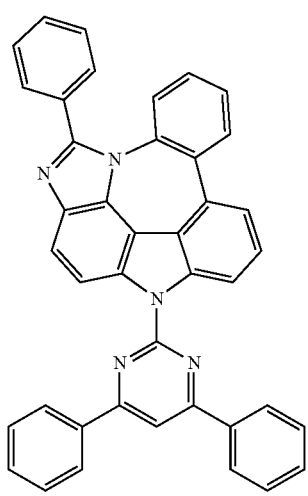
C-25 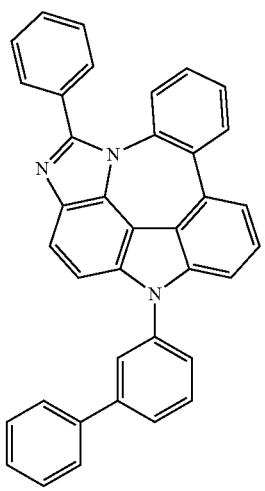
C-26 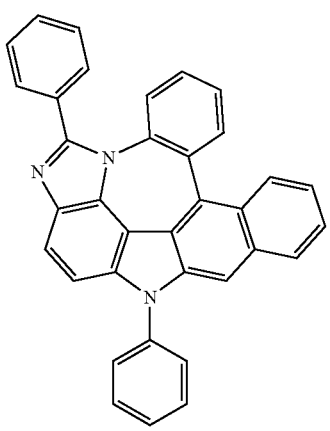
C-27 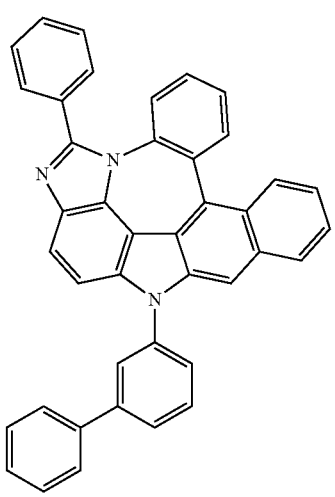

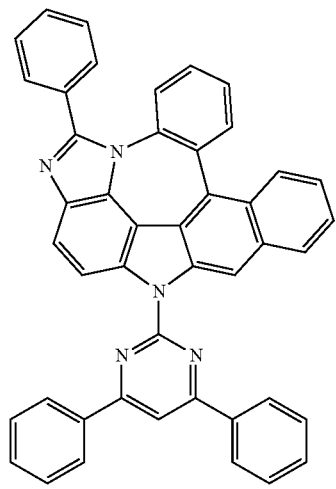
C-28
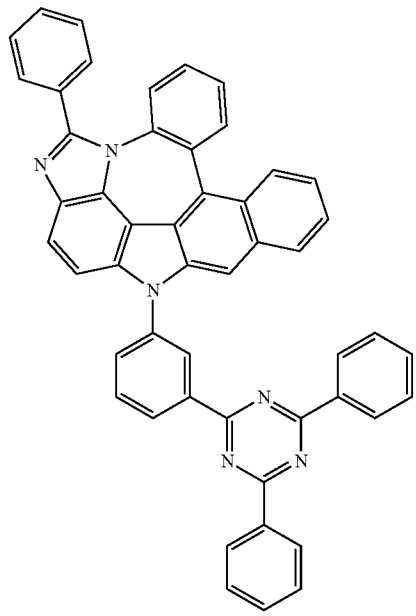
C-30
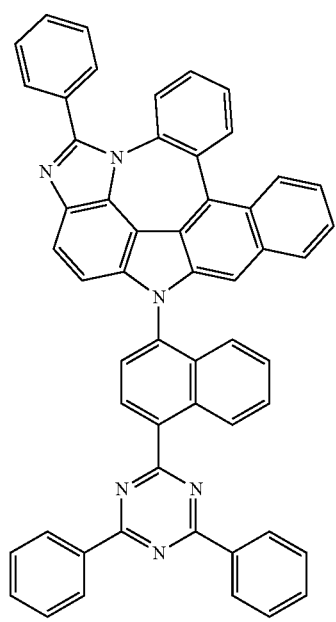
C-29
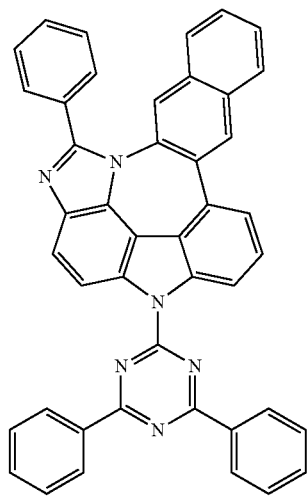
C-31

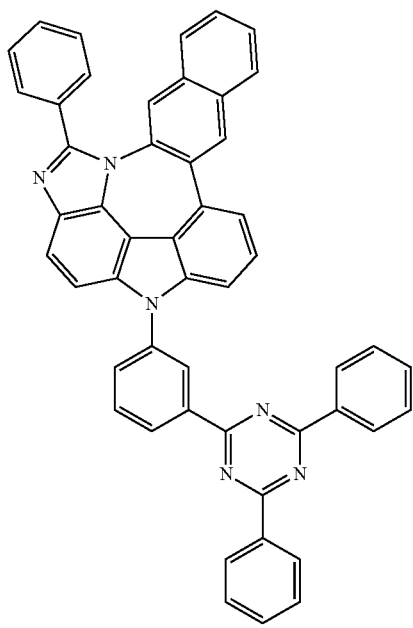
C-32
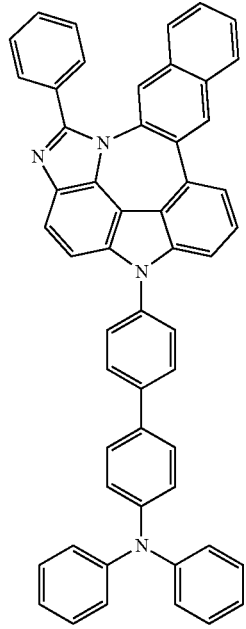
C-35
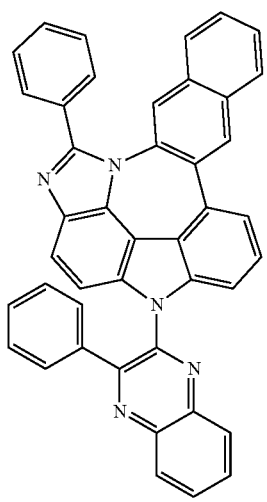
C-33
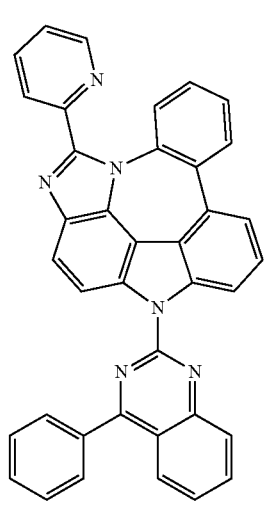
C-36
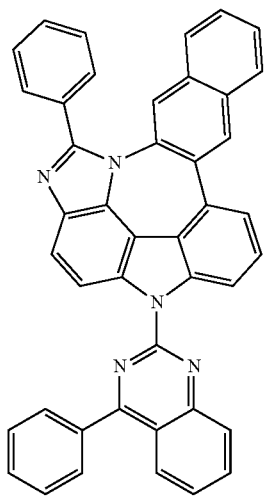
C-34
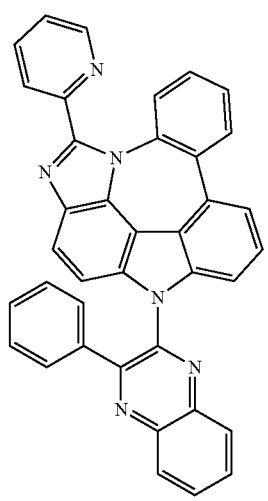
C-37

C-38 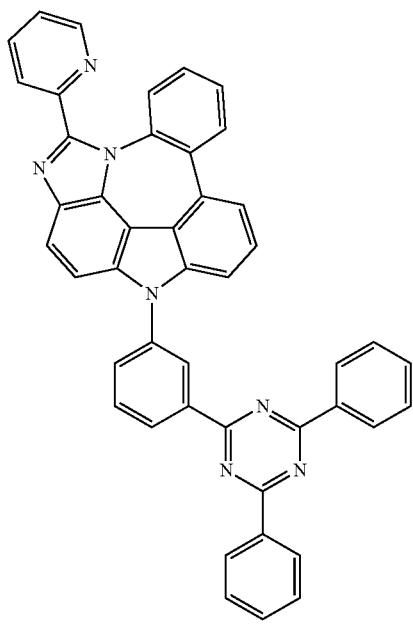
C-41 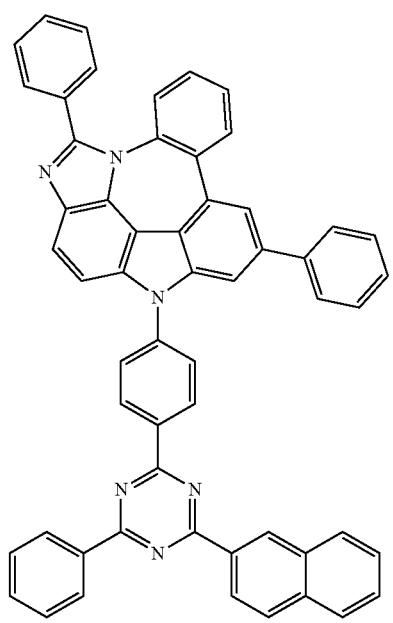
C-39 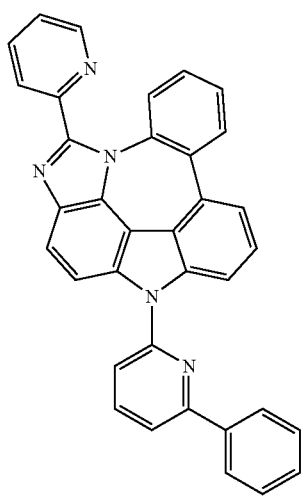
C-42 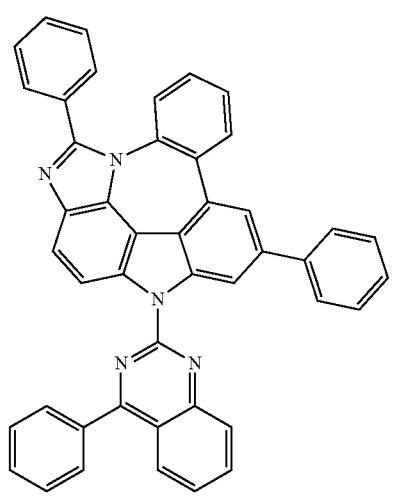
C-40 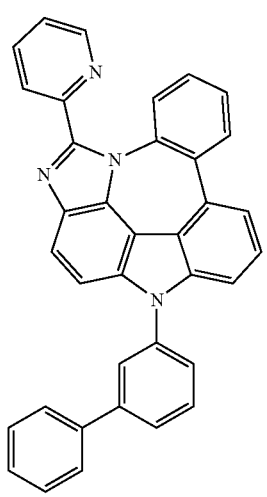
C-43 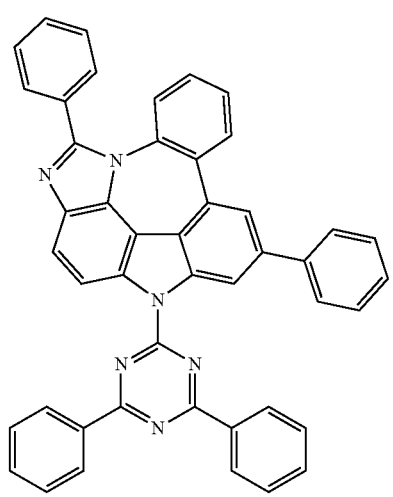

C-44
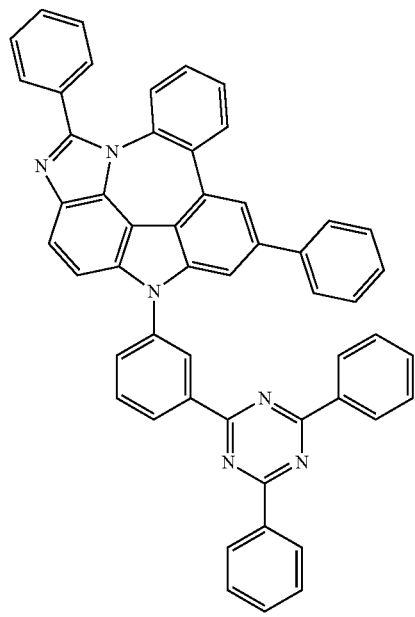
C-45
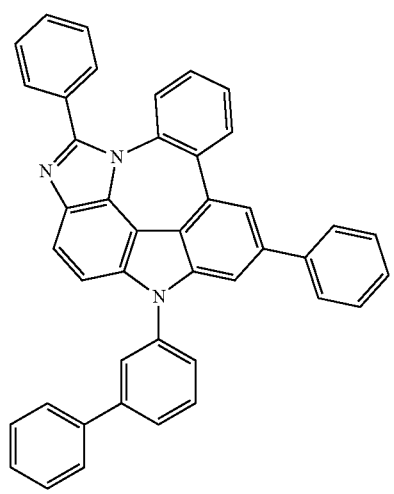
C-46
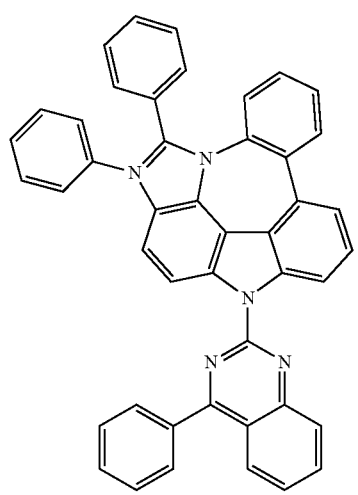
C-47
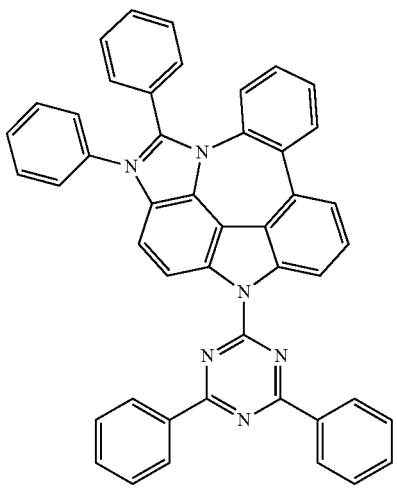
C-48
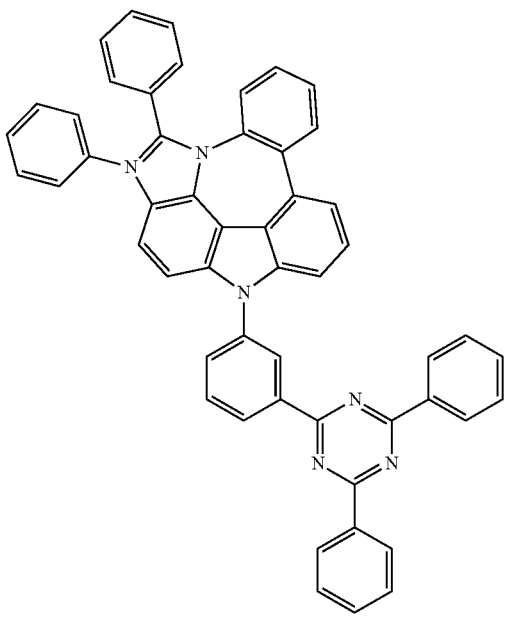
C-49
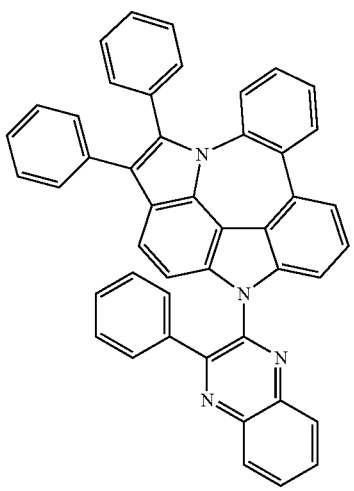

C-50
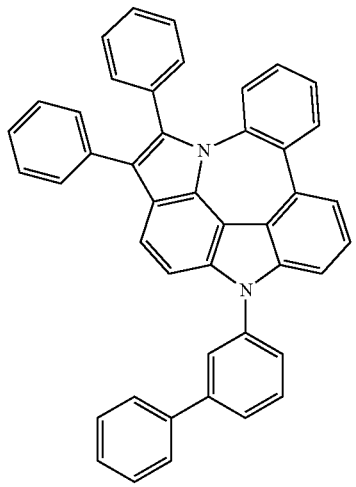
C-51
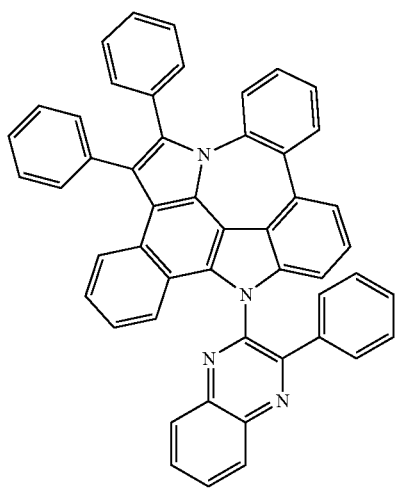
C-52
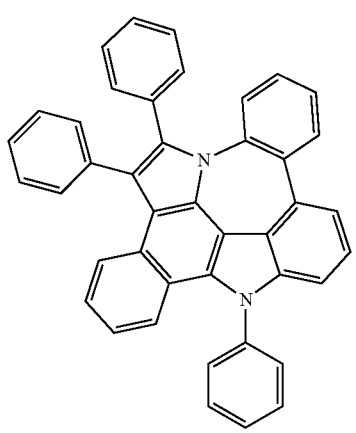
C-53
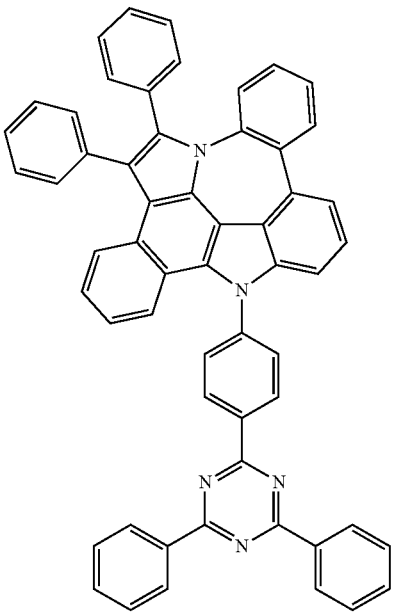
C-54
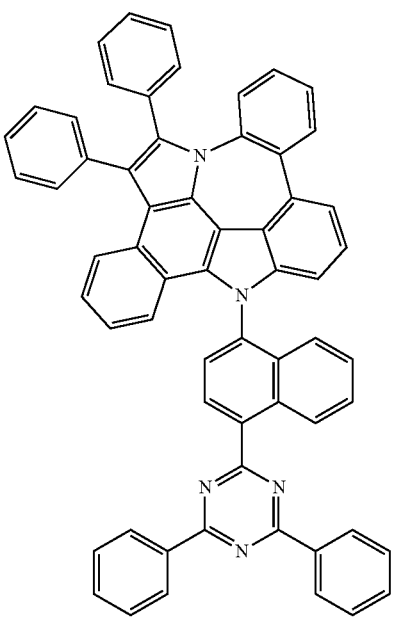

C-55
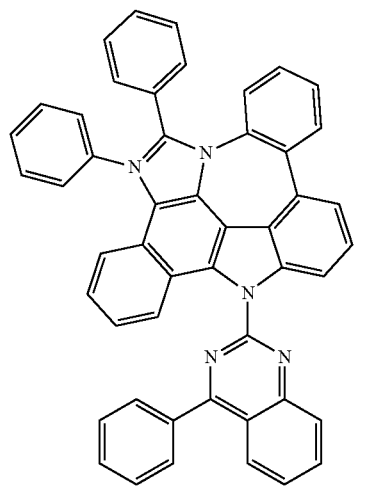
C-56
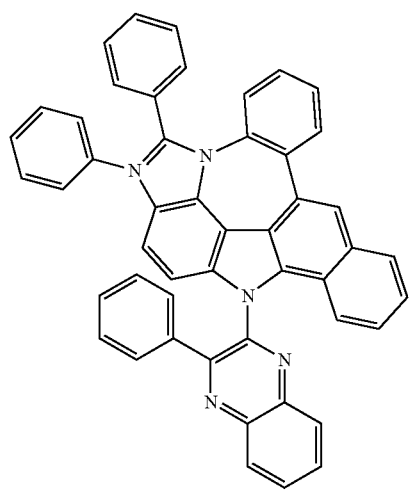
C-57
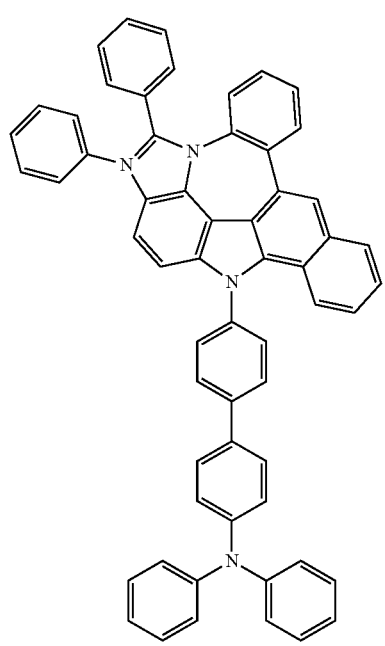
C-58
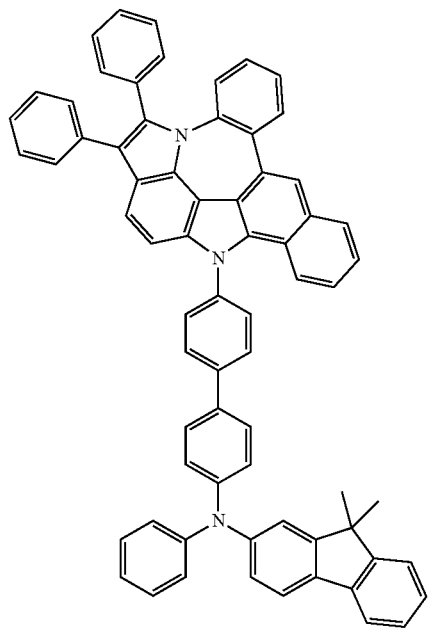
C-59
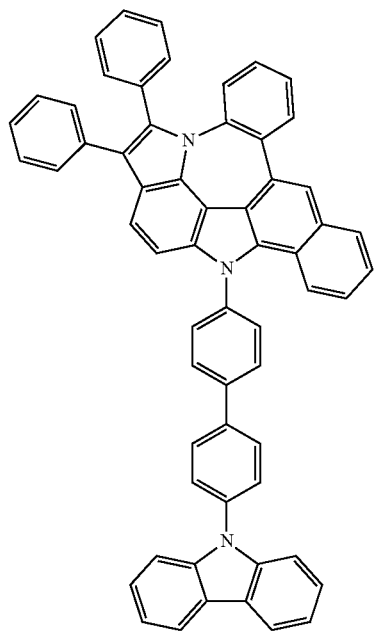

C-60
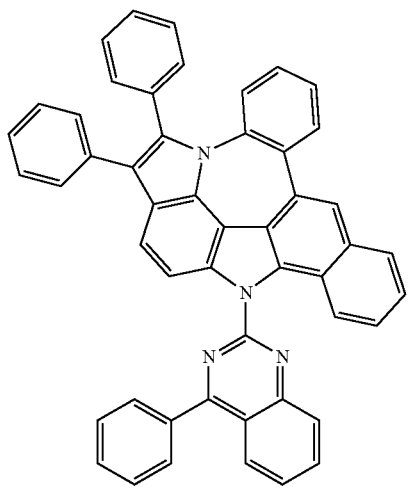
C-63
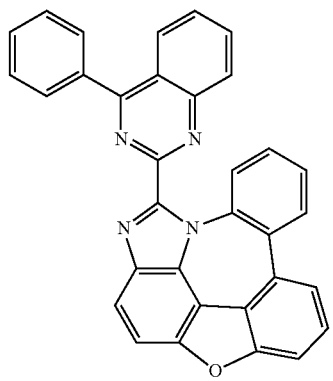
C-61
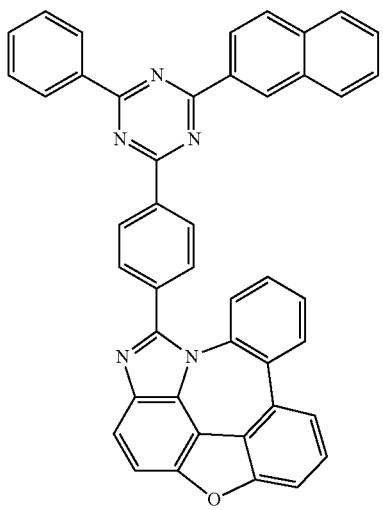
C-64
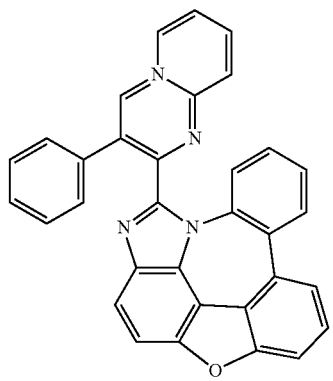
C-62
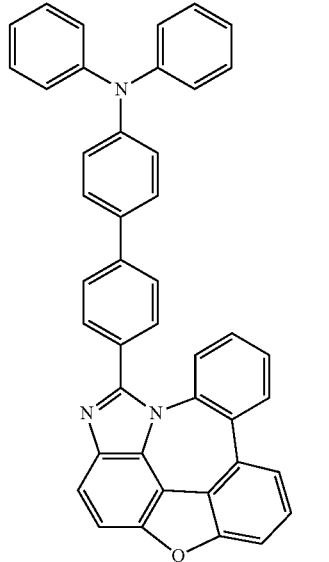
C-65

-continued
C-66
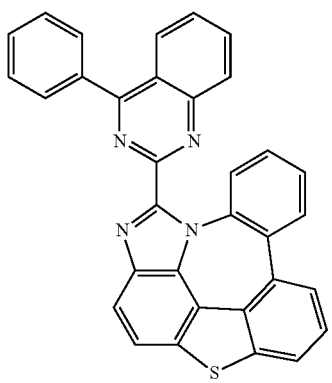
C-67
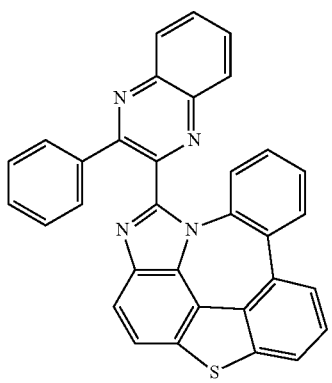
C-68
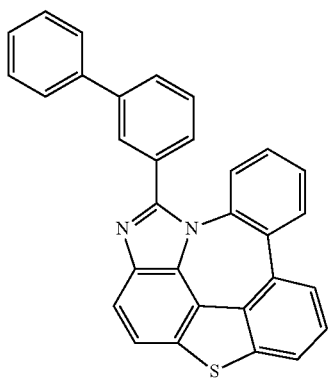
-continued
C-69
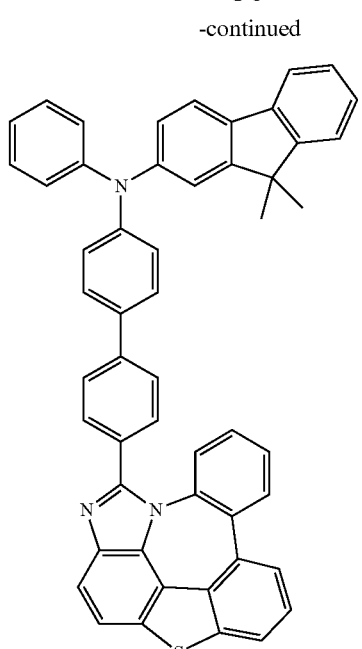
C-70
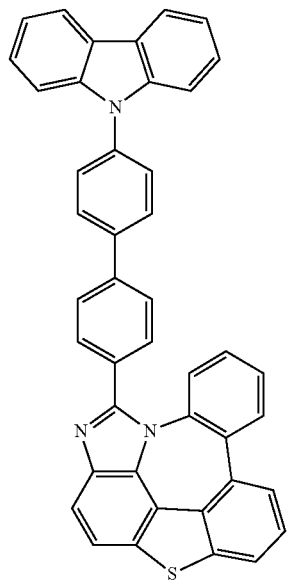
C-71
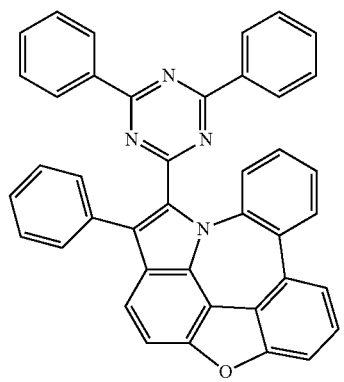

C-72
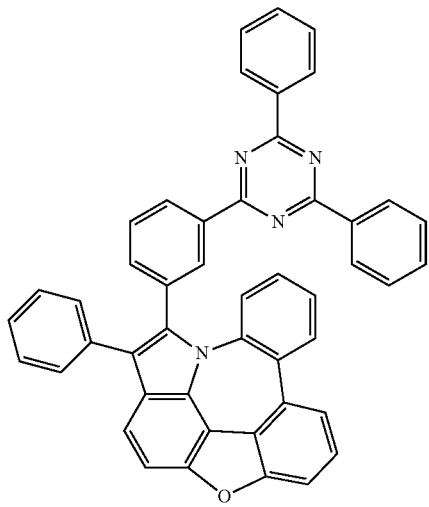
C-73
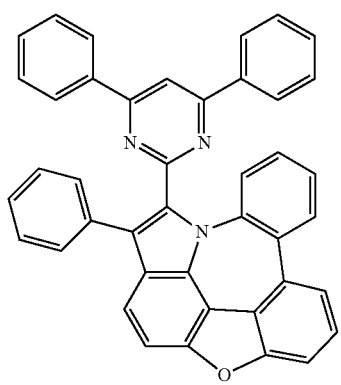
C-74
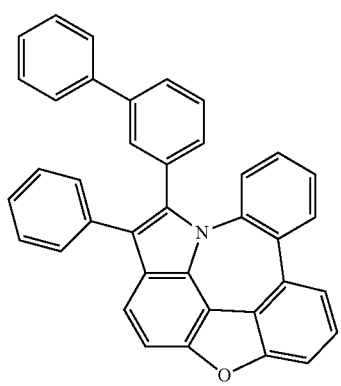
C-75
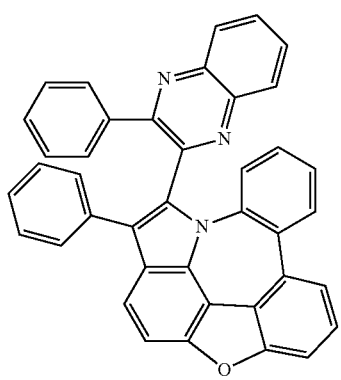
C-76
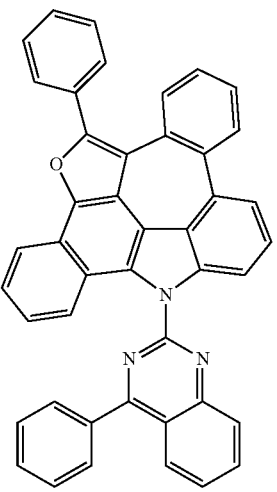
C-77
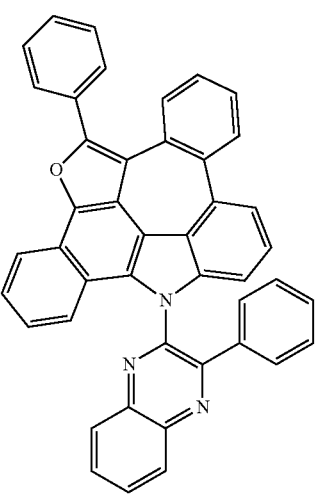
C-78
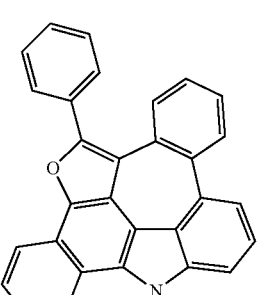
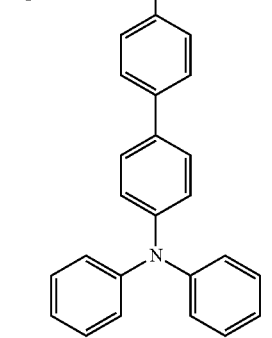

C-79
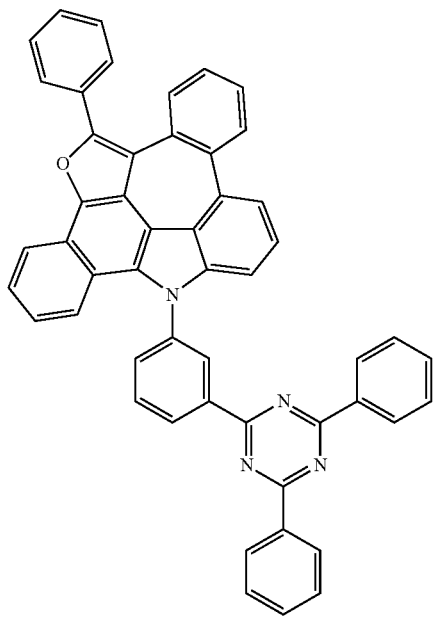
C-80
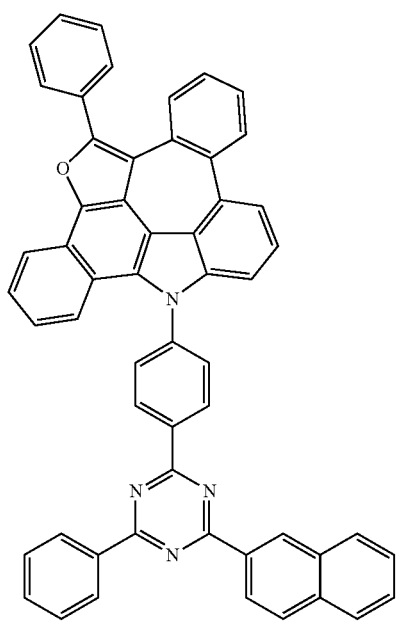
C-81
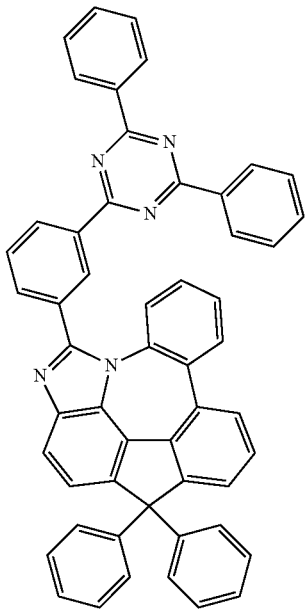
C-82
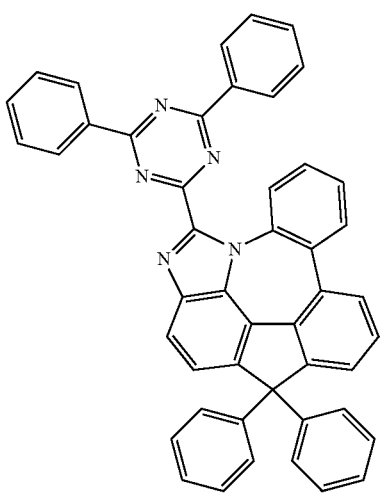
C-83
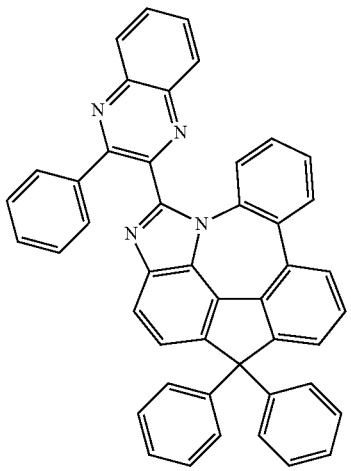

C-84
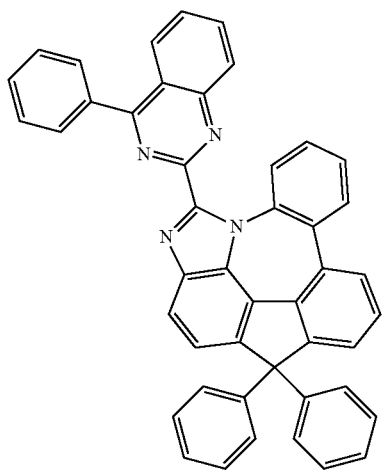
C-85
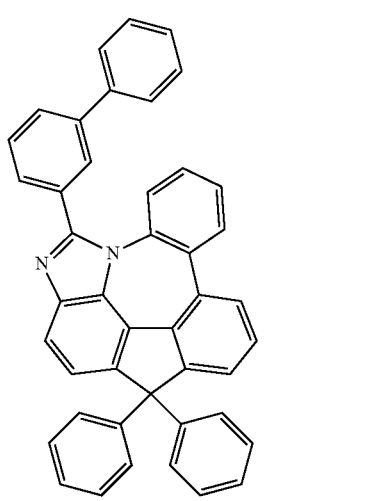
C-86
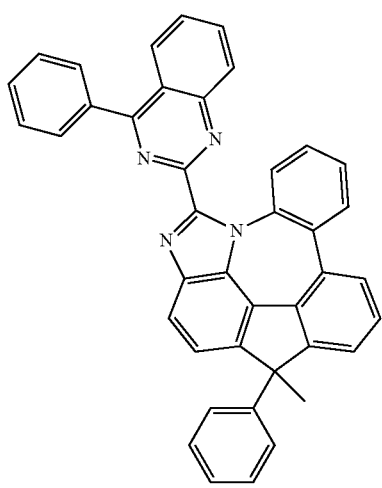
C-87
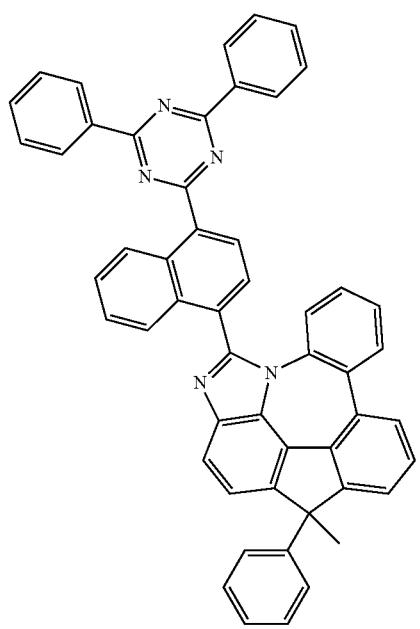
C-88
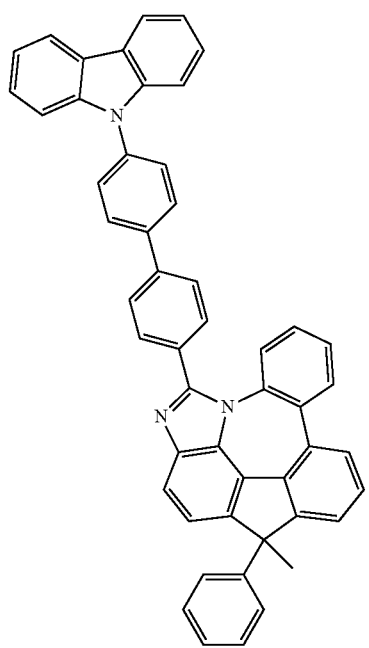

C-89
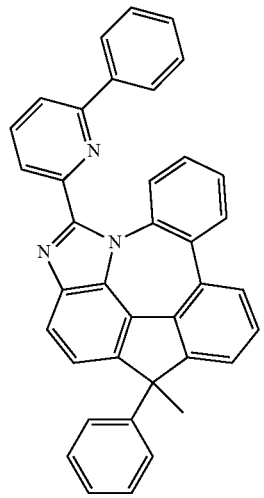
C-91
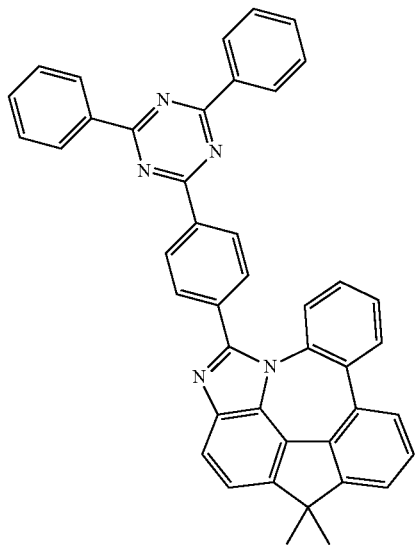
C-92
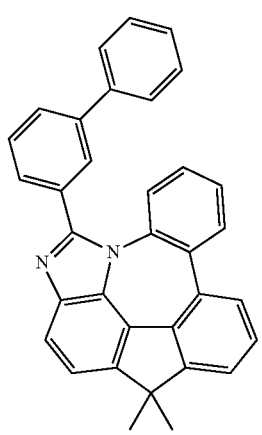
C-90
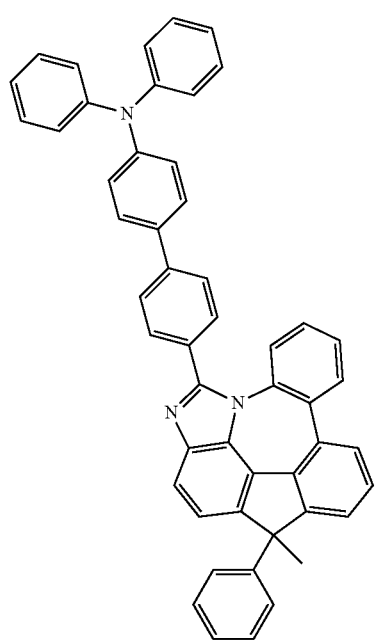
C-93
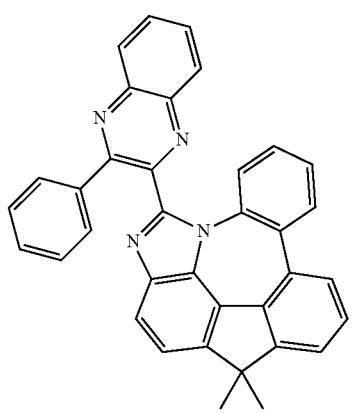

C-94
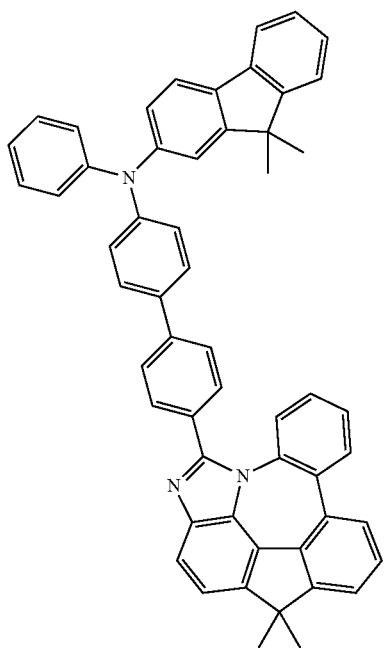
C-97
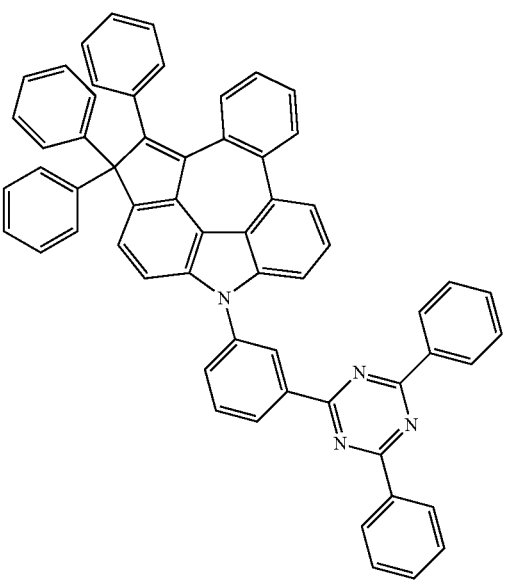
C-95
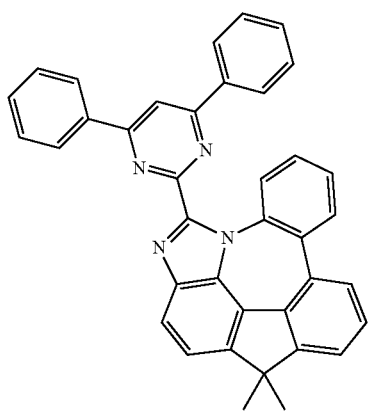
C-98
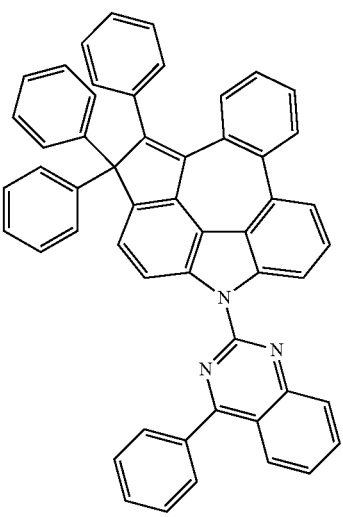
C-96
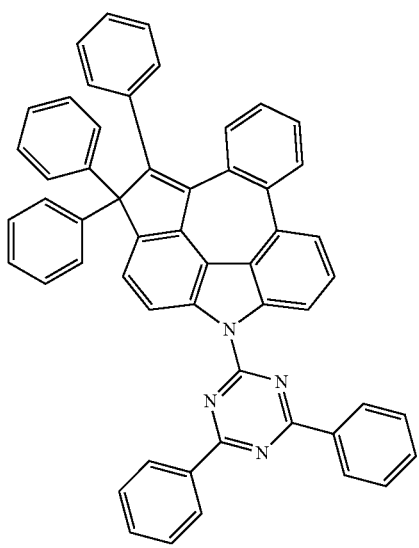
C-99

C-100
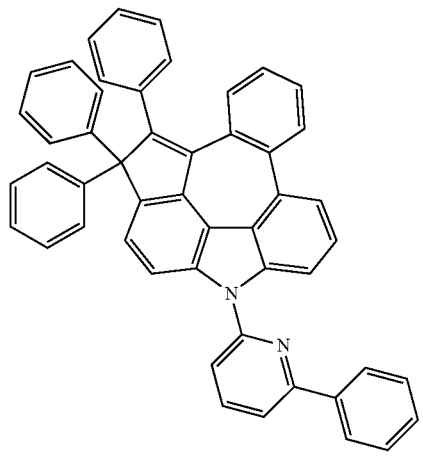
C-101
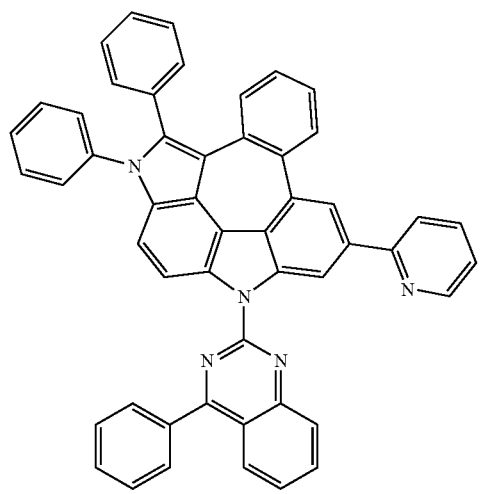
C-102
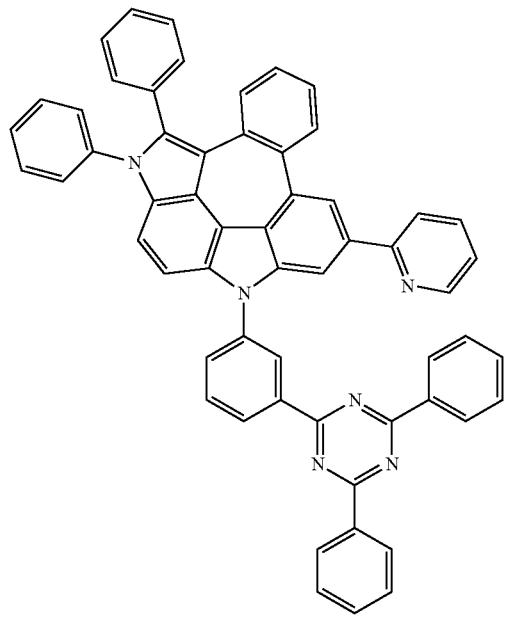
C-103
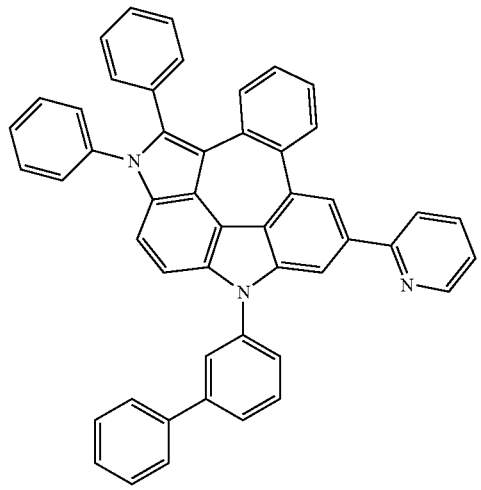
C-104
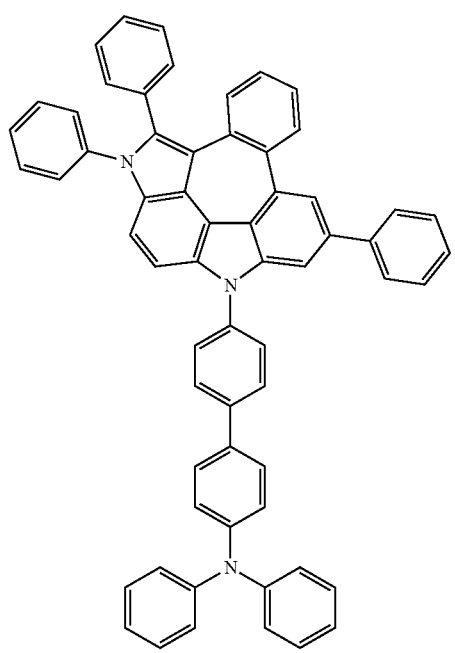
C-105
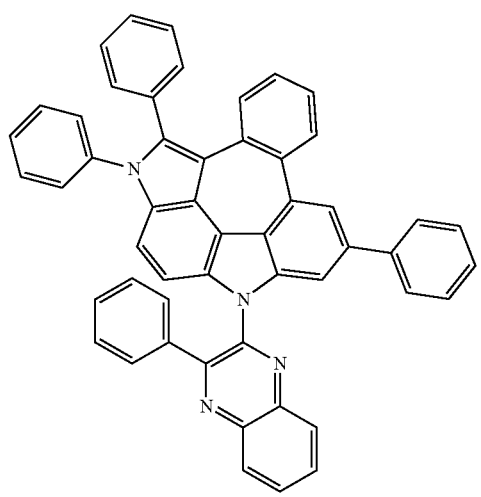

C-106
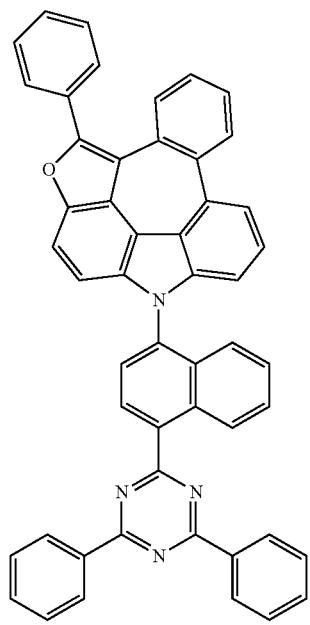
C-107
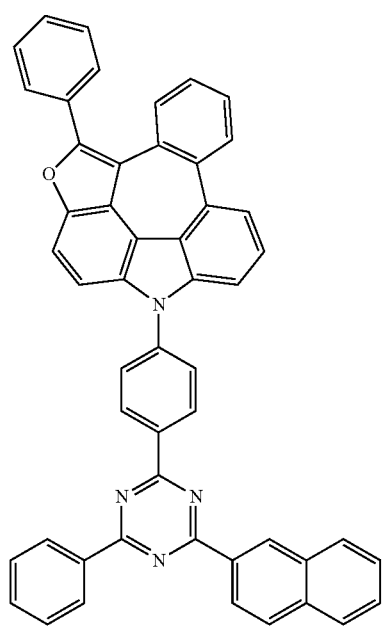
C-108
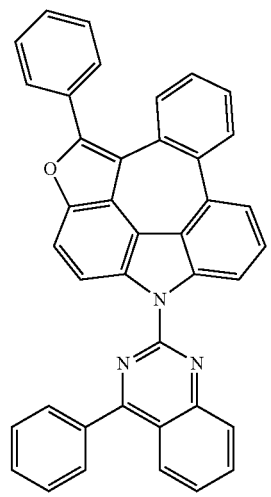
C-109
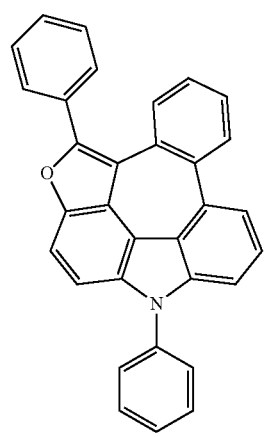
C-110
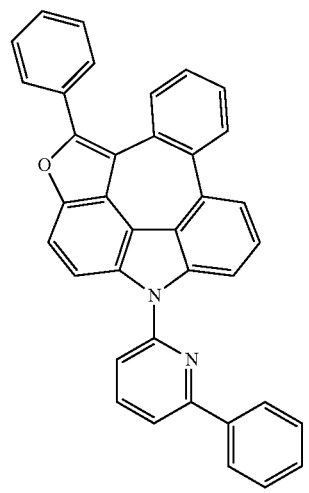

C-111
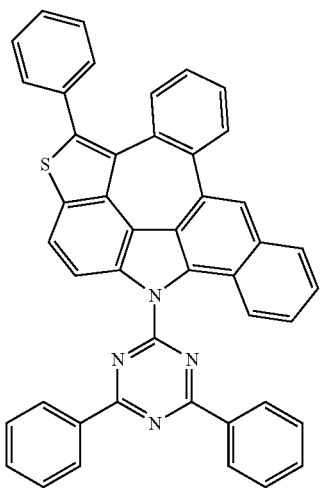
C-114
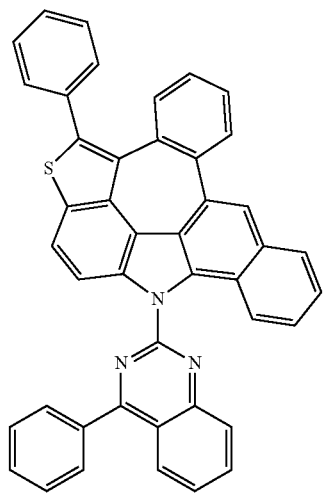
C-112
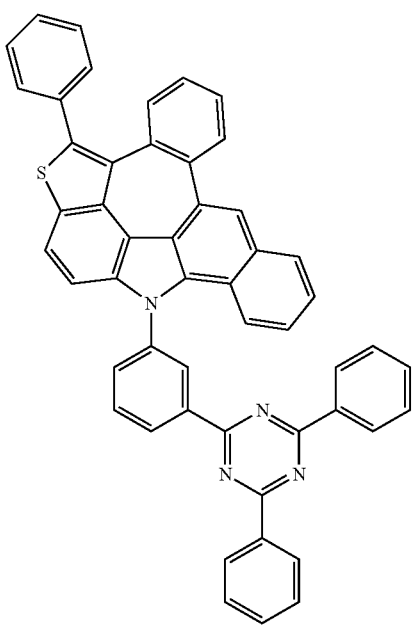
C-115
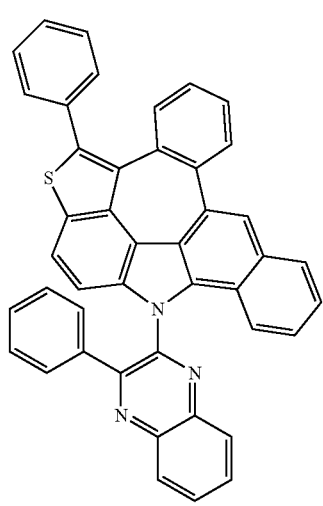
C-113
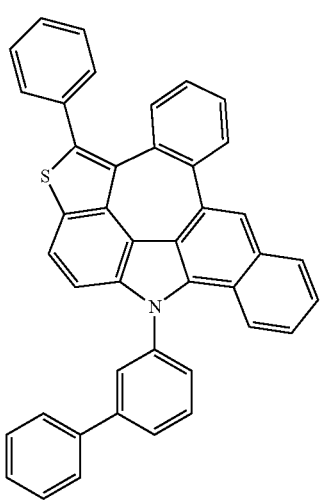
C-116
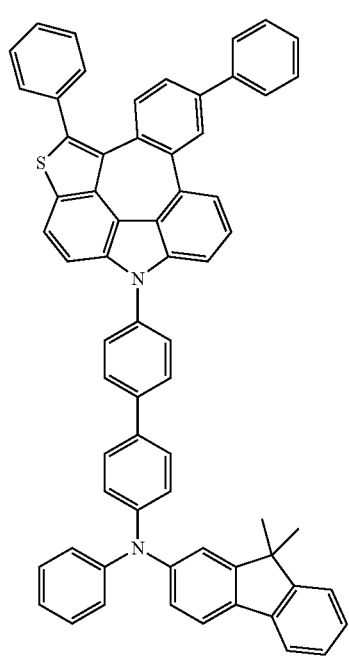

C-117
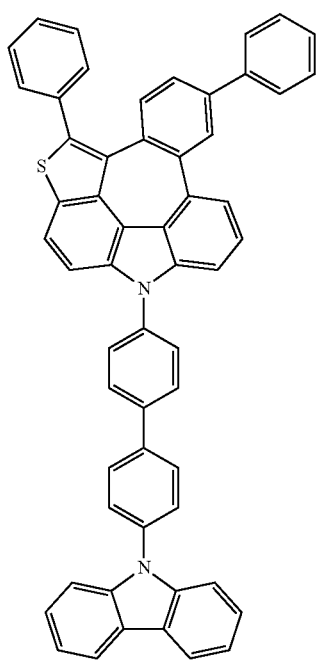
C-118
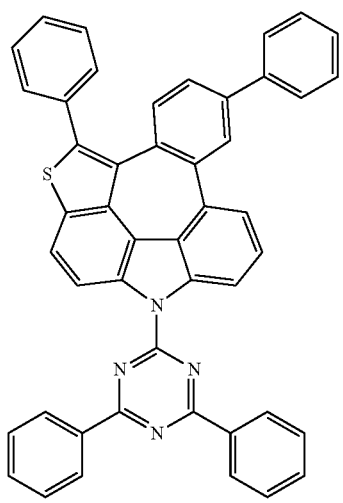
C-119
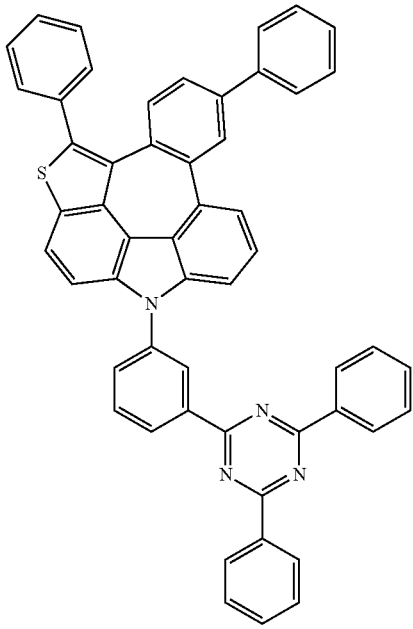
C-120
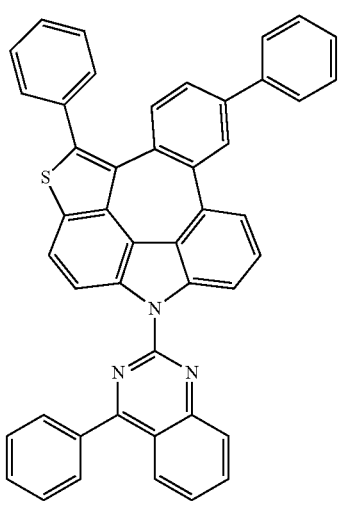

C-121 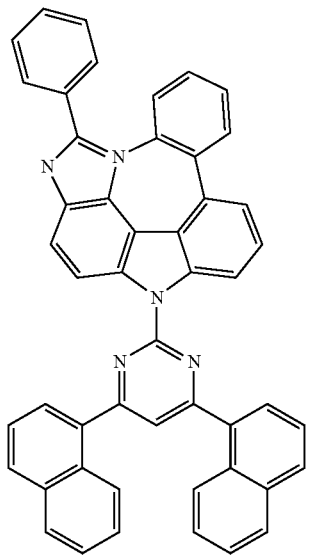
C-122 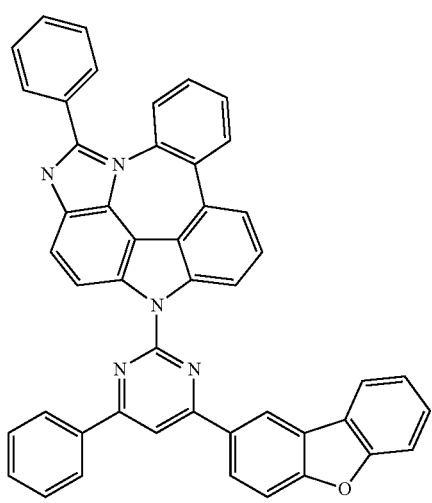
C-123 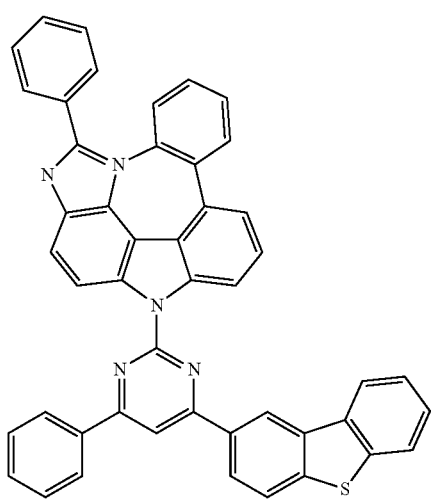
C-124 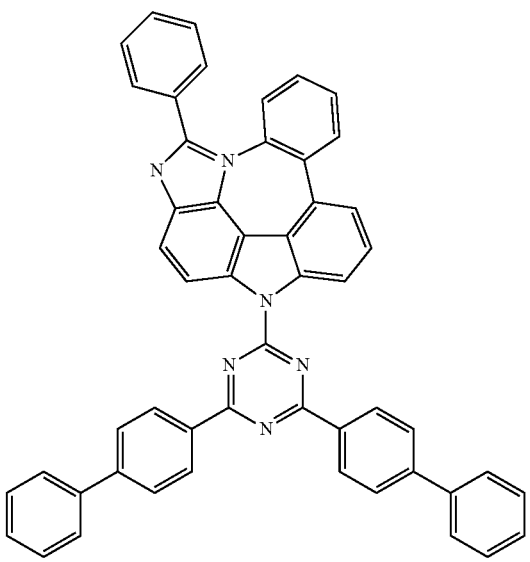
C-125
C-126

C-127
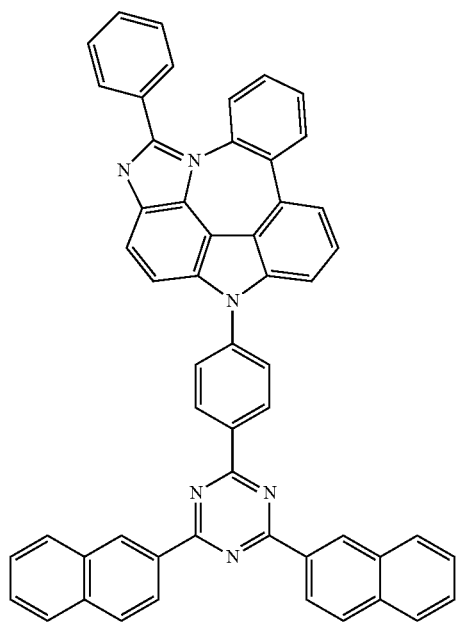
C-129
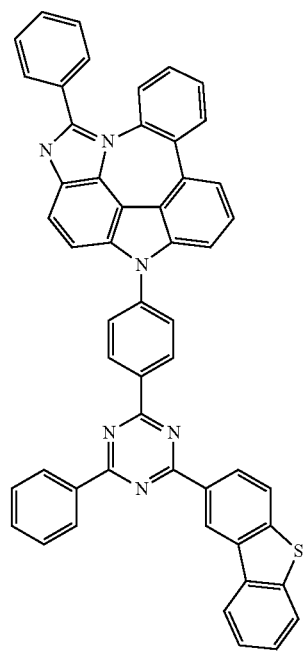
C-128
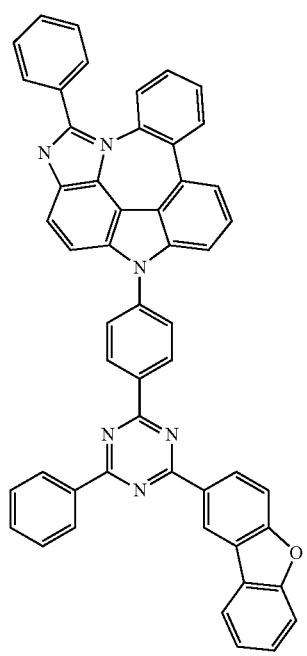
C-130
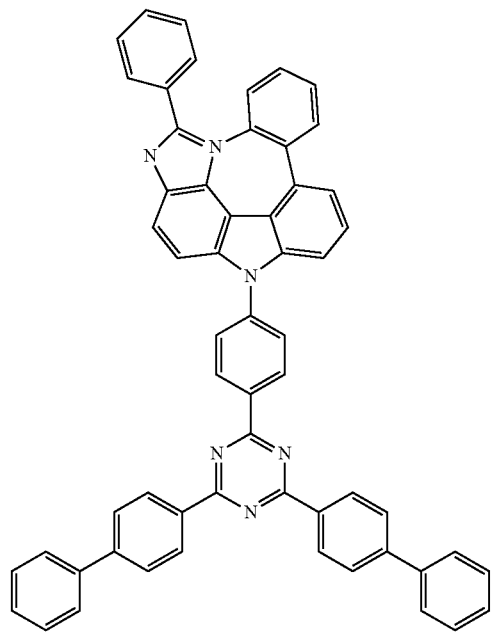

C-131
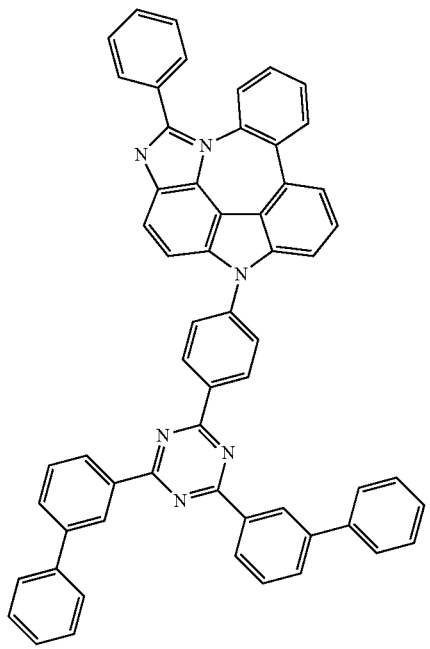
C-133
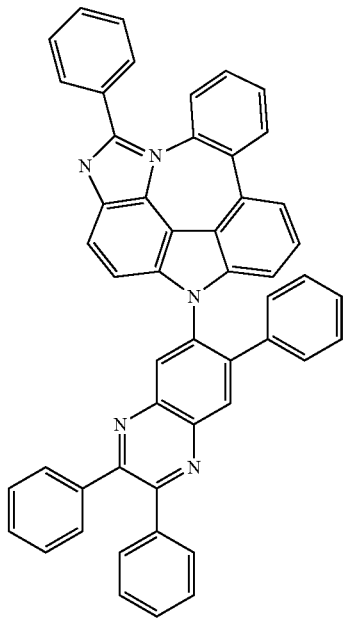
C-132
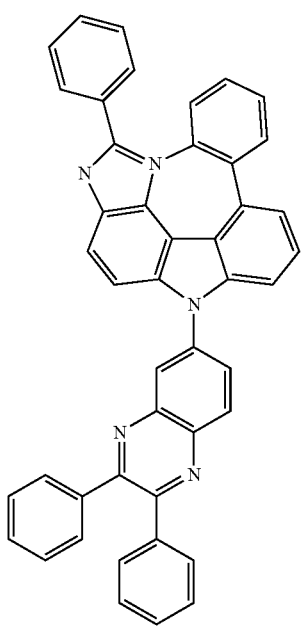
C-134
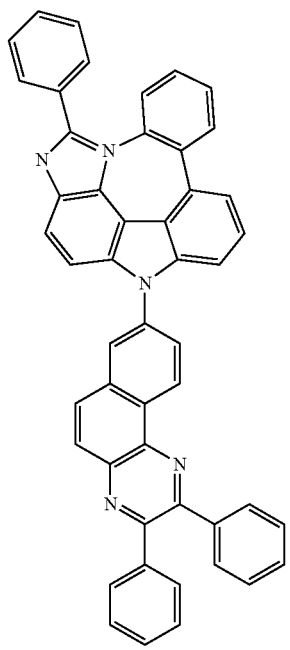

C-135
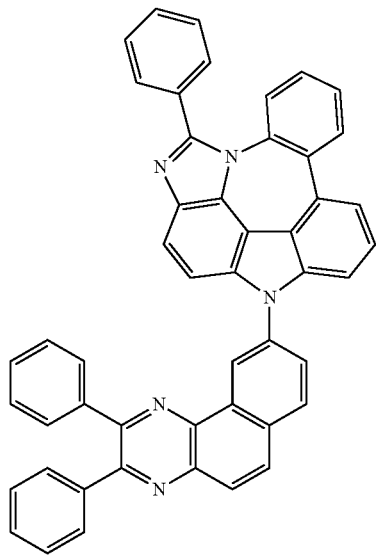
C-136
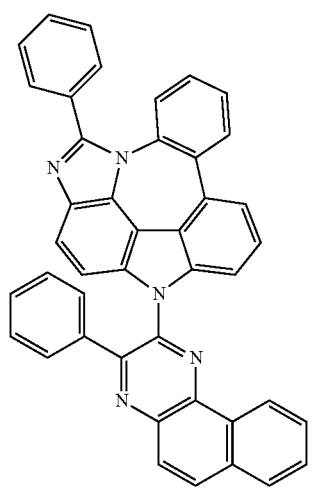
C-137
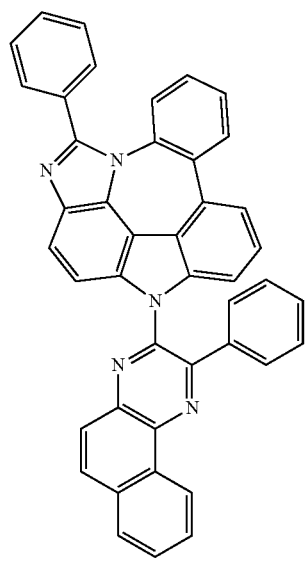
C-138
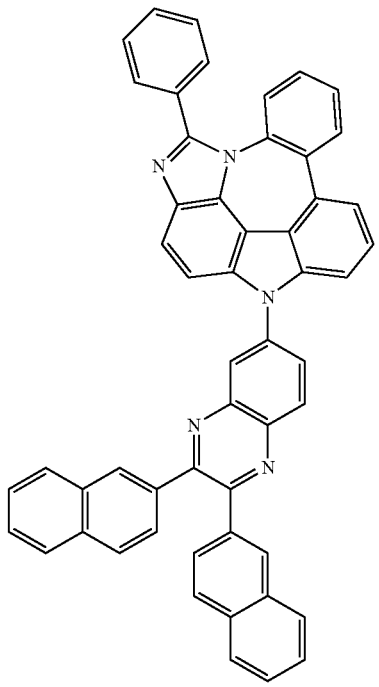
C-139
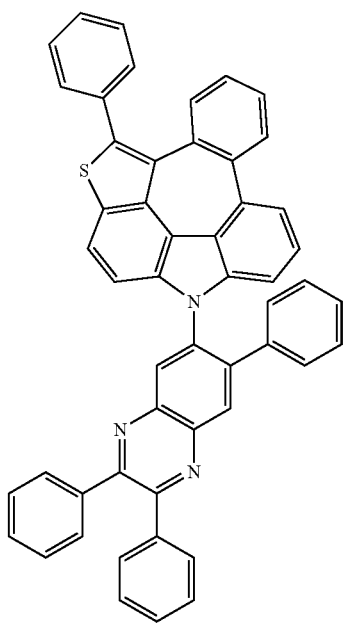

C-140
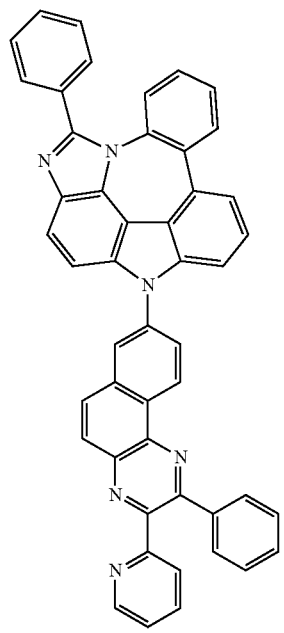
C-141
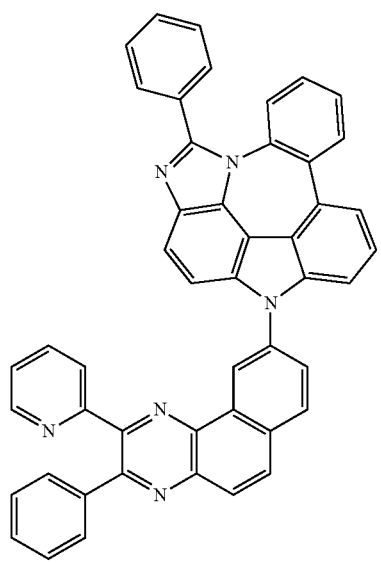
C-142
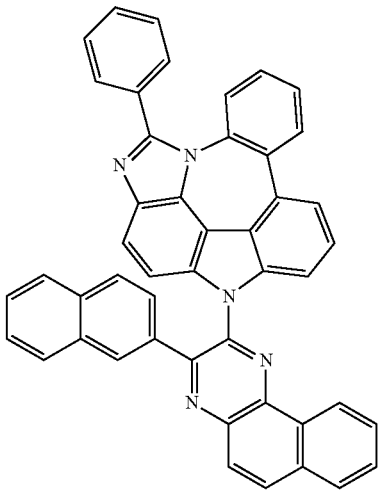
C-143
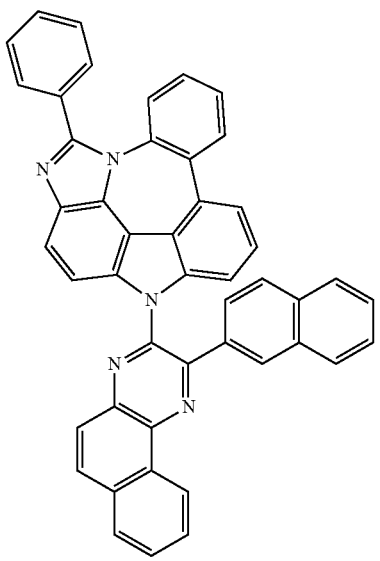
C-144
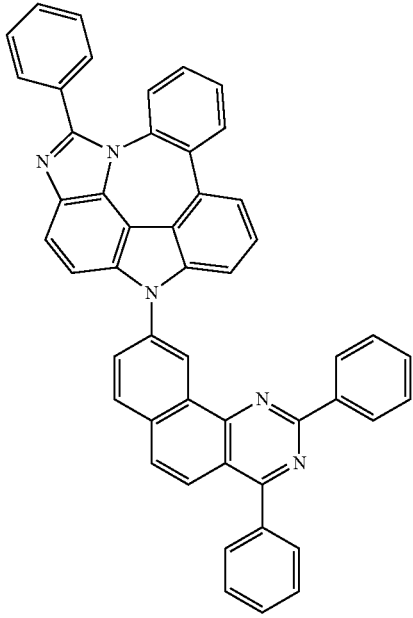

-continued
C-145
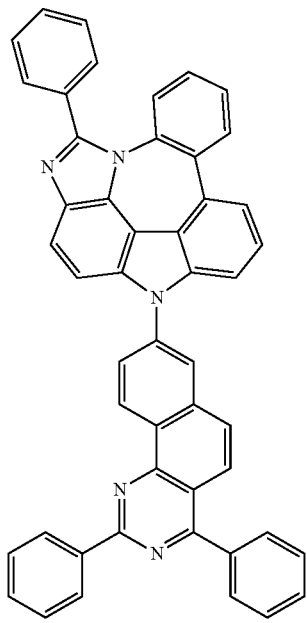
C-146
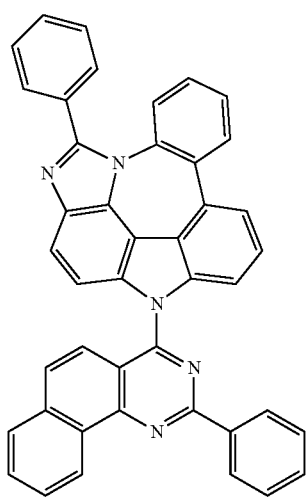
C-147
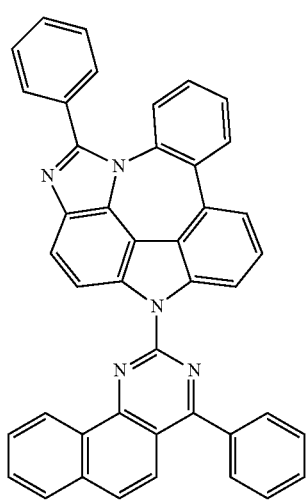
C-148
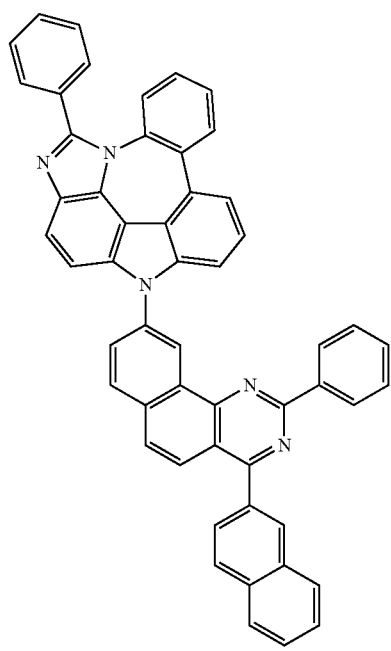
C-149
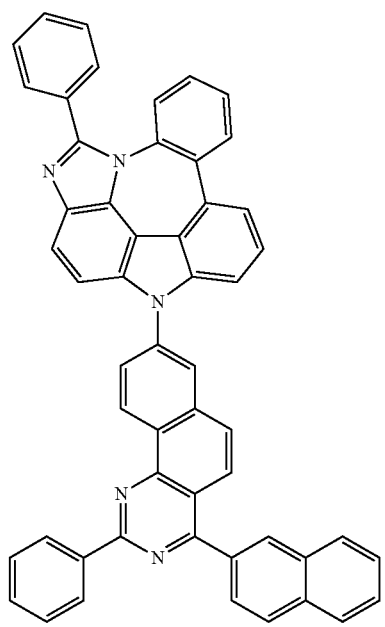

C-150 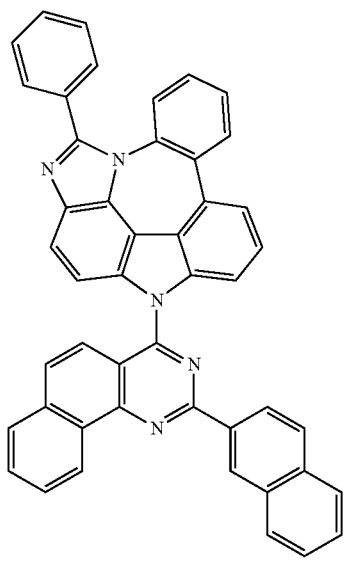
C-151 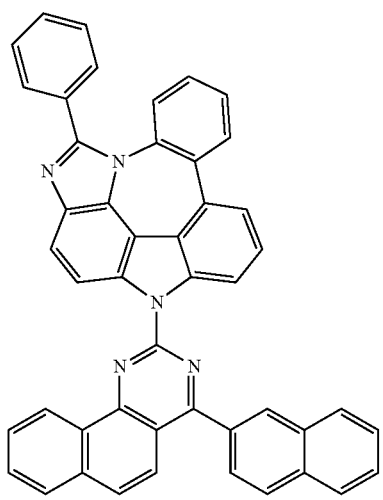
C-152 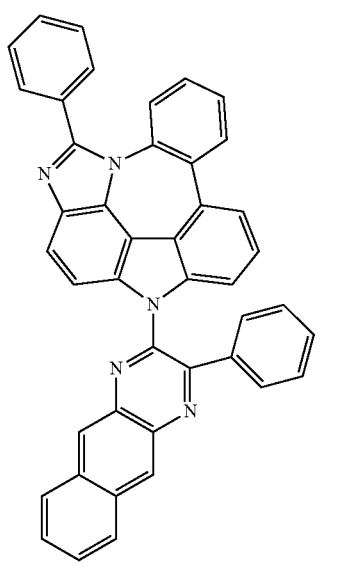
C-153 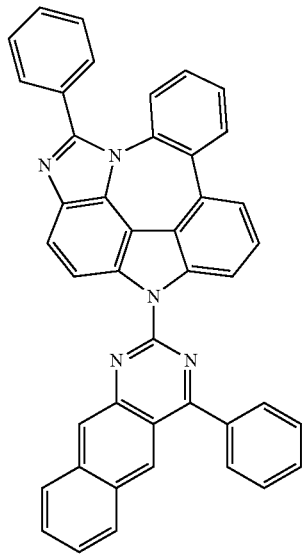
C-154 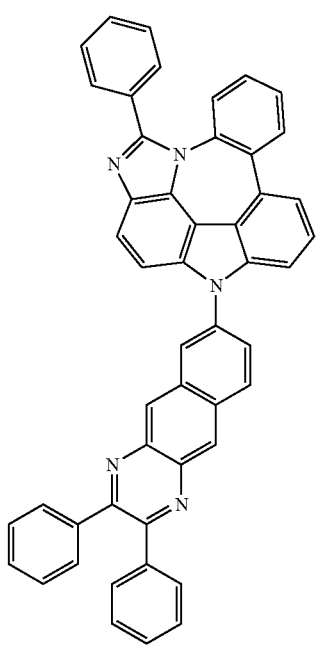

C-155
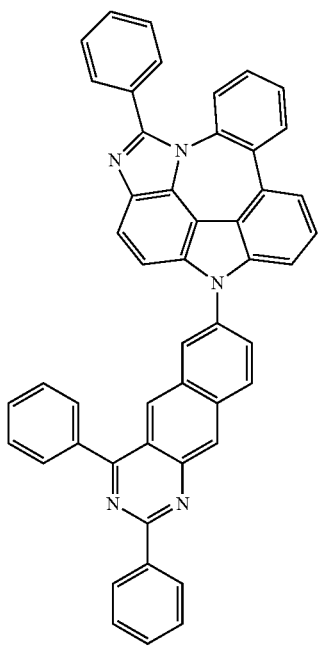
The compound of formula 1 according to the present disclosure may be prepared by a synthetic method known to one skilled in the art, and for example, as shown in the following reaction schemes, but is not limited thereto.
[Reaction Scheme 1]
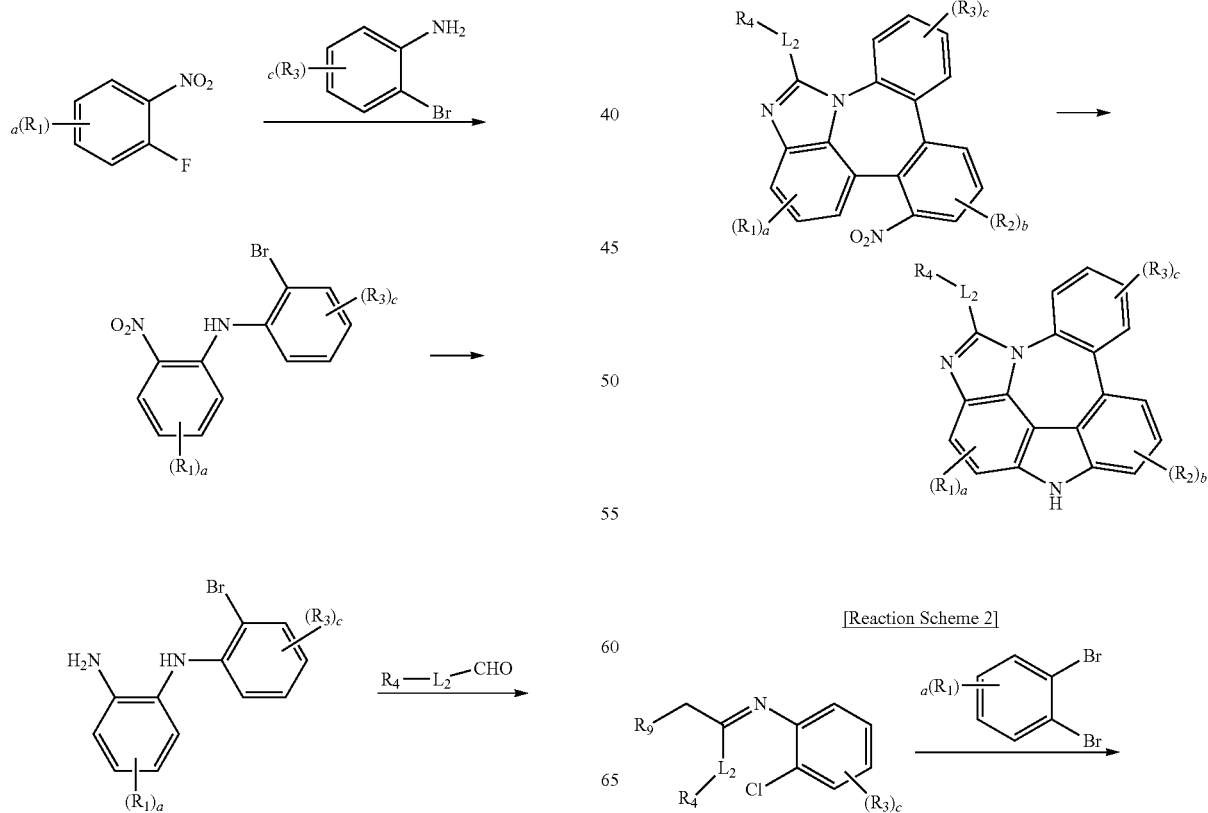
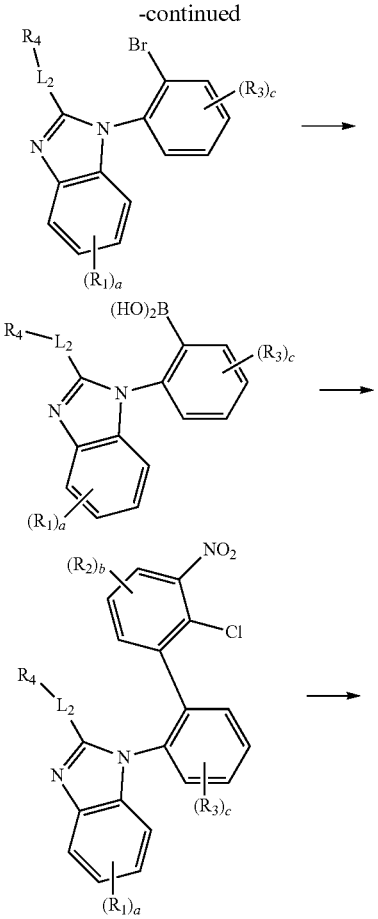
[Reaction Scheme 2]

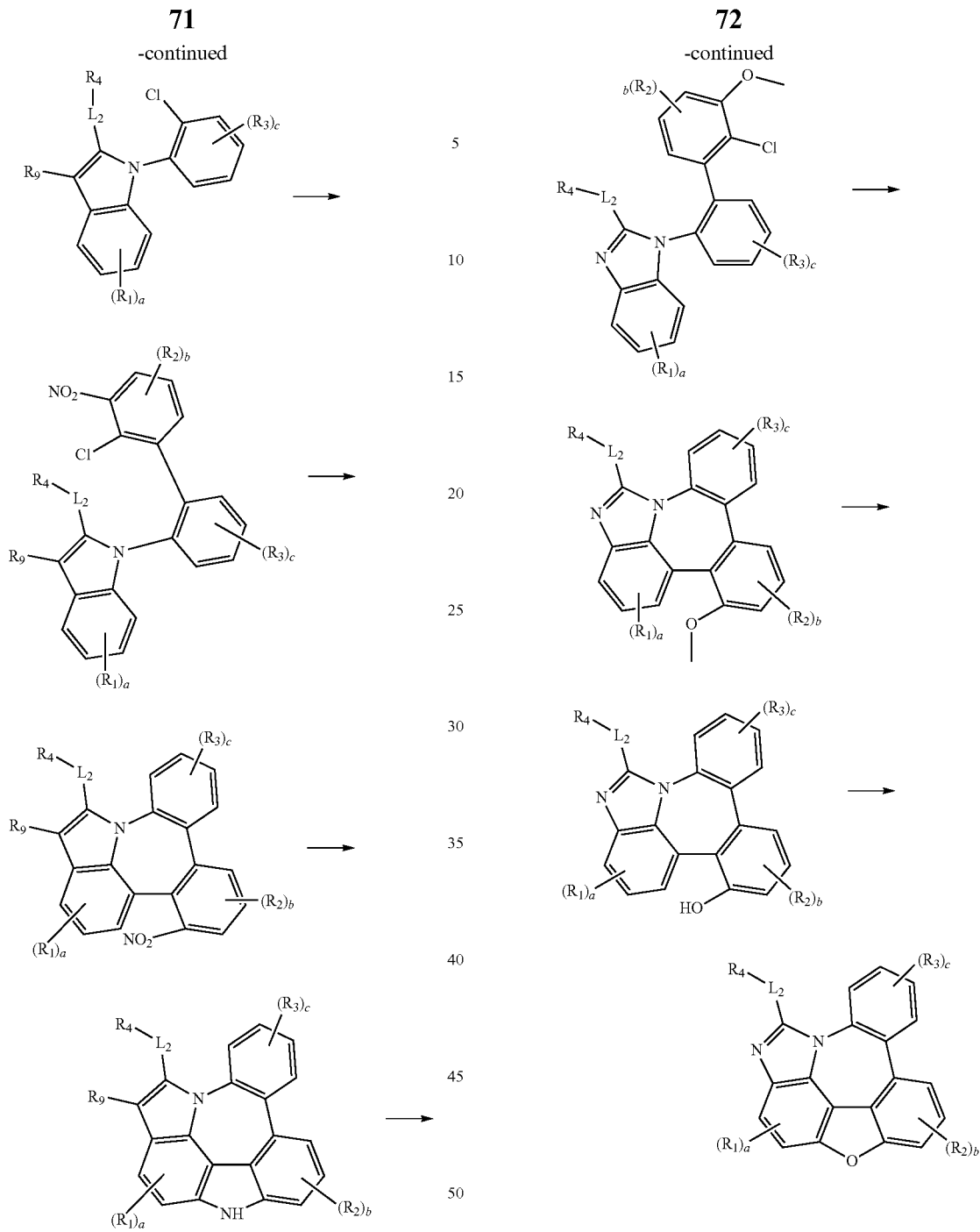
[Reaction Scheme 3]
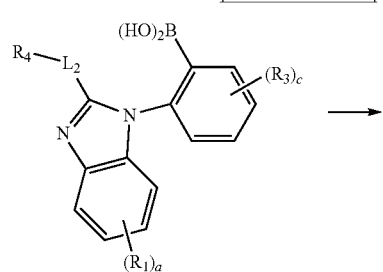
[Reaction Scheme 4]
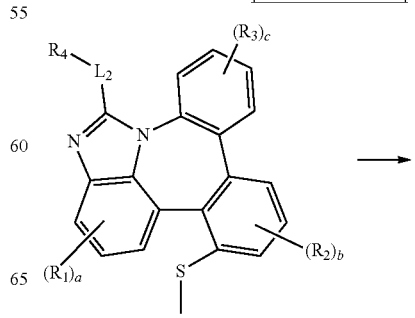

73
-continued
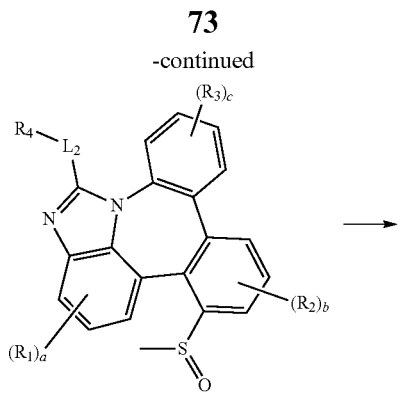
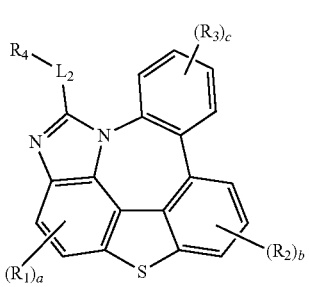
[Reaction Scheme 5]
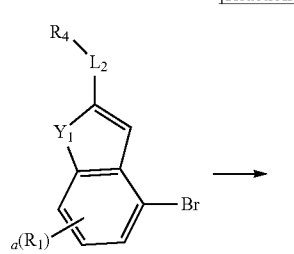
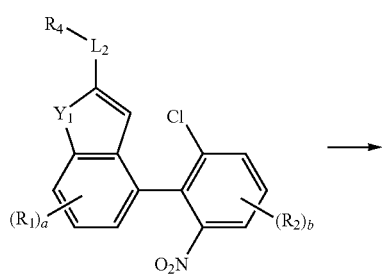
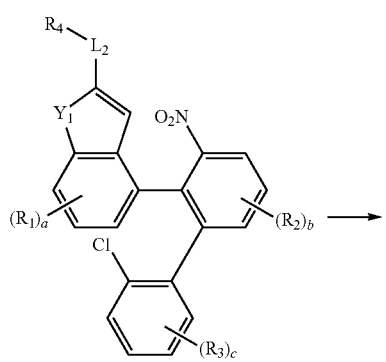
74
-continued
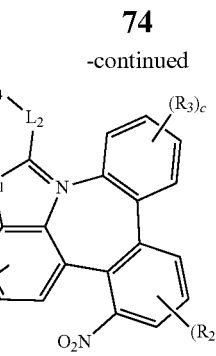
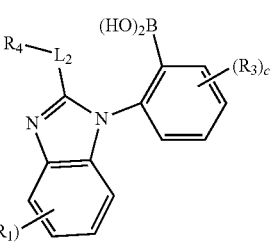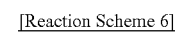
[Reaction Scheme 6]
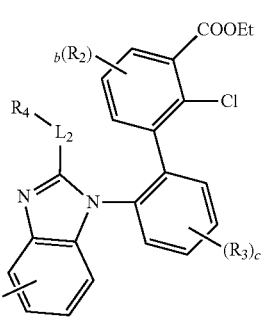
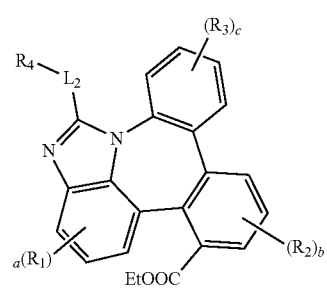

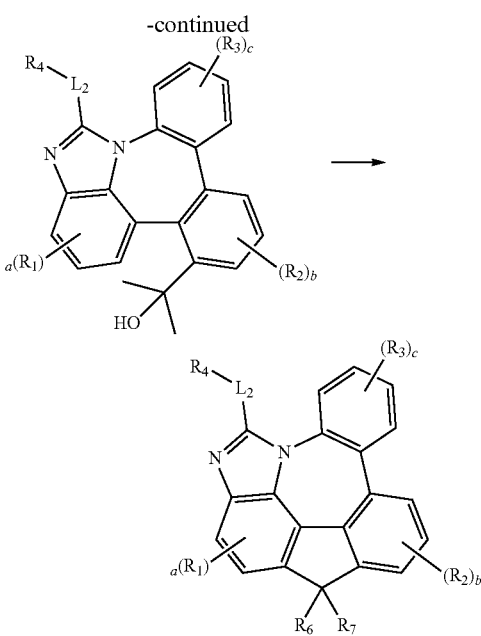

In reaction schemes 1 to 6, $Y_1$, $L_2$, $R_1$ to $R_4$, $R_6$, $R_7$, $R_9$, and a to c are as defined in formula 1.

Although illustrative synthesis examples of the compound represented by formula 1 were described above, one skilled in the art will be able to readily understand that all of them are based on a Buchwald-Hartwig cross-coupling reaction, an N-arylation reaction, a H-mont-mediated etherification reaction, a Miyaura borylation reaction, a Suzuki cross-coupling reaction, an Intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, and a Phosphine-mediated reductive cyclization reaction, and the above reactions proceed even when substituents, which are defined in formula 1 above but are not specified in the specific synthesis examples, are bonded.

The present disclosure provides an organic electroluminescent material comprising the compound represented by formula 1, and an organic electroluminescent device comprising the organic electroluminescent material.

The organic electroluminescent material may consist of the compound according to the present disclosure alone, or may further comprise conventional materials included in the organic electroluminescent material.

The organic electroluminescent compound represented by formula 1 of the present disclosure may be comprised in at least one of a light-emitting layer, a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer, preferably, may be comprised in the light-emitting layer. When used in the light-emitting layer, the organic electroluminescent compound represented by formula 1 of the present disclosure may be comprised as a host material. Preferably, the light-emitting layer may further comprise at least one dopant. If necessary, the organic electroluminescent compound of the present disclosure may be used as a co-host material. That is, the light-emitting layer may further include an organic electroluminescent compound other than the organic electroluminescent compound represented by formula 1 of the present disclosure (first host material) as a second host material. The weight ratio between the first host material and the second host material is in the range of 1:99 to 99:1. When two or more materials are included in one layer, mixed deposition may be performed to form a layer, or co-deposition may be performed separately to form a layer.

The second host material may be selected from any of the known host materials. Preferably, the second host material may be selected from the group consisting of the compounds represented by the following formulas 11 to 16:

  (11)

  (12)

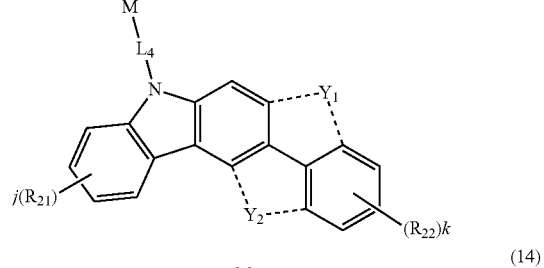  (13)

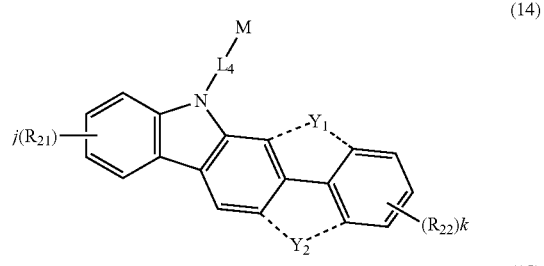  (14)

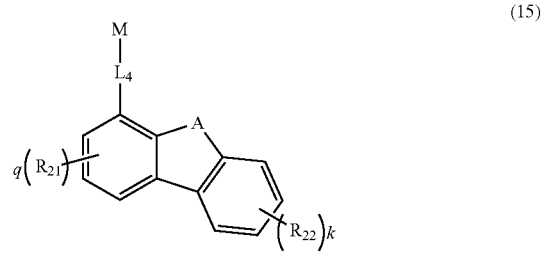  (15)

wherein, Cz represents the following structure:

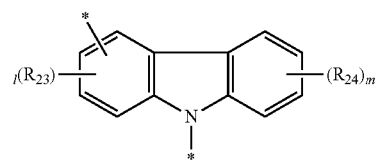

A represents —O— or —S—; $R_{21}$ to $R_{24}$, each independently, represent hydrogen, deuterium, a halogen, a substituted or unsubstituted (C1-C30)alkyl, a substituted or unsubstituted (C6-C30)aryl, a substituted or unsubstituted (5- to 30-membered)heteroaryl, or —$SiR_{25}R_{26}R_{27}$; $R_{25}$ to $R_{27}$, each independently, represent a substituted or unsubstituted (C1-C30)alkyl, or a substituted or unsubstituted (C6-C30) aryl; $L_4$ represents a single bond, a substituted or unsubstituted (C6-C30)arylene, or a substituted or unsubstituted (5- to 30-membered)heteroarylene; M represents a substituted or unsubstituted (C6-C30)aryl, or a substituted or unsubstituted (5- to 30-membered)heteroaryl; $Y_1$ and $Y_2$, each independently, represent —O—, —S—, —N($R_{31}$)—, or —C($R_{32}$)($R_{33}$)—, and $Y_1$ and $Y_2$ are not present simultaneously; $R_{31}$ to $R_{33}$, each independently, represent a substituted or unsubstituted (C1-C30)alkyl, a substituted or unsubstituted (C6-C30)aryl, or a substituted or unsubstituted (5- to 30-membered)heteroaryl, $R_{32}$ and $R_{33}$ may be the same or different; h and i, each independently, represent an integer of 1 to 3; j, k, l and m, each independently, represent an integer of 0 to 4; q represents an integer of 1 to 3; and where h, i, j, k, l, m or q is an integer of 2 or more, each of (Cz-$L_4$), each of (Cz), each of $R_{21}$, each of $R_{22}$, each of $R_{23}$, or each of $R_{24}$ may be the same or different.

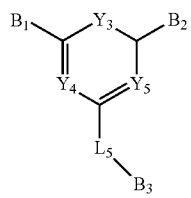

(16)

In formula 16, $Y_3$ to $Y_5$, each independently, represent $CR_{34}$ or N; $R_{34}$ represents hydrogen, a substituted or unsubstituted (C1-C30)alkyl, a substituted or unsubstituted (C6-C30)aryl, or a substituted or unsubstituted (5- to 30-membered)heteroaryl; $B_1$ and $B_2$, each independently, represent hydrogen, a substituted or unsubstituted (C6-C30)aryl, or a substituted or unsubstituted (5- to 30-membered)heteroaryl; $B_3$ represents a substituted or unsubstituted (C6-C30)aryl, or a substituted or unsubstituted (5- to 30-membered)heteroaryl; and $L_5$ represents a single bond, a substituted or unsubstituted (C6-C30)arylene, or a substituted or unsubstituted (5- to 30-membered)heteroarylene.

Specifically, the examples of the second host material include the following, but are not limited thereto.

B-1

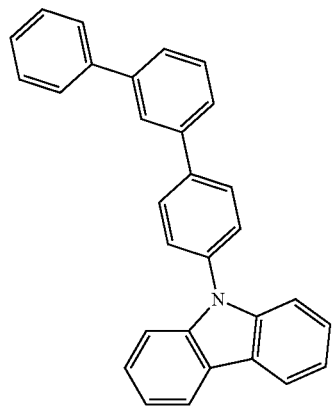

B-2

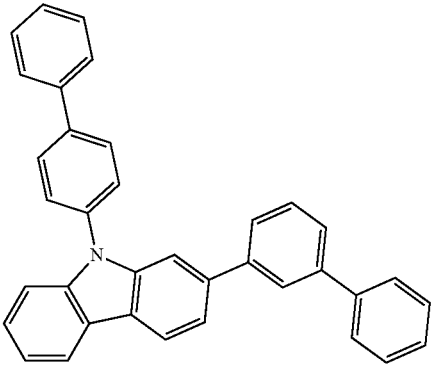

B-3

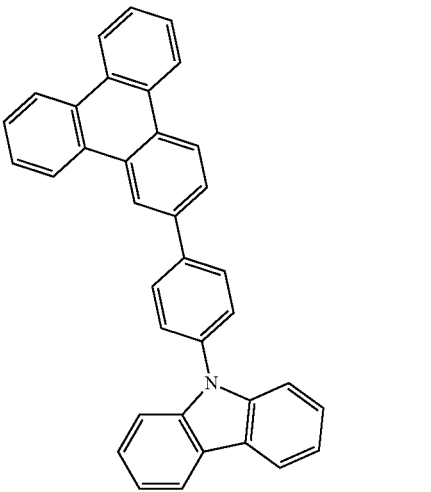

B-4

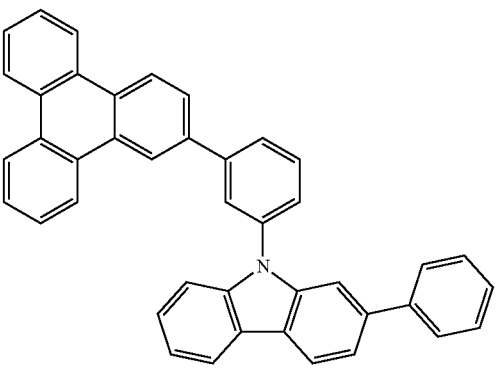

B-5

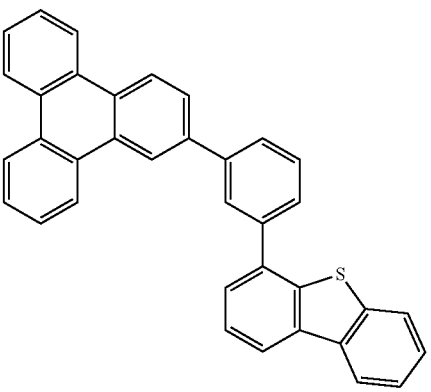

B-6
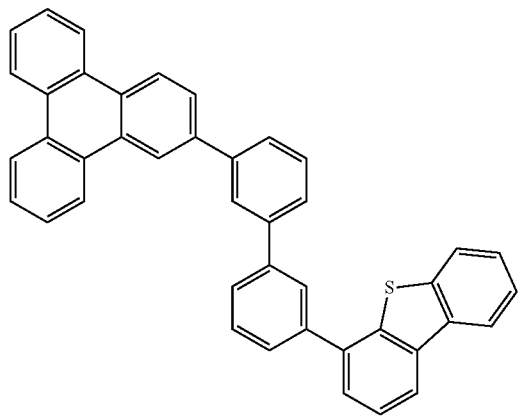
B-7
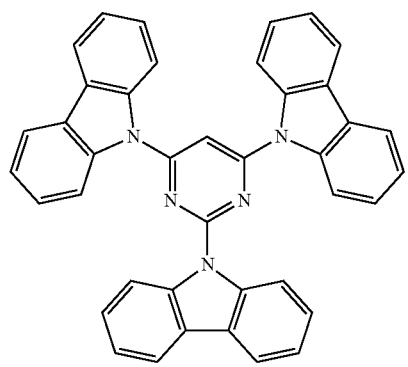
B-8
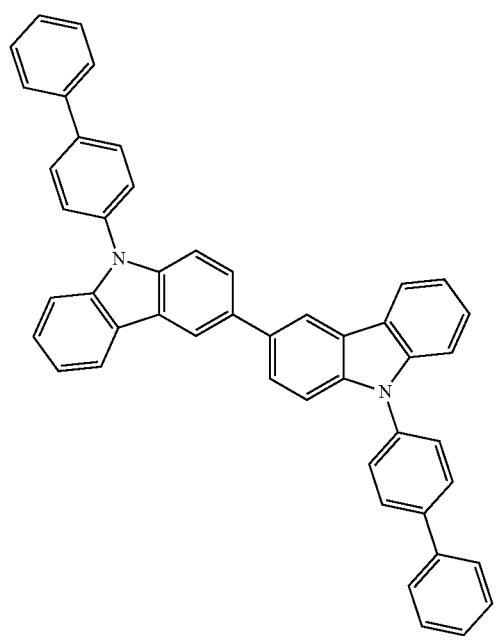
B-9
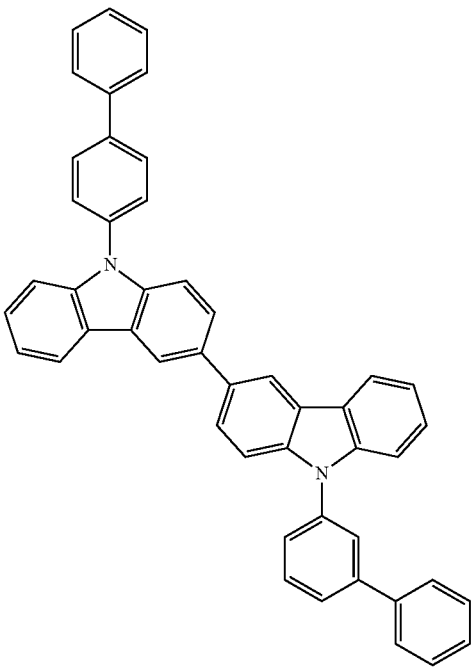
B-10
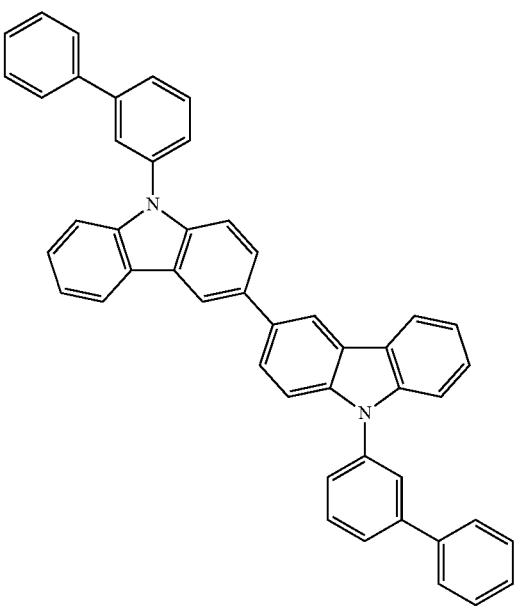

-continued
B-11
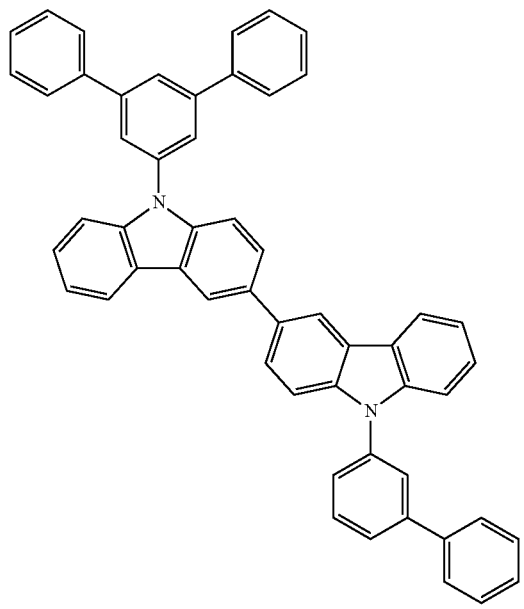
B-13
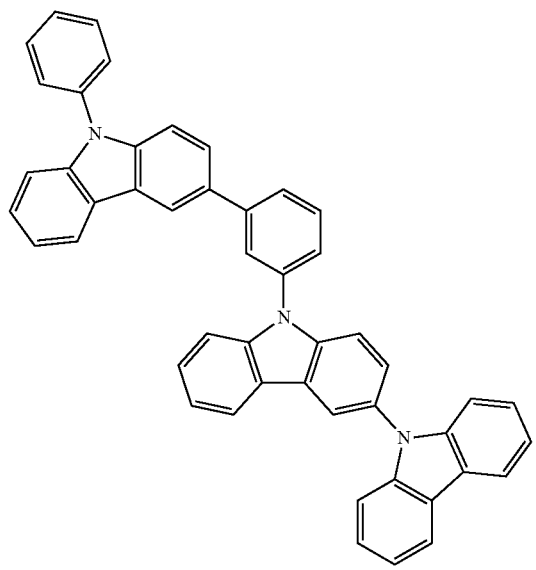
B-14
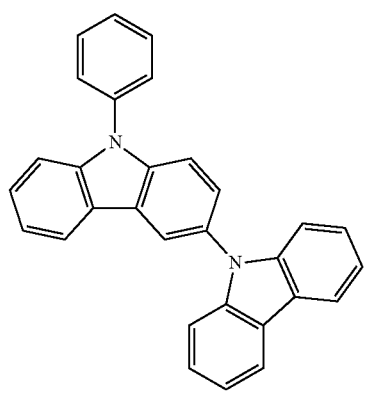
B-12
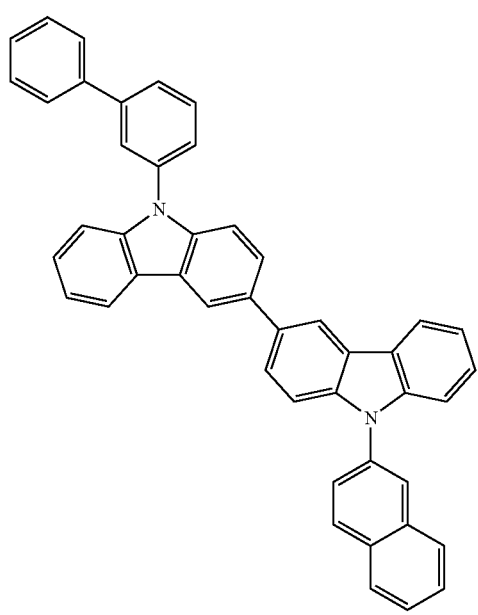
B-15
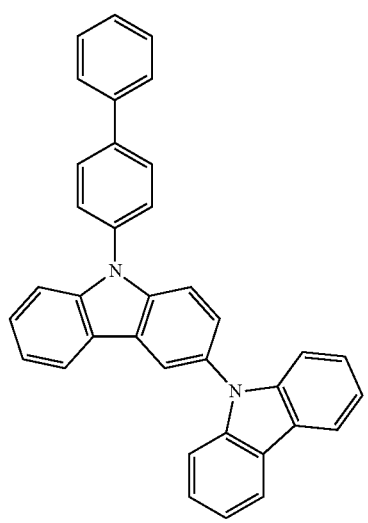

B-16
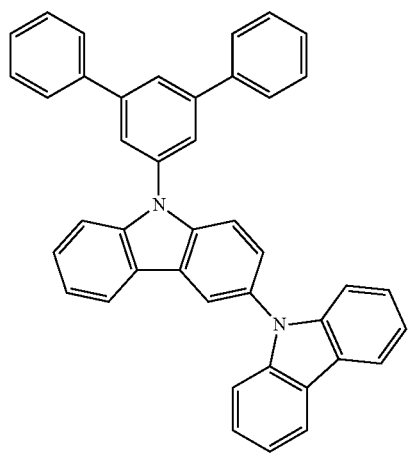
B-17
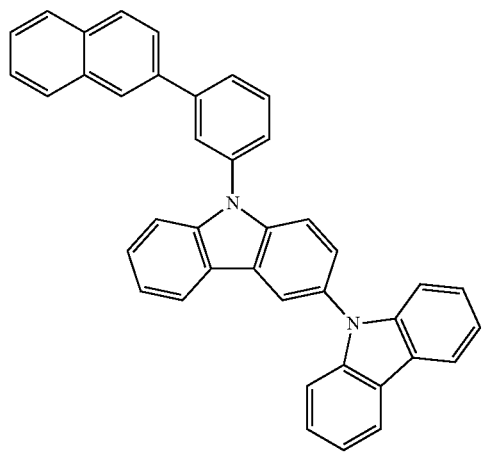
B-18
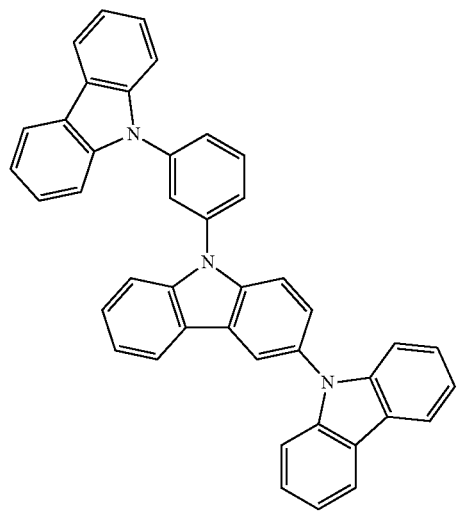
B-19
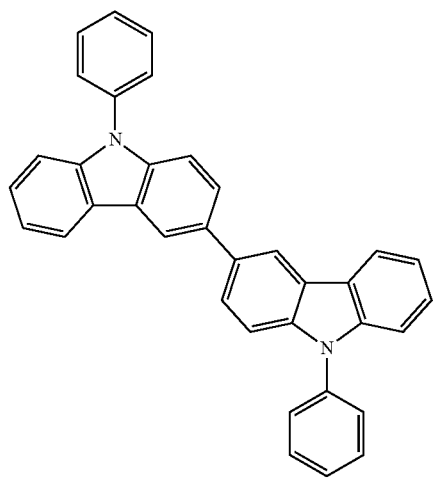
B-20
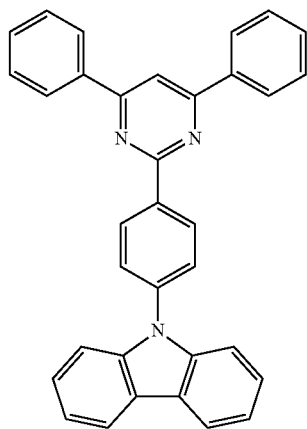
B-21
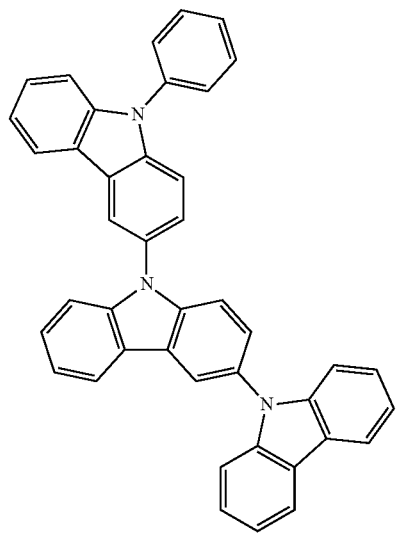

-continued
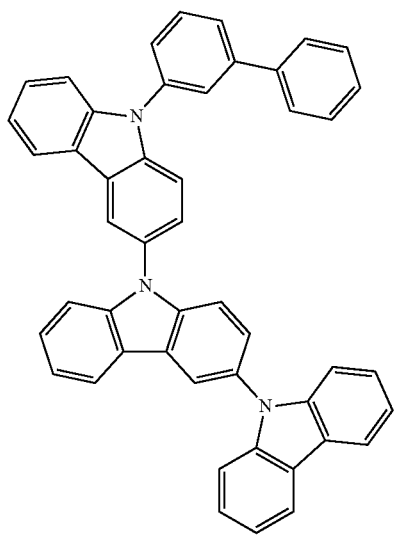
B-22
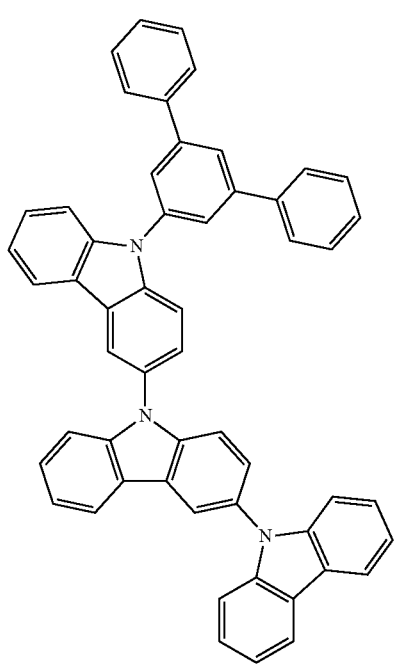
B-23
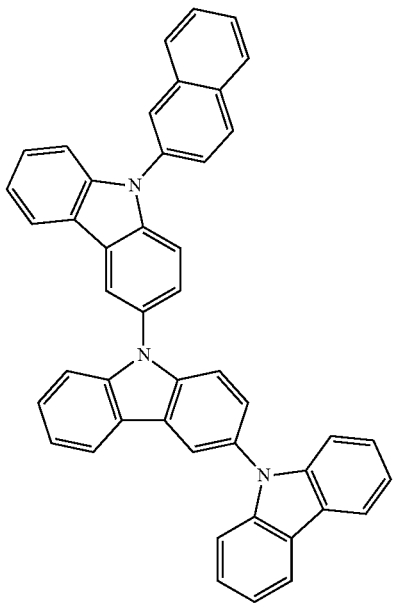
B-24
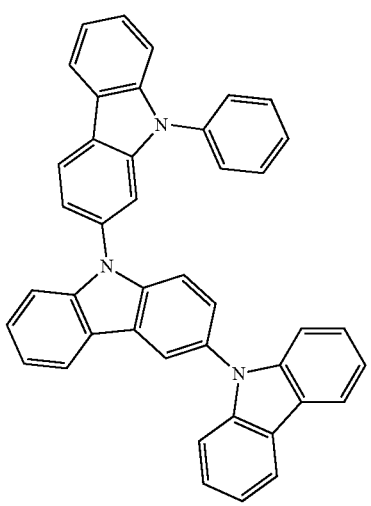
B-25
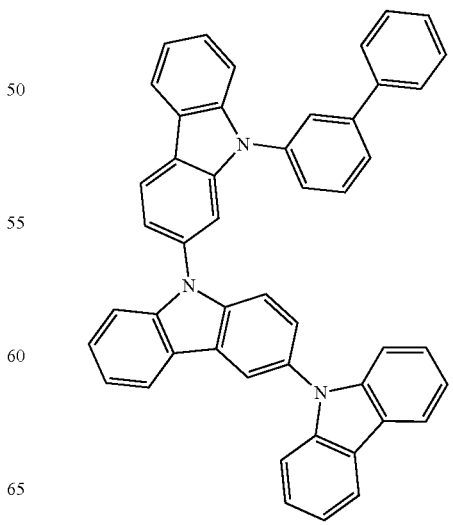
B-26

B-27
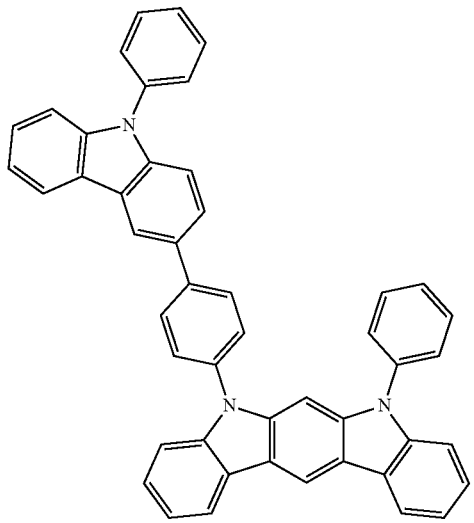
B-28
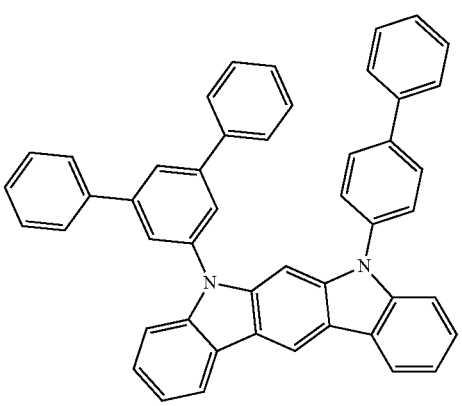
B-29
B-30
B-31
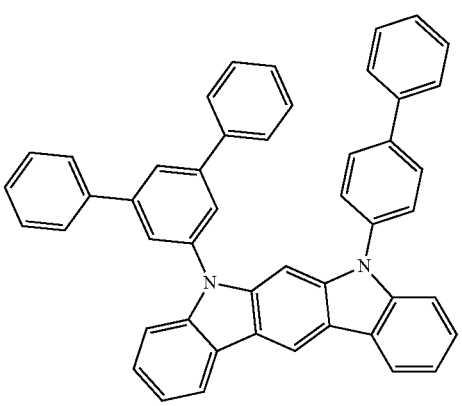
B-32
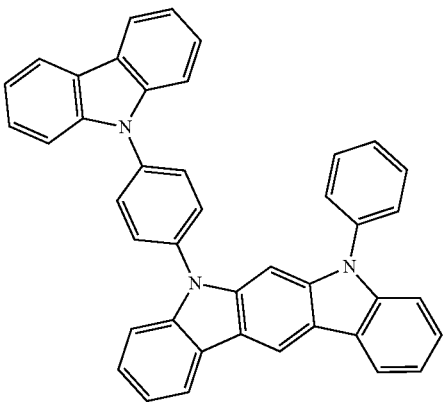
B-33
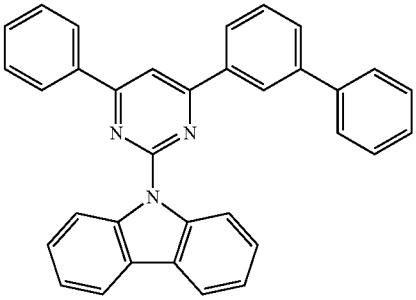
B-34
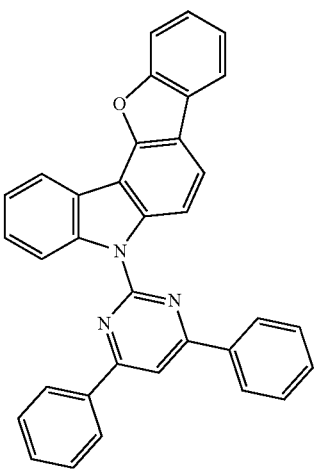

B-35
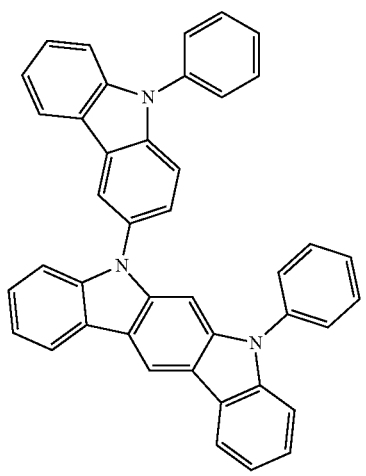
B-36
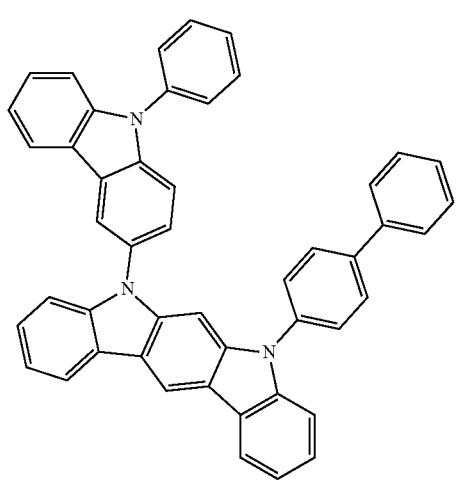
B-37
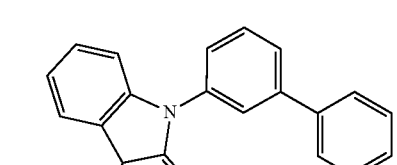
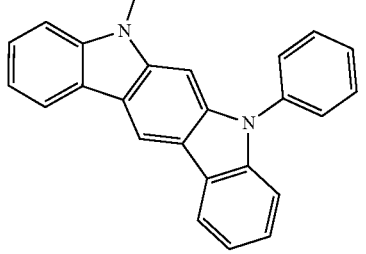
B-38
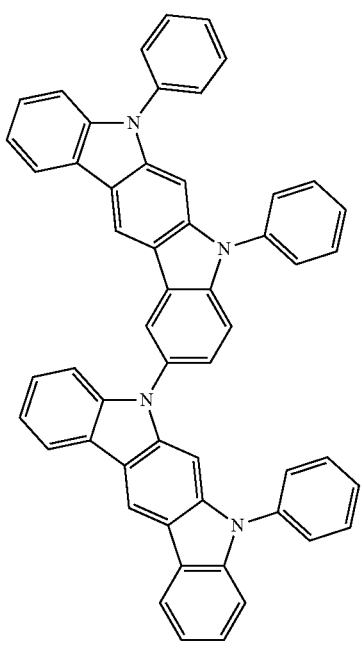
B-39
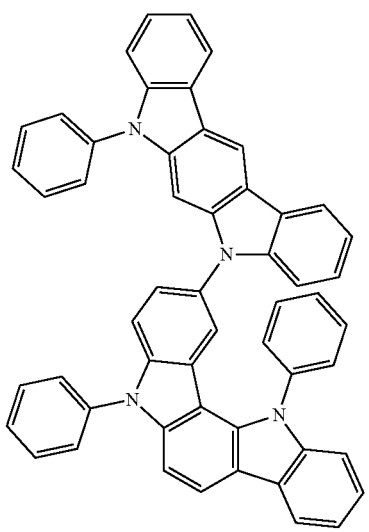
B-40
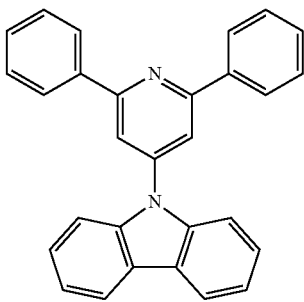

B-41
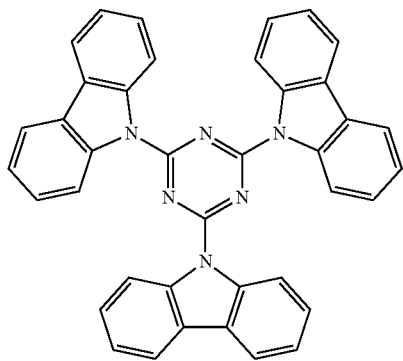
B-42
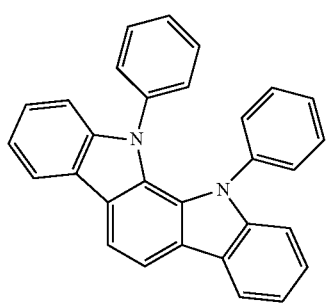
B-43
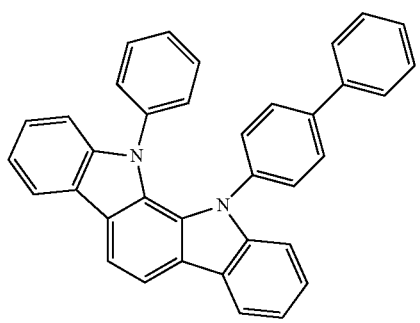
B-44
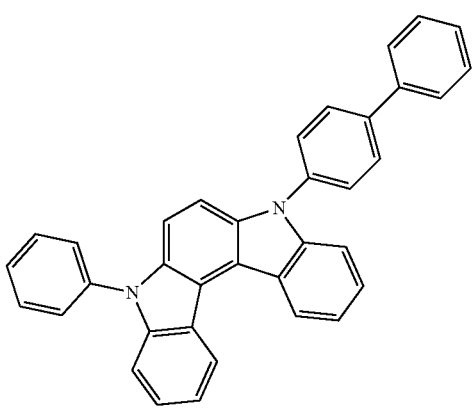
B-45
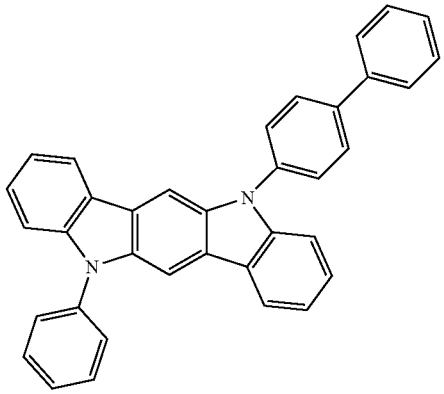
B-46
B-47
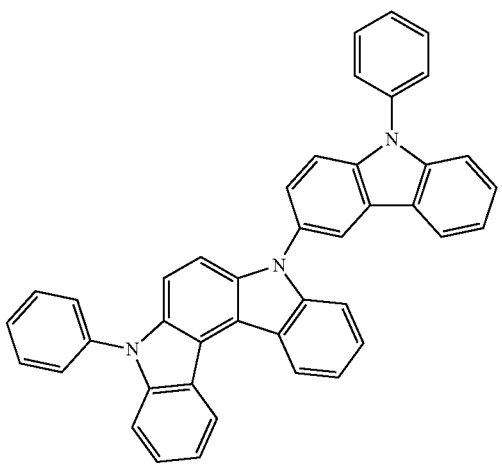

B-48
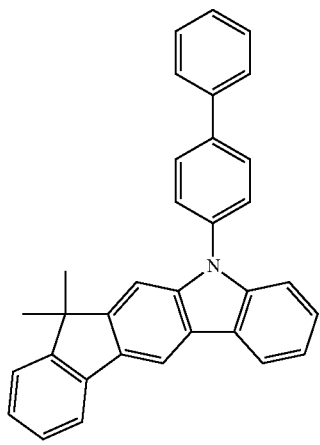
B-49
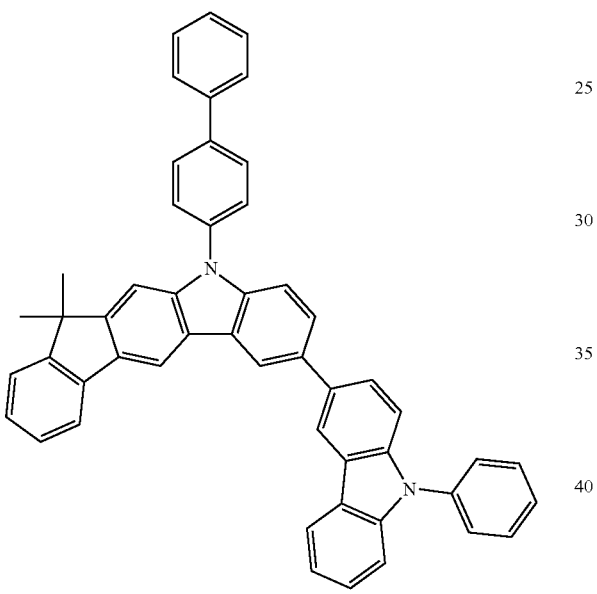
B-50
B-51
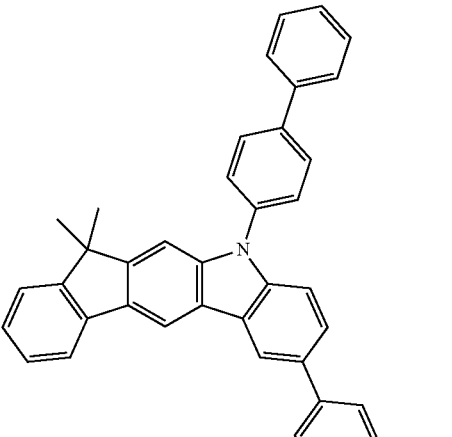
B-52
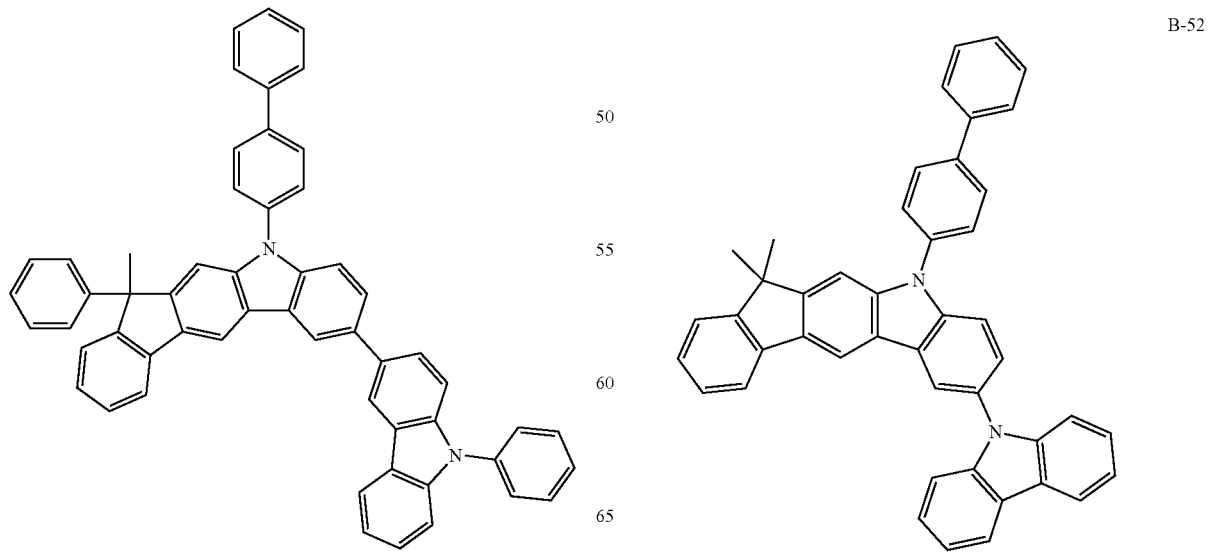

B-53
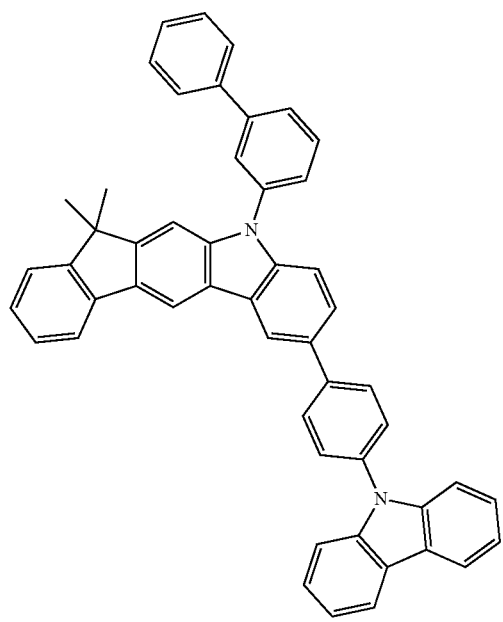
B-54
B-55
B-56
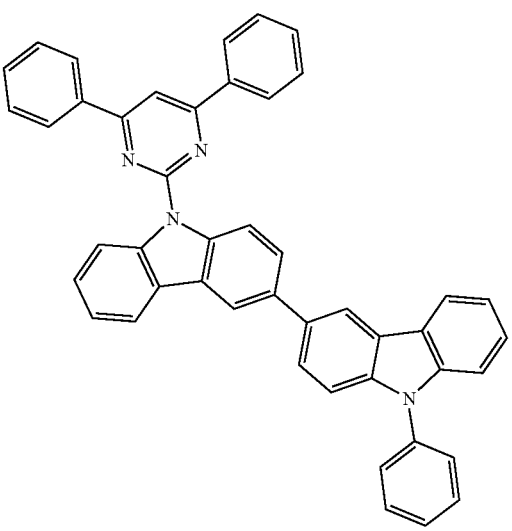
B-57
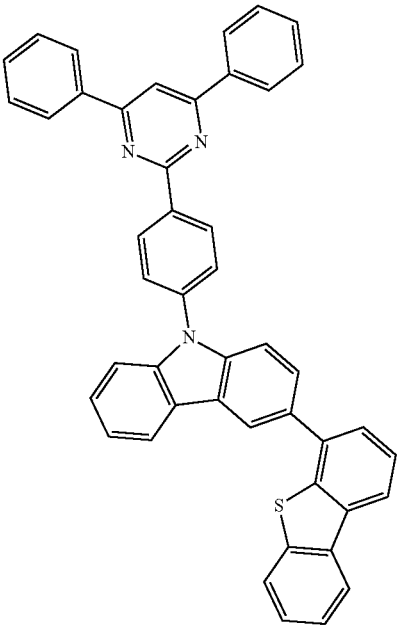

B-58
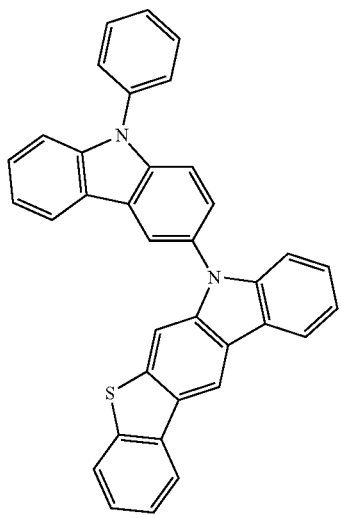
B-59
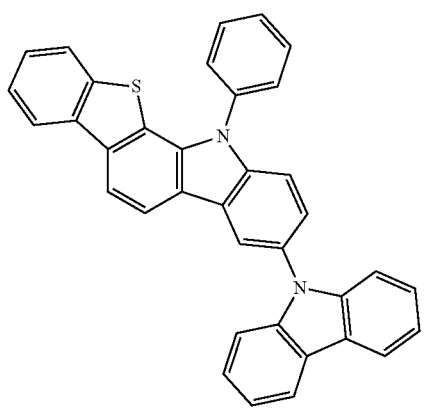
B-60
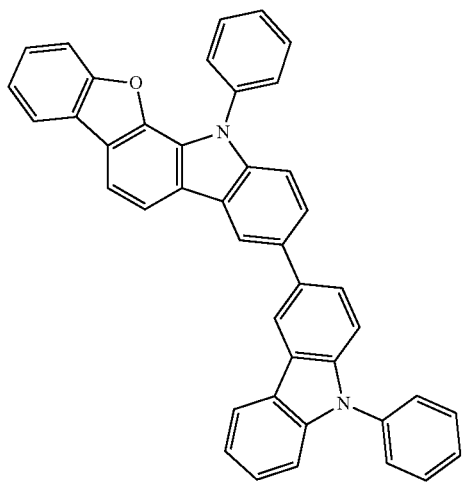
B-61
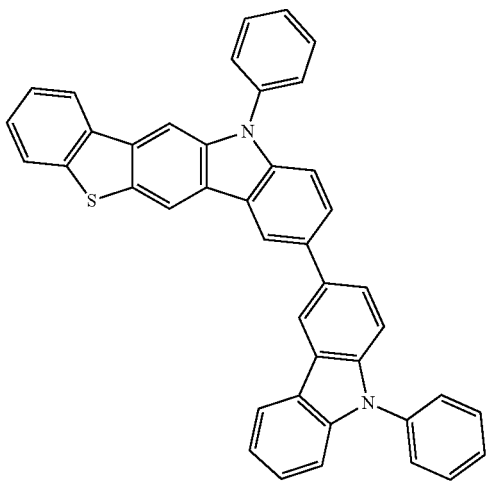
B-62
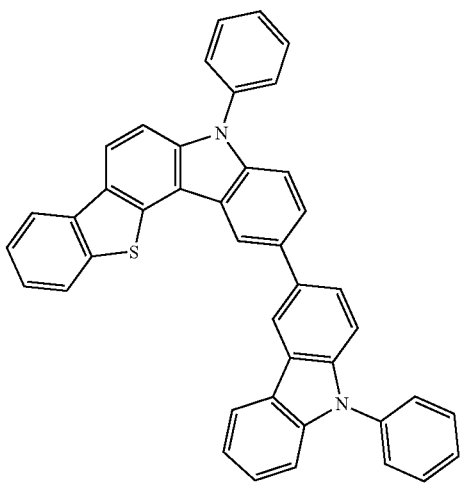
B-63
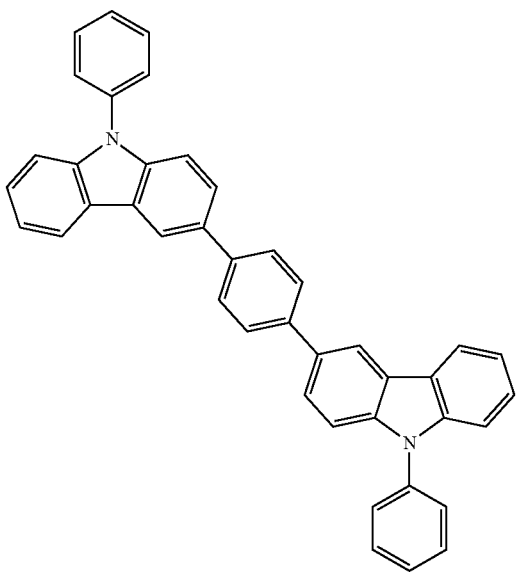

B-64
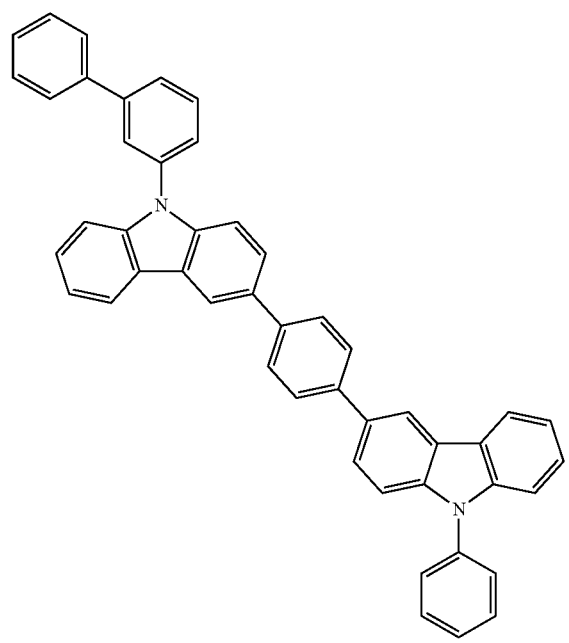
B-65
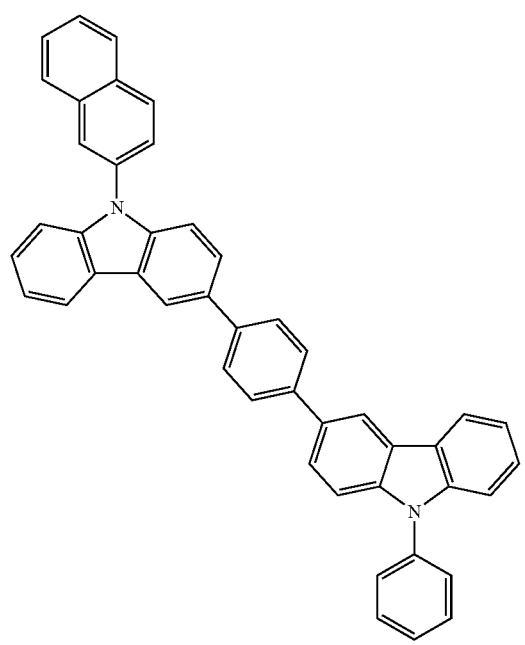
B-66
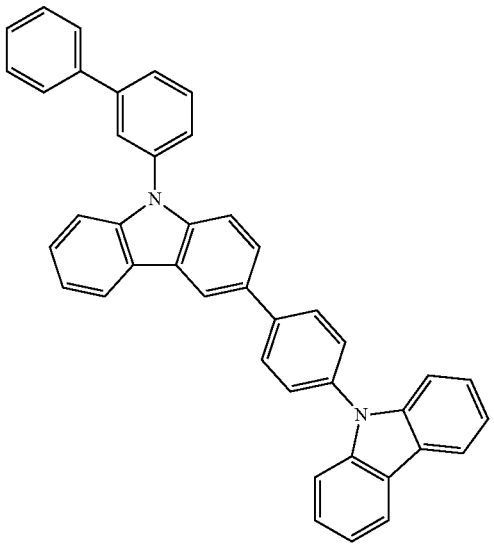
B-67
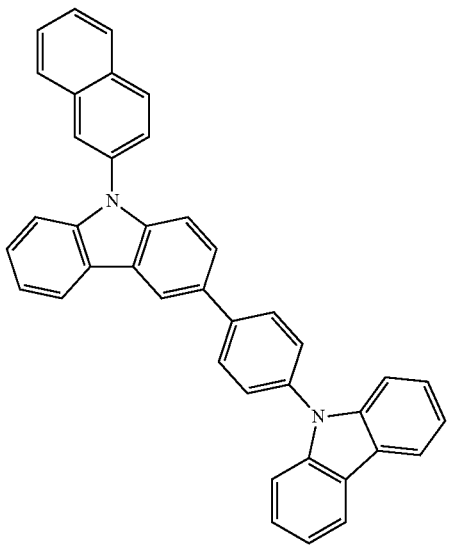

B-68
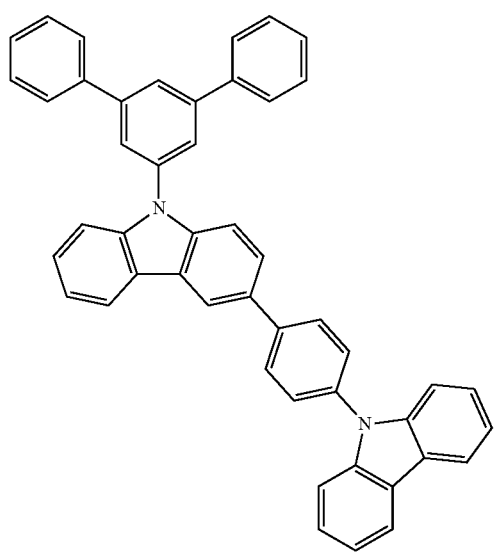
B-69
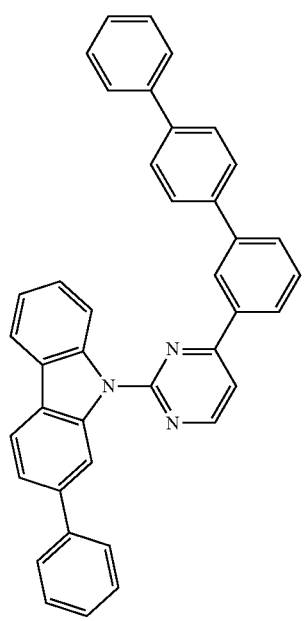
B-70
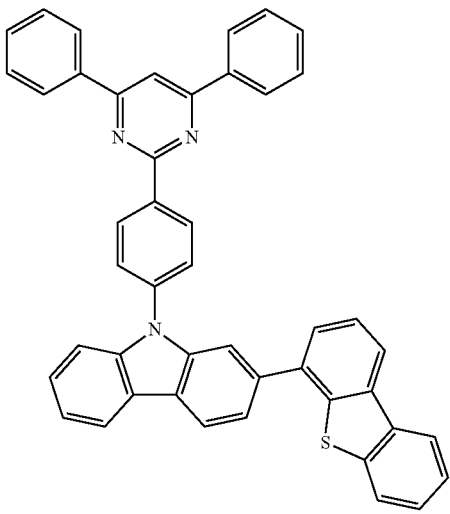
B-71
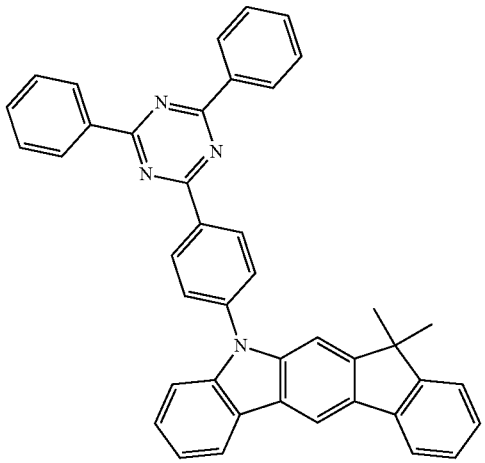
B-72

B-73
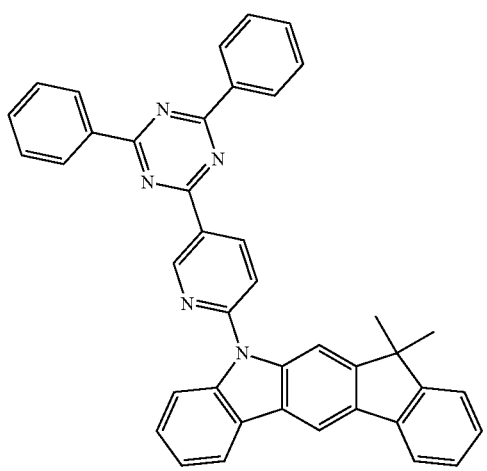
B-74
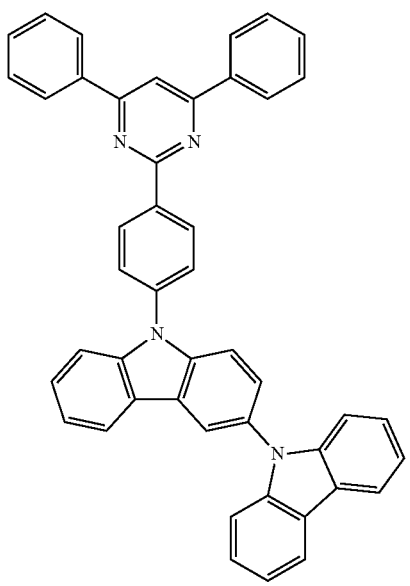
B-75
B-76
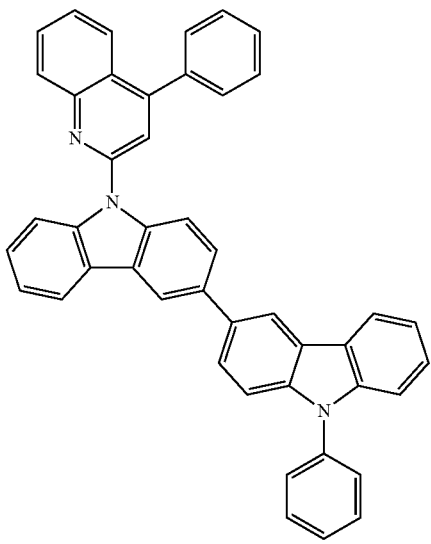
B-77
B-78
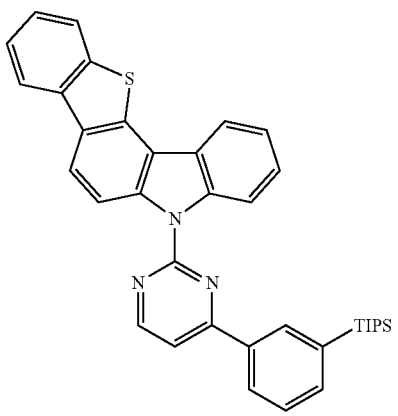

B-79
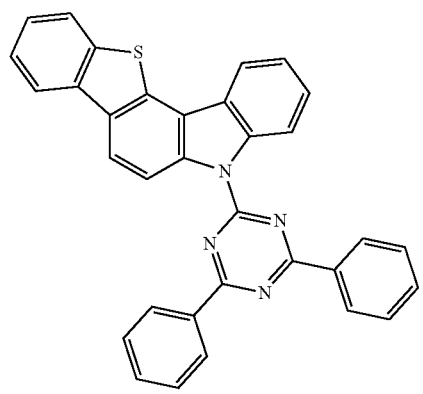
B-80
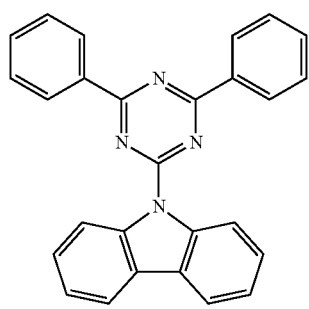
B-81
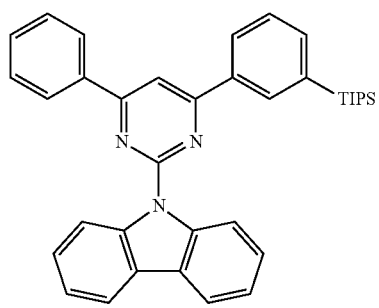
B-82
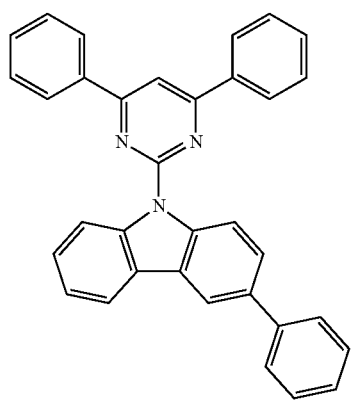
B-83
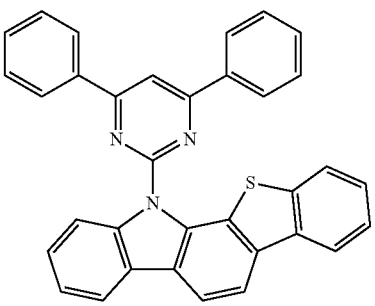
B-84
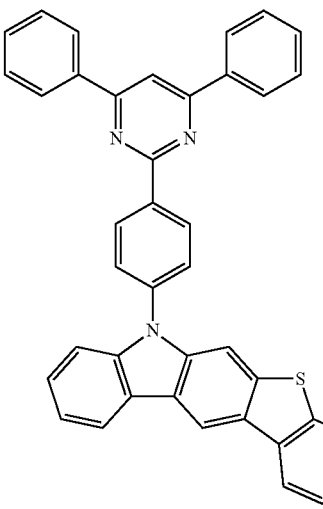
B-85

B-86
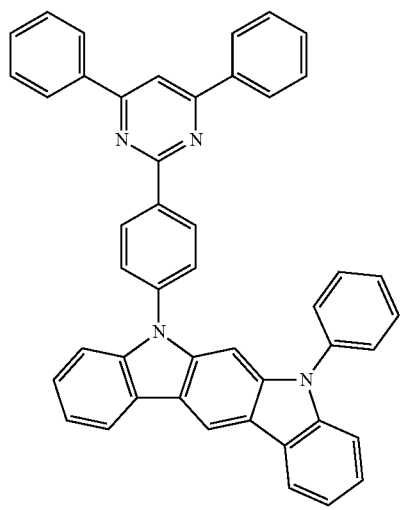
B-87
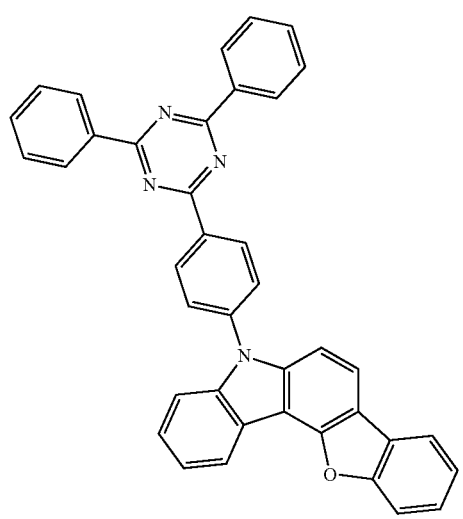
B-88
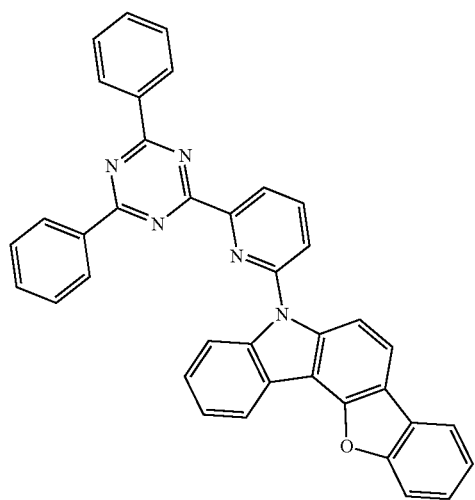
B-89
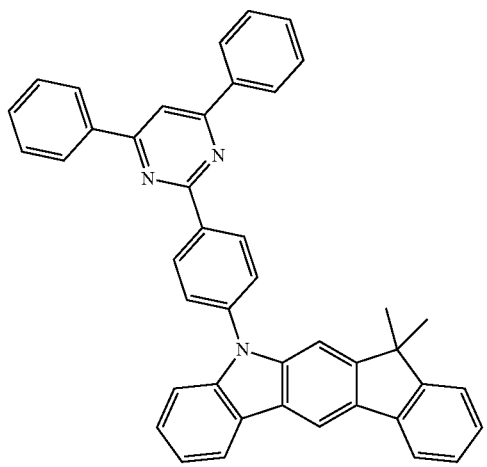
B-90
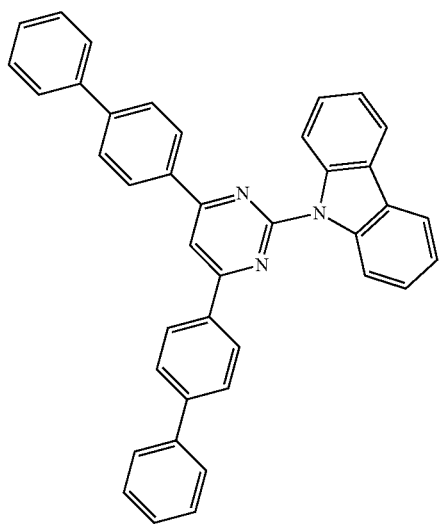
B-91
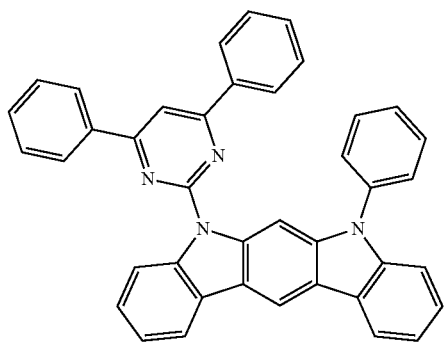

B-92
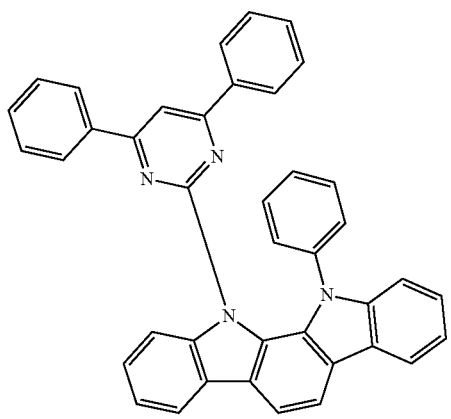
B-95
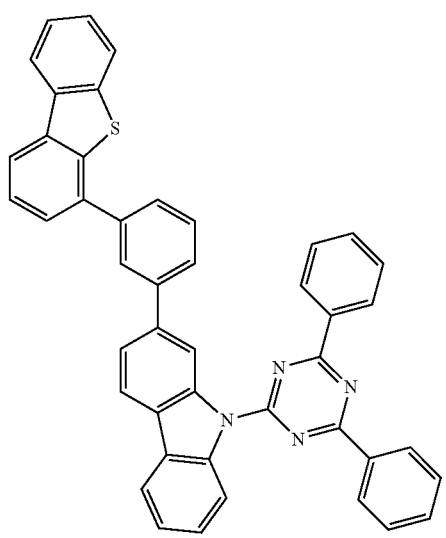
B-93
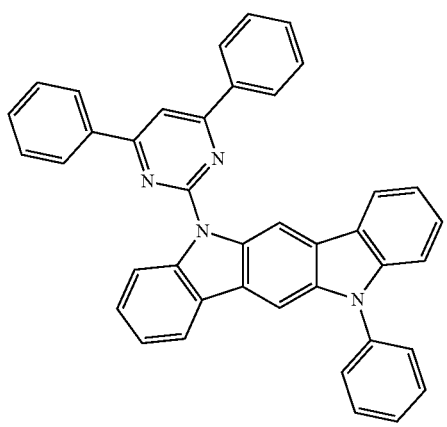
B-96
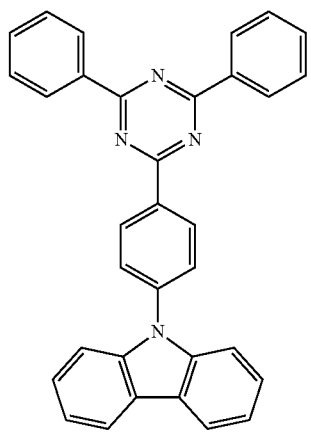
B-94
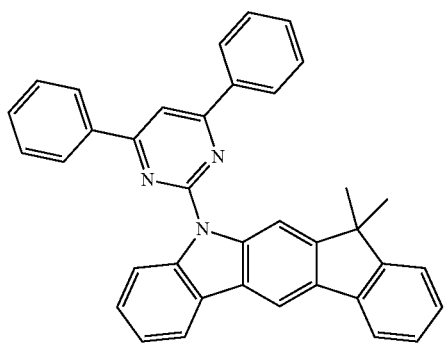
B-97
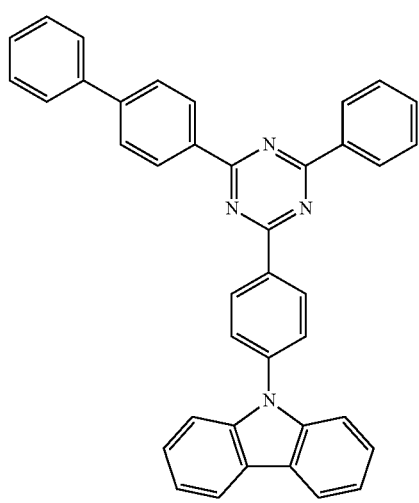

B-98
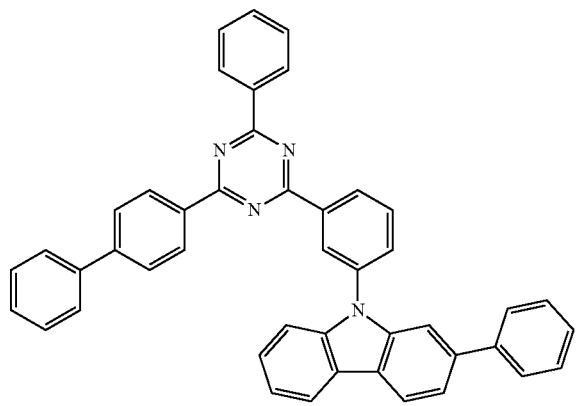
B-99
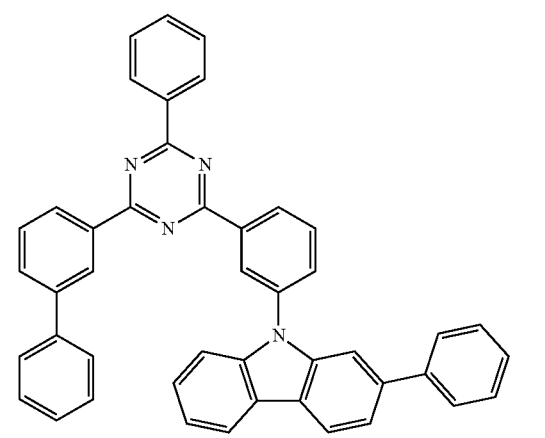
B-100
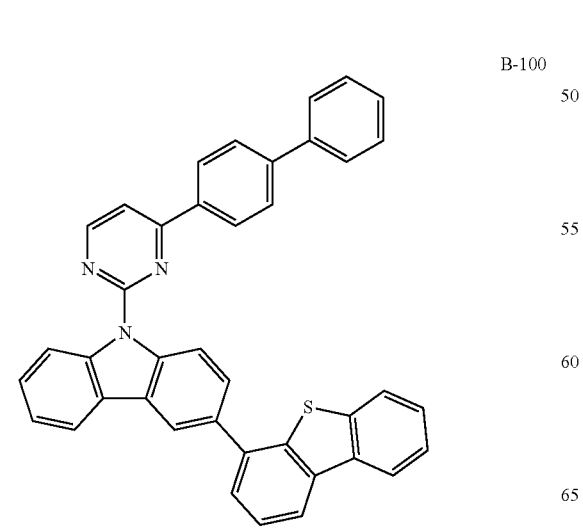
B-101
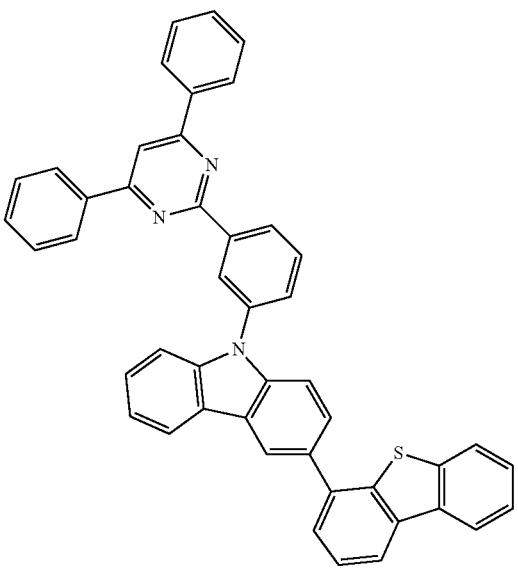
B-102
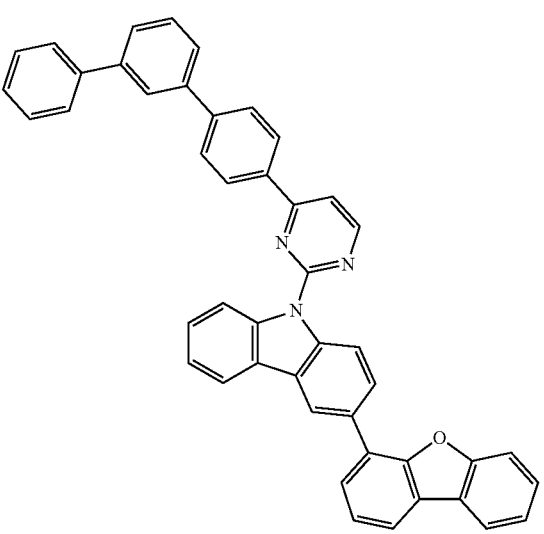

B-103
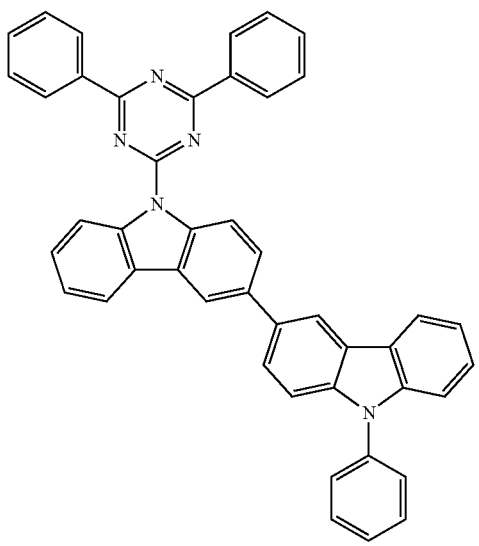
B-104
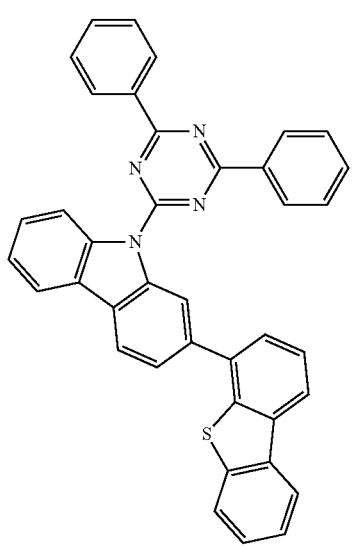
B-105
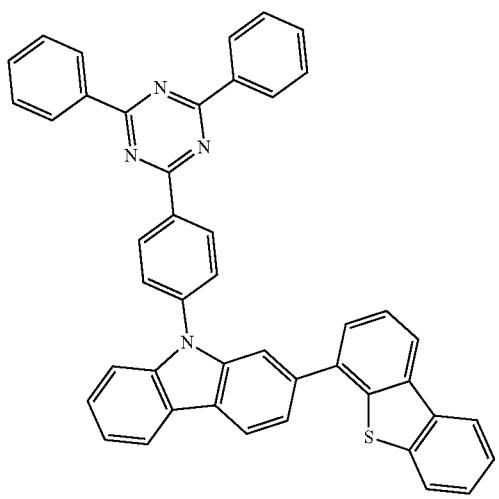
B-106
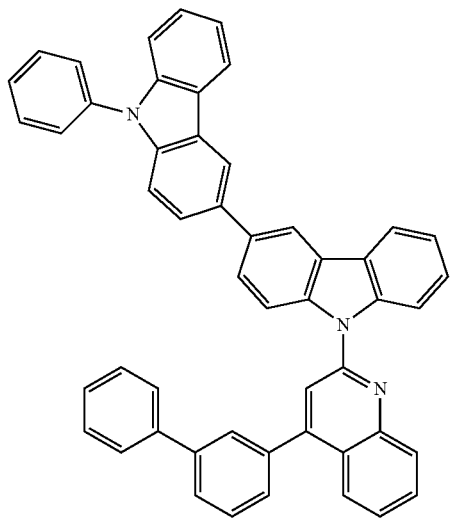
B-107
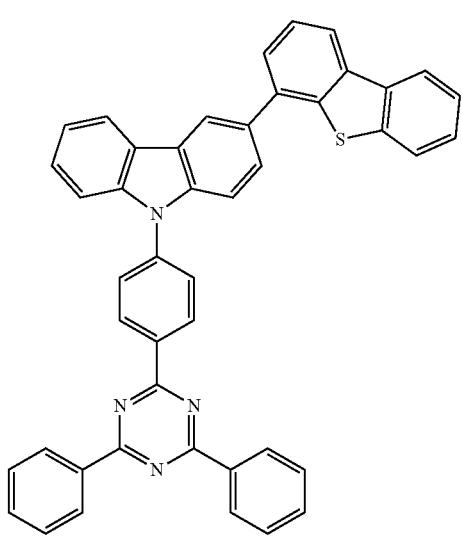
B-108
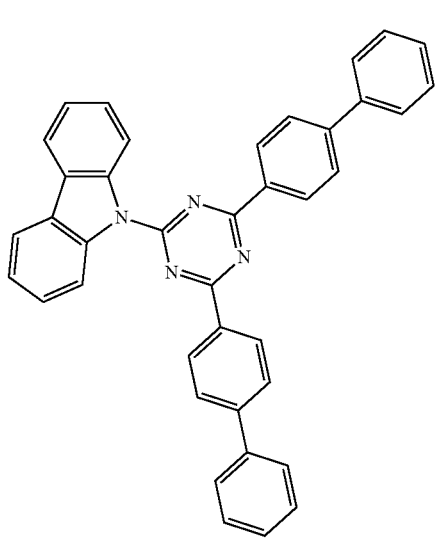

B-109
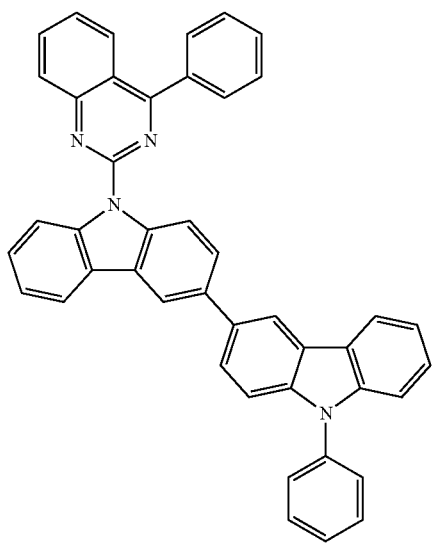
B-110
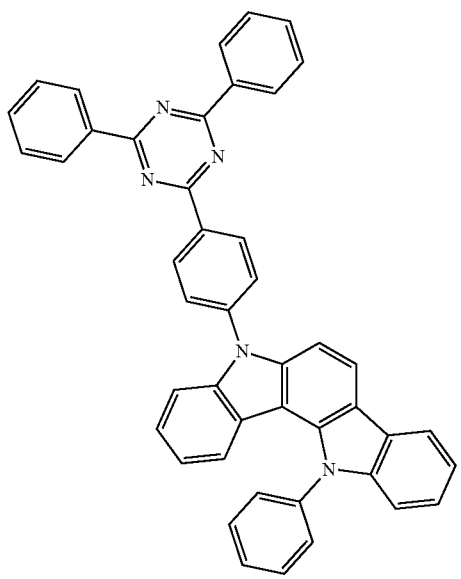
B-111
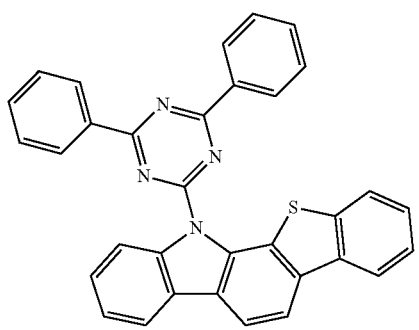
B-112
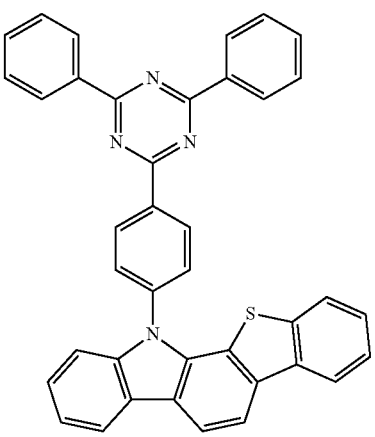
B-113
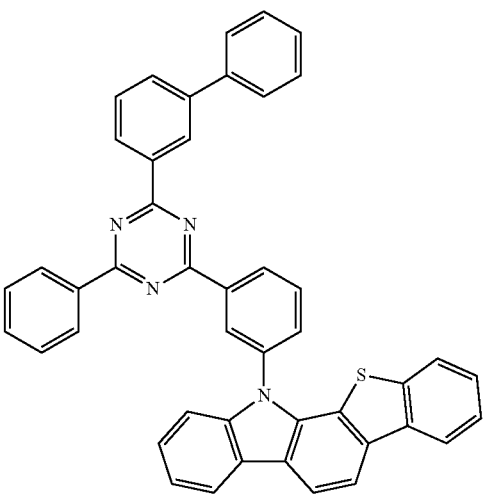
B-114
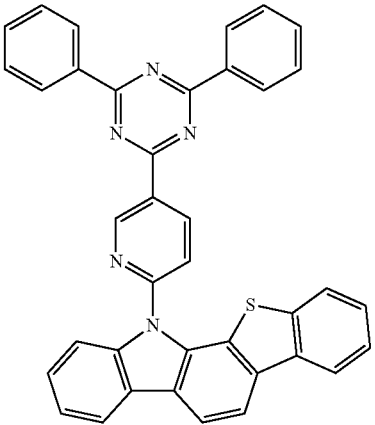

B-115
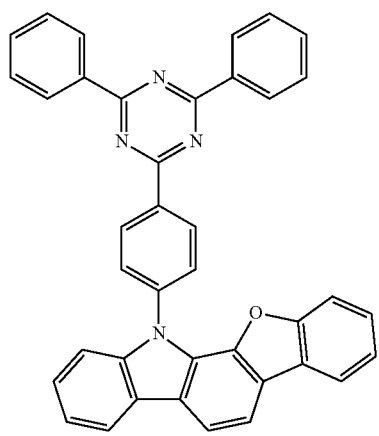
B-118
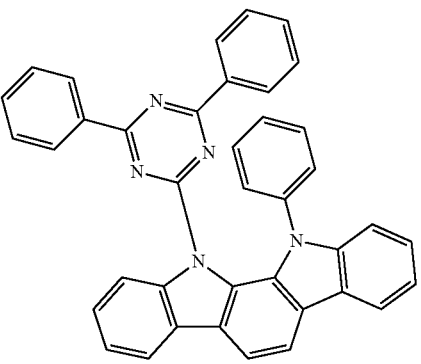
B-116
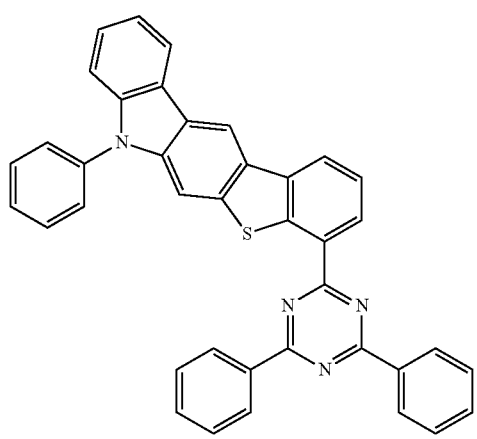
B-119
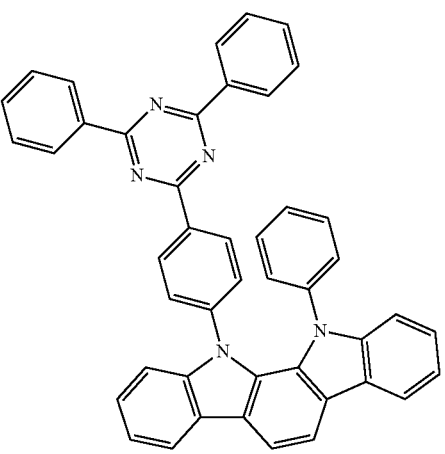
B-117
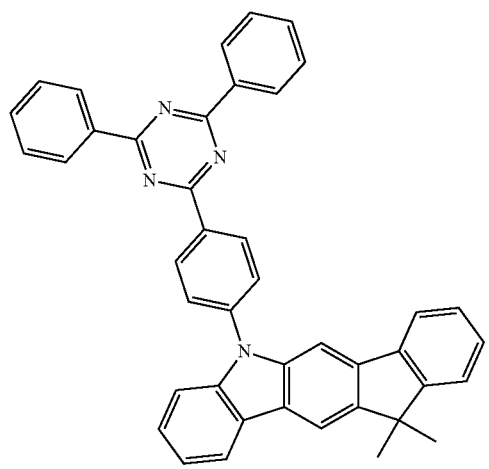
B-120
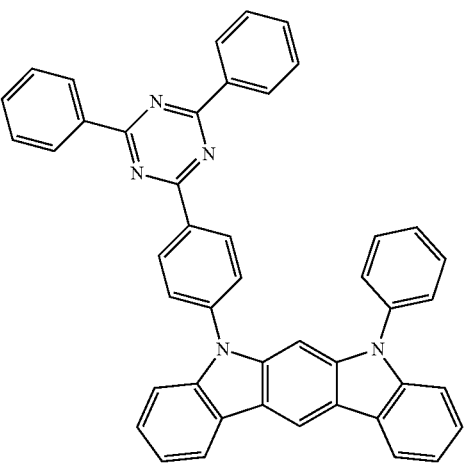

B-121
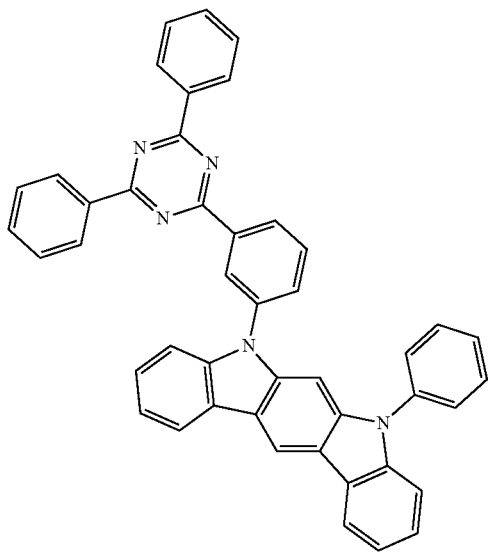
B-122
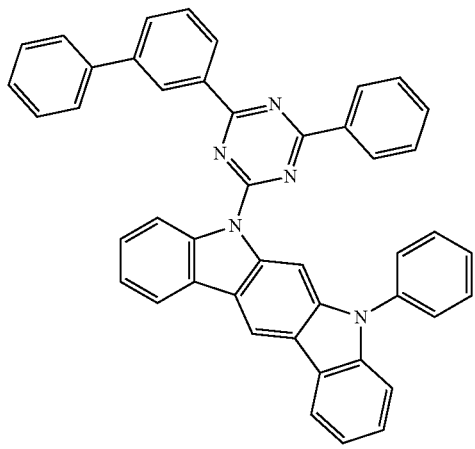
B-123
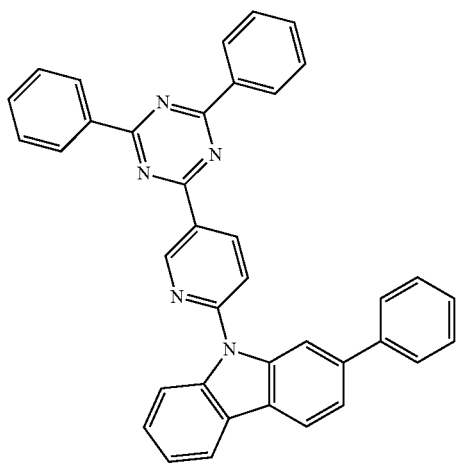
B-124
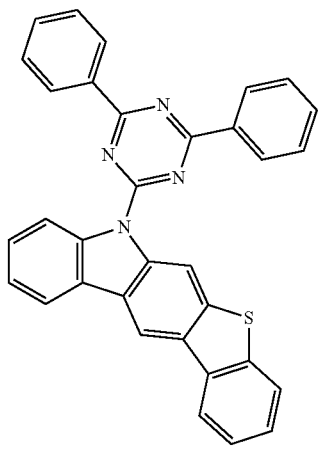
B-125
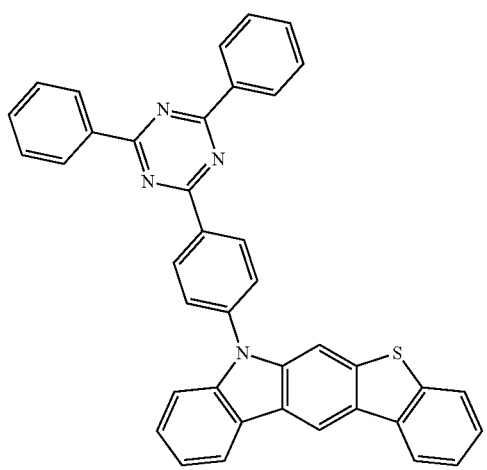
B-126
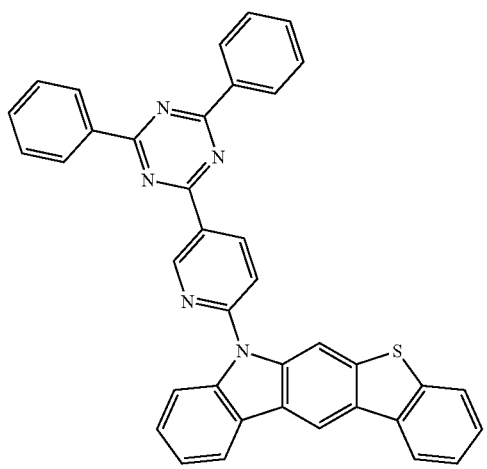

-continued
B-127
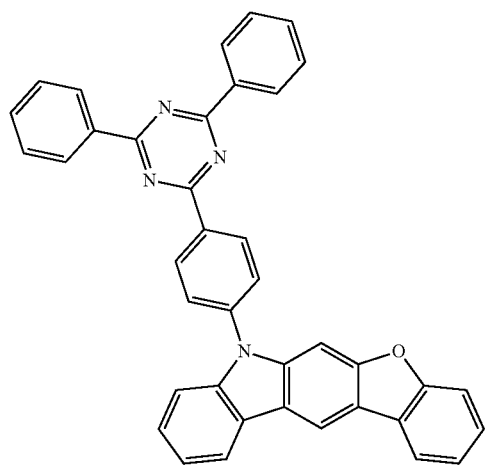
B-128
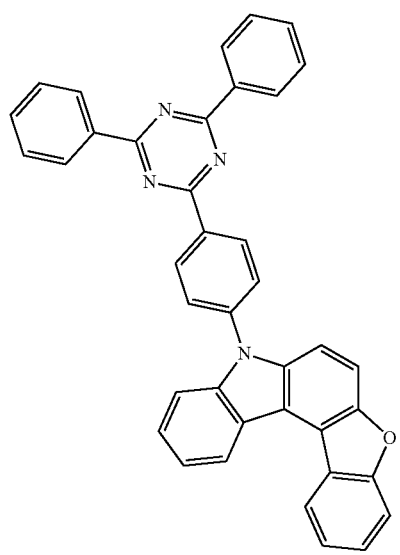
B-129
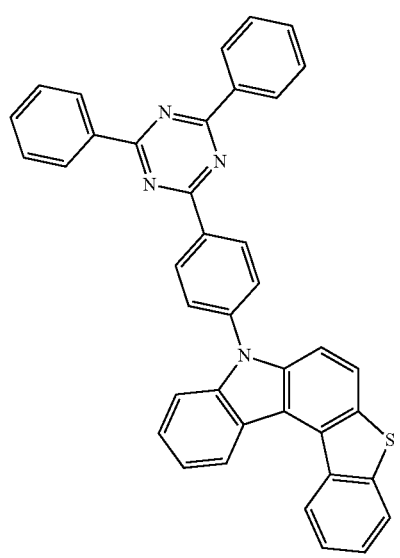
-continued
B-130
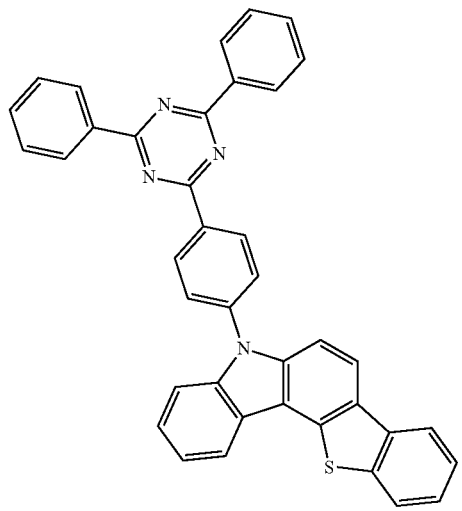
B-131
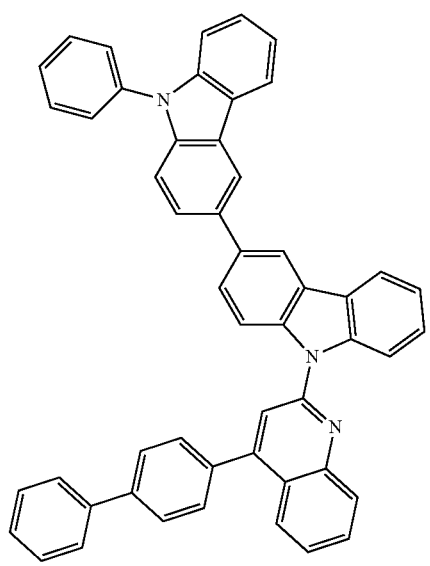
B-132
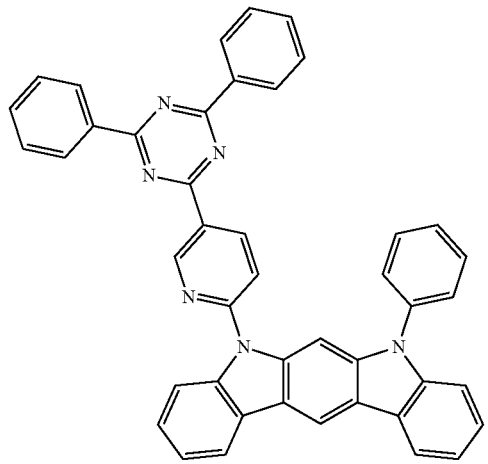

B-133
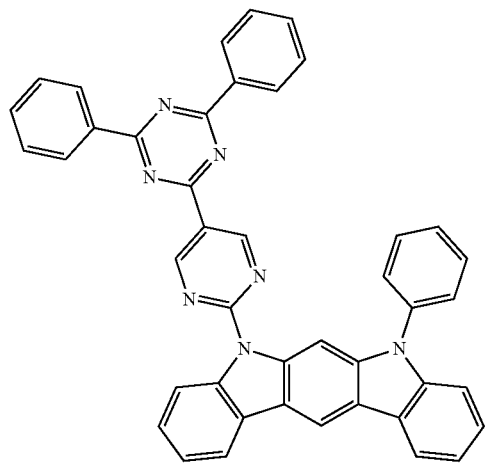
B-134
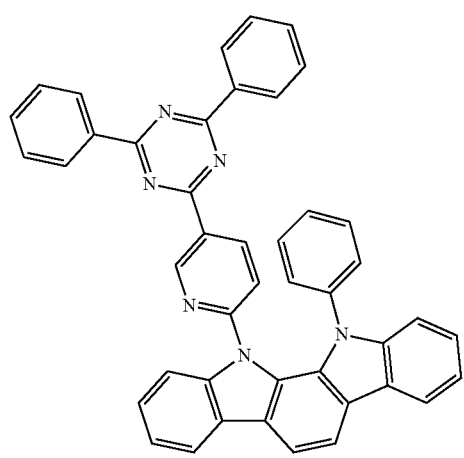
B-135
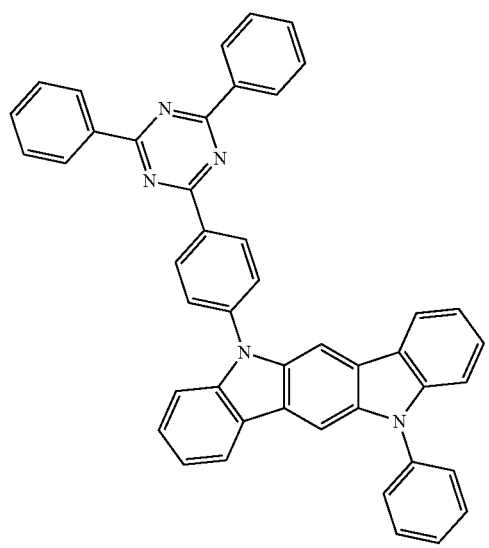
B-136
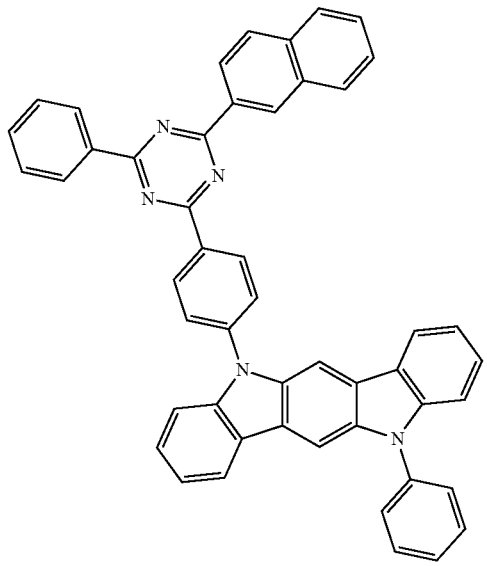
B-137
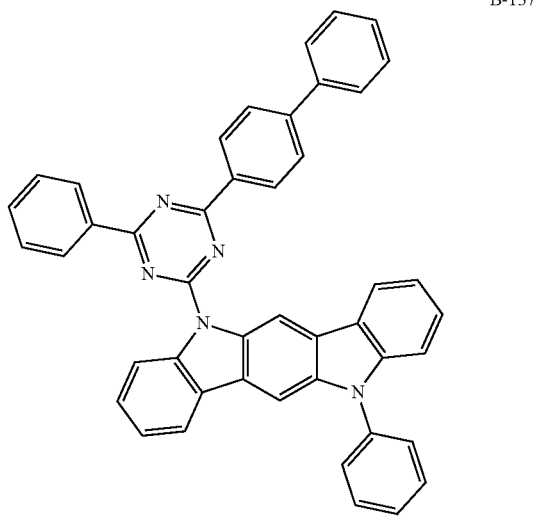
B-138
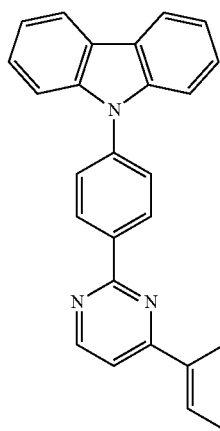

-continued
B-139
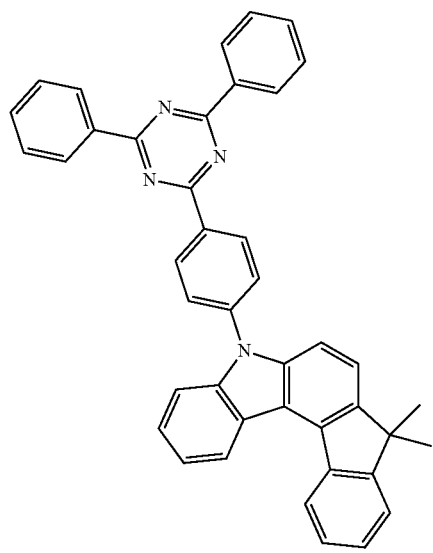
B-140
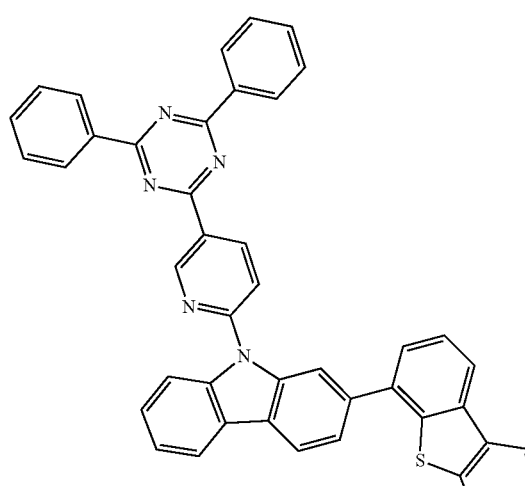
B-141
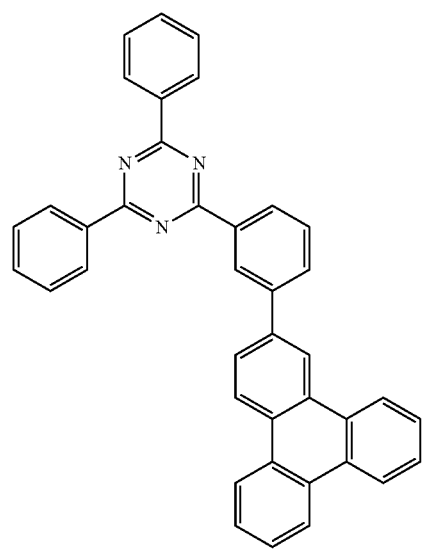
-continued
B-142
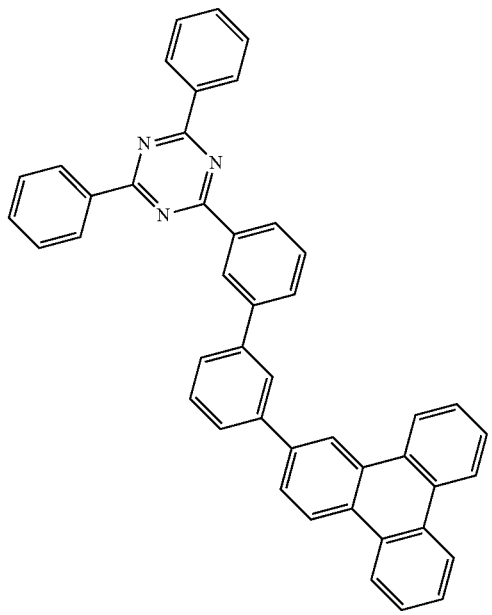
B-143
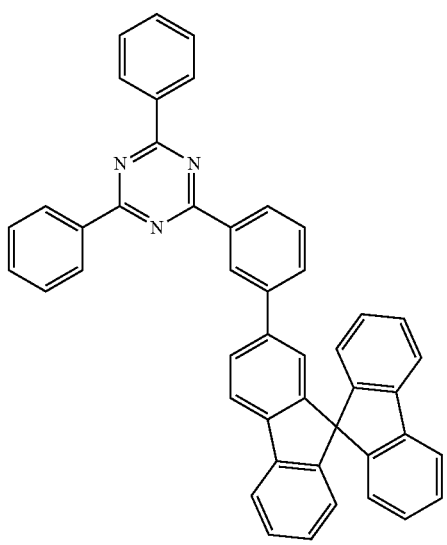
B-144
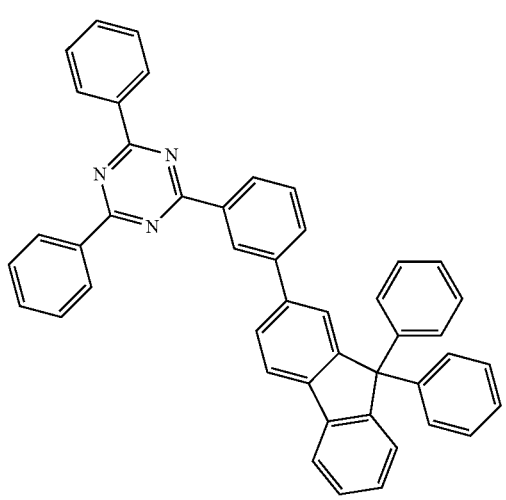

B-145
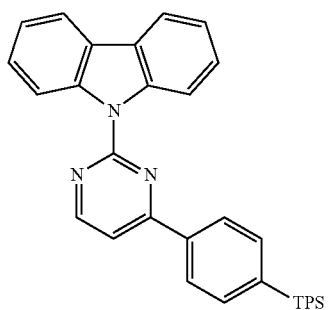
B-146
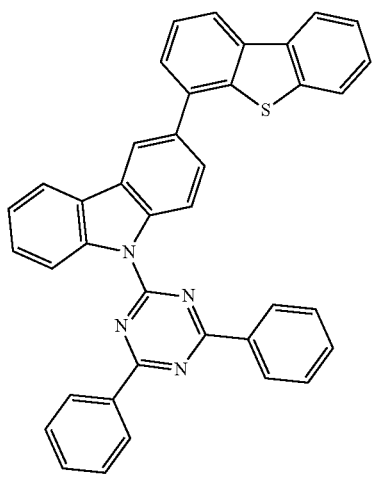
B-147
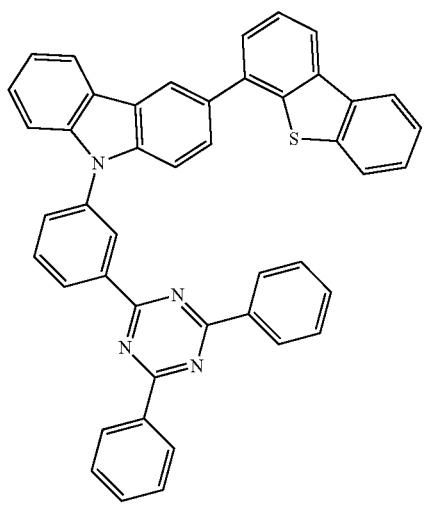
B-148
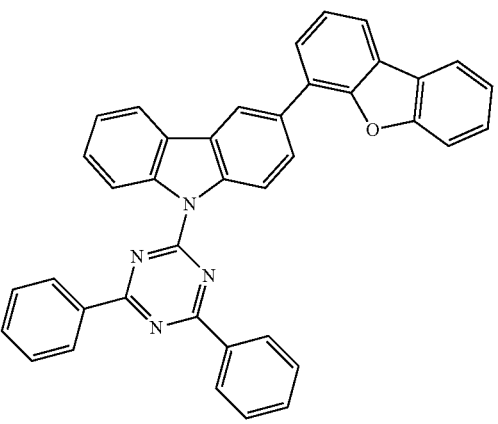
B-149
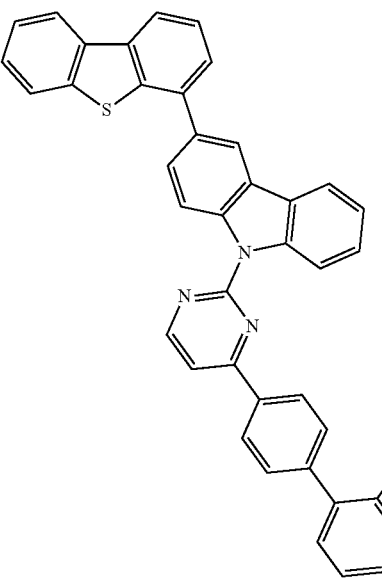
B-150
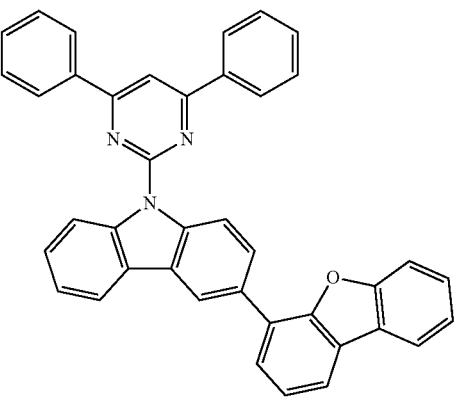

B-151
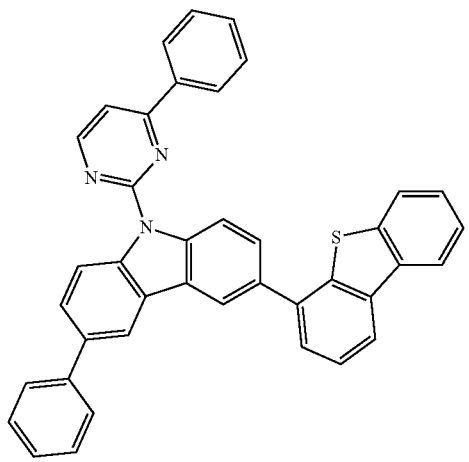
B-152
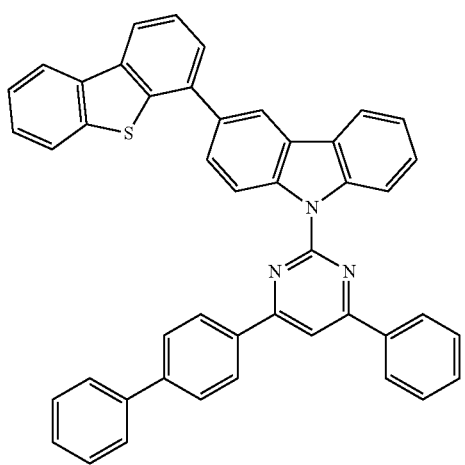
B-153
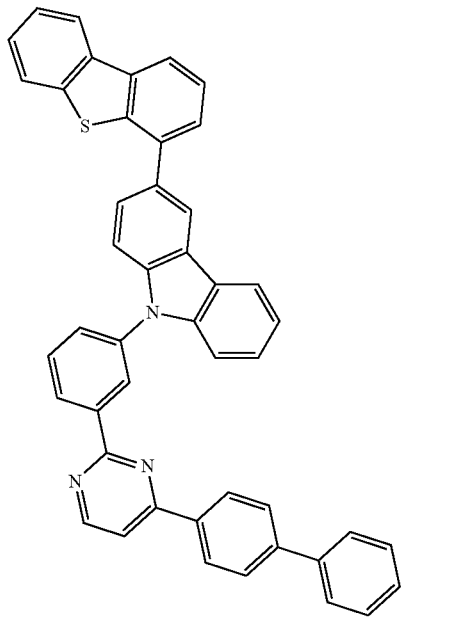
B-154
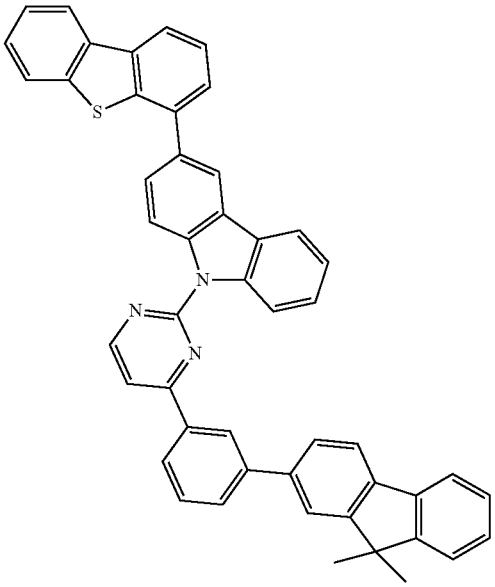
B-155
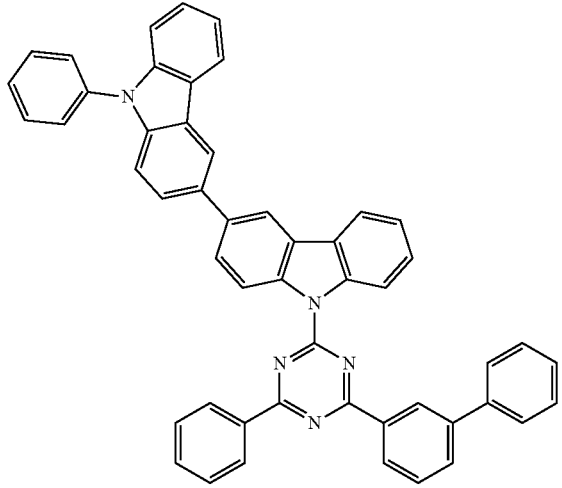

B-156
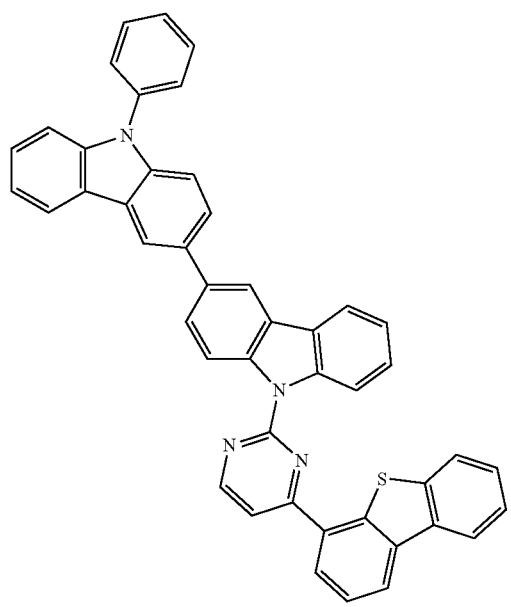
B-158
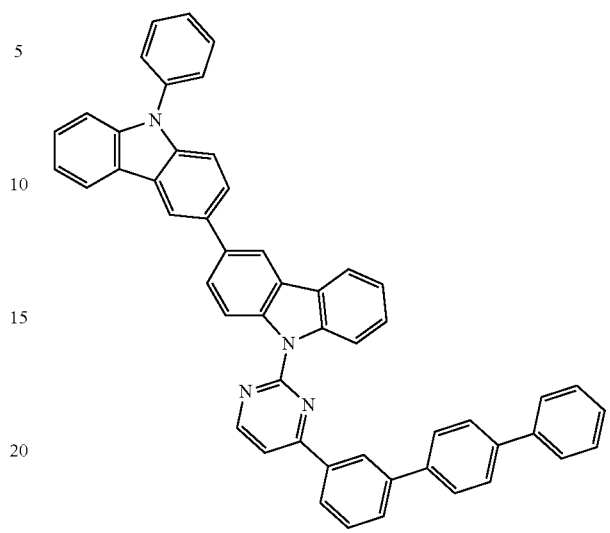
B-157
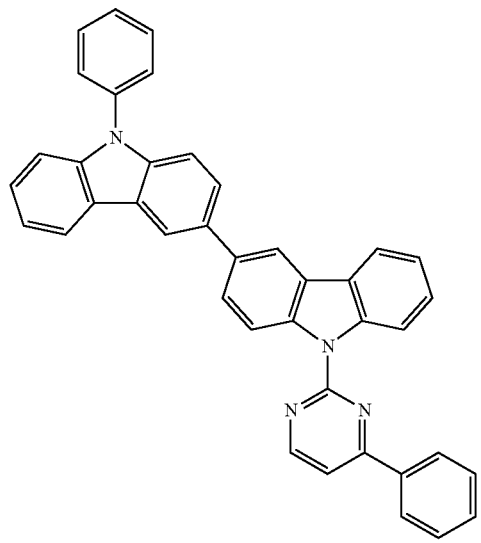
B-159
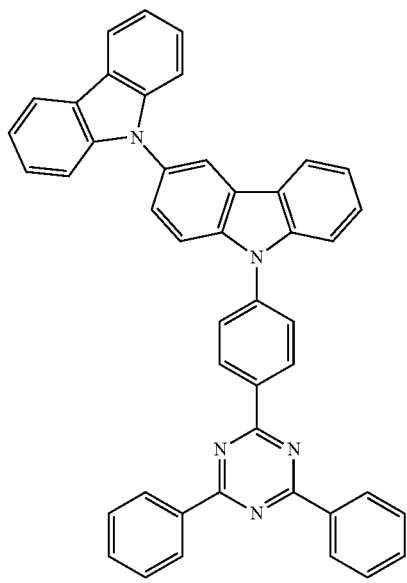

B-160
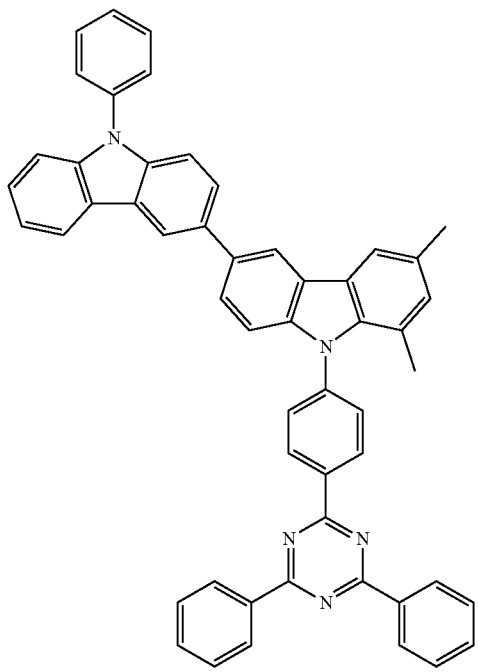
B-163
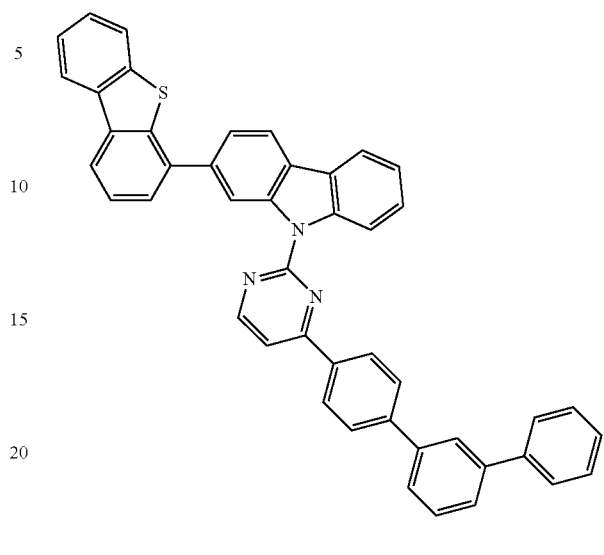
B-164
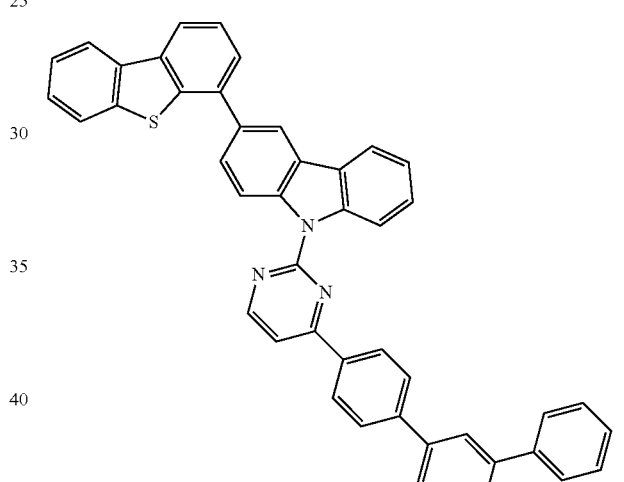
B-161
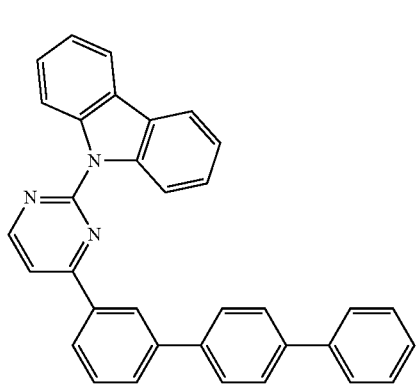
B-162
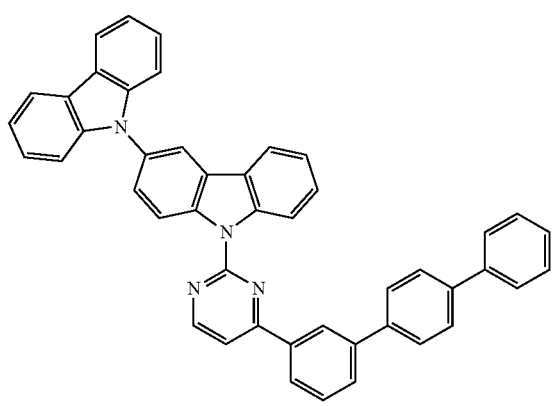
B-165
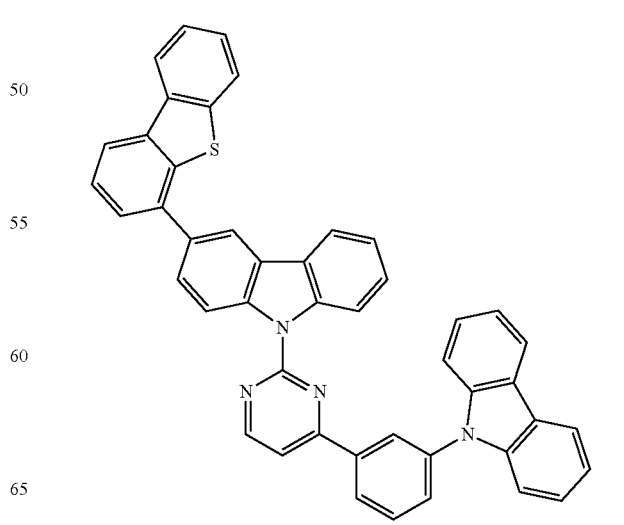

-continued
B-166
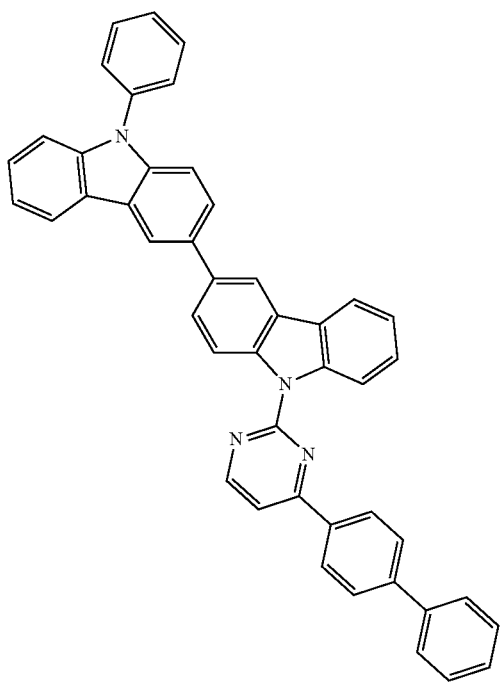
B-167
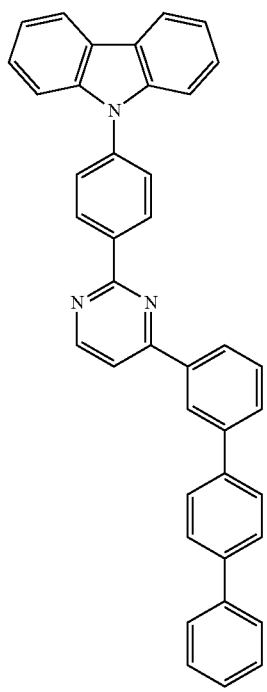
-continued
B-168
B-169
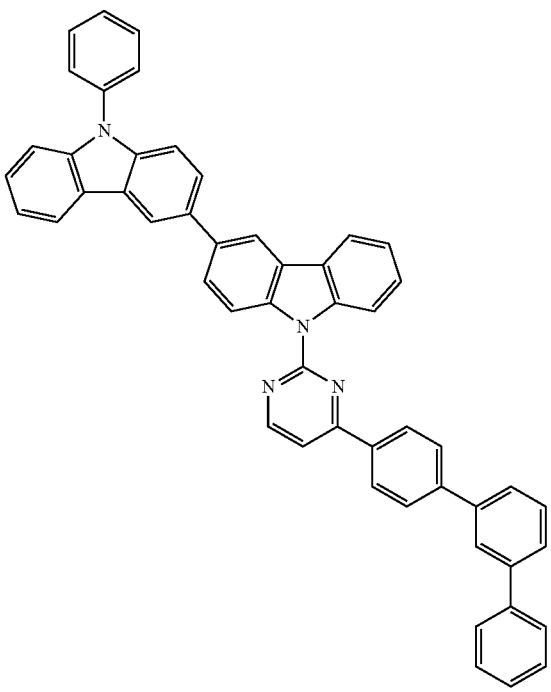

B-170
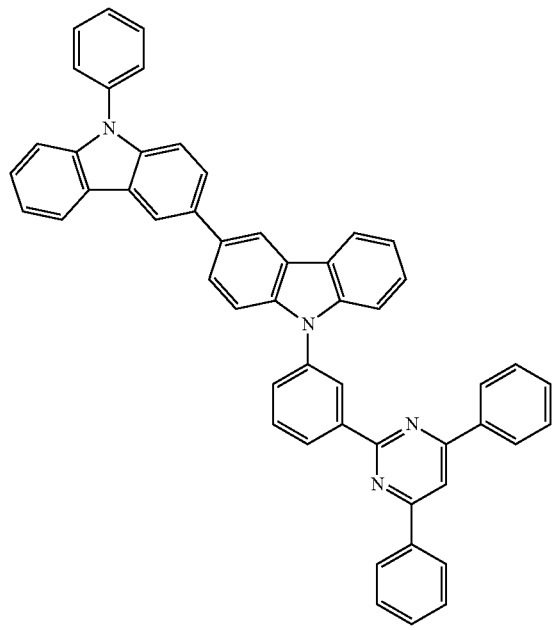
B-172
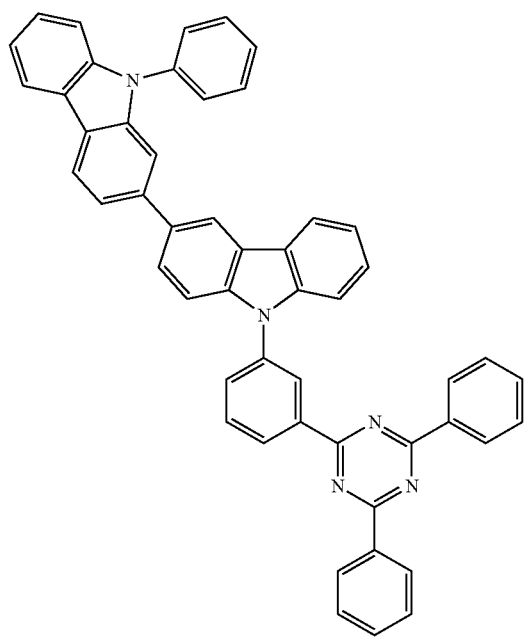
B-171
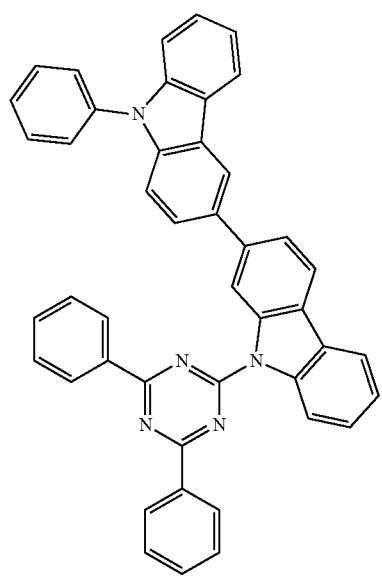
B-173
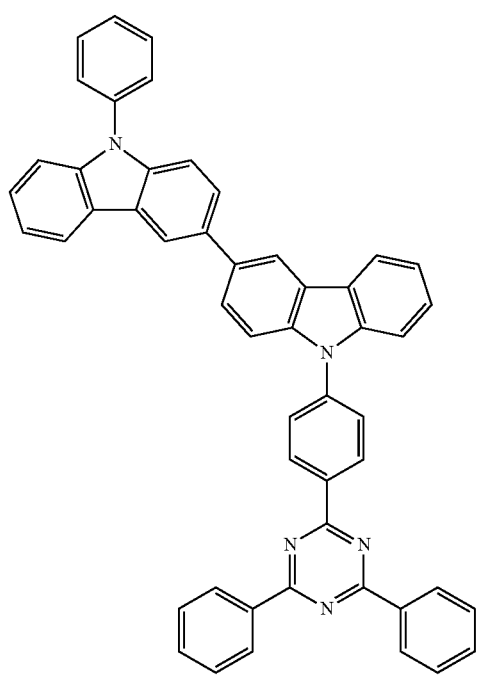

-continued
B-174
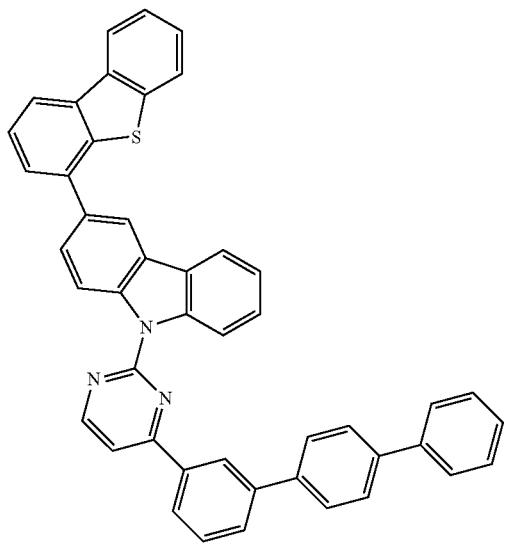
B-175
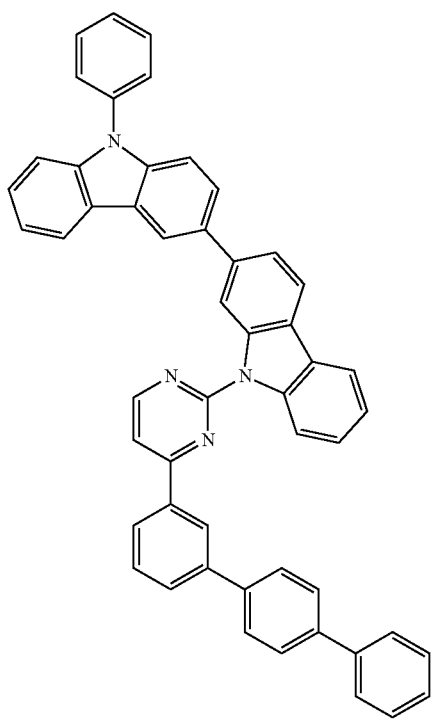
B-176
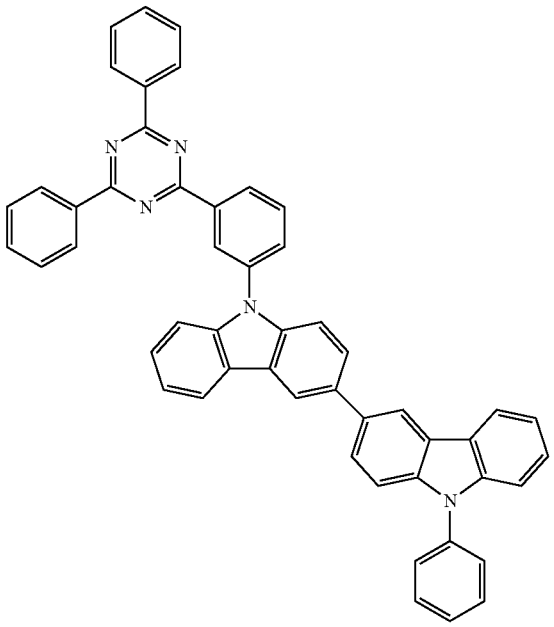
B-177
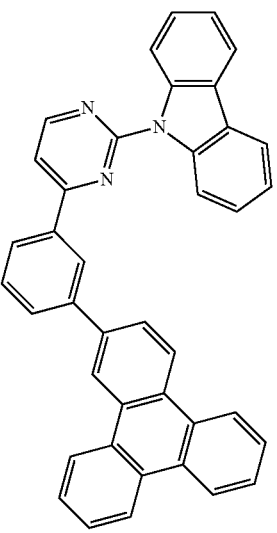

B-178
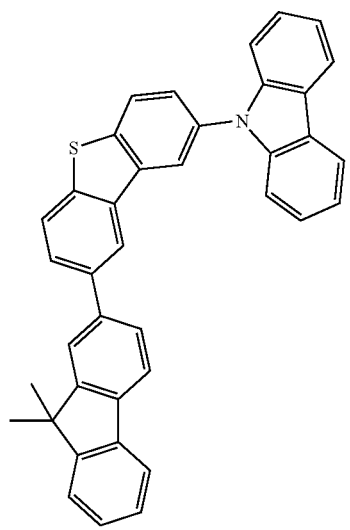
B-180
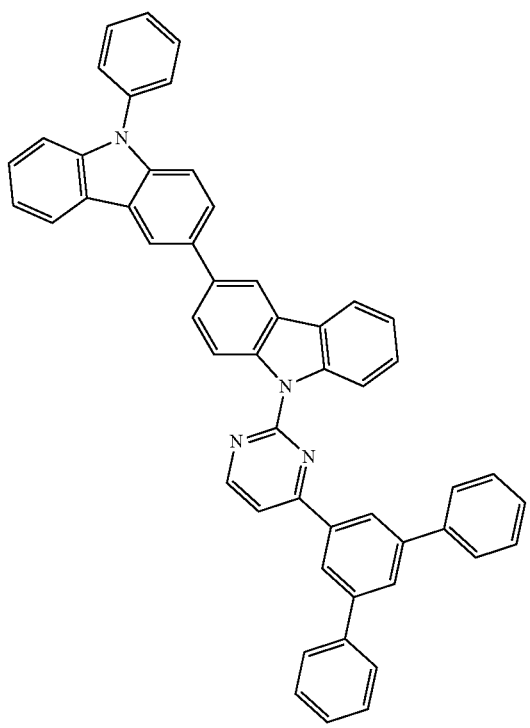
B-179
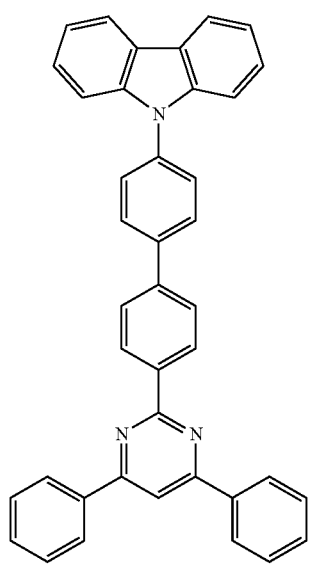
B-181
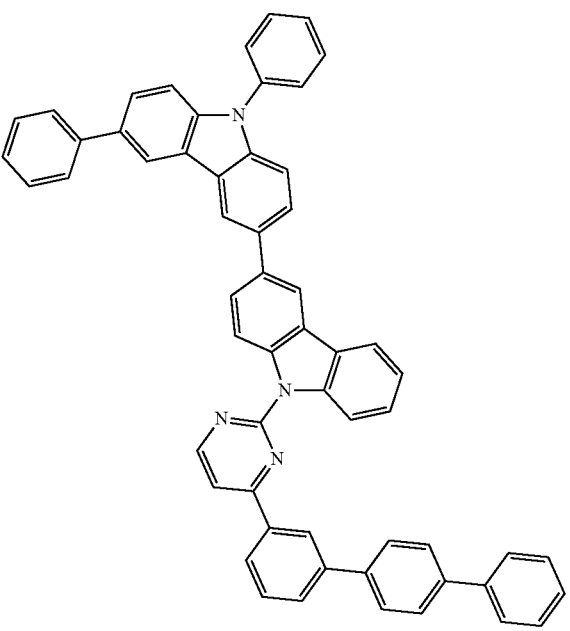

B-182
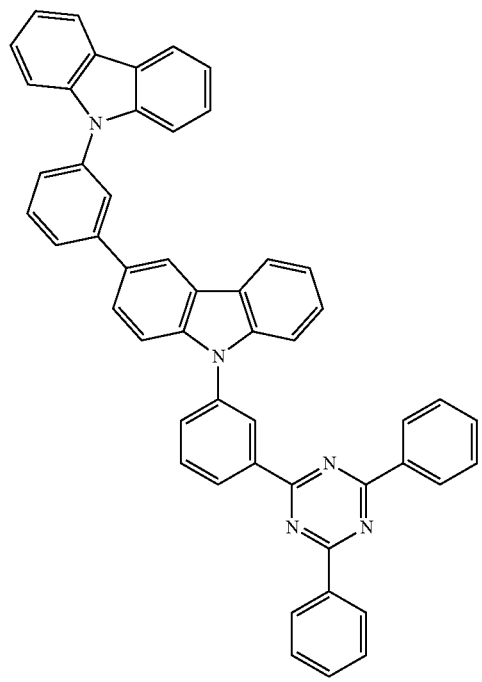
B-183
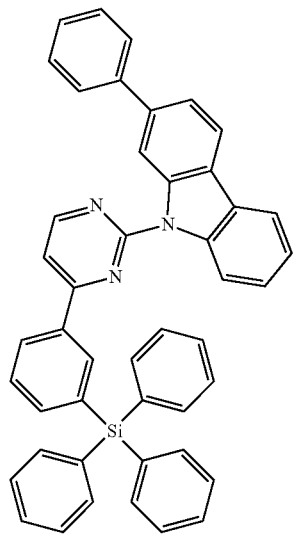
B-184
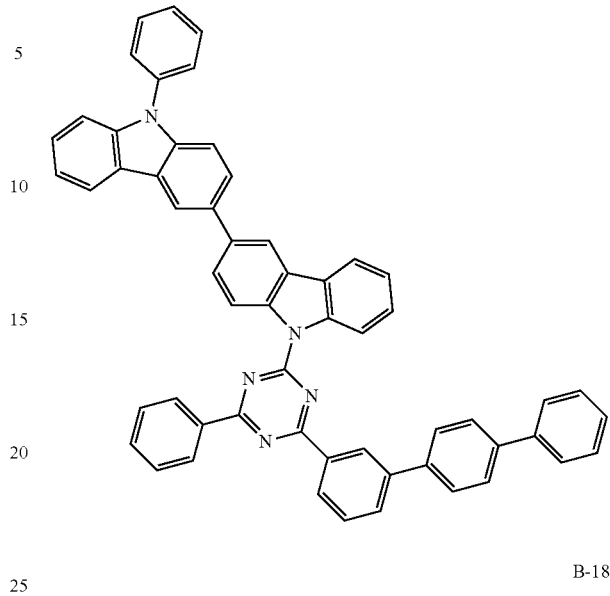
B-185
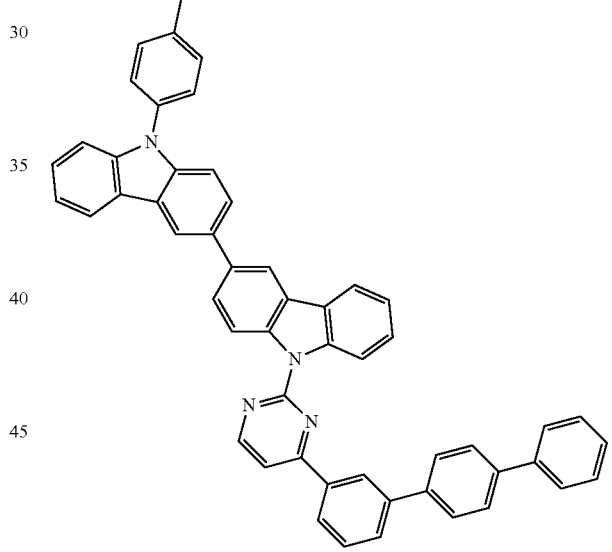
B-186
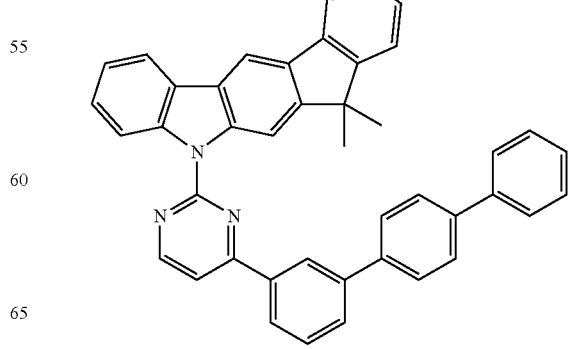

B-187
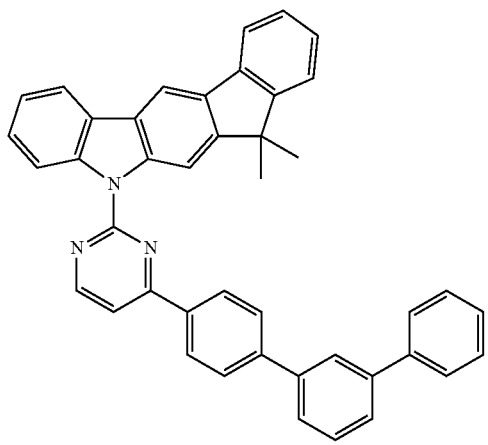
B-190
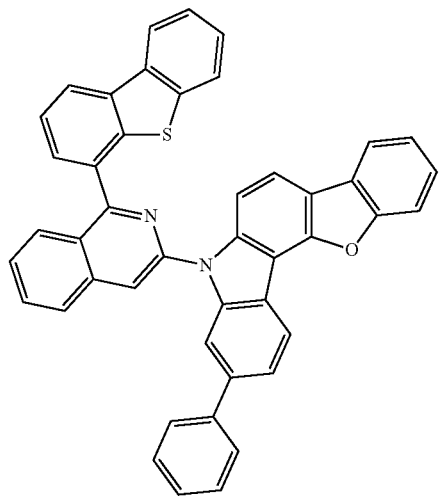
B-188
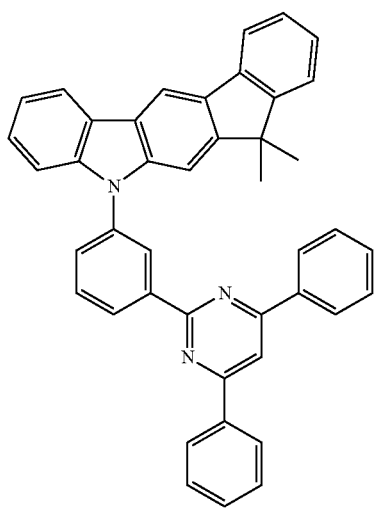
B-191
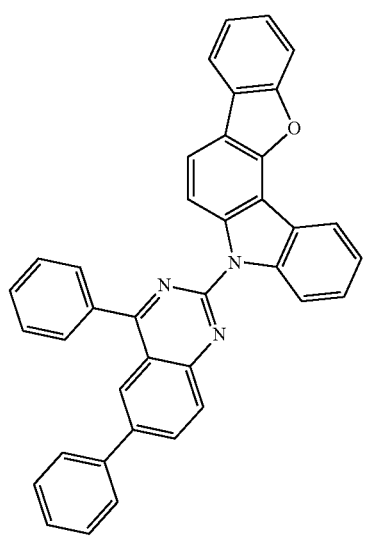
B-189
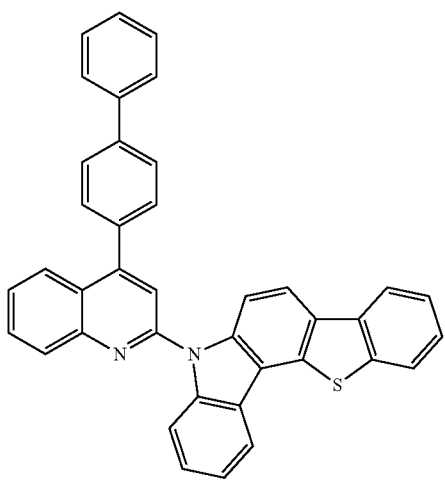
B-192
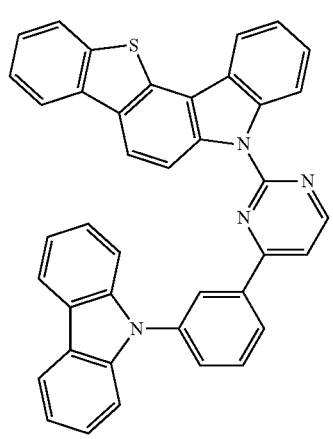

B-193

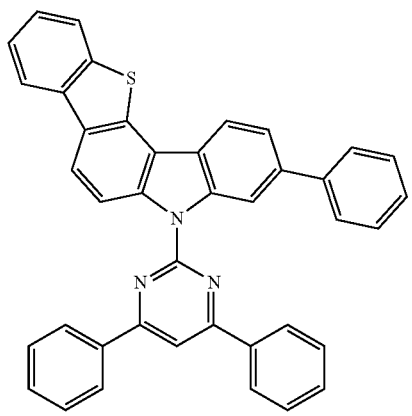

B-196

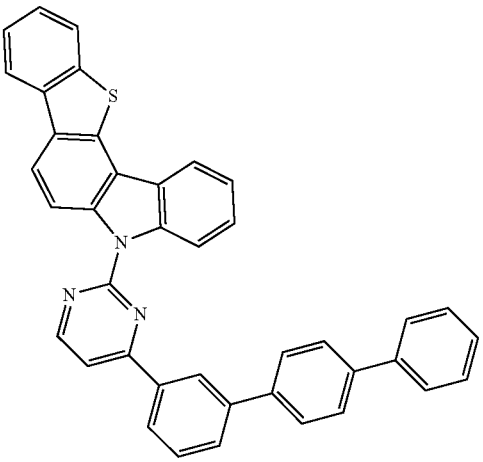

B-194

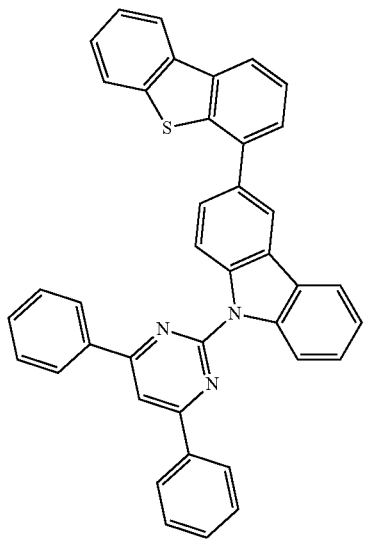

B-197

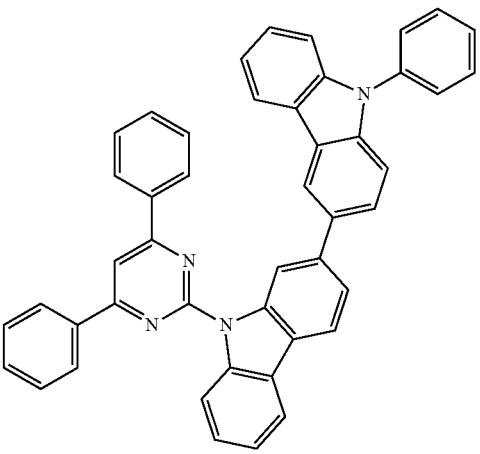

B-195

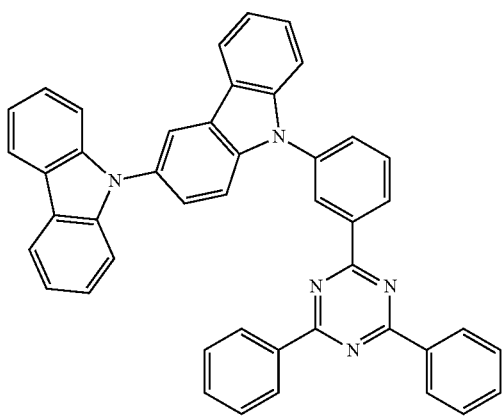

Wherein, TPS represents a triphenylsilyl group.

The dopant comprised in the organic electroluminescent device of the present disclosure is at least one phosphorescent or fluorescent dopant, preferably at least one phosphorescent dopant. The phosphorescent dopant material applied to the organic electroluminescent device of the present disclosure is not particularly limited, but may be preferably selected from the metallated complex compounds of iridium (Ir), osmium (Os), copper (Cu), and platinum (Pt), more preferably selected from ortho-metallated complex compounds of iridium (Ir), osmium (Os), copper (Cu), and platinum (Pt), and even more preferably ortho-metallated iridium complex compounds.

The dopant comprised in the organic electroluminescent device of the present disclosure may comprise the compound represented by the following formula 101, but is not limited thereto.

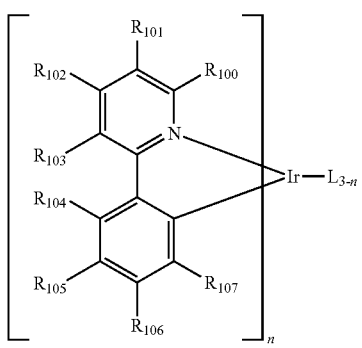

(101)

In formula 101, L is selected from the following structures 1 and 2:

[Structure 1]

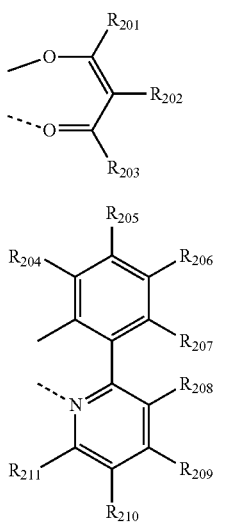

[Structure 2]

$R_{100}$ to $R_{103}$, each independently, represent hydrogen, deuterium, a halogen, a (C1-C30)alkyl unsubstituted or substituted with deuterium or a halogen, a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent $R_{100}$ to $R_{103}$, to form a substituted or unsubstituted fused ring with a pyridine, e.g., a substituted or unsubstituted quinoline, a substituted or unsubstituted isoquinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline or a substituted or unsubstituted indenoquinoline;

$R_{104}$ to $R_{107}$, each independently, represent hydrogen, deuterium, a halogen, a (C1-C30)alkyl unsubstituted or substituted with deuterium or a halogen, a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to adjacent $R_{104}$ to $R_{107}$ to form a substituted or unsubstituted fused ring with a benzene, e.g., a substituted or unsubstituted naphthyl, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{211}$, each independently, represent hydrogen, deuterium, a halogen, a (C1-C30)alkyl unsubstituted or substituted with deuterium or a halogen, a substituted or unsubstituted (C3-C30)cycloalkyl, or a substituted or unsubstituted (C6-C30)aryl; or may be linked to adjacent $R_{201}$ to $R_{211}$ to form a substituted or unsubstituted fused ring; and n represents an integer of 1 to 3.

The specific examples of the dopant compound are as follows, but are not limited thereto.

D-1

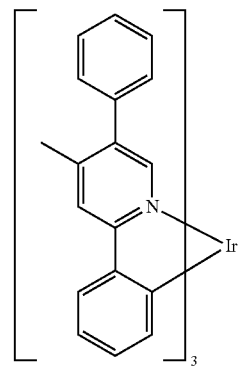

D-2

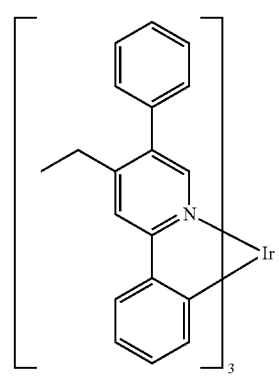

D-3

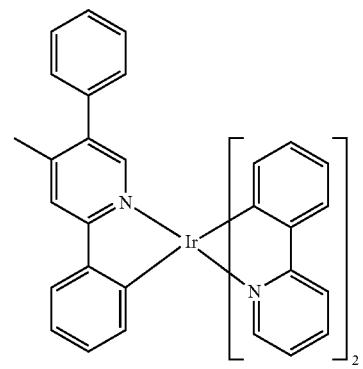

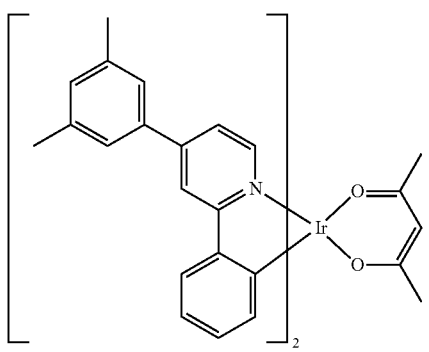 D-4
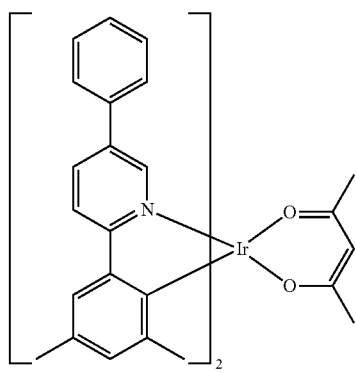 D-8
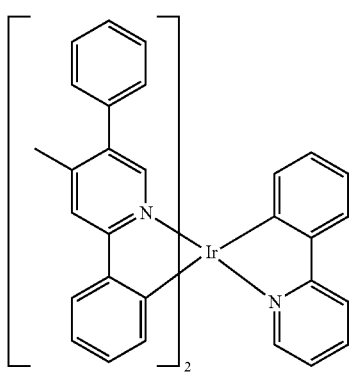 D-5
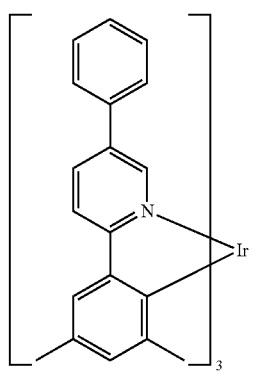 D-9
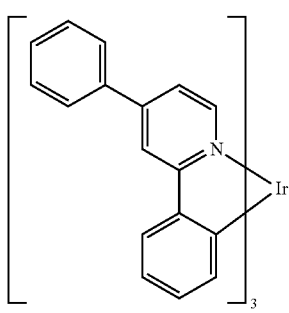 D-6
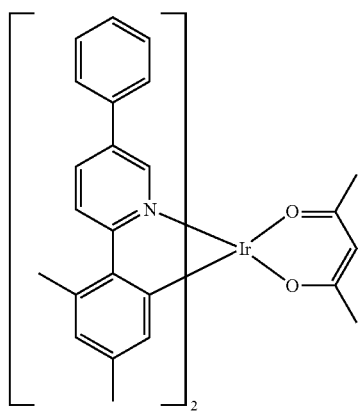 D-10
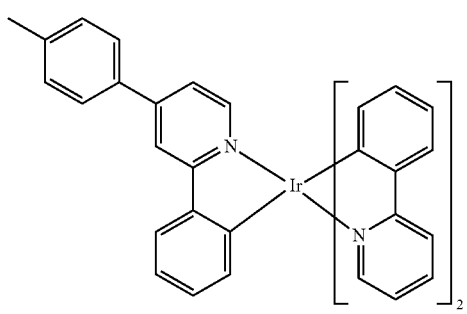 D-7
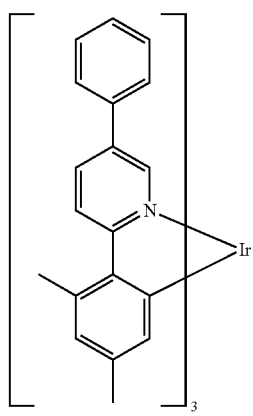 D-11

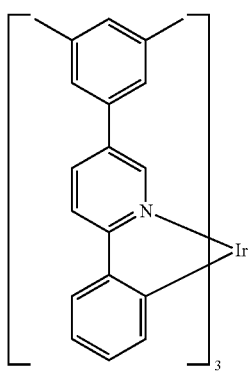
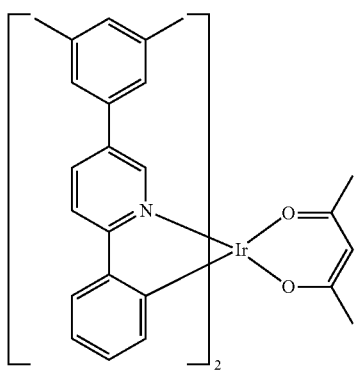
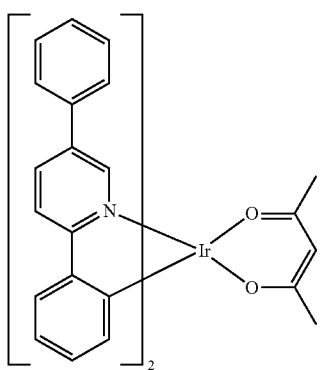
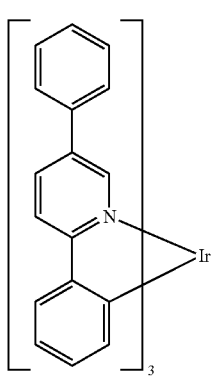
D-12
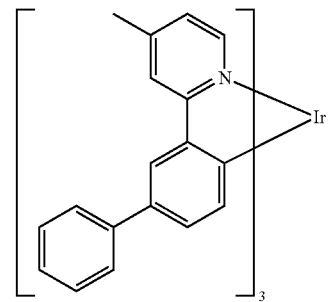
D-13
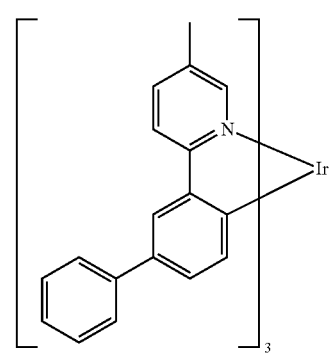
D-14
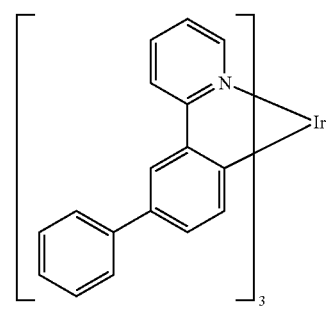
D-15
D-16
D-17
D-18
D-19
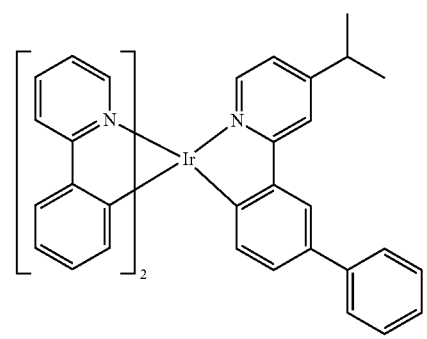
D-20
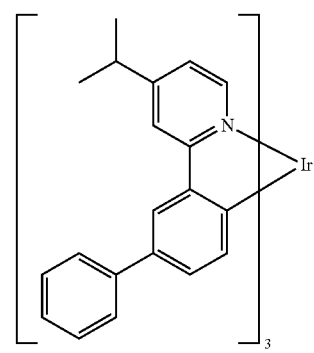

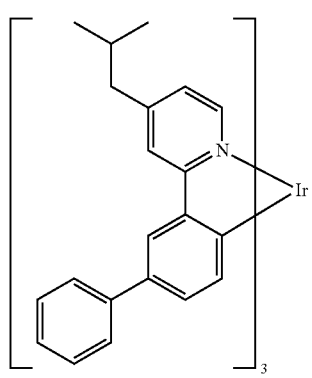
D-21
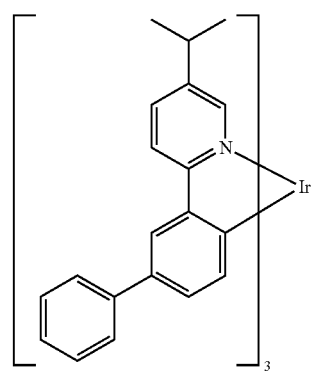
D-25
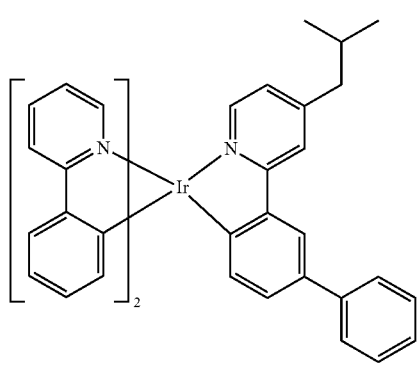
D-22
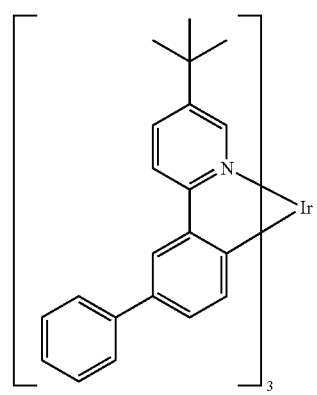
D-26
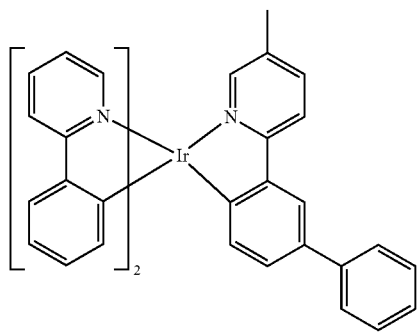
D-23
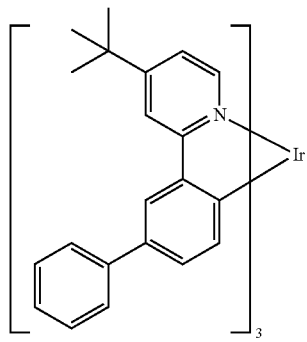
D-24
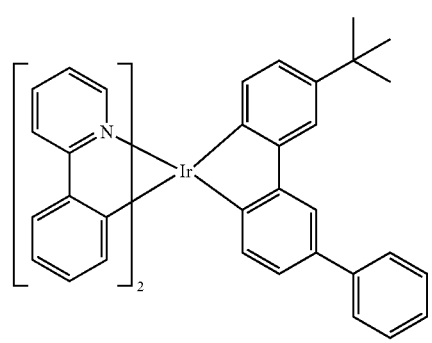
D-27
D-28

-continued
D-29
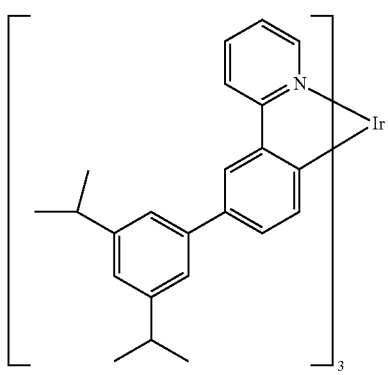
D-30
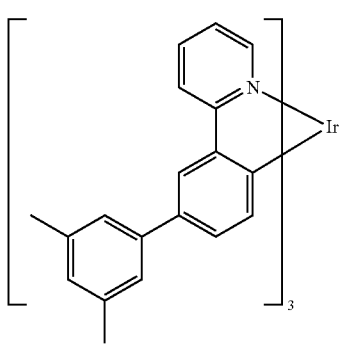
D-31
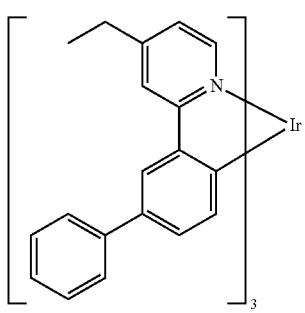
D-32
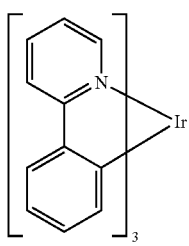
D-33
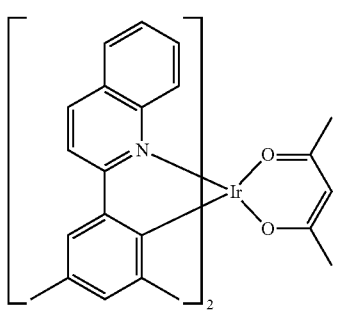
-continued
D-34
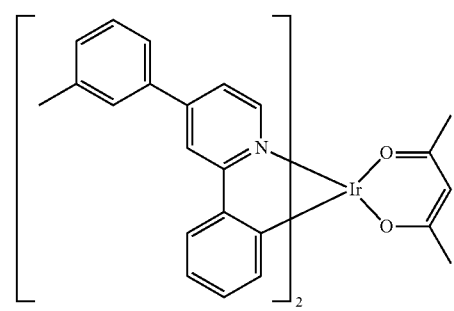
D-35
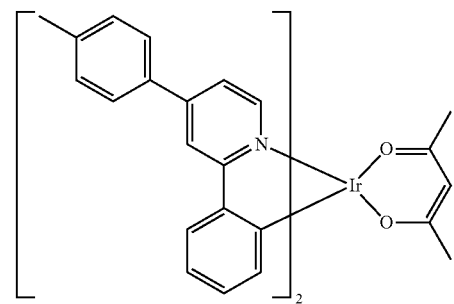
D-36
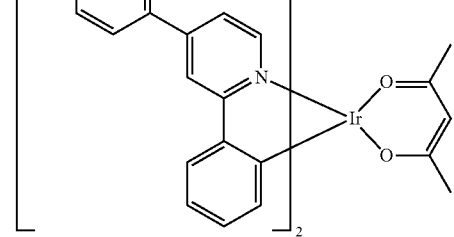
D-37
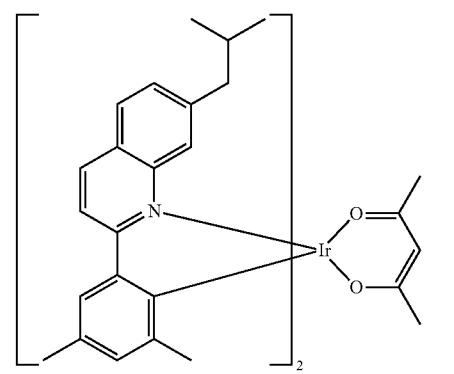
D-38
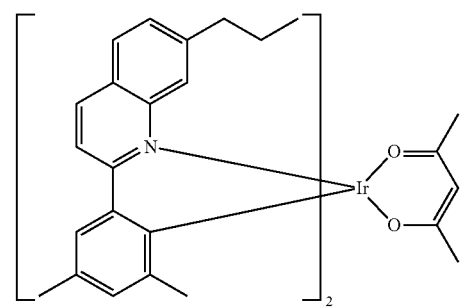

D-39
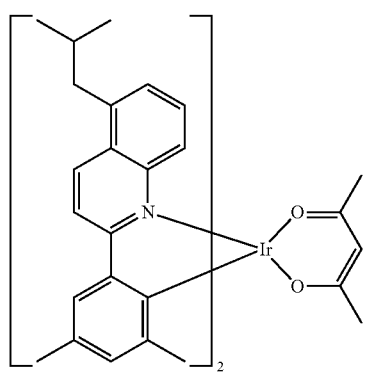
D-40
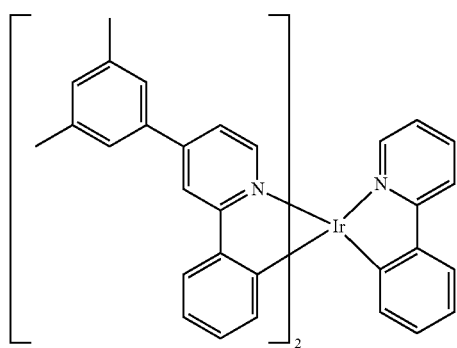
D-41
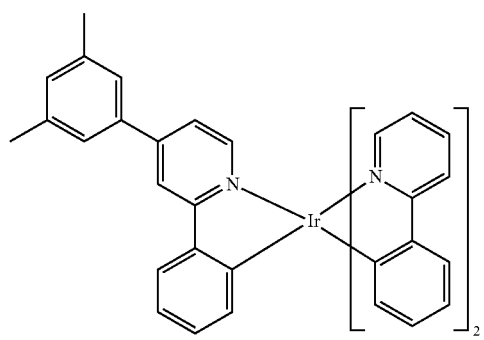
D-42
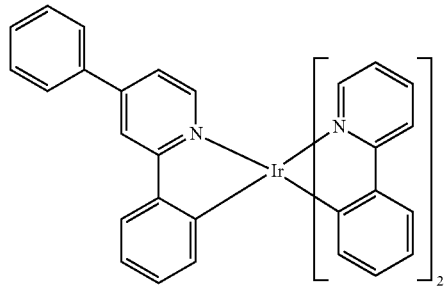
D-43
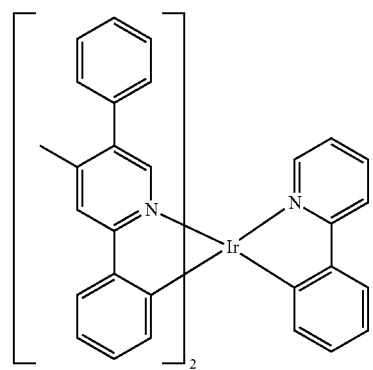
D-44
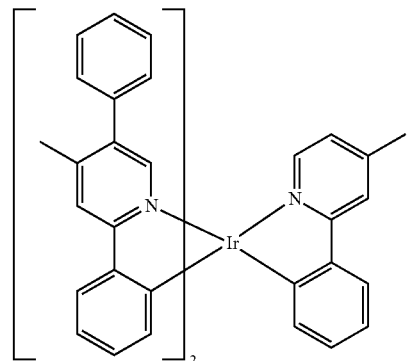
D-45
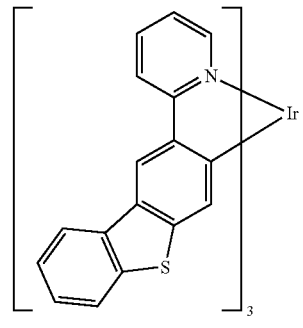
D-46
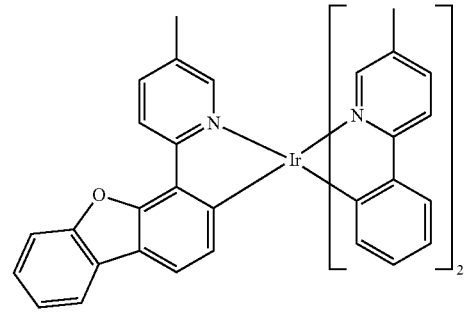

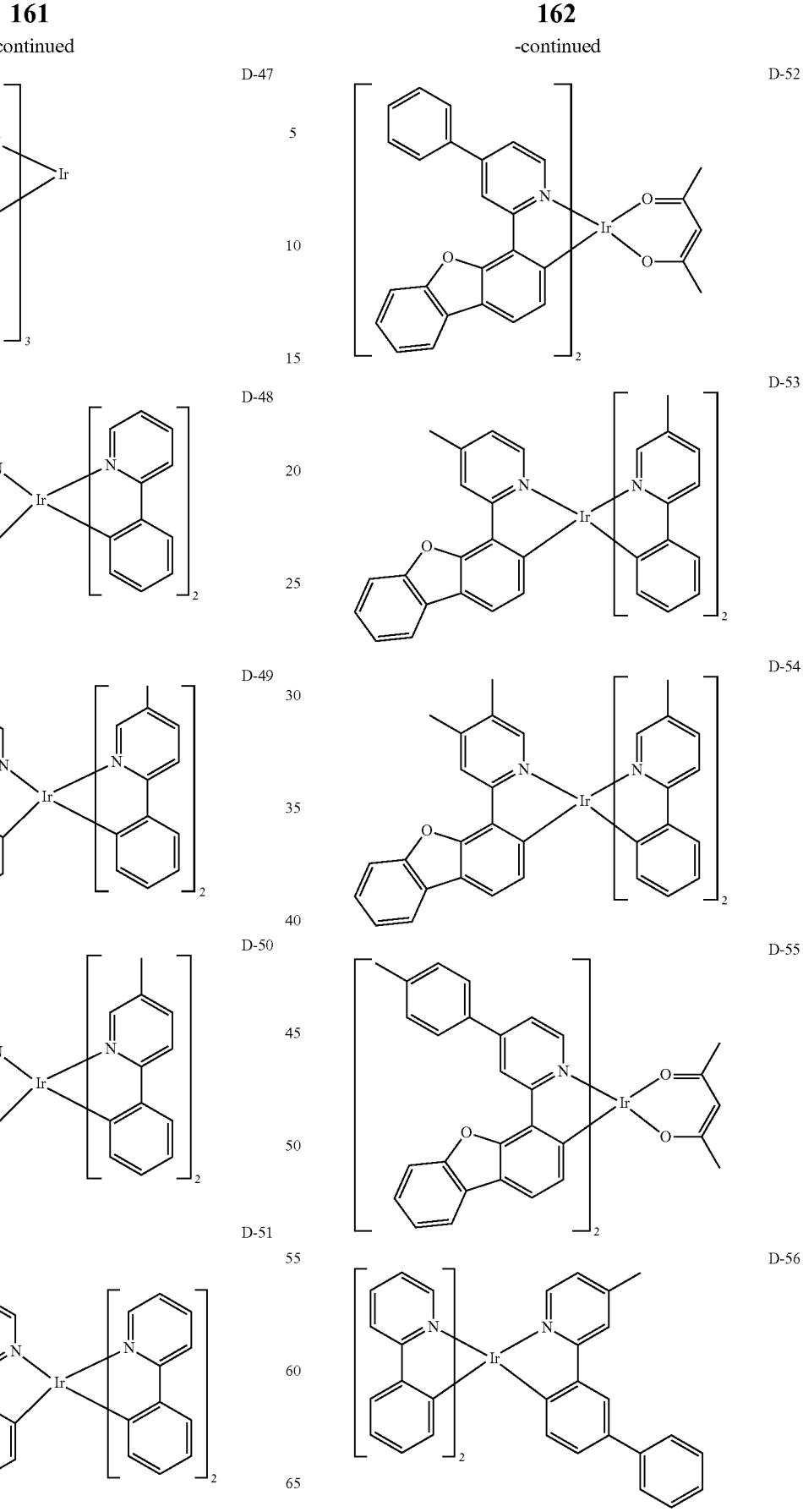

-continued
D-57
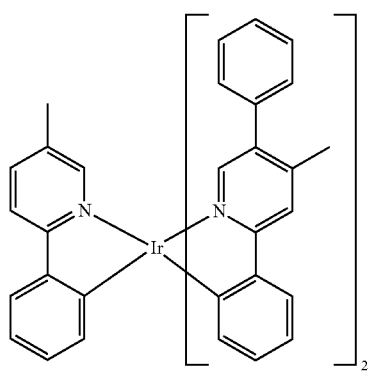
D-58
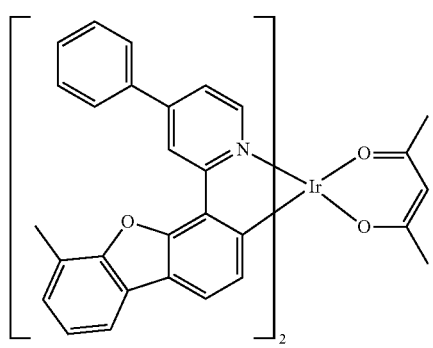
D-59
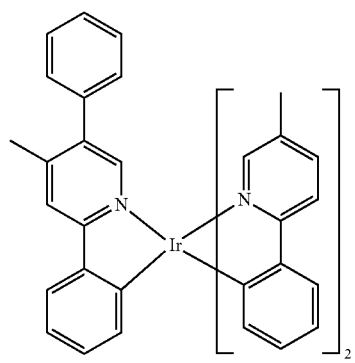
D-60
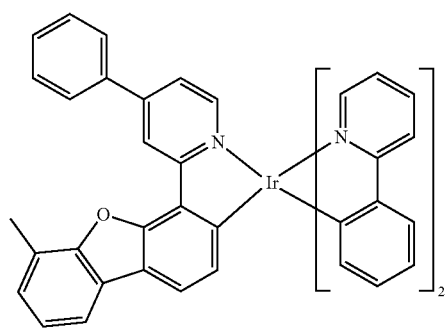
-continued
D-61
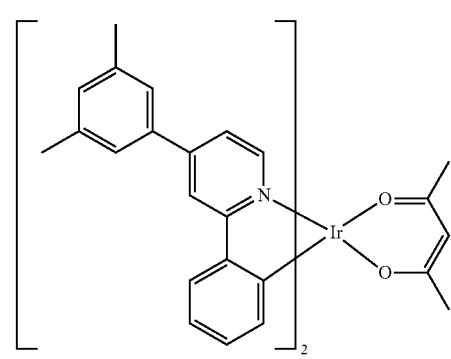
D-62
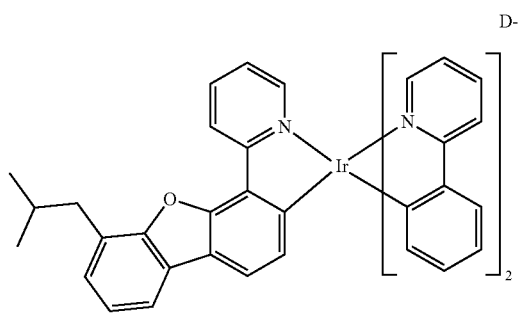
D-63
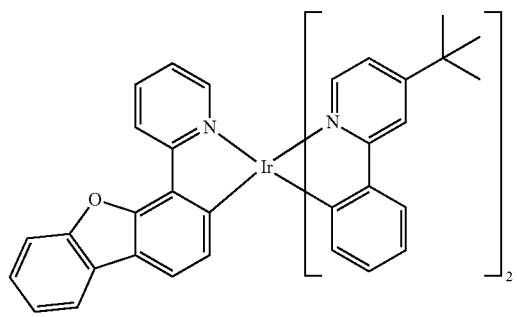
D-64
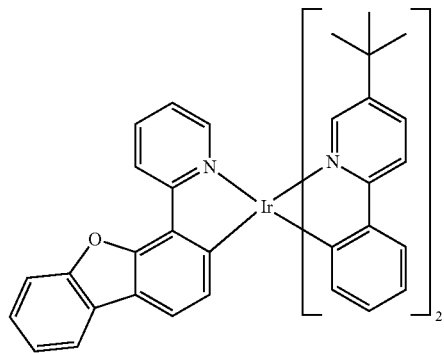

D-65
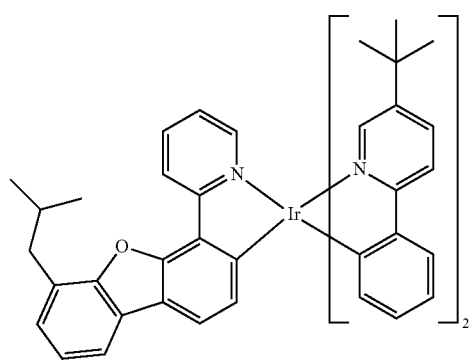
D-66
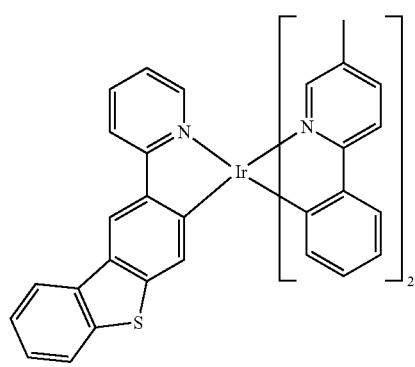
D-67
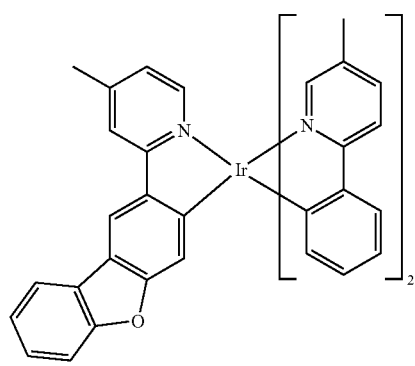
D-68
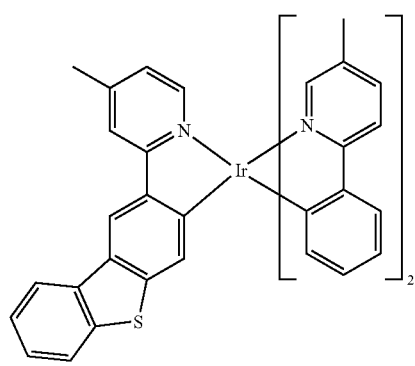
D-69
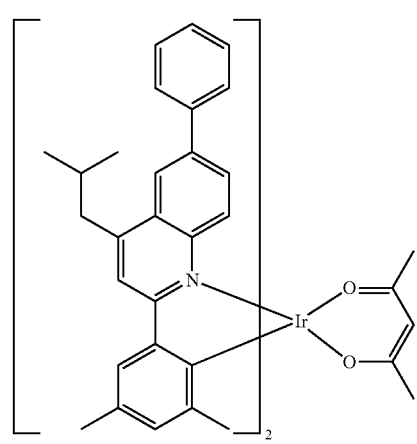
D-70
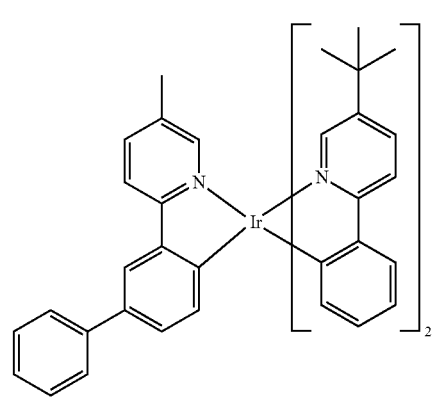
D-71
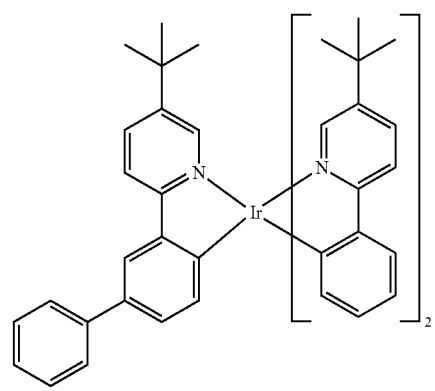
D-72
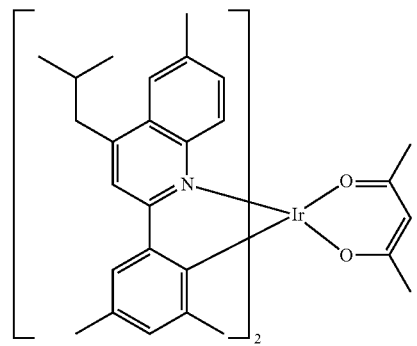

D-73
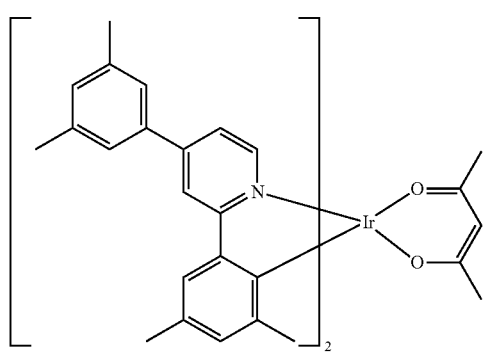
D-78
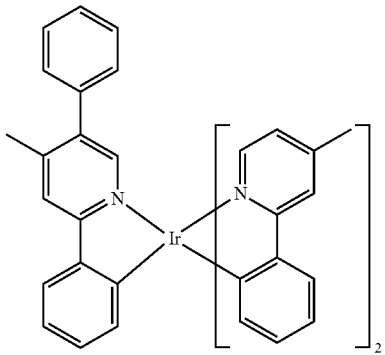
D-75
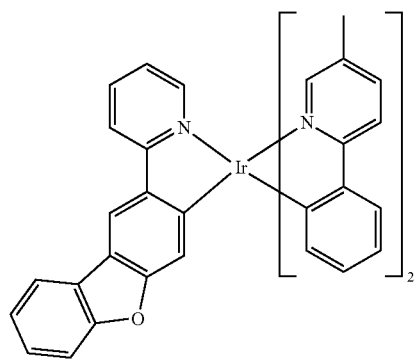
D-79
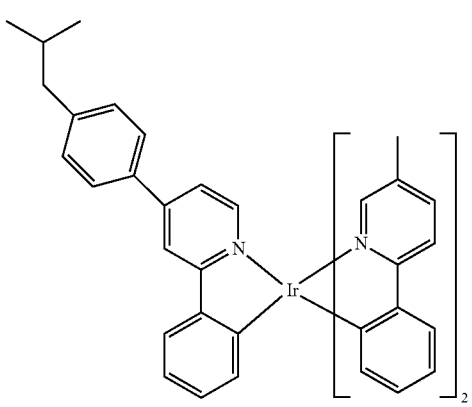
D-76
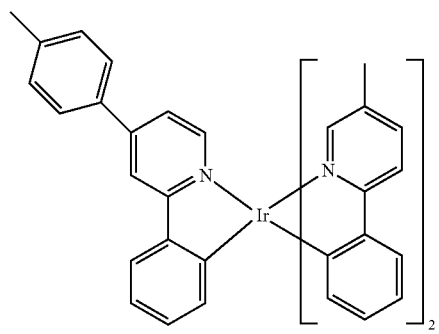
D-80
D-77
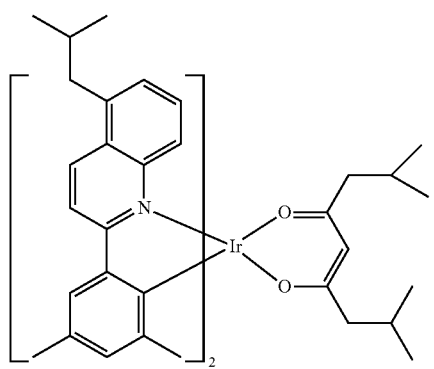
D-81
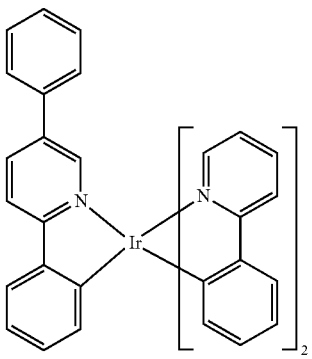

-continued
D-82
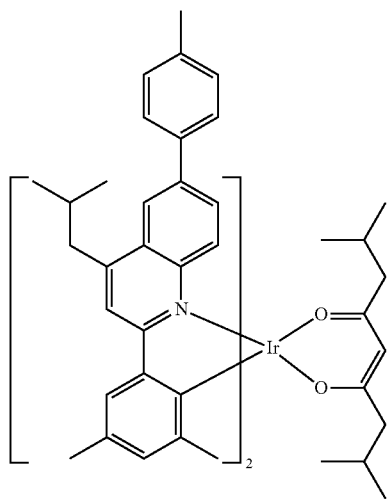
D-83
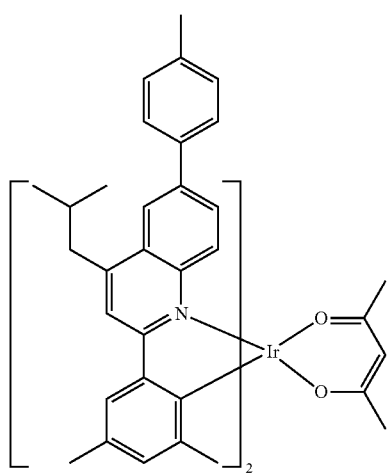
D-84
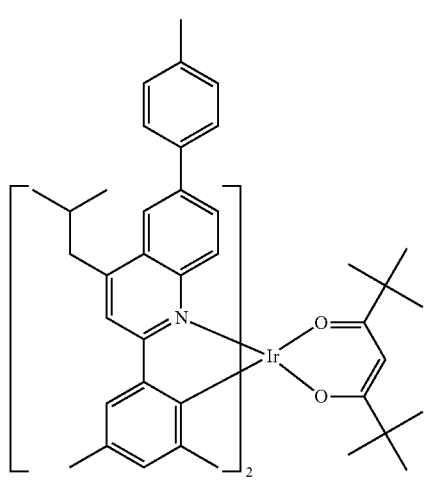
-continued
D-85
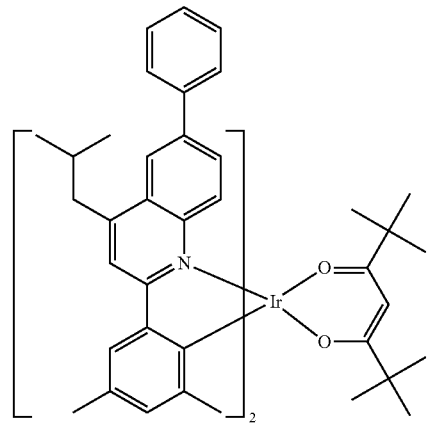
D-86
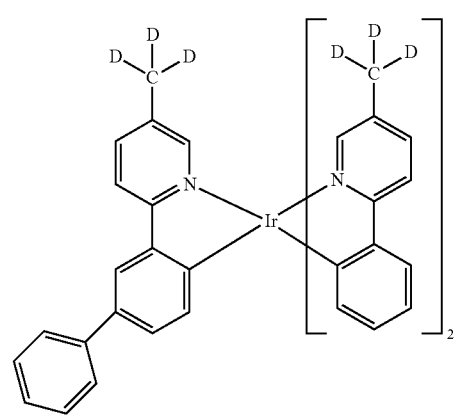
D-87
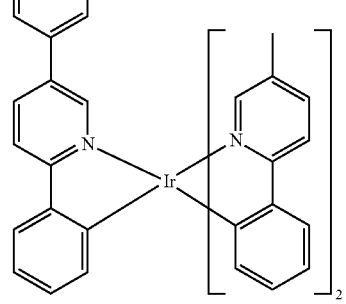
D-88
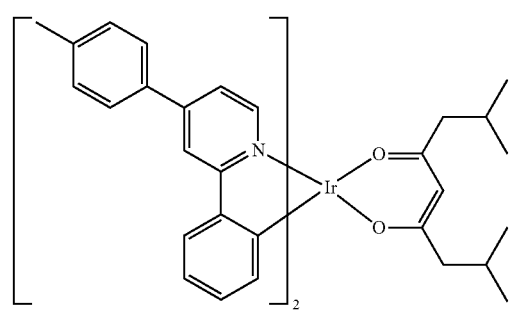

-continued
D-89
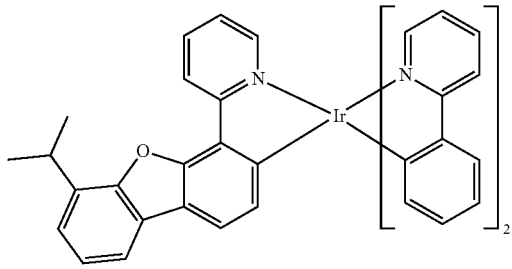
D-90
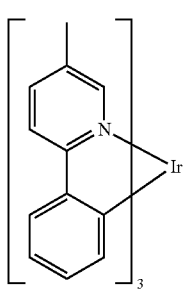
D-91
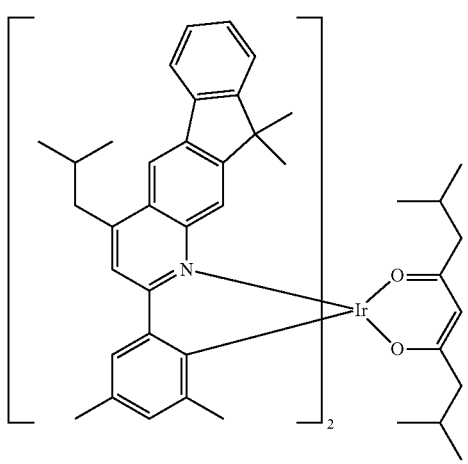
D-92
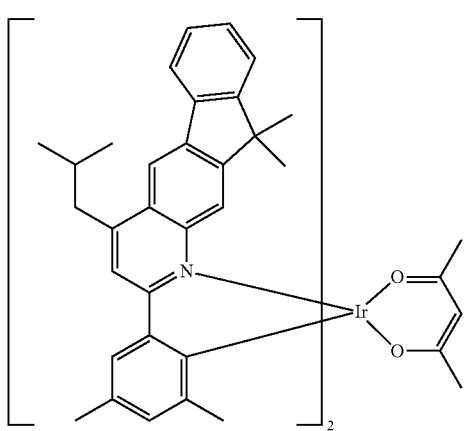
-continued
D-93
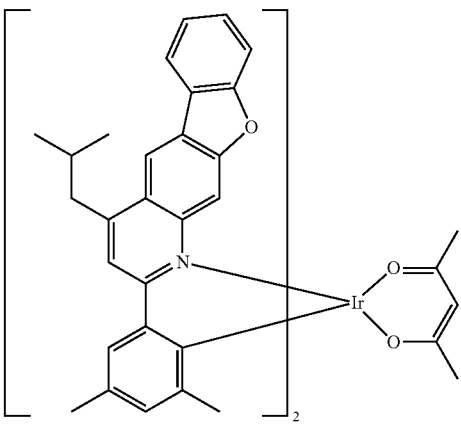
D-94
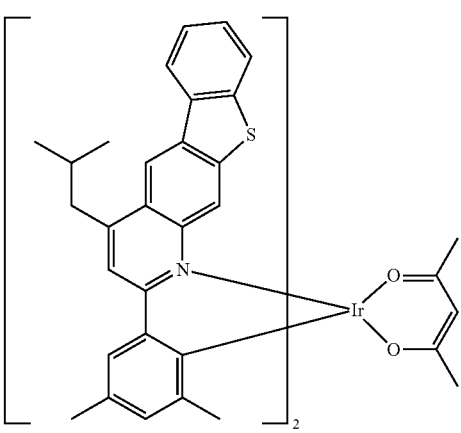
D-95
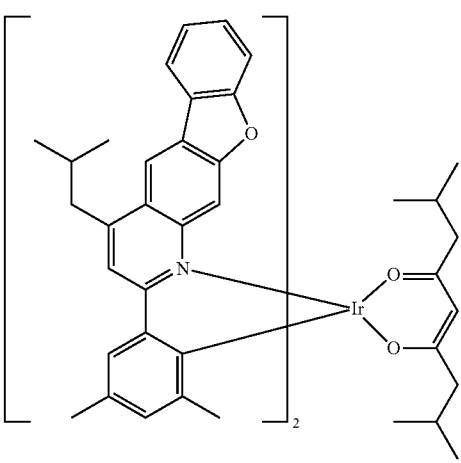

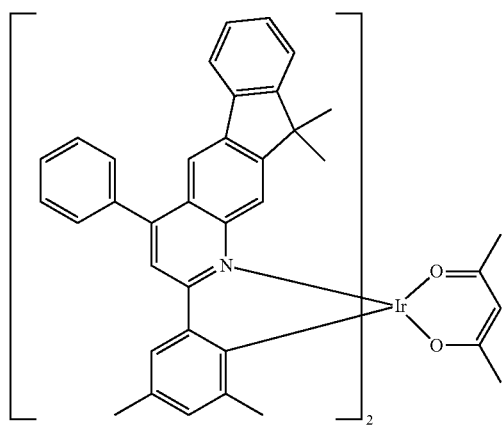
D-96
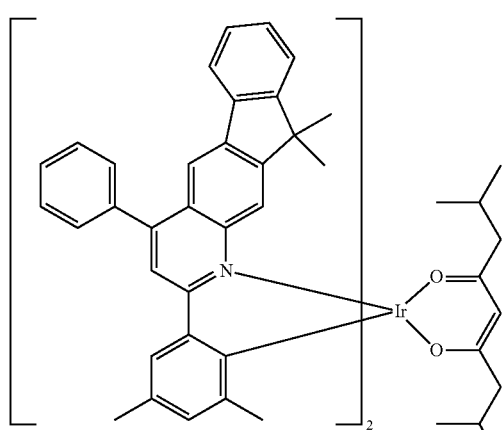
D-97
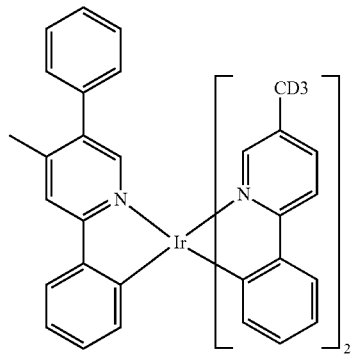
D-98
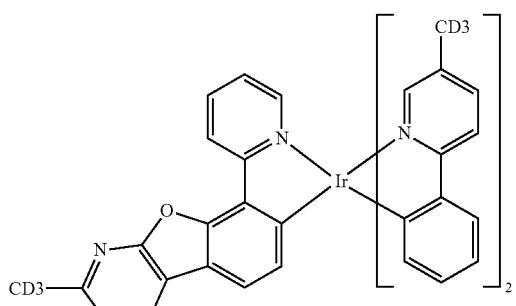
D-100
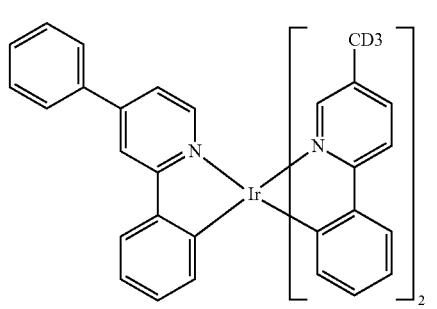
D-101
D-102
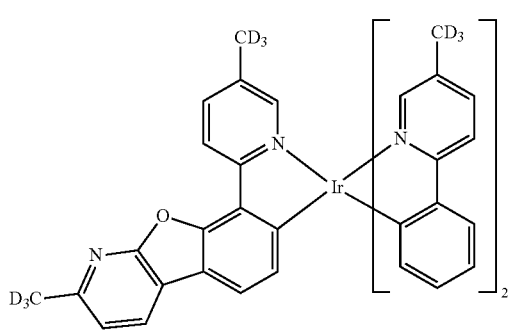
D-99
D-103

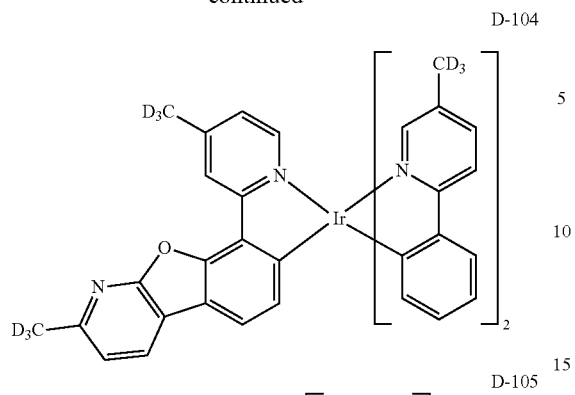
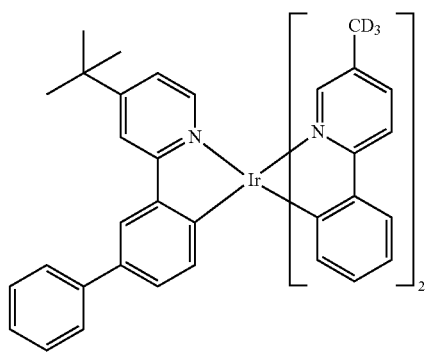
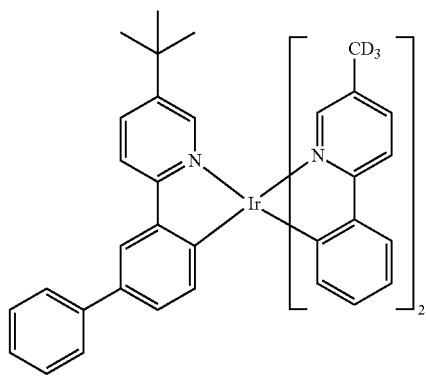
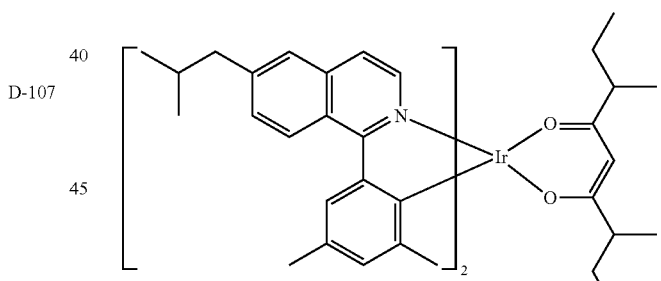
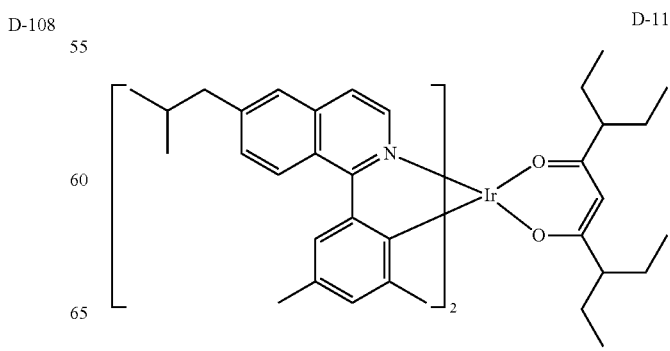

D-113
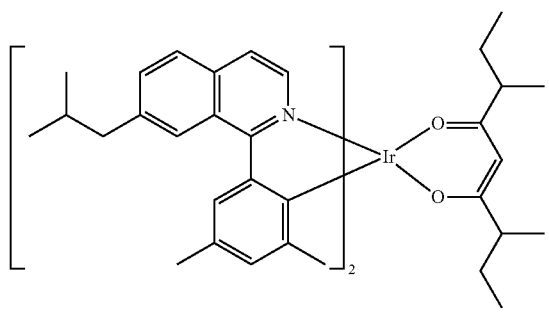

D-114
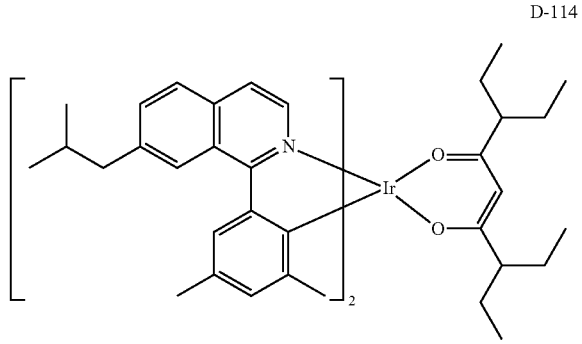

D-115
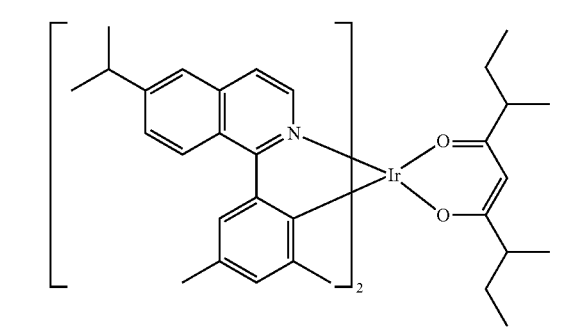

D-116
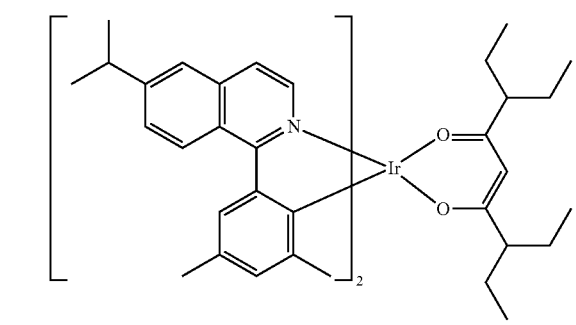

D-117
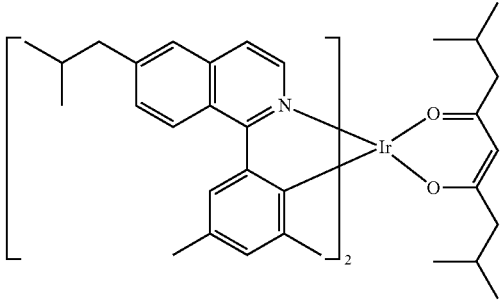

D-118
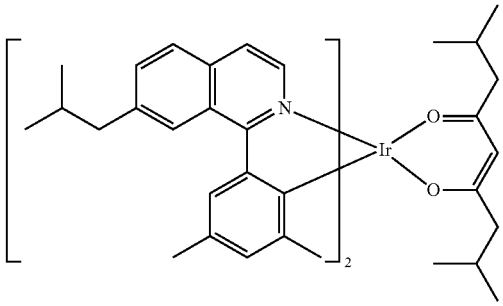

D-119
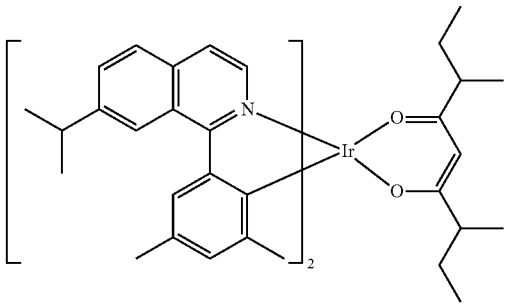

D-120
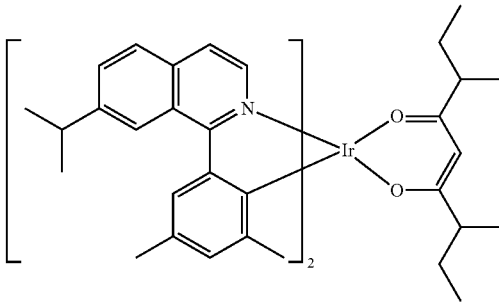

The organic electroluminescent device according to the present disclosure comprises a first electrode, a second electrode, and at least one organic layer between the first and second electrodes.

One of the first and second electrodes may be an anode, and the other may be a cathode. The organic layer may comprise a light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. Each of the layers may further consist of multi-layers.

The first electrode and the second electrode may each be formed with a transmissive conductive material, a transflective conductive material, or a reflective conductive material. The organic electroluminescent device may be a top emission type, a bottom emission type, or both-sides emission type according to the kinds of the material forming the first electrode and the second electrode. In addition, the hole injection layer may be further doped with a p-dopant, and the electron injection layer may be further doped with an n-dopant.

The organic layer may further comprise at least one compound selected from the group consisting of arylamine-based compounds and styrylarylamine-based compounds.

In addition, in the organic electroluminescent device of the present disclosure, the organic layer may further comprise at least one metal selected from the group consisting of metals of Group 1, metals of Group 2, transition metals of the $4^{th}$ period, transition metals of the $5^{th}$ period, lanthanides and organic metals of d-transition elements of the Periodic Table, or at least one complex compound comprising said metal.

The organic electroluminescent device of the present disclosure may emit white light by further including at least one light-emitting layer containing a blue, red or green light-emitting compound, which is known in the art. In addition, it may further include a yellow or orange light-emitting layer, if necessary.

In the organic electroluminescent device of the present disclosure, at least one layer selected from a chalcogenide layer, a metal halide layer and a metal oxide layer (hereinafter, "a surface layer") may be preferably placed on an inner surface(s) of one or both electrodes. Specifically, a chalcogenide (including oxides) layer of silicon or aluminum is preferably placed on an anode surface of an electroluminescent medium layer, and a metal halide layer or a metal oxide layer is preferably placed on a cathode surface of an electroluminescent medium layer. The surface layer may provide operation stability for the organic electroluminescent device. Preferably, the chalcogenide includes $SiO_X$ ($1 \leq X \leq 2$), $AlO_X$ ($1 \leq X \leq 1.5$), SiON, SiAlON, etc.; the metal halide includes LiF, $MgF_2$, $CaF_2$, a rare earth metal fluoride, etc.; and the metal oxide includes $Cs_2O$, $Li_2O$, MgO, SrO, BaO, CaO, etc.

A hole injection layer, a hole transport layer, a hole auxiliary layer, a light-emitting auxiliary layer, or an electron blocking layer, or a combination thereof may be used between the anode and the light-emitting layer. The hole injection layer may be multilayers in order to lower the hole injection barrier (or hole injection voltage) from the anode to the hole transport layer or the electron blocking layer, wherein each of the multilayers may use two compounds simultaneously. The hole transport layer or the electron blocking layer may also be multilayers.

An electron buffer layer, a hole blocking layer, an electron transport layer, or an electron injection layer, or a combination thereof can be used between the light-emitting layer and the cathode. The electron buffer layer may be multilayers in order to control the injection of the electron and improve the interfacial properties between the light-emitting layer and the electron injection layer, wherein each of the multilayers may use two compounds simultaneously. The hole blocking layer or the electron transport layer may also be multilayers, wherein each of the multilayers may use a plurality of compounds.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. Further, the electron blocking layer may be placed between the hole transport layer (or hole injection layer) and the light-emitting layer, and may block overflowing electrons from the light-emitting layer and confine the excitons in the light-emitting layer to prevent light leakage. When an organic electroluminescent device includes two or more hole transport layers, the hole transport layer, which is further included, may be used as a hole auxiliary layer or an electron blocking layer. The light-emitting auxiliary layer, the hole auxiliary layer or the electron blocking layer may have an effect of improving the efficiency and/or the lifespan of the organic electroluminescent device.

In the organic electroluminescent device of the present disclosure, a mixed region of an electron transport compound and a reductive dopant, or a mixed region of a hole transport compound and an oxidative dopant is preferably placed on at least one surface of a pair of electrodes. In this case, the electron transport compound is reduced to an anion, and thus it becomes easier to inject and transport electrons from the mixed region to an electroluminescent medium. Further, the hole transport compound is oxidized to a cation, and thus it becomes easier to inject and transport holes from the mixed region to the electroluminescent medium. Preferably, the oxidative dopant includes various Lewis acids and acceptor compounds; and the reductive dopant includes alkali metals, alkali metal compounds, alkaline earth metals, rare-earth metals, and mixtures thereof. A reductive dopant layer may be employed as a charge-generating layer to prepare an organic electroluminescent device having two or more light-emitting layers, which emits white light.

An organic electroluminescent material according to one embodiment of the present disclosure may be used as light-emitting materials for a white organic light-emitting device. The white organic light-emitting device has been suggested to have various structures such as a parallel arrangement (side-by-side) method, a stacking method, or color conversion material (CCM) method, etc., according to the arrangement of R (red), G (green), B (blue), or YG (yellowish green) light-emitting units. In addition, the organic electroluminescent material according to one embodiment of the present disclosure may also be applied to the organic electroluminescent device comprising QD (quantum dot).

In order to form each layer of the organic electroluminescent device of the present disclosure, dry film-forming methods such as vacuum evaporation, sputtering, plasma, ion plating, etc., or wet film-forming methods such as ink jet printing, nozzle printing, slot coating, spin coating, dip coating, flow coating, etc., can be used. The first and second host compounds of the present disclosure may be co-evaporated or mixture-evaporated.

When using a wet film-forming method, a thin film can be formed by dissolving or diffusing the materials forming each layer into any suitable solvent such as ethanol, chloroform, tetrahydrofuran, dioxane, etc. The solvent is not specifically limited as long as the material constituting each layer is soluble or dispersible in the solvents, which do not cause any problems in forming a film.

It is possible to produce a display system, e.g., a display system for smartphones, tablets, notebooks, PCs, TVs, or cars, or a lighting system, e.g., an outdoor or indoor lighting system, by using the organic electroluminescent device of the present disclosure.

Hereinafter, the preparation method of the compound of the present disclosure, and the properties thereof will be explained in detail with reference to the representative compounds of the present disclosure. However, the present disclosure is not limited to the following examples.

Example 1: Preparation of Compound C-2

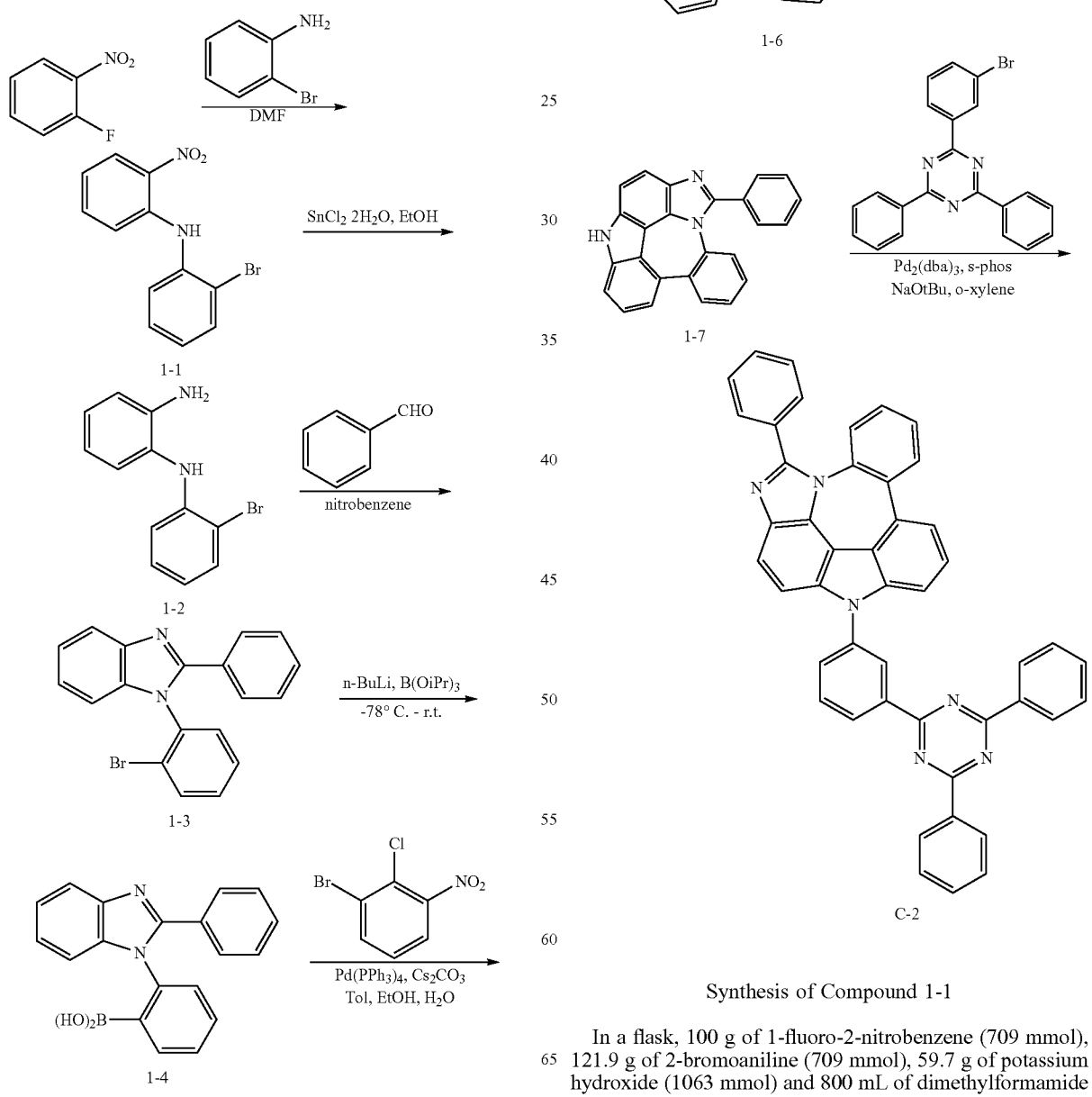

Synthesis of Compound 1-1

In a flask, 100 g of 1-fluoro-2-nitrobenzene (709 mmol), 121.9 g of 2-bromoaniline (709 mmol), 59.7 g of potassium hydroxide (1063 mmol) and 800 mL of dimethylformamide (DMF) were added, and the mixture was stirred at 150° C.

for 4 hours. After completion of the reaction, the organic layer was extracted with dichloromethane, and the residual moisture was removed by using magnesium sulfate. The residue was dried and separated by column chromatography to obtain 83.8 g of compound 1-1 (yield: 40%).

Synthesis of Compound 1-2

In a flask, 83.8 g of compound 1-1 (286 mmol) and 322.5 g of Tin (II) chloride dihydrate (1429 mmol) were dissolved in 1400 mL of ethanol, and the mixture was refluxed for 1 hour. After completion of the reaction, the organic layer was extracted with ethyl acetate, and the residual moisture was removed by using magnesium sulfate. The residue was dried and separated by column chromatography to obtain 62.1 g of compound 1-2 (yield: 83%).

Synthesis of Compound 1-3

In a flask, 62.1 g of compound 1-2 (236 mmol), 25.1 g of benzaldehyde (236 mmol) and 472 mL of nitrobenzene were added, and the mixture was refluxed for 5 hours. After completion of the reaction, the organic layer was extracted with ethyl acetate after distillation under reduced pressure. The residual moisture was removed by using magnesium sulfate. The residue was dried and separated by column chromatography to obtain 48.4 g of compound 1-3 (yield: 59%).

Synthesis of Compound 1-4

In a flask, 48.4 g of compound 1-3 (139 mmol) and 460 mL of tetrahydrofuran were added, and n-butyl lithium was slowly added dropwise at −78° C. and stirred. After 1 hour, 39.1 g of triisopropyl borate (208 mmol) was slowly added dropwise and stirred at room temperature. After completion of the reaction, the reaction mixture was washed with an aqueous solution of ammonium chloride, and the organic layer was extracted with ethyl acetate. The residual moisture was removed by using magnesium sulfate. The residue was dried and separated by column chromatography to obtain 43.5 g of compound 1-4 (yield: 88%).

Synthesis of Compound 1-5

In a flask, 38.4 g of compound 1-4 (122 mmol), 31.8 g of 1-bromo-2-chloro-3-nitrobenzene (134 mmol), 7.1 g of tetrakis(triphenylphosphine)palladium(0) (6 mmol), and 99.6 g of cesium carbonate (306 mmol) were dissolved in 600 mL of toluene, 150 mL of ethanol and 150 mL of water, and the mixture was refluxed for 24 hours. After completion of the reaction, the organic layer was extracted with ethyl acetate, and the residual moisture was removed by using magnesium sulfate. The residue was dried and separated by column chromatography to obtain 10.6 g of compound 1-5 (yield: 20%).

Synthesis of Compound 1-6

In a flask, 10 g of compound 1-5 (23 mmol), 1.05 g of palladium(II) acetate (5 mmol), 3.5 g of tricyclohexylphosphine tetrafluoroborate (9 mmol), and 23 g of cesium carbonate (70 mmol) were dissolved in 120 mL of o-xylene, and the mixture was stirred at 130° C. for 4 hours. After completion of the reaction, the solvent was removed, and the resulting mixture was separated by column chromatography to obtain 6.6 g of compound 1-6 (yield: 72%).

Synthesis of Compound 1-7

In a flask, 6.3 g of compound 1-6 (16 mmol), 12.7 g of triphenylphosphine (49 mmol) and 80 mL of 1,2-dichlorobenzene were added, and the mixture was refluxed for 24 hours. After completion of the reaction, the organic layer was extracted with ethyl acetate after distillation under reduced pressure. The residual moisture was removed by using magnesium sulfate. The residue was dried and separated by column chromatography to obtain 6 g of compound 1-7 (yield: 105%).

Synthesis of Compound C-2

In a flask, 3 g of compound 1-7 (8 mmol), 3.3 g of 2-(3-bromophenyl)-4,6-diphenyl-1,3,5-triazine (8 mmol), 0.3 g of tris(dibenzylideneacetone)dipalladium(0) (0.34 mmol), 0.3 g of 2-dicyclohexylphosphino-2',6'-dimethoxybiphenyl (s-phos) (0.84 mmol), and 2.0 g of sodium-tert-butoxide (21 mmol) were dissolved in 55 mL of o-xylene, and the mixture was refluxed. After completion of the reaction, the solvent was removed, and the resulting mixture was separated by column chromatography to obtain 3.4 g of compound C-2 (yield: 61%).

| Compound | MW | M.P. |
| --- | --- | --- |
| C-2 | 664.77 | 260° C. |

Example 2: Preparation of Compound C-6

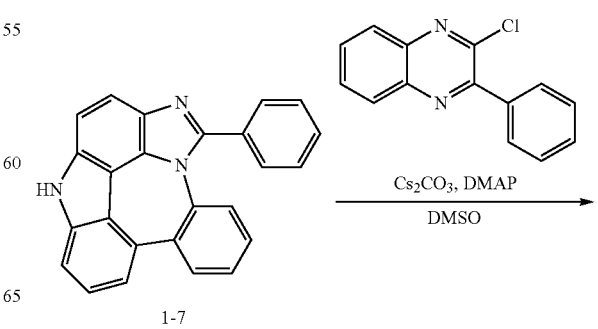

-continued

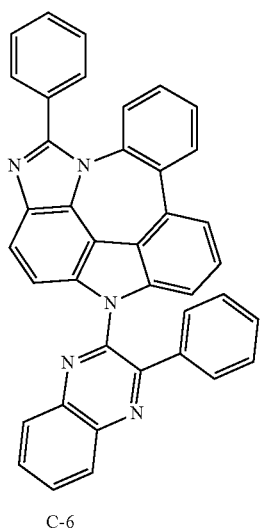

C-6

In a flask, 3 g of compound 1-7 (8 mmol), 2.22 g of 2-chloro-3-phenylquinoxaline (9 mmol), 5.5 g of cesium carbonate (17 mmol), 0.5 g of 4-dimethylaminopyridine (DMAP) (4 mmol) and 42 mL of dimethyl sulfoxide (DMSO) were added, and the mixture was stirred at 100° C. for 4 hours. After completion of the reaction, the reaction mixture was washed with an aqueous solution of ammonium chloride, and the organic layer was extracted with ethyl acetate. The residual moisture was removed by using magnesium sulfate. The residue was dried and separated by column chromatography to obtain 3.4 g of compound C-6 (yield: 72%).

| Compound | MW | M.P. |
| --- | --- | --- |
| C-6 | 561.65 | 277° C. |

Example 3: Preparation of Compound C-49

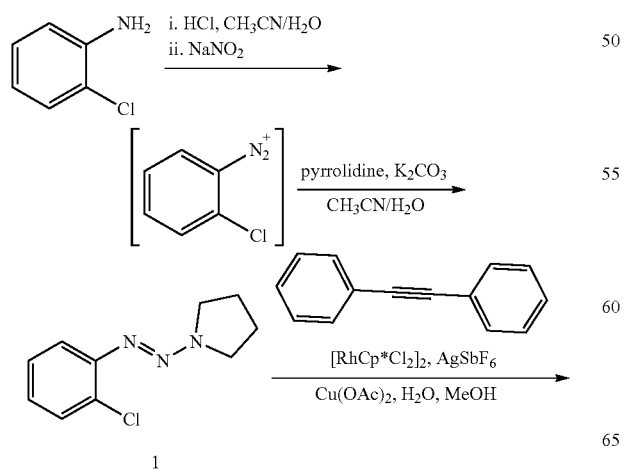

-continued

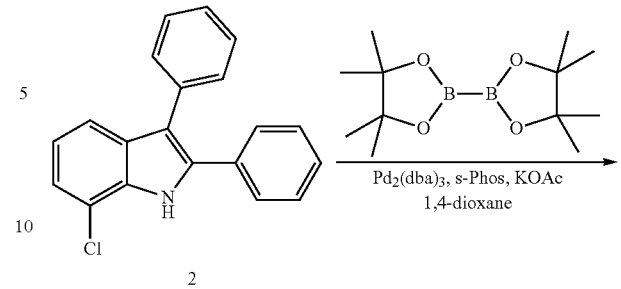

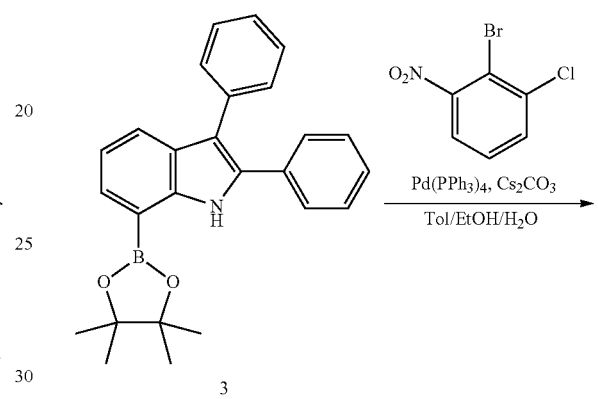

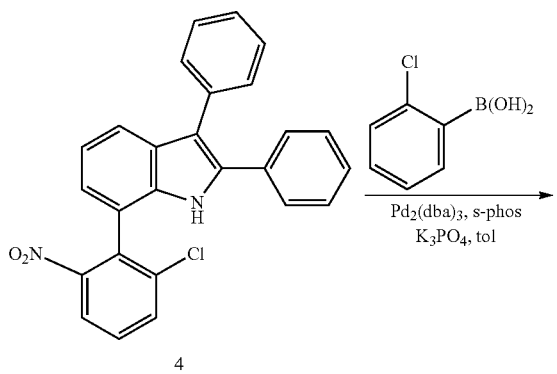

-continued

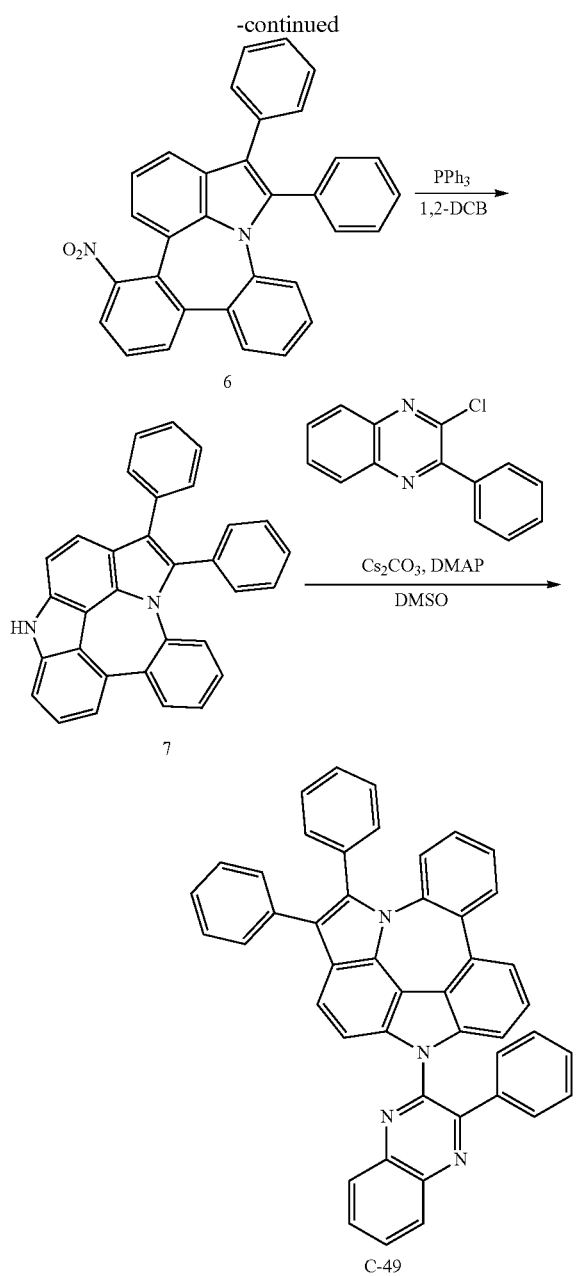

Synthesis of Compound 1

In a flask, 50 g of 2-chloroaniline (392 mmol), 1250 mL of acetonitrile, and 625 mL of water were added, and 130 mL of hydrochloric acid was slowly added dropwise at 0° C., and the mixture was stirred for 30 minutes. An aqueous solution prepared by dissolving 40 g of sodium nitrite (588 mmol) in 500 mL of water at −5° C. was slowly added dropwise to the reaction mixture and stirred for 30 minutes. 82 mL of pyrrolidine (979.85 mmol) dissolved in 400 mL of acetonitrile, and 282 g of potassium carbonate (2038 mmol) dissolved in 200 mL of water were added dropwise to the reaction mixture at 0° C., and the mixture was stirred at room temperature for 1 hour. After completion of the reaction, the organic layer was extracted with ethyl acetate. The residual moisture was removed by using magnesium sulfate. The residue was dried and separated by column chromatography to obtain 38.7 g of compound 1 (yield: 47%).

Synthesis of Compound 2

In a flask, 28.5 g of compound 1 (136 mmol), 48.5 g of diphenylacetylene (272 mmol), 4.2 g of pentamethylcyclopentadienyl rhodium (III) chloride dimer (6.8 mmol), 9.35 g of silver hexafluoroantimonate(V) (27.2 mmol), 54.3 g of copper (II) acetate monohydrate (272 mmol), and 1360 mL of methanol were added, and the mixture was stirred at 90° C. for 24 hours. After completion of the reaction, the organic solvent was removed, and the reaction mixture was separated by column chromatography to obtain 27.6 g of compound 2 (yield: 67%).

Synthesis of Compound 3

In a flask, 27.6 g of compound 2 (91 mmol), 27.7 g of bis(pinacolato)diboron (109 mmol), 4.2 g of tris(dibenzylideneacetone)dipalladium (0) (4.5 mmol), 3.7 g of 2-dicyclohexylphosphino-2',6'-dimethoxybiphenyl (9 mmol), 22.3 g of potassium acetate (227 mmol), and 450 mL of 1,4-dioxane were added, and the mixture was refluxed for 6 hours. After completion of the reaction, the organic solvent was removed, and the reaction mixture was separated by column chromatography to obtain 24.3 g of compound 3 (yield: 68%).

Synthesis of Compound 4

In a flask, 9 g of 2-bromo-1-chloro-3-nitrobenzene (41 mmol), 24.3 g of compound 3 (61 mmol), 2.4 g of tetrakis(triphenylphosphine)palladium(0) (2 mmol), and 33.4 g of cesium carbonate (102 mmol) were dissolved in 205 mL of toluene, 50 mL of ethanol, and 50 mL of water, and the mixture was refluxed for 24 hours. After completion of the reaction, the organic layer was extracted with ethyl acetate. The residual moisture was removed by using magnesium sulfate. The residue was dried and separated by column chromatography to obtain 12 g of compound 4 (yield: 69%).

Synthesis of Compound 5

In a flask, 12 g of compound 4 (28 mmol), 8.8 g of 2-chlorophenylboronic acid (57 mmol), 1.3 g of tris(dibenzylideneacetone)dipalladium(0) (1.4 mmol), 1.2 g of 2-dicyclohexylphosphino-2',6'-dimethoxybiphenyl (2.8 mmol), 30 g of tripotassium phosphate (141 mmol), and 140 mL of toluene were added, and the mixture was refluxed for 5 hours. After completion of the reaction, the organic layer was extracted with ethyl acetate. The residual moisture was removed by using magnesium sulfate. The residue was dried and separated by column chromatography to obtain 4.6 g of compound 5 (yield: 33%).

Synthesis of Compound 6

In a flask, 4.3 g of compound 5 (8.6 mmol), 0.55 g of copper powder (8.6 mmol), 4.8 g of potassium carbonate (34 mmol), and 43 mL of nitrobenzene were added, and the mixture was stirred at 230° C. for 4 hours. After completion of the reaction, the organic layer was extracted with ethyl acetate after distillation under reduced pressure. The residual moisture was removed by using magnesium sulfate. The residue was dried and separated by column chromatography to obtain 3 g of compound 6 (yield: 75%).

Synthesis of Compound 7

In a flask, 3 g of compound 6 (6.5 mmol), 5.1 g of triphenylphosphine (19 mmol), and 43 mL of 1,2-dichlorobenzene were added, and the mixture was refluxed for 24 hours. After completion of the reaction, the organic layer was extracted with ethyl acetate after distillation under reduced pressure. The residual moisture was removed by using magnesium sulfate. The residue was dried and separated by column chromatography to obtain 2.8 g of compound 7 (yield: 100%).

Synthesis of Compound C-49

In a flask, 2.8 g of compound 7 (6.5 mmol), 1.7 g of 2-chloro-3-phenylquinoxaline (7.1 mmol), 4.2 g of cesium carbonate (13 mmol), 0.4 g of 4-dimethylaminopyridine (3.2 mmol), and 32 mL of dimethylsulfoxide (DMSO) were added, and the mixture was stirred at 100° C. for 5 hours. After completion of the reaction, the reaction mixture was washed with an aqueous solution of ammonium chloride, and the organic layer was extracted with ethyl acetate. The residual moisture was removed by using magnesium sulfate. The residue was dried and separated by column chromatography to obtain 2.3 g of compound C-49 (yield: 56%).

| Compound | MW | M.P. |
|---|---|---|
| C-49 | 636.76 | 285° C. |

Device Examples 1 to 3: Producing an OLED Deposited with a Compound According to the Present Disclosure as a Host An OLED according to the present disclosure was produced as follows: A transparent electrode indium tin oxide (ITO) thin film (10 Ω/sq) on a glass substrate for an OLED (GEOMATEC CO., LTD., Japan) was subjected to an ultrasonic washing with acetone, ethanol and distilled water, sequentially, and then was stored in isopropanol. The ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr. Thereafter, an electric current was applied to the cell to evaporate the above-introduced material, thereby forming a first hole injection layer having a thickness of 80 nm on the ITO substrate. Next, compound HI-2 was introduced into another cell of the vacuum vapor deposition apparatus and was evaporated by applying an electric current to the cell, thereby forming a second hole injection layer having a thickness of 5 nm on the first hole injection layer. Compound HT-1 was then introduced into another cell of the vacuum vapor deposition apparatus and was evaporated by applying an electric current to the cell, thereby forming a first hole transport layer having a thickness of 10 nm on the second hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layers and the hole transport layers, a light-emitting layer was formed thereon as follows: The host material shown in Table 1 was introduced into one cell of the vacuum vapor depositing apparatus as a host, and compound D-39 was introduced into another cell as a dopant. The two materials were evaporated at different rates and the dopant was deposited in a doping amount of 3 wt % based on the total amount of the hosts and dopant to form a light-emitting layer having a thickness of 40 nm on the second hole transport layer. Next, compound ET-1 and compound EI-1 were evaporated at a rate of 1:1 in two other cells to deposit an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

Comparative Example 1: Producing an OLED Deposited with a Comparative Compound as a Host An OLED was produced in the same manner as in Device Example 1, except that compound A shown in Table 2 was used as a host of the light-emitting layer.

TABLE 1

| | Host Material | Driving Voltage (V) | Luminous Efficiency (cd/A) | Lifespan (T95, hr) |
|---|---|---|---|---|
| Comparative Example 1 | A | 9.2 | 9.2 | 0.25 |
| Device Example 1 | C-6 | 3.6 | 22.0 | 5.5 |
| Device Example 2 | C-2 | 3.4 | 17.6 | 6.5 |
| Device Example 3 | C-49 | 3.3 | 23.4 | 120 |

The OLED produced by using the organic electroluminescent compound according to the present disclosure as a host exhibited lower driving voltage, higher luminous efficiency, and longer lifespan properties than the OLED produced by using the comparative compound as a host.

TABLE 2
Organic Electroluminescent Material Used in the Device Examples and the Comparative Example
| Hole Injection Layer/ Hole Transport Layer | 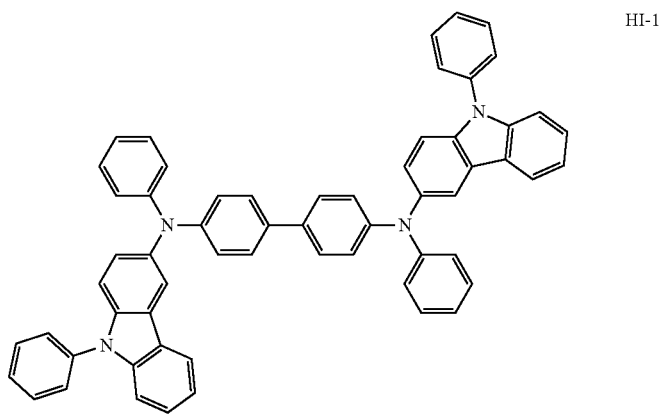 | HI-1 |
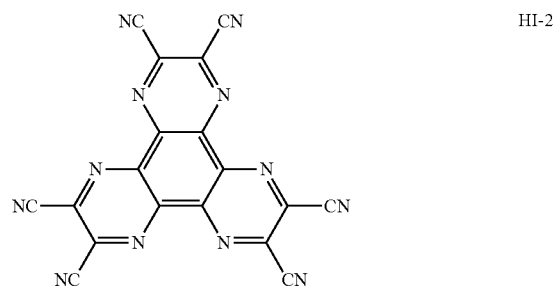
HI-2
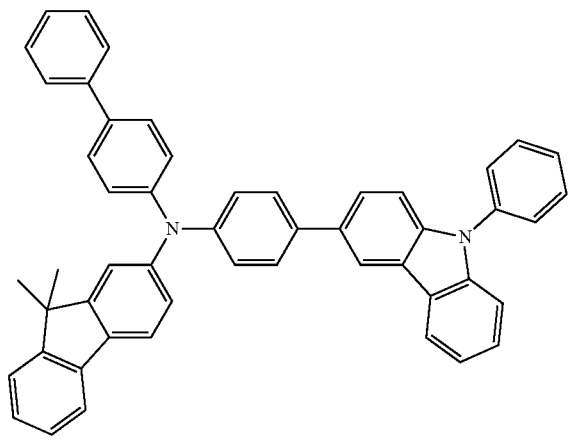 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
HT-1
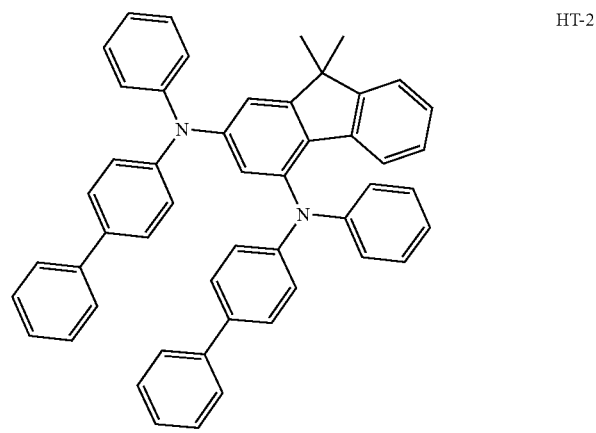
HT-2

TABLE 2-continued
Organic Electroluminescent Material Used in the Device Examples and the Comparative Example
| Light Emitting Layer | | |
|---|---|---|
| | 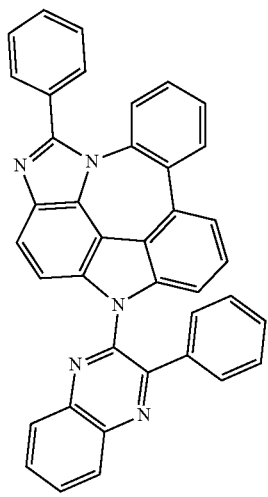 [SMILES: c1ccc(-c2nc3ccccc3nc2-n2c3cccc4c5ccccc5n5c(-c6ccccc6)nc6ccc2c(c43)c65)cc1] | C-6 |
| | 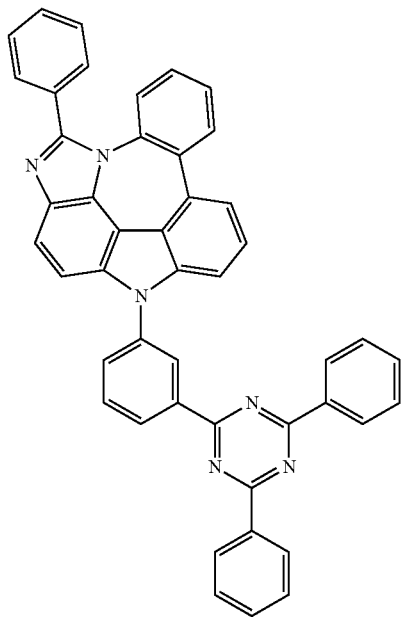 [SMILES: c1ccc(-c2nc(-c3ccccc3)nc(-c3cccc(-n4c5cccc6c7ccccc7n7c(-c8ccccc8)nc8ccc4c(c65)c87)c3)n2)cc1] | C-2 |
| | 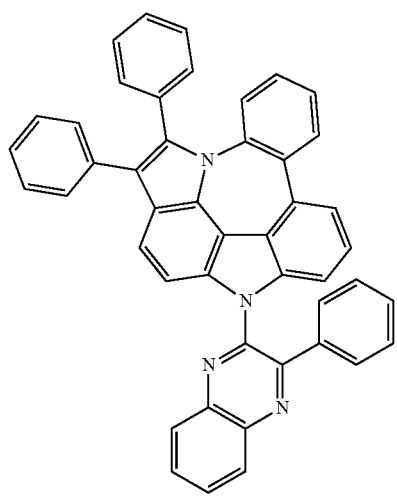 [SMILES: c1ccc(-c2nc3ccccc3nc2-n2c3cccc4c5ccccc5n5c(-c6ccccc6)c(-c6ccccc6)c6ccc2c(c43)c65)cc1] | C-49 |

TABLE 2-continued
Organic Electroluminescent Material Used in the Device Examples and the Comparative Example
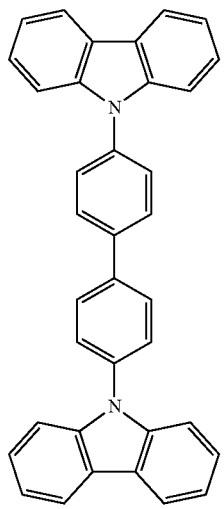 [SMILES: c1ccc2c(c1)c1ccccc1n2-c1ccc(-c2ccc(-n3c4ccccc4c4ccccc43)cc2)cc1]
A
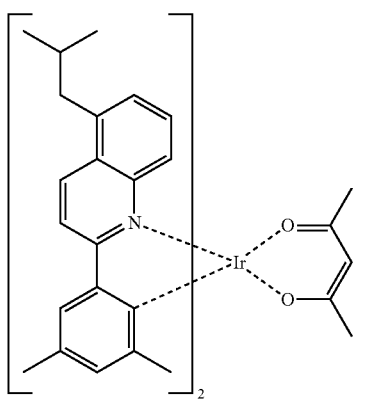
D-39
Electron Transport Layer/ Electron Injection Layer
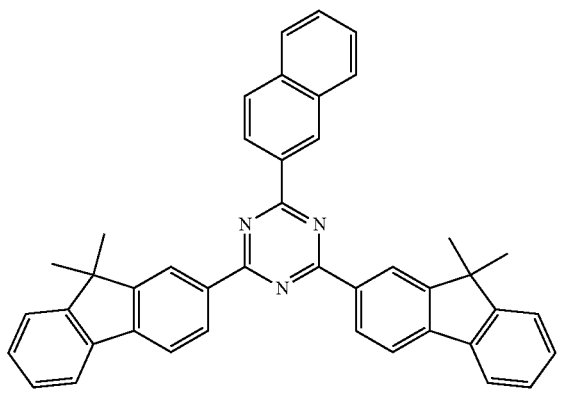 [SMILES: CC1(C)c2ccccc2-c2ccc(-c3nc(-c4ccc5c(c4)C(C)(C)c4ccccc4-5)nc(-c4ccc5ccccc5c4)n3)cc21]
ET-1
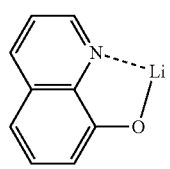
EI-1

The invention claimed is:

1. An organic electroluminescent compound represented by the following formula 1:

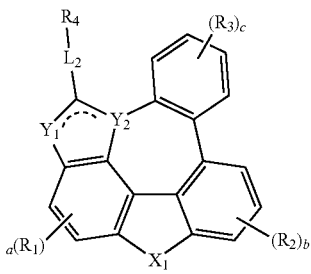

(1)

wherein $X_1$ represents —N($L_1$-$R_5$)—, —O—, —S— or —C($R_6$)($R_7$)—;

$Y_1$ represents —N=, —N($R_8$)—, —O—, —S—, —C($R_9$)= or —C($R_{10}$)($R_{11}$)—;

$Y_2$ represents —N— or —C=;

$L_1$ and $L_2$, each independently, represent a single bond, a substituted or unsubstituted (C6-C30)arylene, a substituted or unsubstituted (3- to 30-membered)heteroarylene, or a substituted or unsubstituted (C3-C30) cycloalkylene;

$R_1$ to $R_3$ and $R_6$ to $R_{11}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring;

$R_4$ and $R_5$, each independently, represent a substituted or unsubstituted (C6-C30)aryl, a substituted or unsubstituted (3- to 30-membered)heteroaryl, or a substituted or unsubstituted mono- or di-(C6-C30)arylamino; and a represents an integer of 1 or 2; b represents an integer of 1 to 3; c represents an integer of 1 to 4; where if a to c, each independently, are an integer of 2 or more, each of $R_1$, each of $R_2$, and each of $R_3$ may be the same or different.

2. The organic electroluminescent compound according to claim 1, wherein the substituents of the substituted (C1-C30)alkyl, the substituted (C6-C30)aryl(ene), the substituted (3- to 30-membered)heteroaryl(ene), the substituted (C3-C30)cycloalkyl(ene), the substituted (C1-C30)alkoxy, the substituted tri(C1-C30)alkylsilyl, the substituted di(C1-C30)alkyl(C6-C30)arylsilyl, the substituted (C1-C30)alkyldi(C6-C30)arylsilyl, the substituted tri(C6-C30)arylsilyl, the substituted mono- or di-(C1-C30)alkylamino, the substituted mono- or di-(C6-C30)arylamino, and the substituted (C1-C30)alkyl(C6-C30)arylamino in $L_1$, $L_2$, and $R_1$ to $R_{11}$, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (5- to 30-membered)heteroaryl unsubstituted or substituted with a (C6-C30)aryl; a (C6-C30)aryl unsubstituted or substituted with a (5- to 30-membered)heteroaryl; a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with a (C1-C30)alkyl; a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

3. The organic electroluminescent compound according to claim 1, wherein $L_1$ and $L_2$, each independently, represent a single bond, or any one of the following R-1 to R-4:

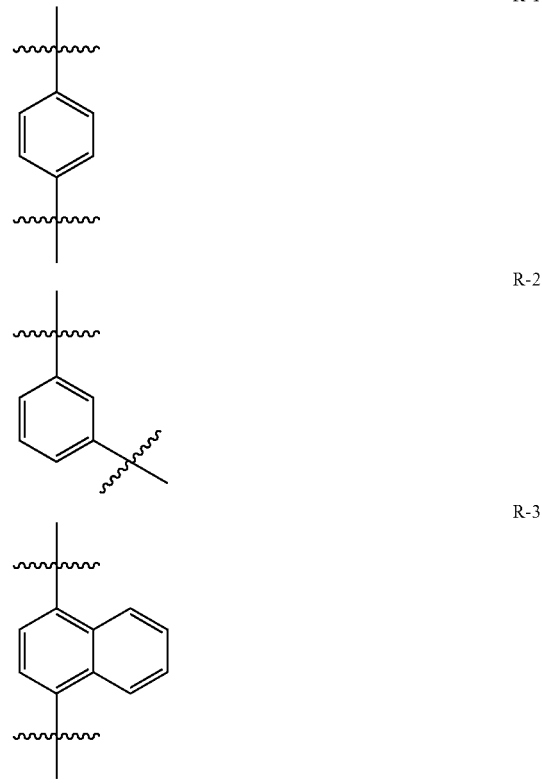

-continued

R-4

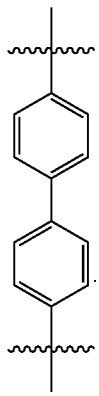

4. The organic electroluminescent compound according to claim 1, wherein $L_1$ and $L_2$, each independently, represent a single bond, a substituted or unsubstituted (C6-C15)arylene, or a substituted or unsubstituted (5- to 15-membered)heteroarylene;

$R_1$ to $R_3$, each independently, represent hydrogen, a substituted or unsubstituted (C6-C15)aryl, or a substituted or unsubstituted (5- to 15-membered)heteroaryl; or may be linked to an adjacent substituent to form a ring;

$R_4$ and $R_5$, each independently, represent a substituted or unsubstituted (C6-C15)aryl, a substituted or unsubstituted (5- to 15-membered)heteroaryl, or a substituted or unsubstituted mono- or di-(C6-C15)arylamino;

$R_6$ to $R_{11}$, each independently, represent a substituted or unsubstituted (C1-C6)alkyl, or a substituted or unsubstituted (C6-C15)aryl; and a, b and c, each independently, represent 1 or 2.

5. The organic electroluminescent compound according to claim 1, wherein $L_1$ and $L_2$, each independently, represent a single bond, or an unsubstituted (C6-C15)arylene;

$R_1$ to $R_3$, each independently, represent hydrogen, an unsubstituted (C6-C15)aryl, or an unsubstituted (5- to 15-membered)heteroaryl; or may be linked to an adjacent substituent to form a ring;

$R_4$ and $R_5$, each independently, represent an unsubstituted (C6-C15)aryl; a (5- to 15-membered)heteroaryl unsubstituted or substituted with a (C6-C15)aryl; a (5- to 15-membered)heteroaryl substituted with a (C6-C15)aryl and a (5- to 15-membered)heteroaryl; or a mono- or di-(C6-C15)arylamino unsubstituted or substituted with a (C1-C6)alkyl;

$R_6$ to $R_{11}$, each independently, represent an unsubstituted (C1-C6)alkyl, or an unsubstituted (C6-C15)aryl; and a, b and c, each independently, represent 1 or 2.

6. The organic electroluminescent compound according to claim 1, wherein the compound represented by the formula 1 is selected from the group consisting of the following compounds:

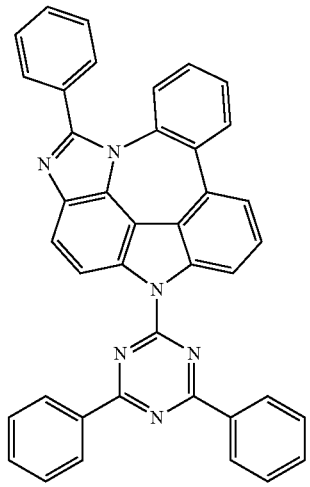

C-1

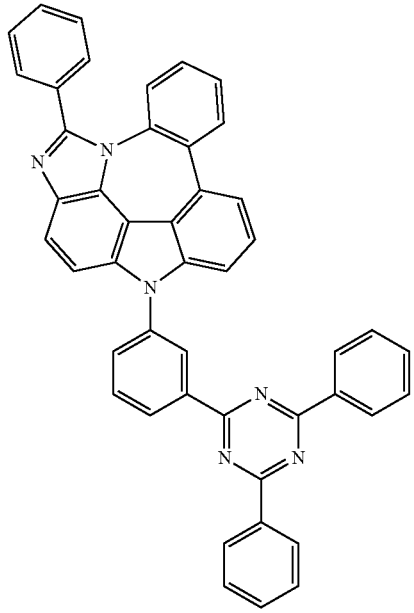

C-2

201
-continued
C-3
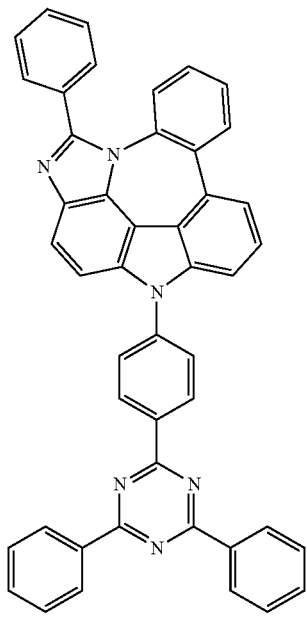
202
-continued
C-5
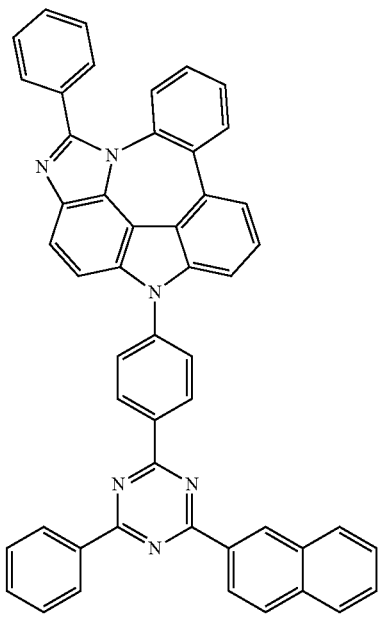
C-4
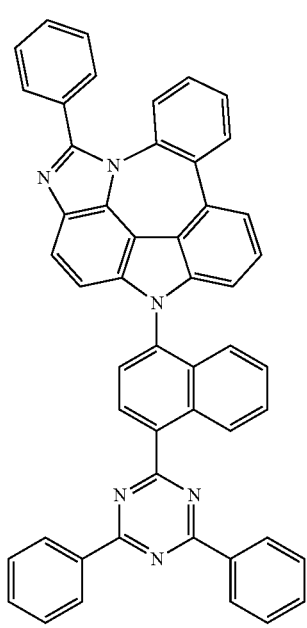
C-6
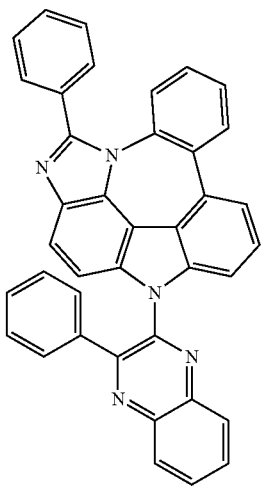

C-7
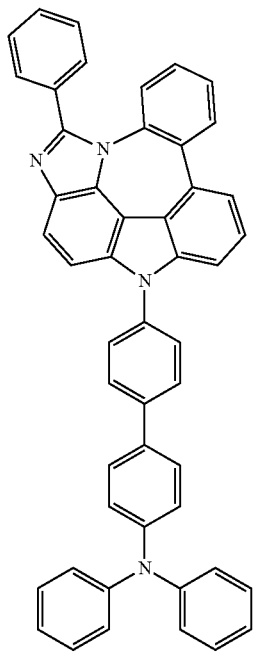
C-8
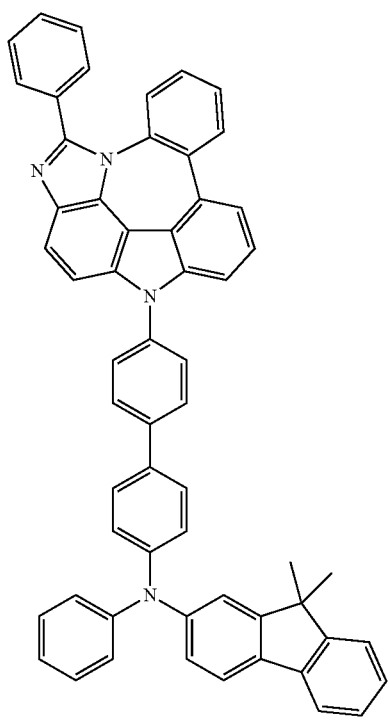
C-9
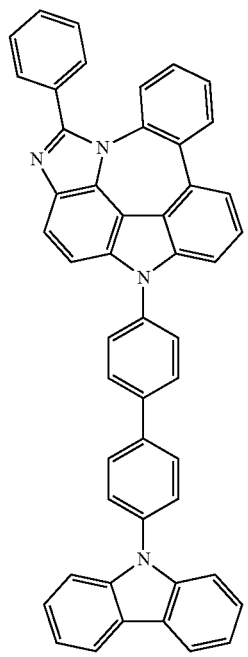
C-10
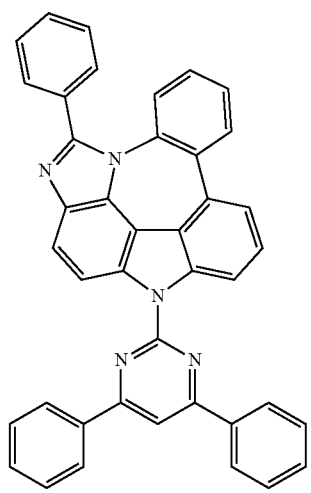
C-11
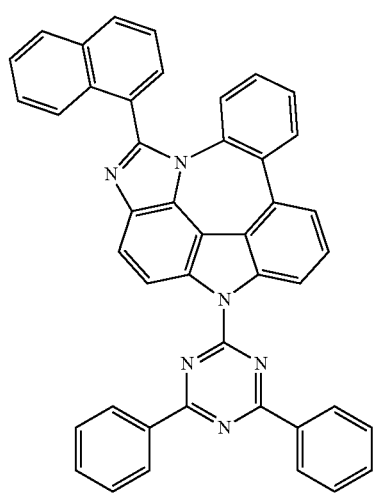

C-12
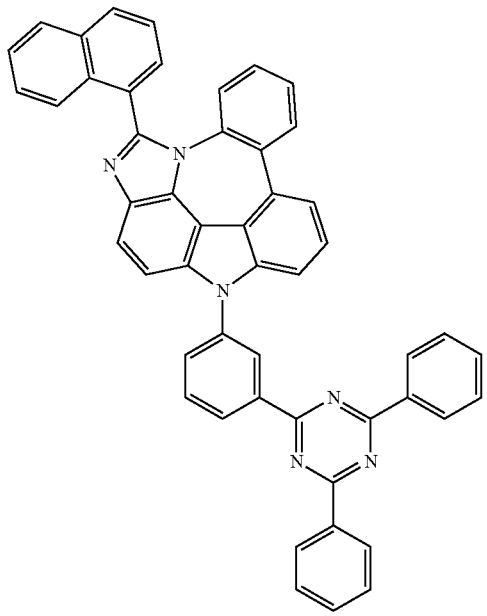
C-13
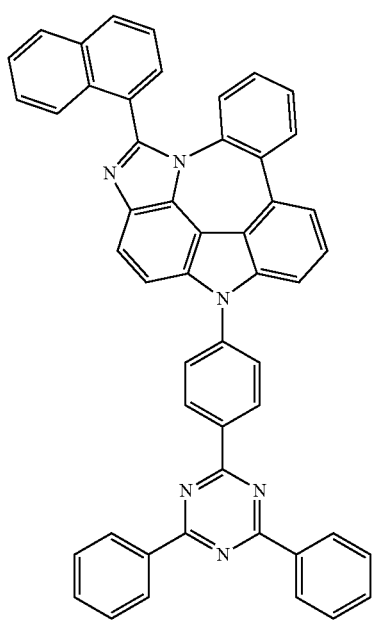
C-14
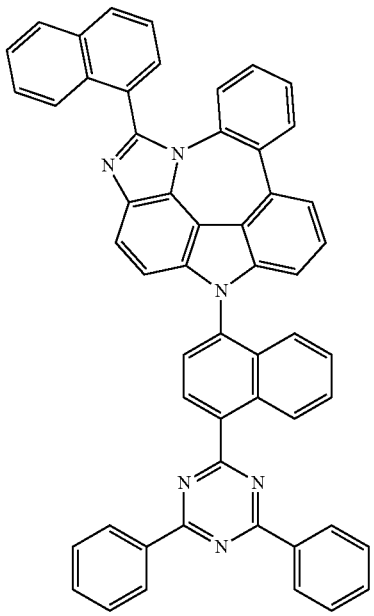
C-15
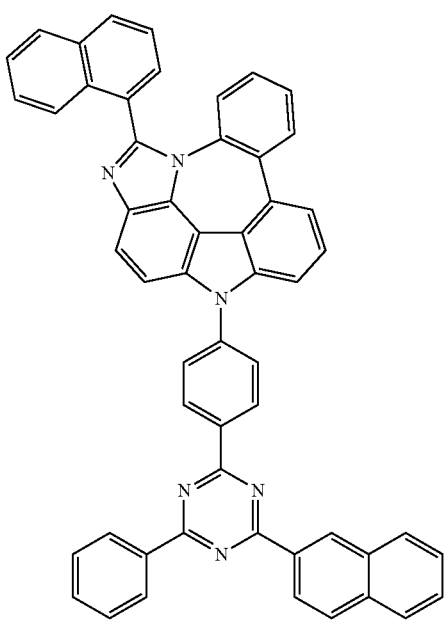

C-16
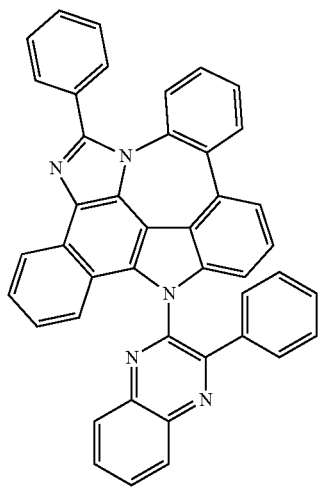
C-17
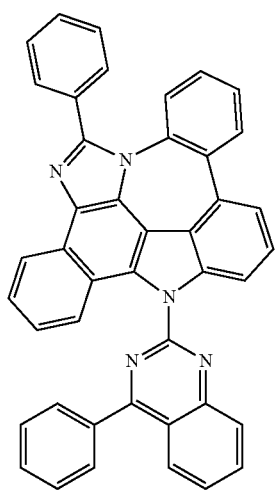
C-18
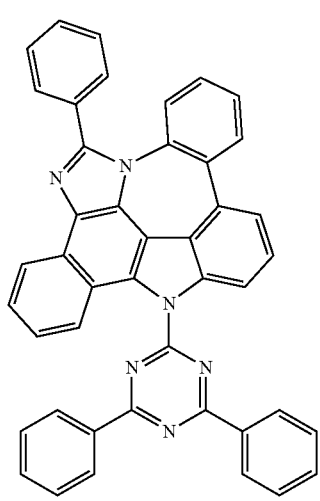
C-19
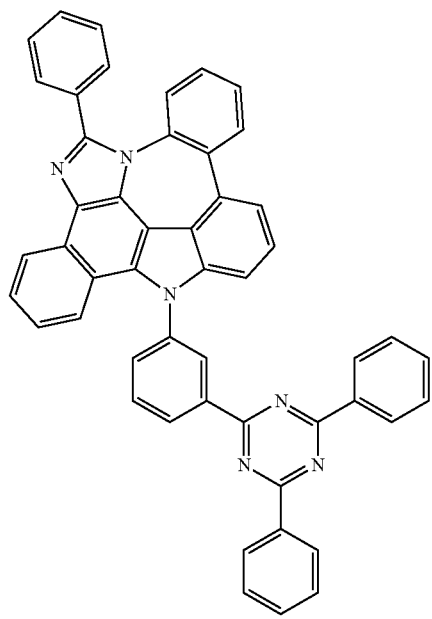
C-20
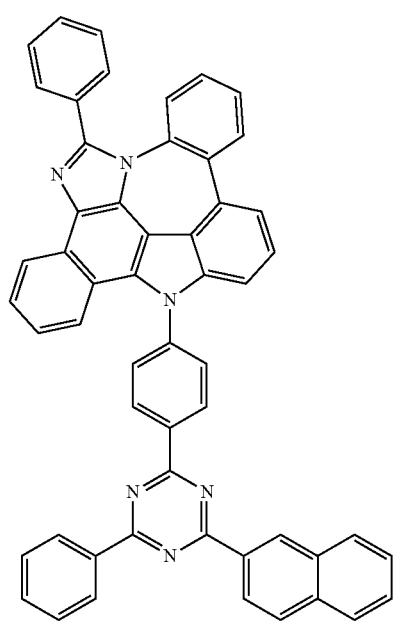
C-21
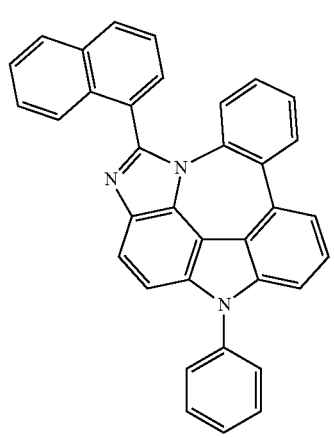

C-22 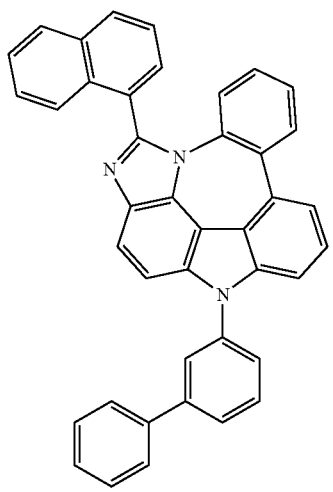
C-23 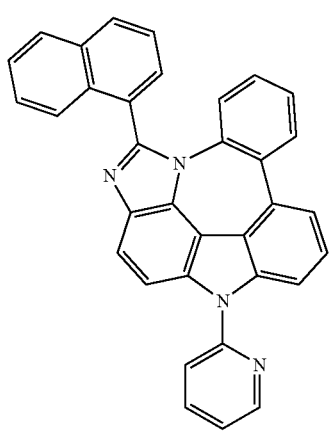
C-24 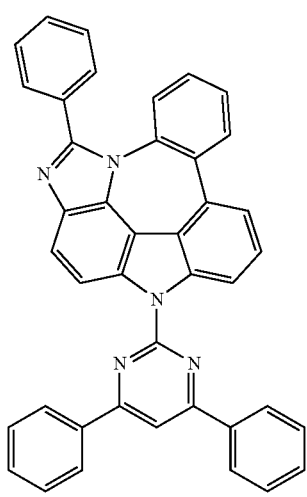
C-25 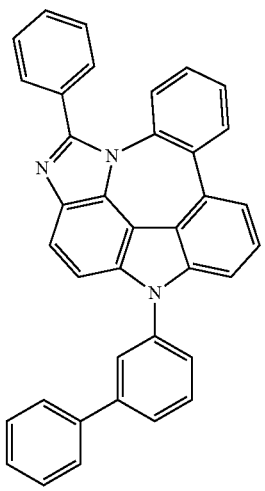
C-26
C-27 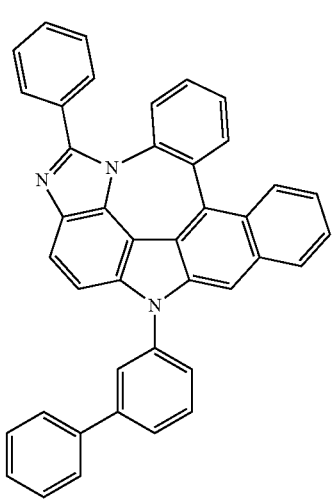

C-28
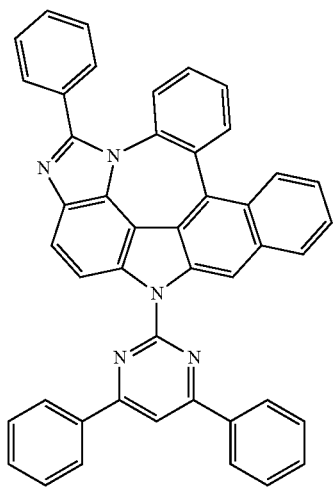
C-30
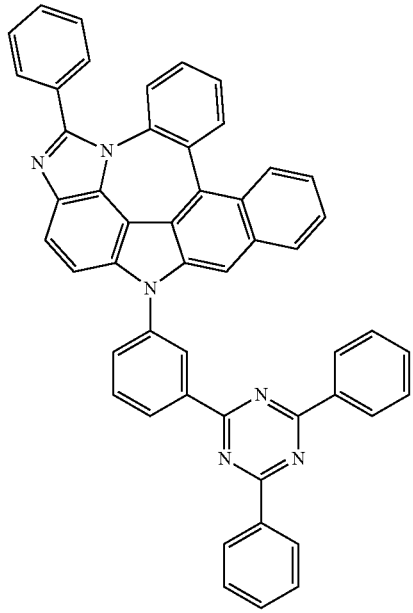
C-29
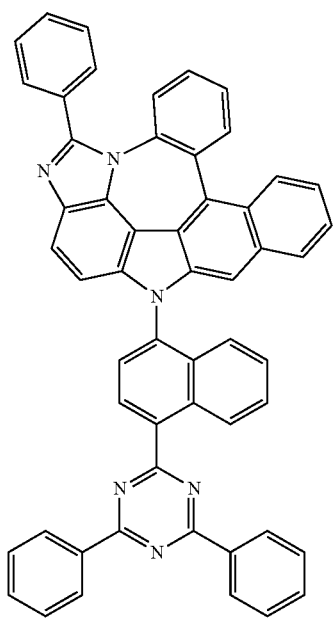
C-31
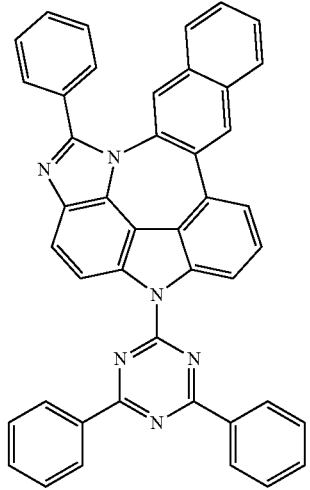

-continued
C-32
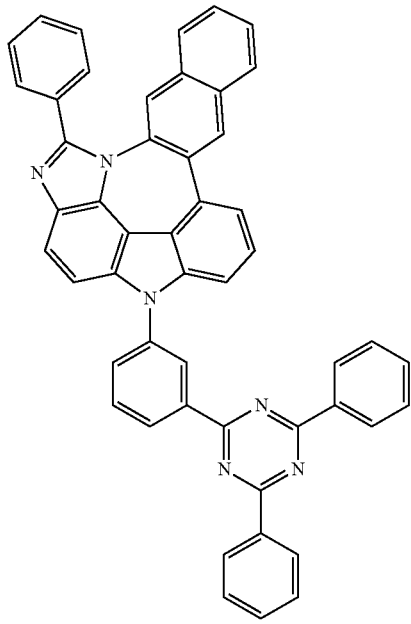
C-33
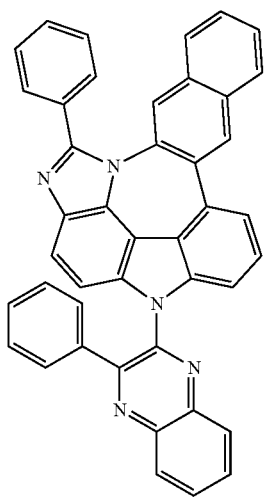
C-34
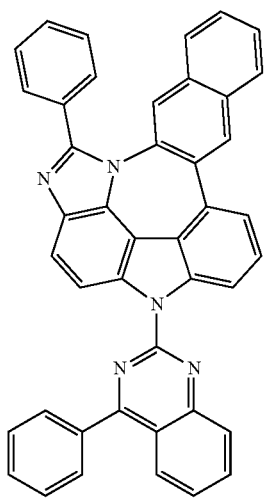
-continued
C-35
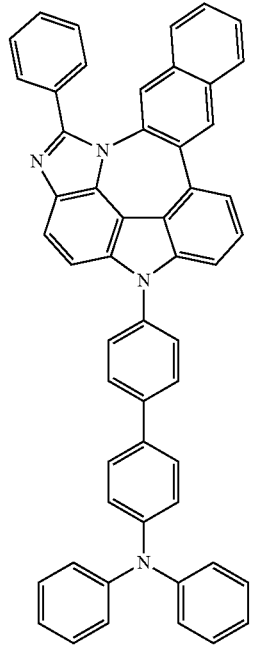
C-36
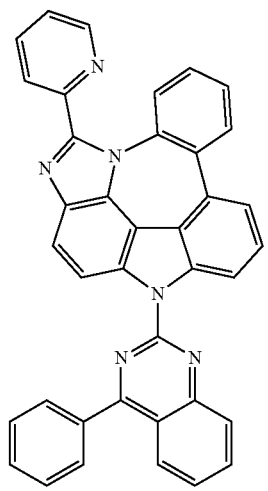
C-37

C-38
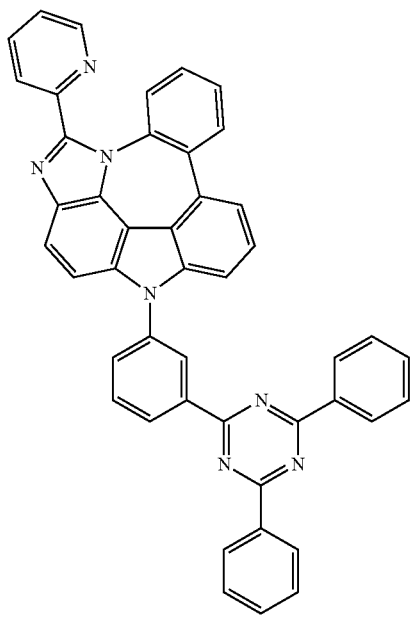
C-39
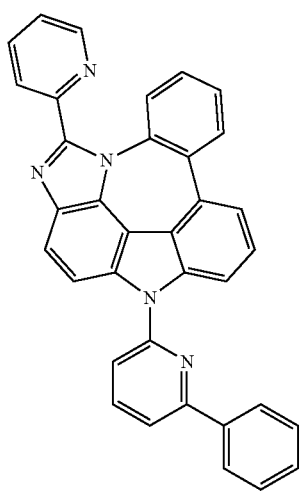
C-40
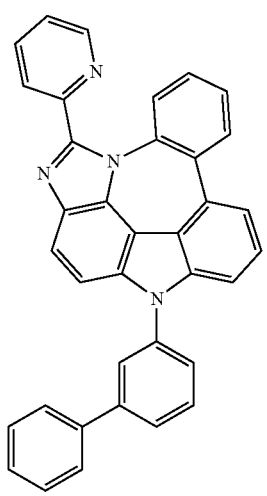
C-41
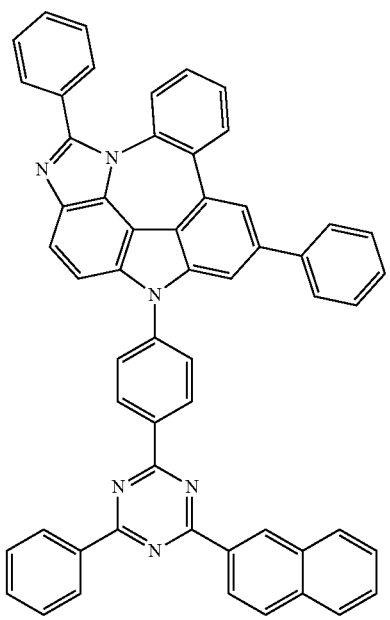
C-42
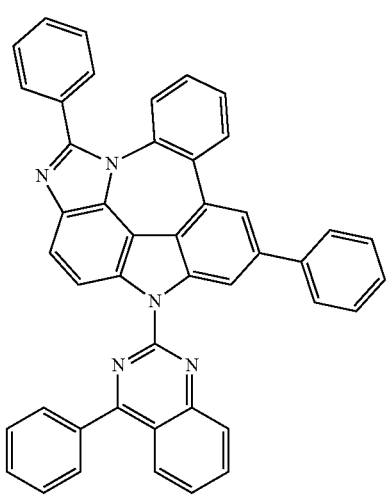
C-43
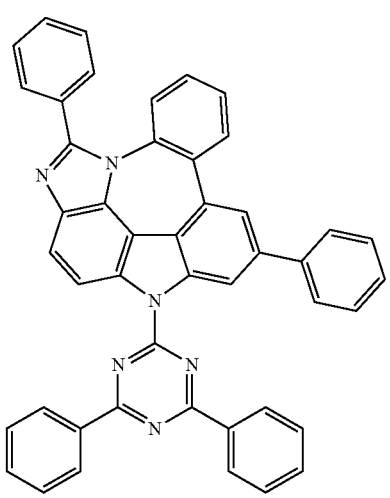

C-44
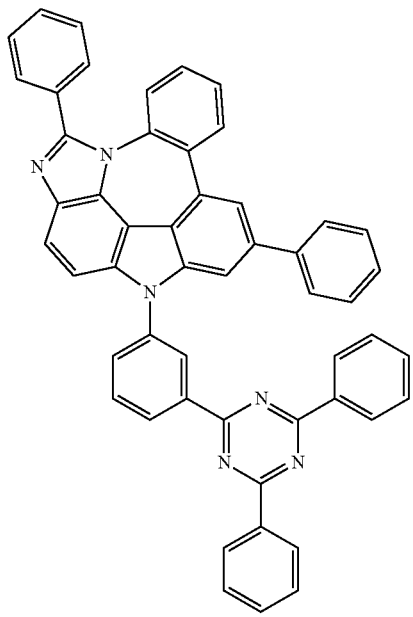
C-45
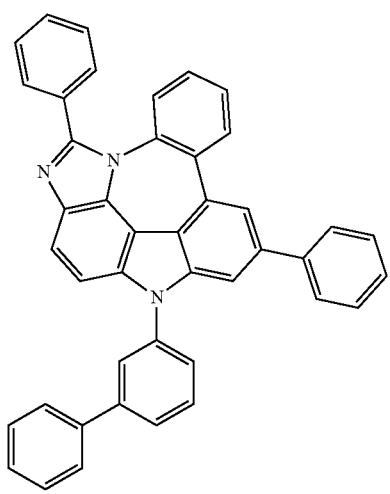
C-46
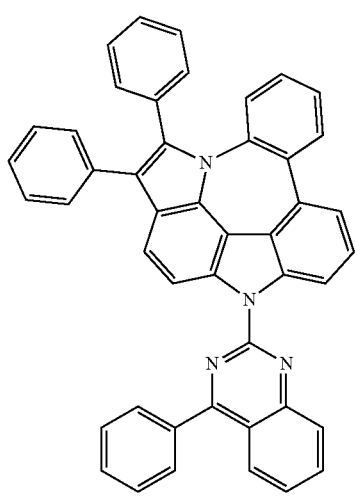
C-47
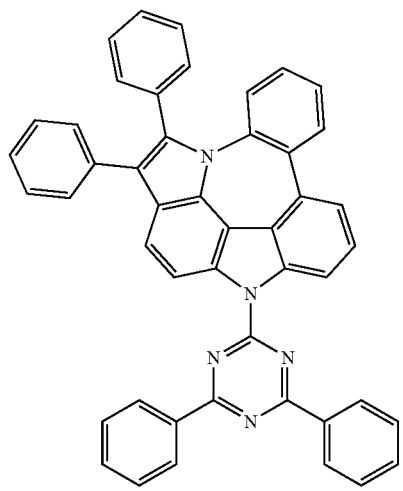
C-48
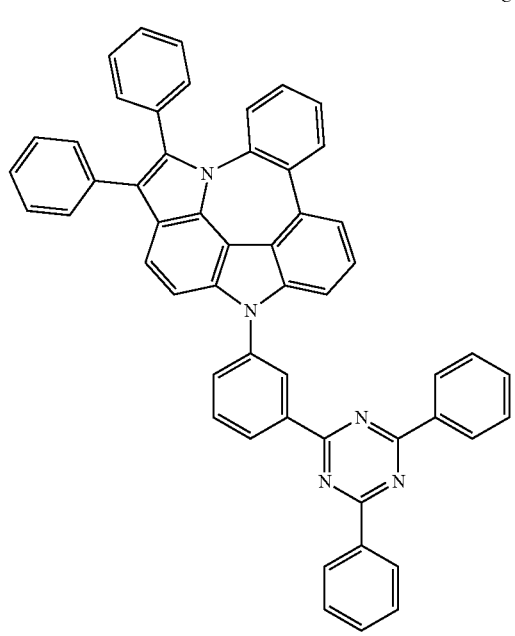
C-49
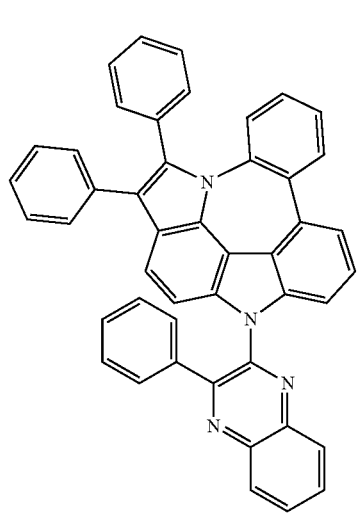

C-50
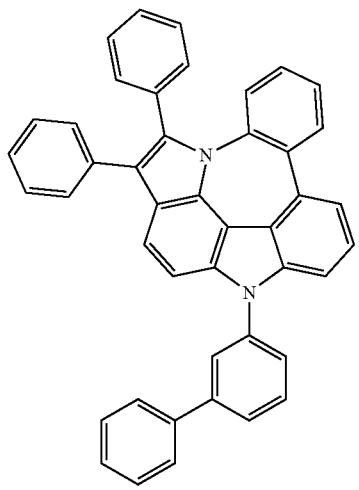
C-51
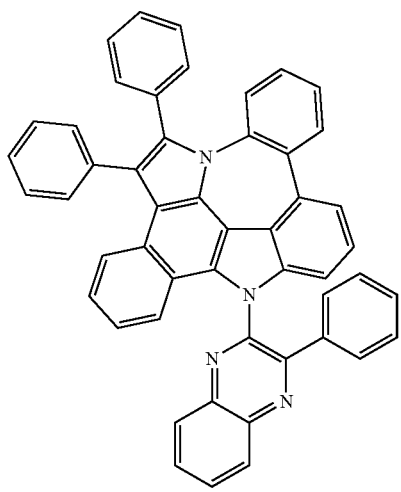
C-52
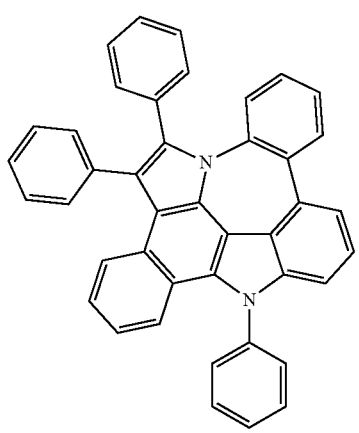
C-53
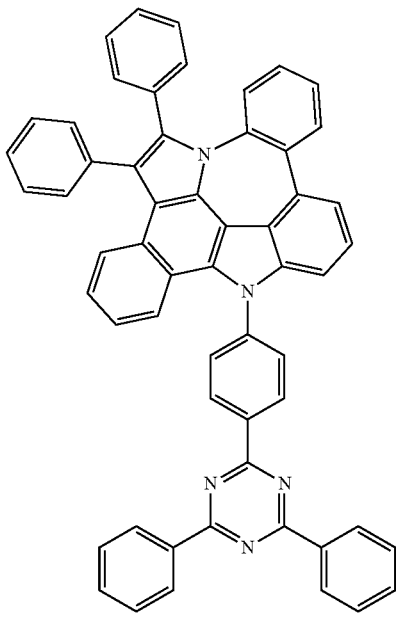
C-54
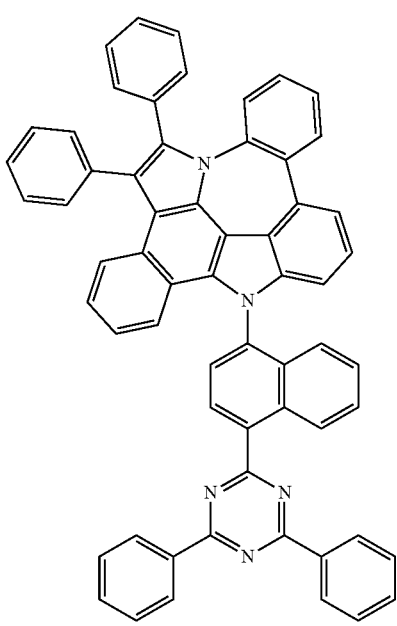

C-55
C-56
C-57
C-58
C-59
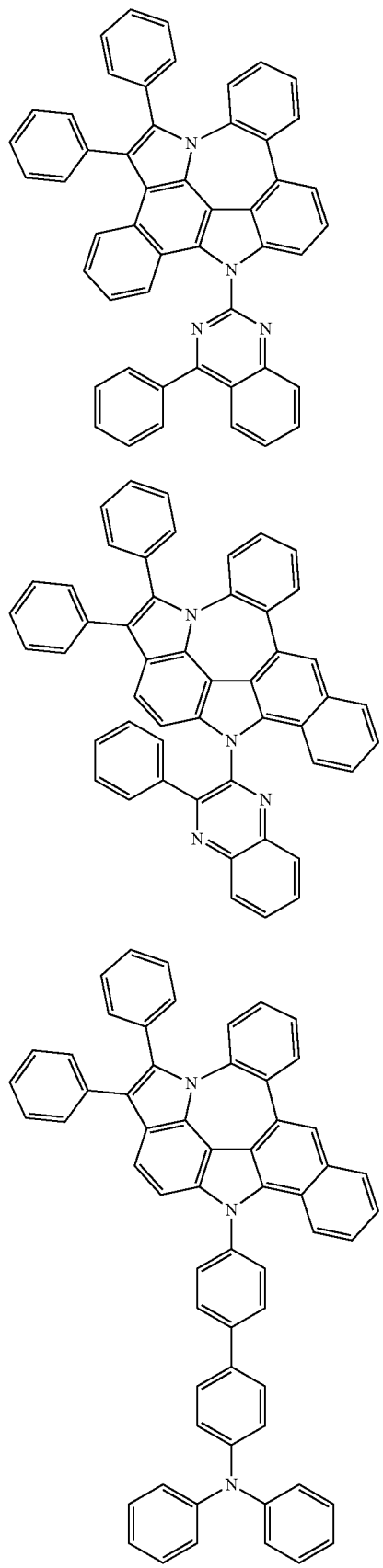
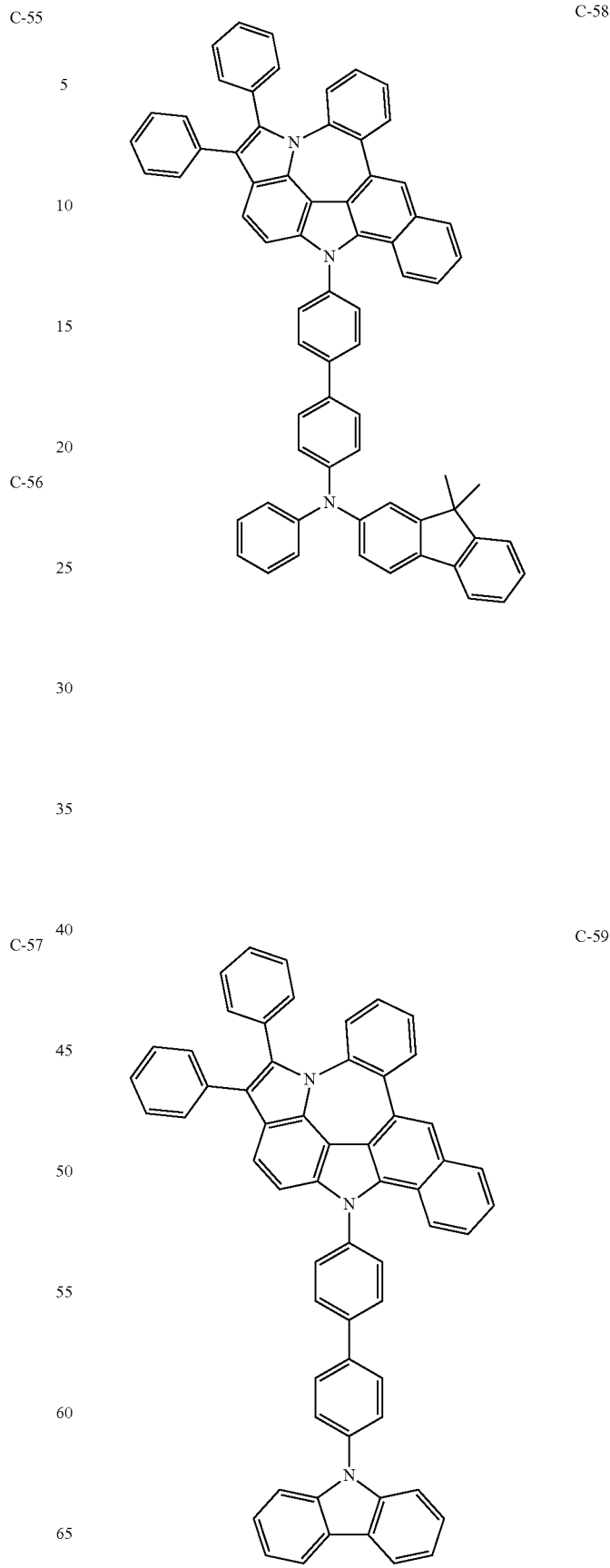

C-60
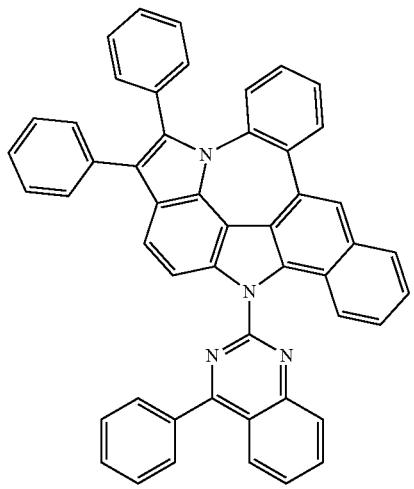
C-63
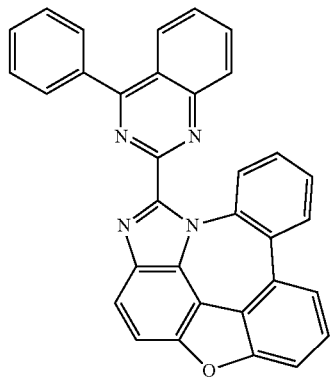
C-61
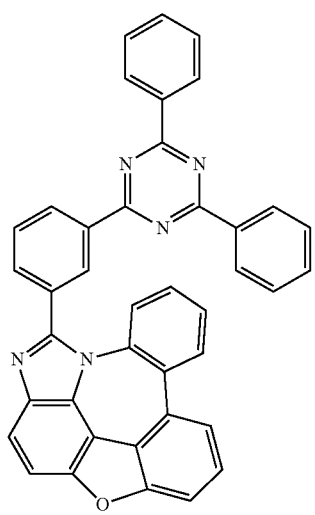
C-64
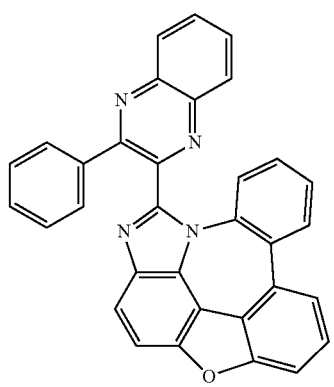
C-62
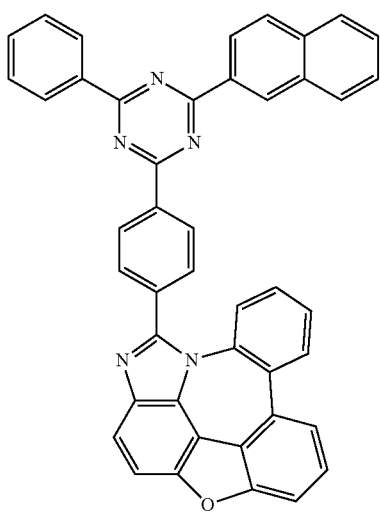
C-65
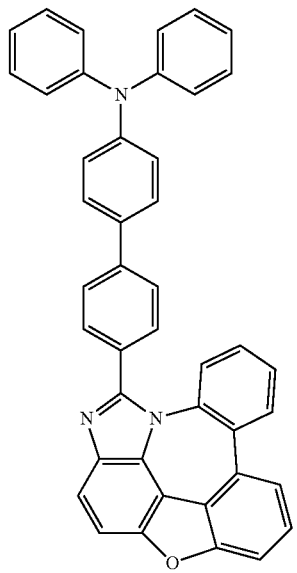

C-66
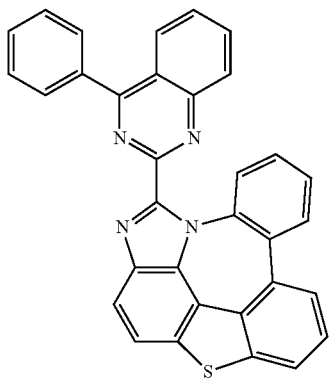
C-69
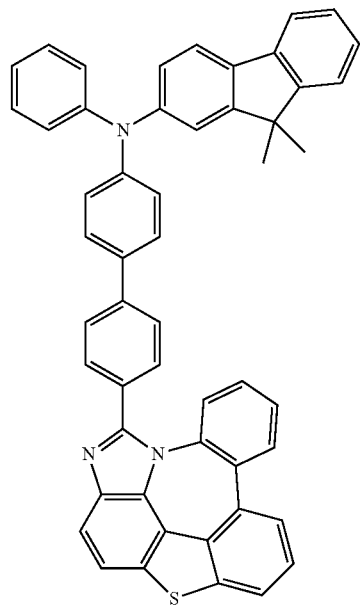
C-67
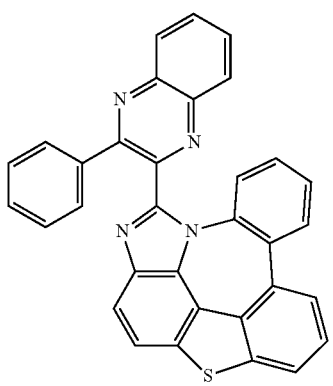
C-70
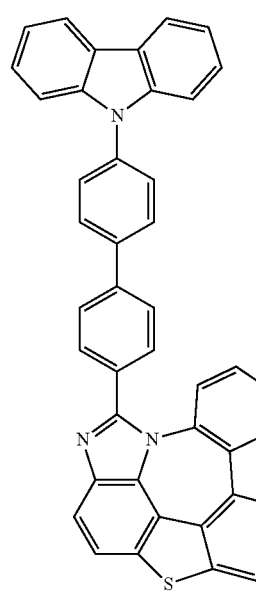
C-68
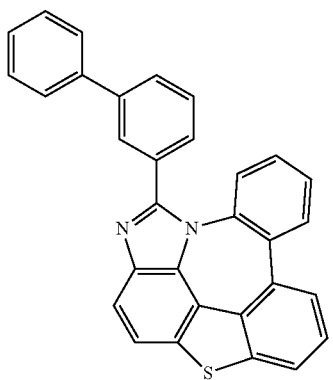
C-71
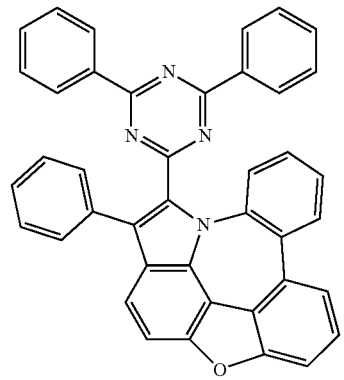

-continued
C-72
C-73
C-74
C-75
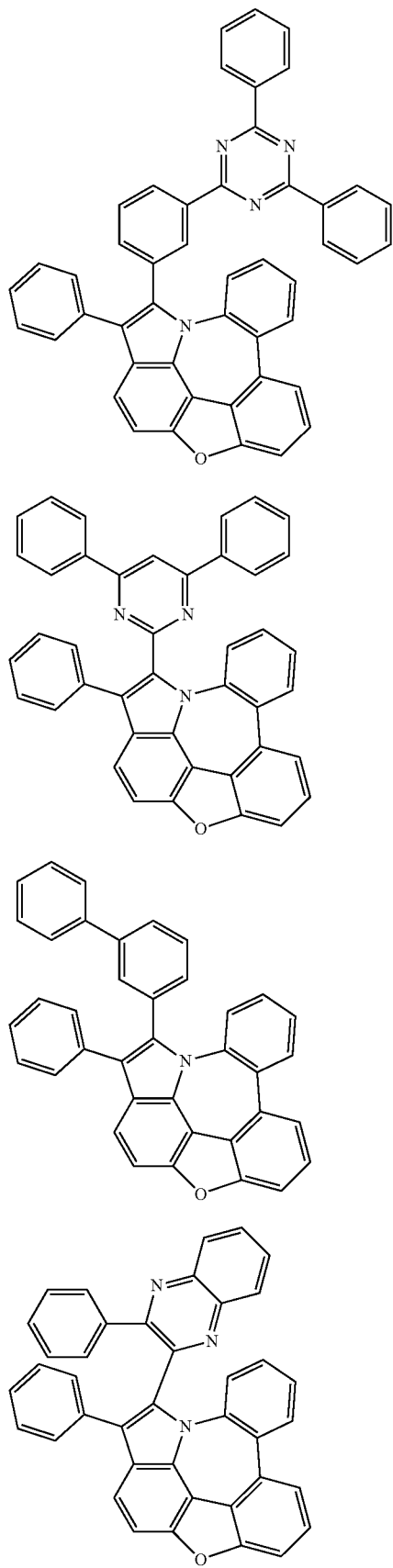
-continued
C-76
C-77
C-78
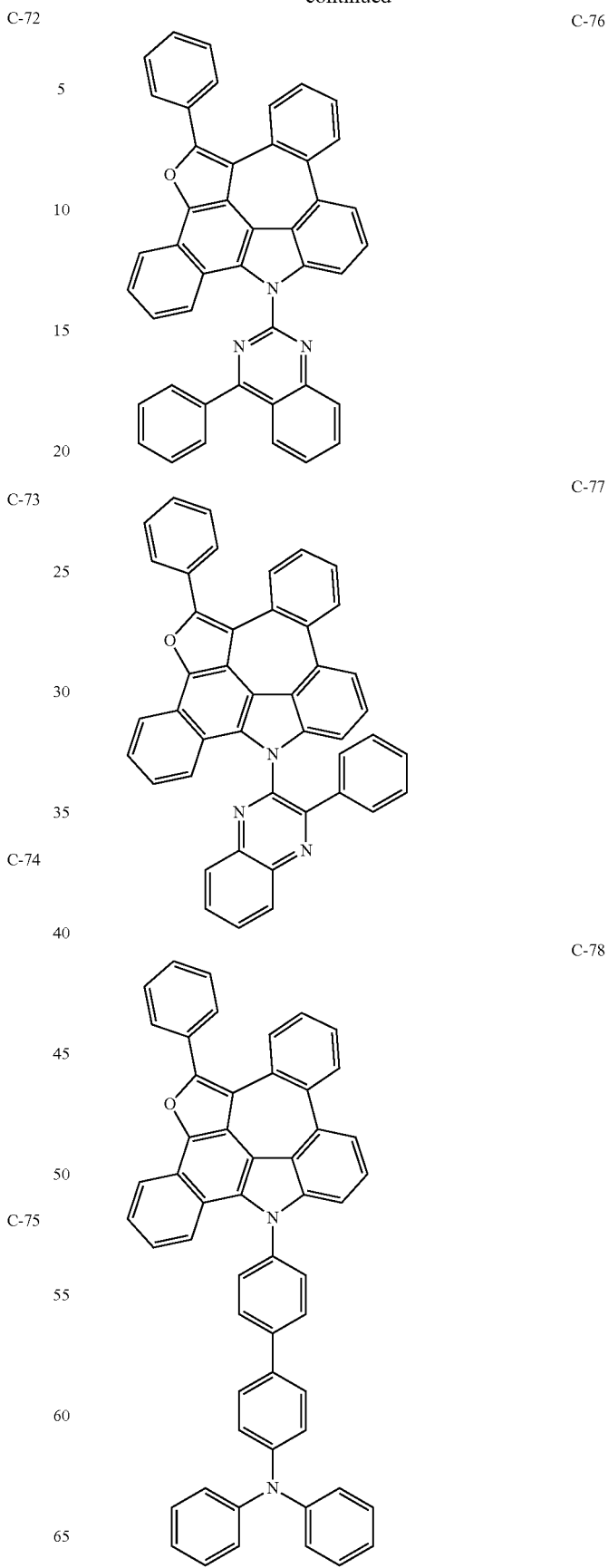

C-79
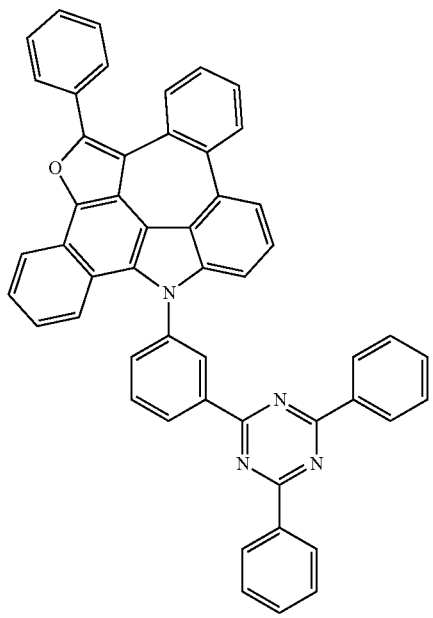
C-80
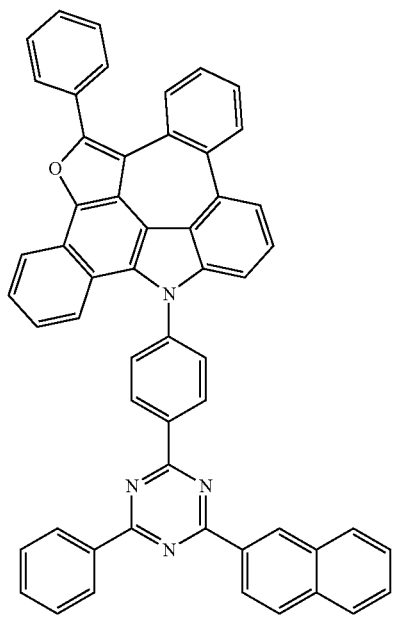
C-81
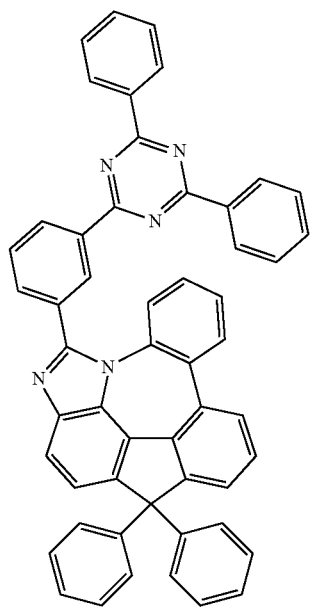
C-82
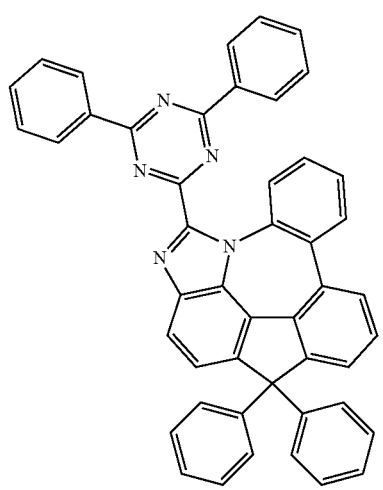
C-83
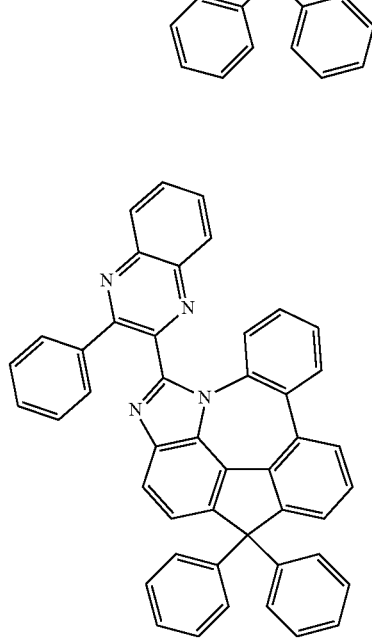

C-84
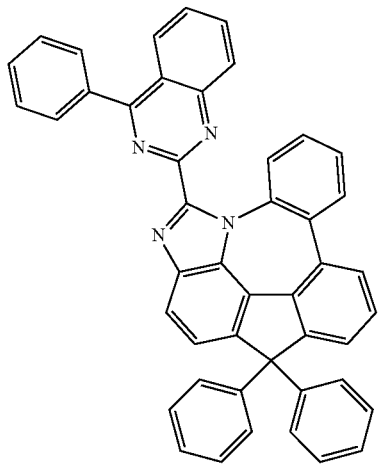
C-85
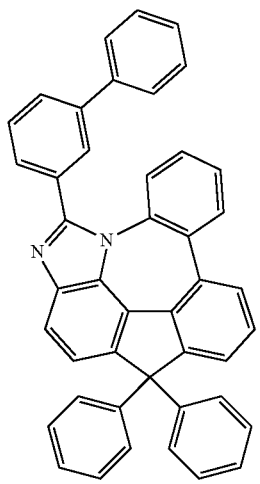
C-86
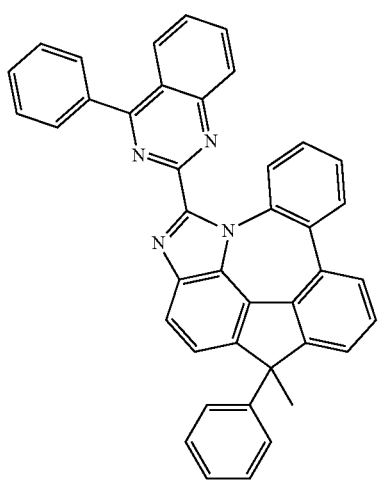
C-87
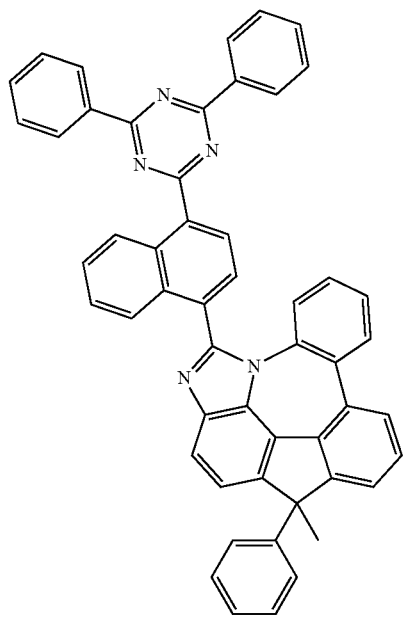
C-88
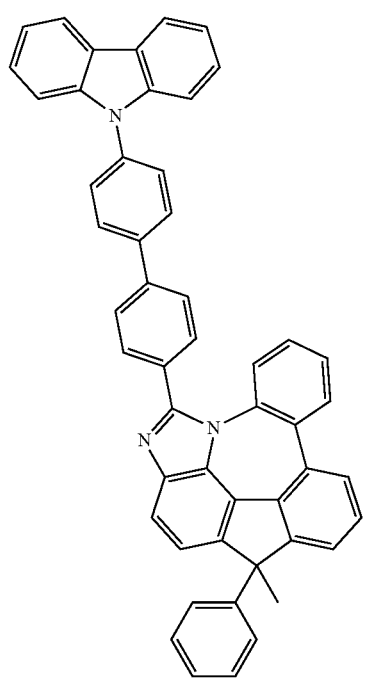

C-89
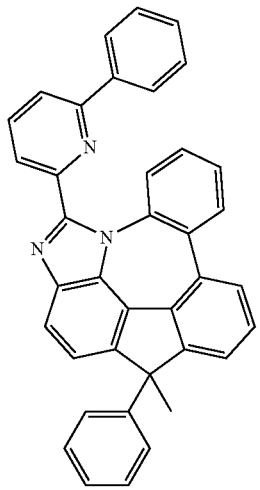
C-91
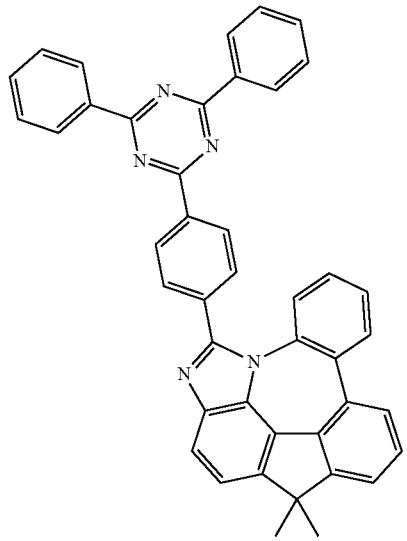
C-90
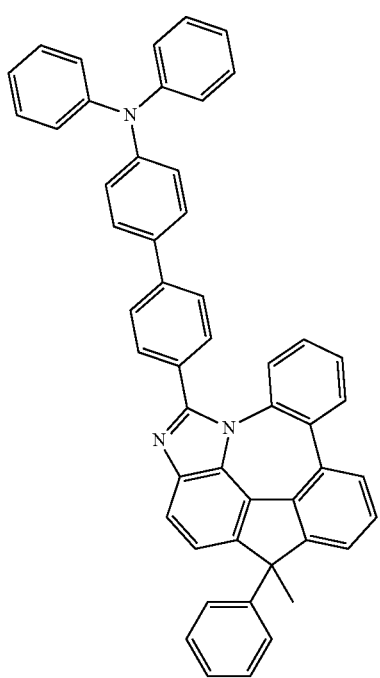
C-92
C-93
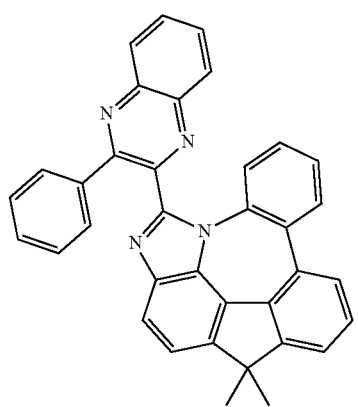

-continued
C-94
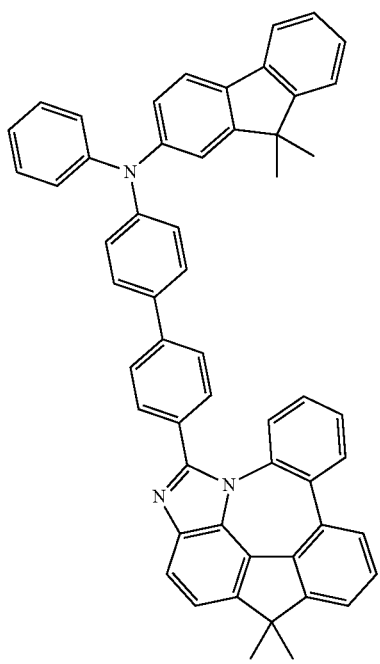
C-95
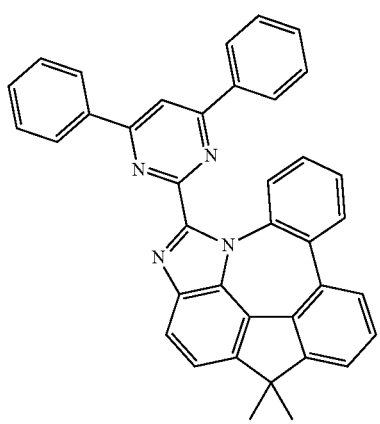
C-96
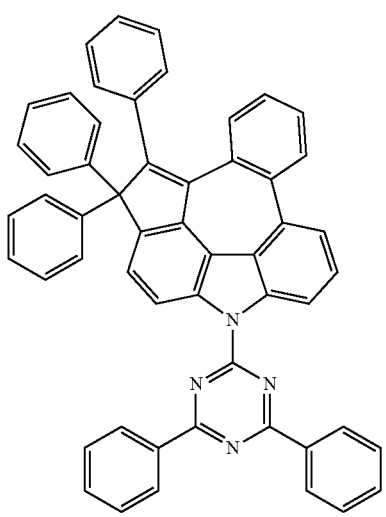
-continued
C-97
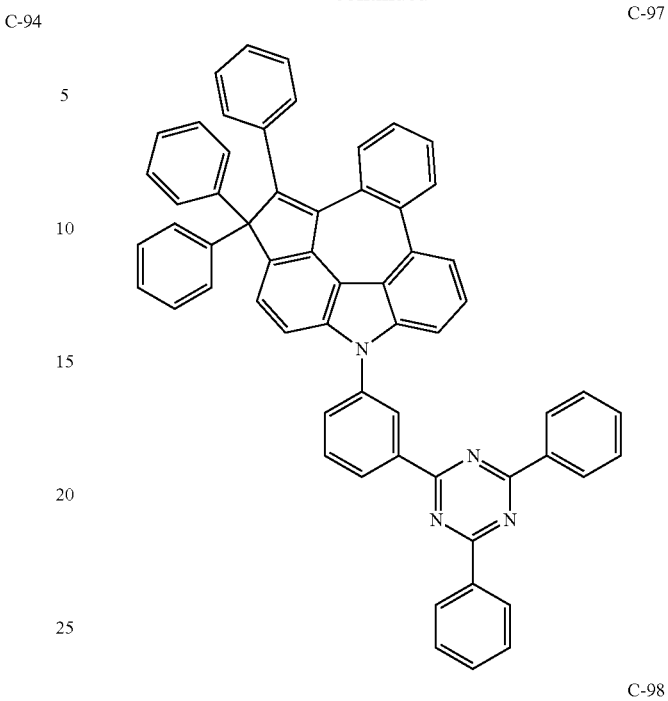
C-98
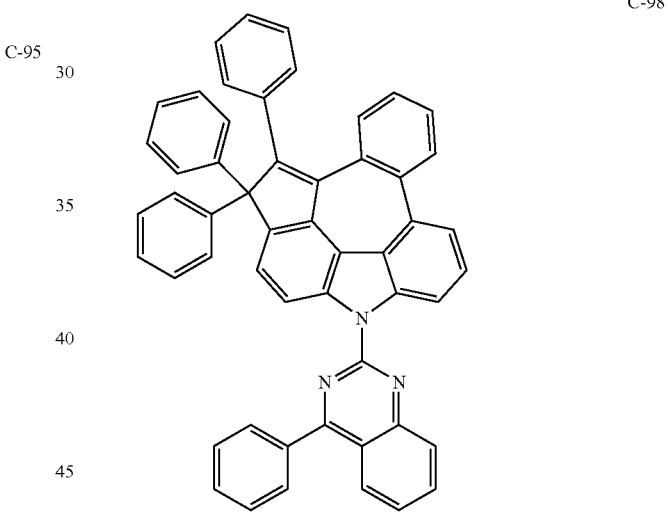
C-99
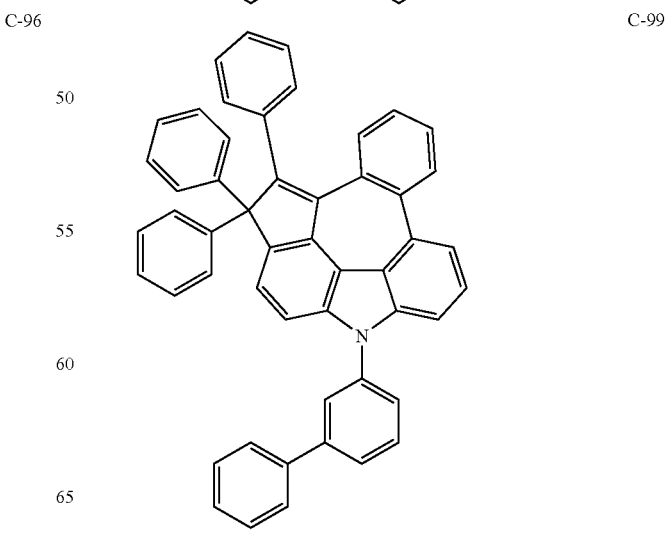

C-100
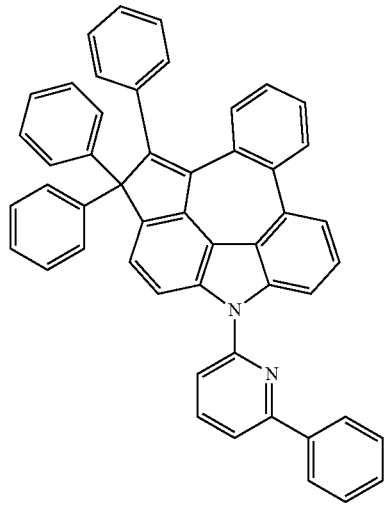
C-101
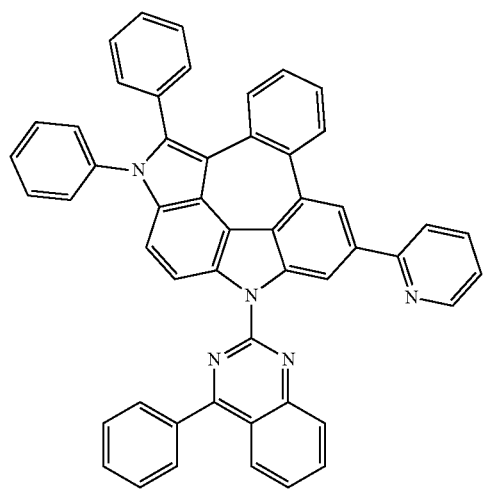
C-102
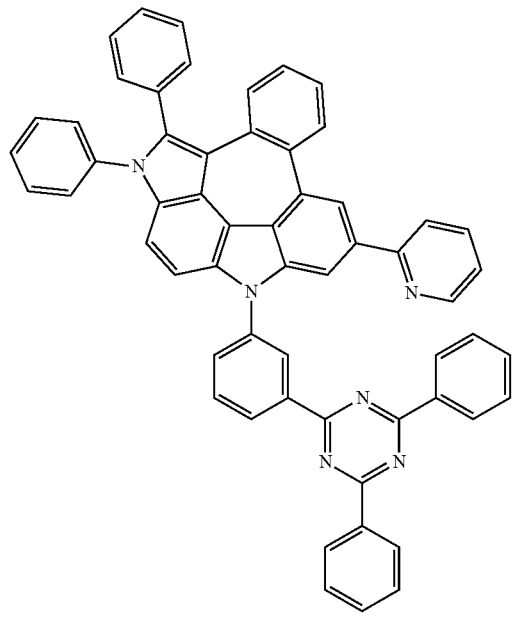
C-103
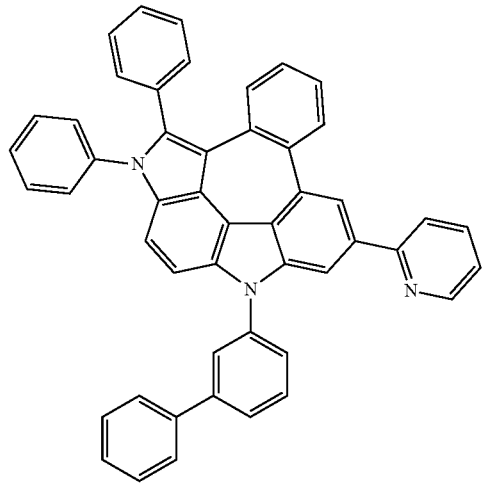
C-104
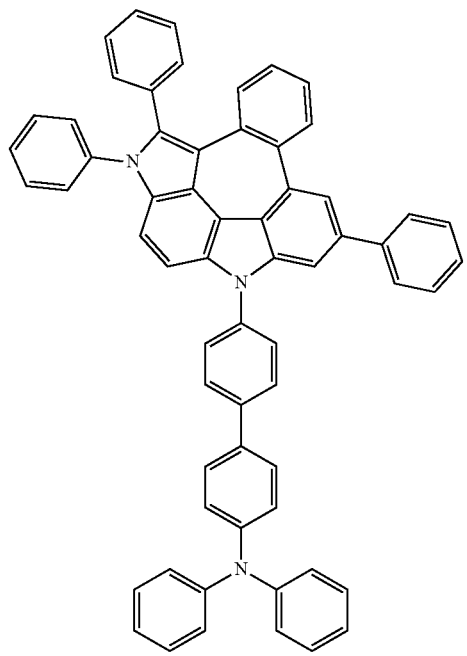
C-105
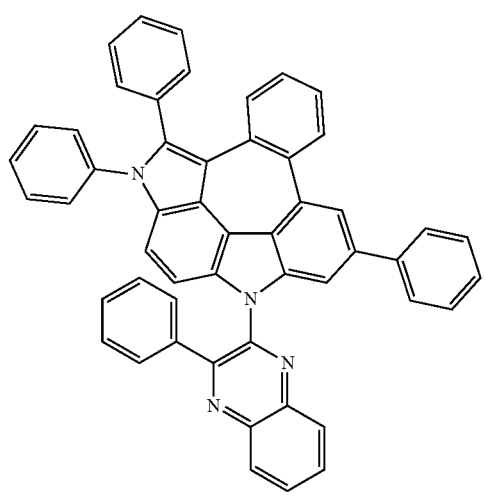

C-106
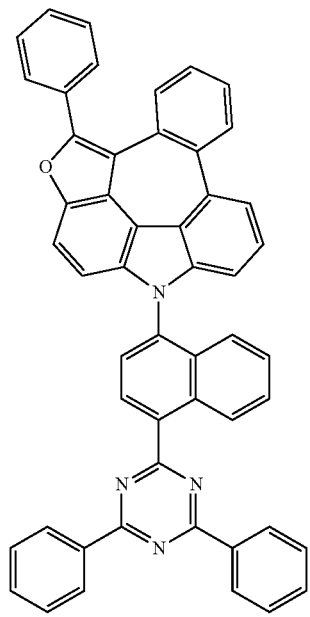
C-107
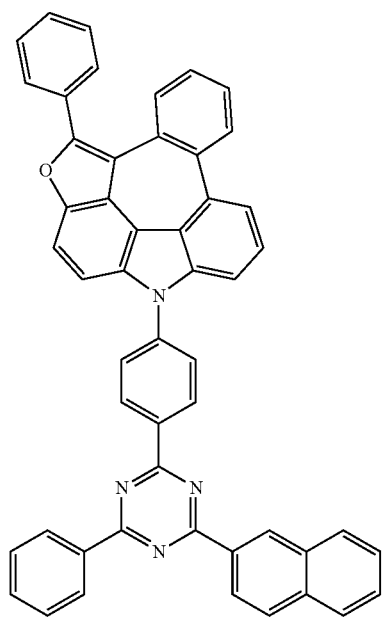
C-108
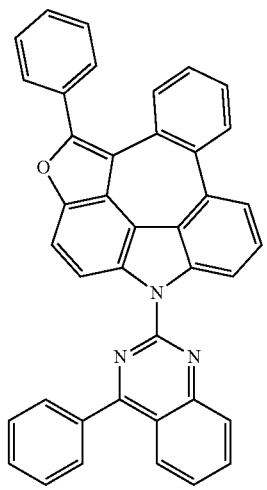
C-109
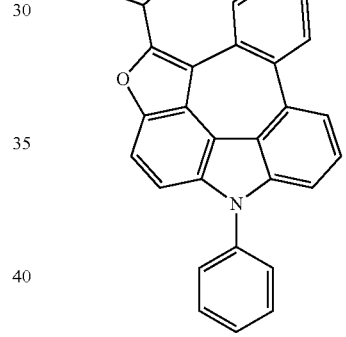
C-110
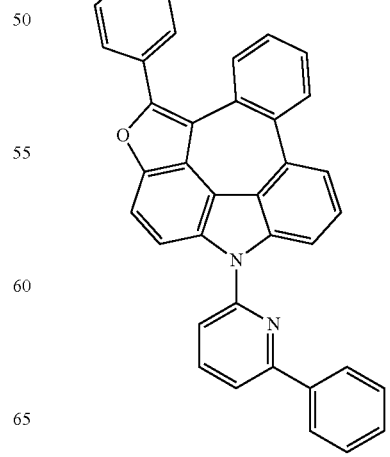

-continued
C-111
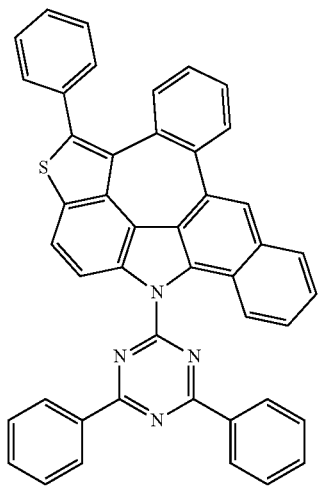
C-112
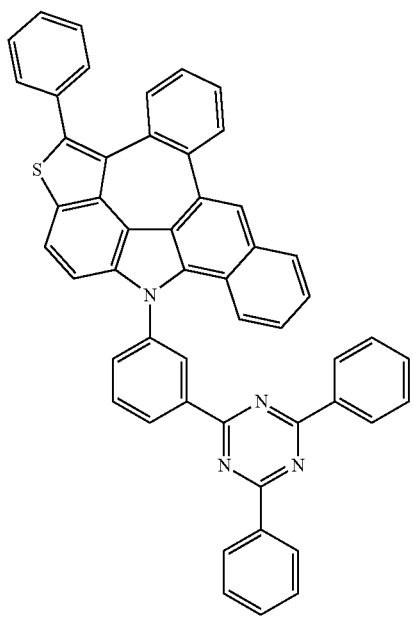
C-113
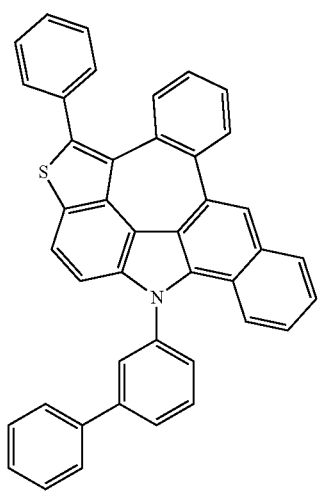
-continued
C-114
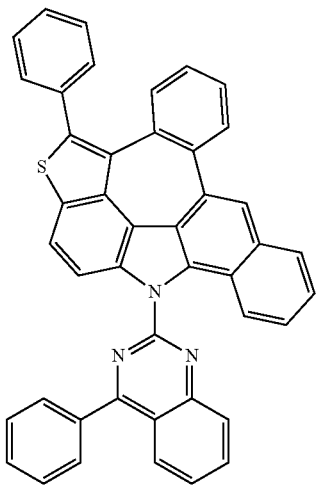
C-115
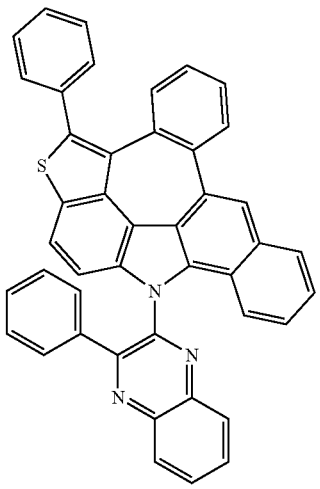
C-116
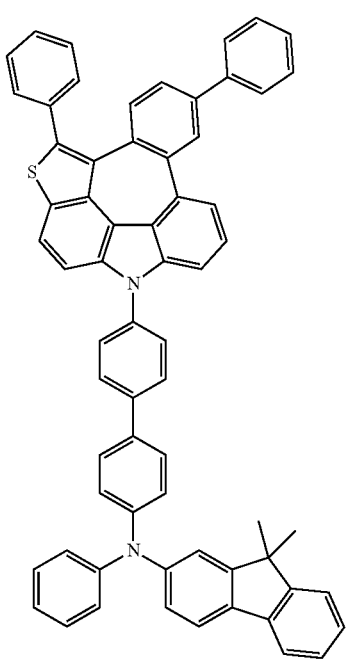

C-117
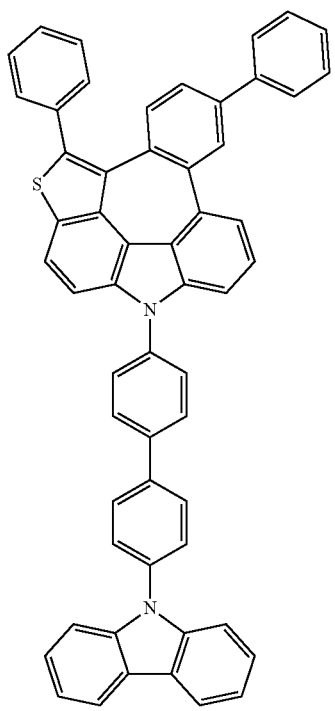
C-118
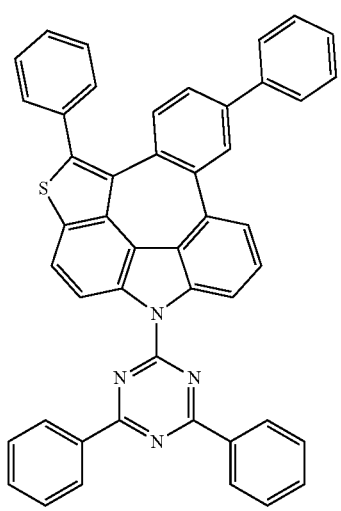
C-119
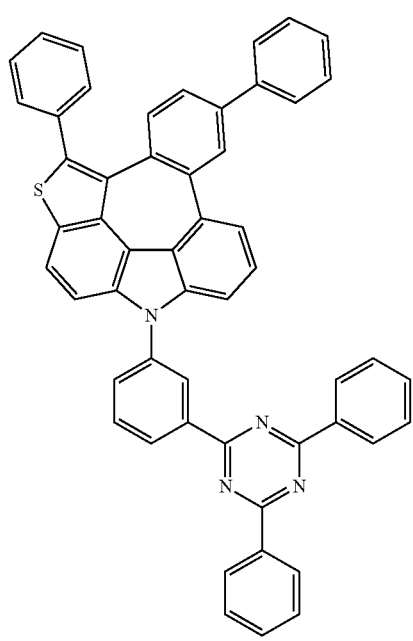
C-120
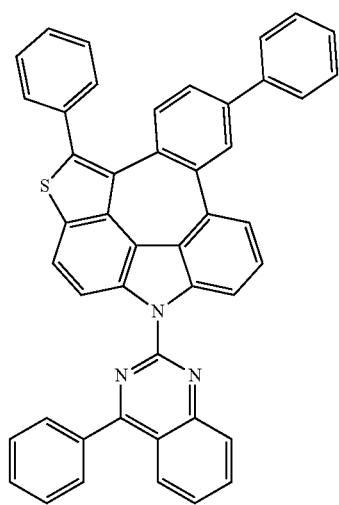

C-121
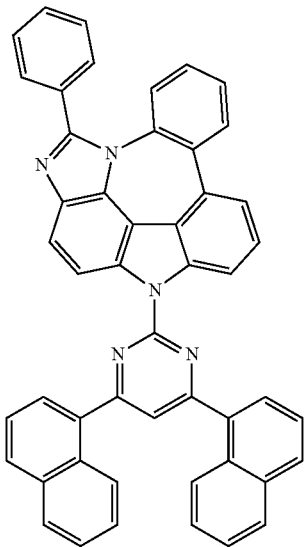
C-124
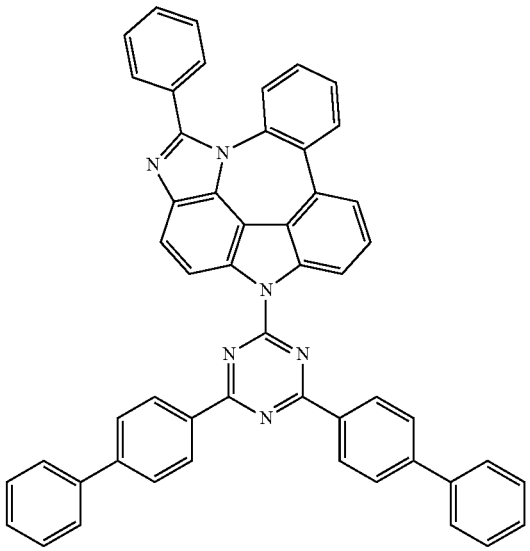
C-122
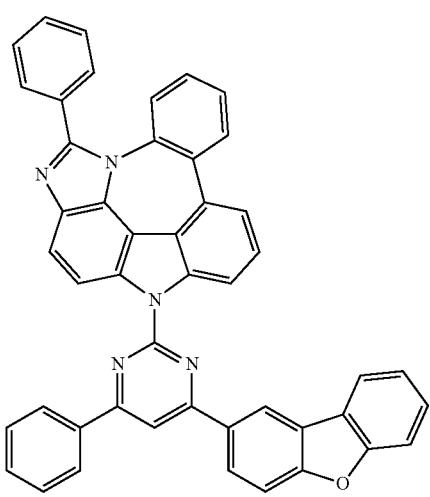
C-125
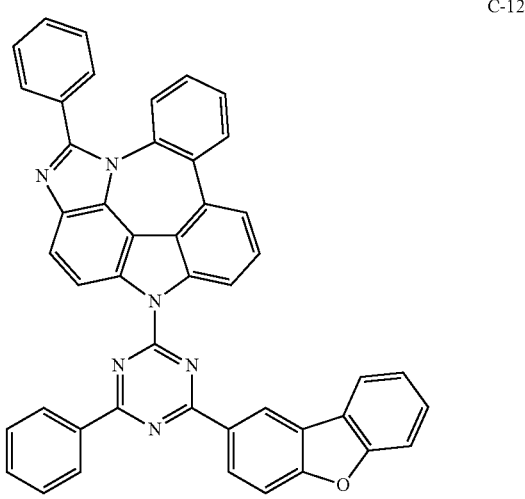
C-123
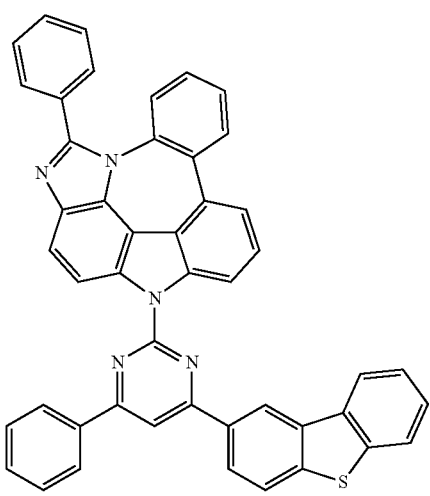
C-126
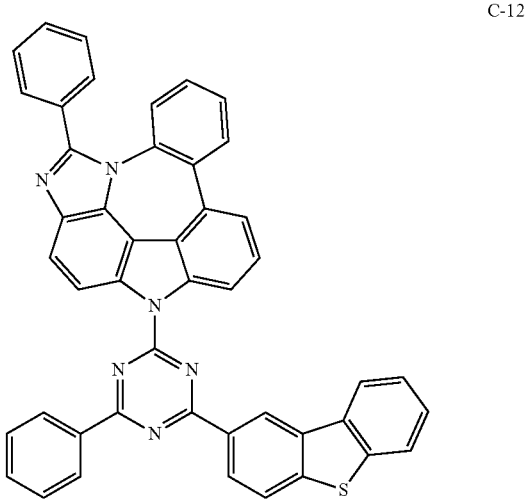

C-127
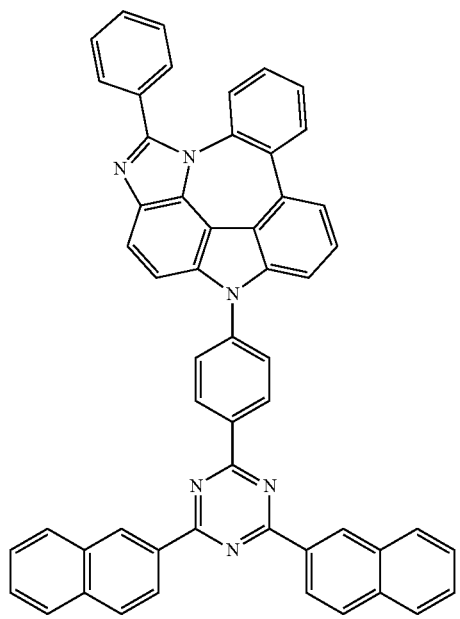
C-128
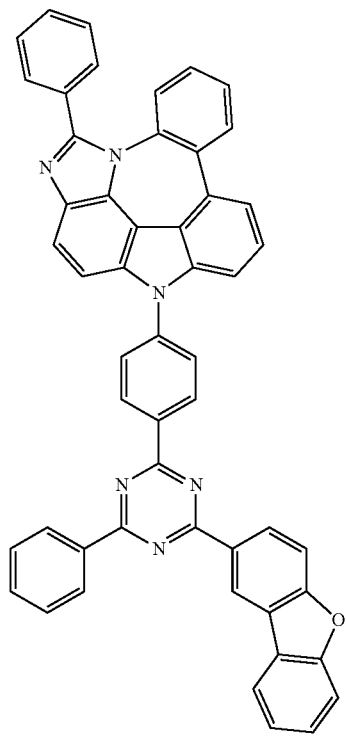
C-129
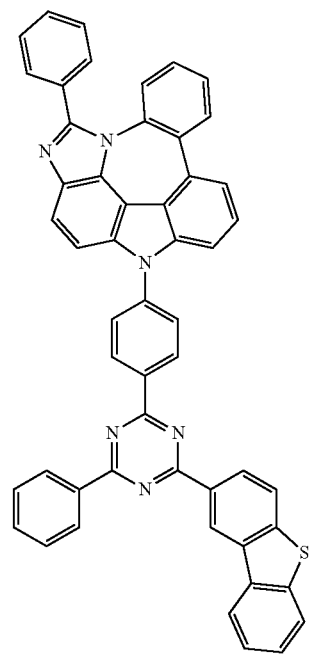
C-130
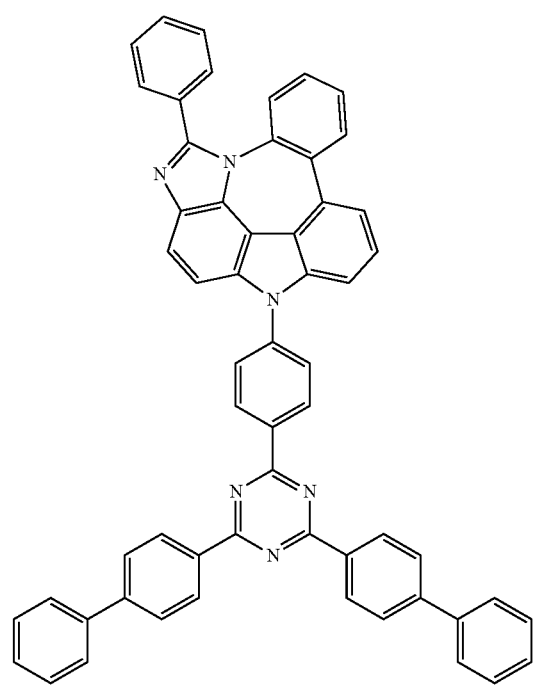

C-131
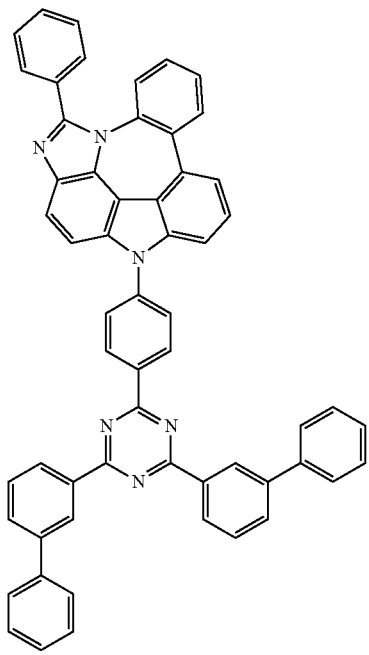
C-132
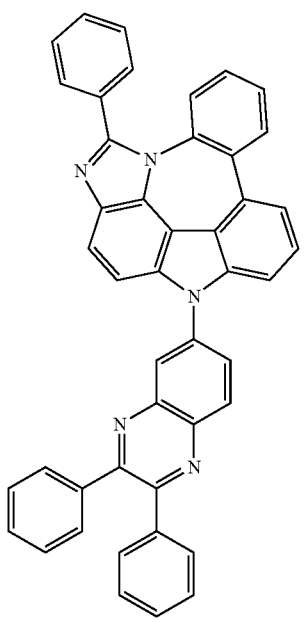
C-133
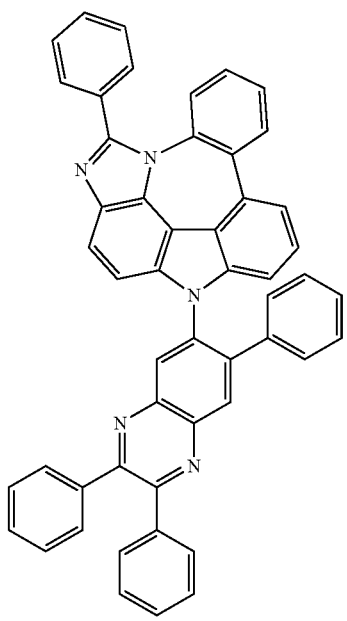
C-134

-continued
C-135
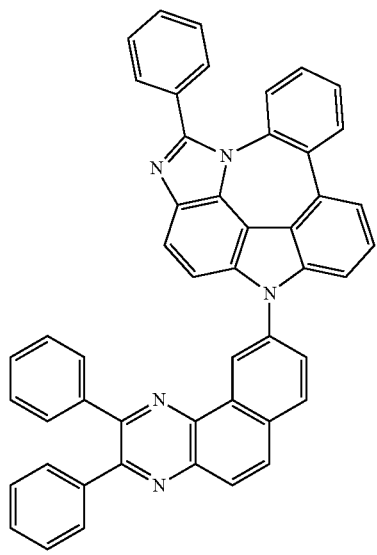
C-136
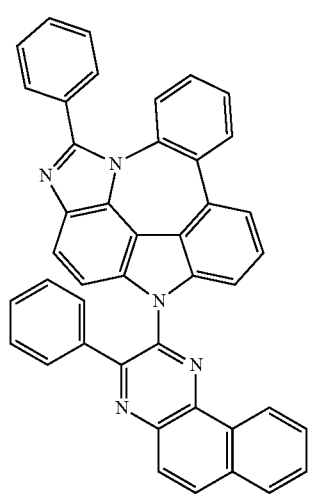
C-137
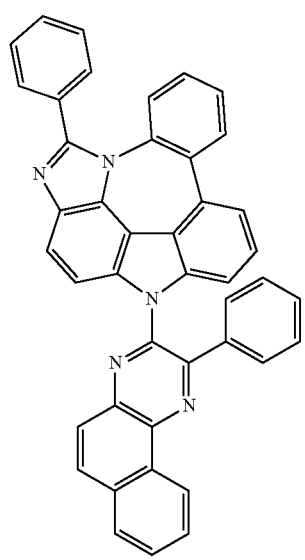
-continued
C-138
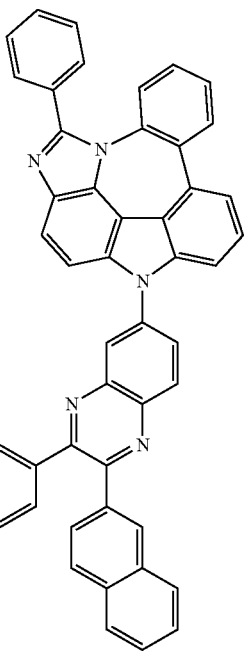
C-139
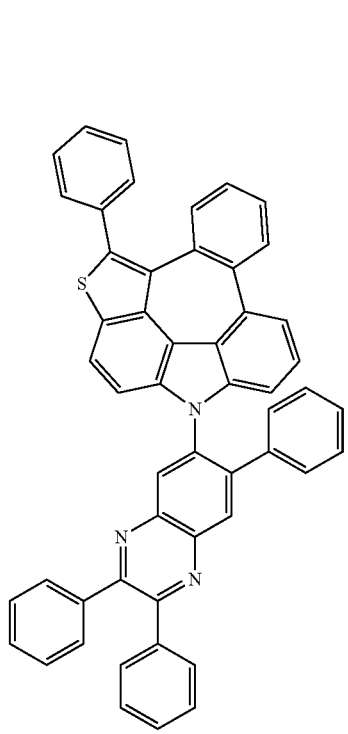

C-140
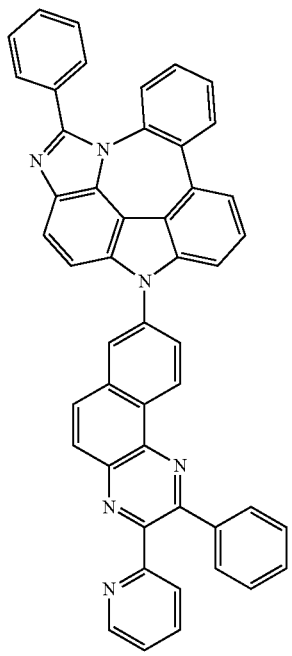
C-141
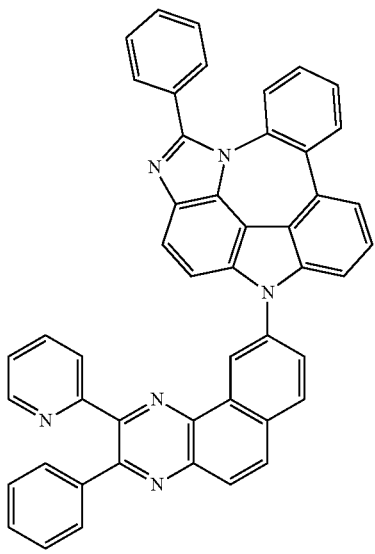
C-142
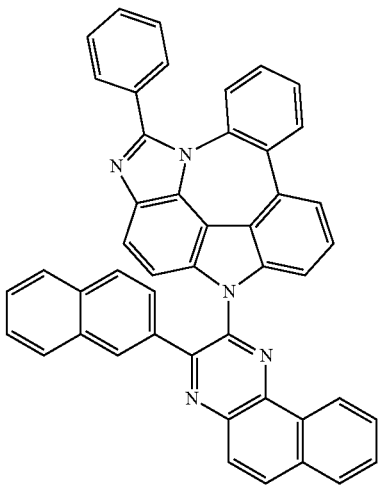
C-143
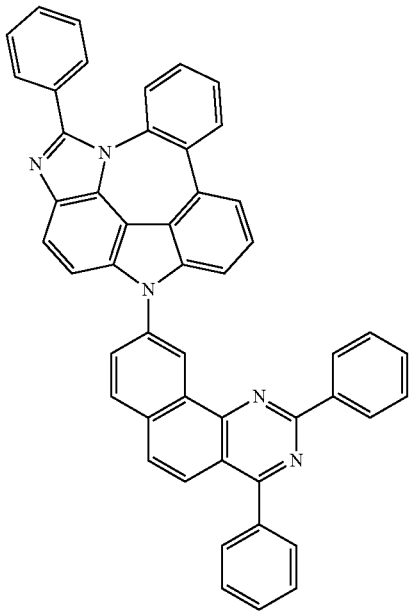
C-144

C-145
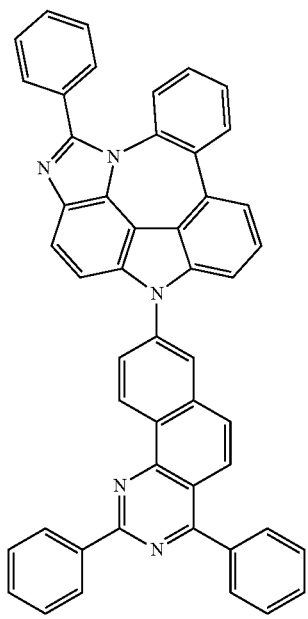
C-146
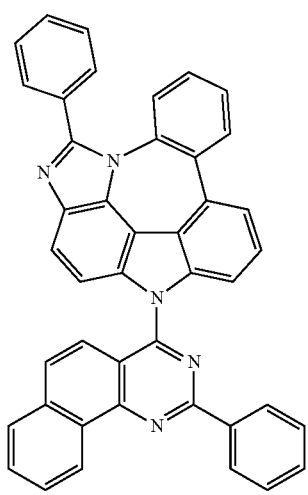
C-147
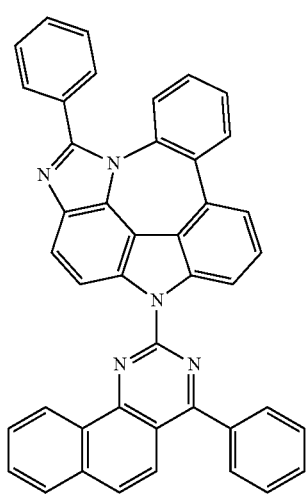
C-148
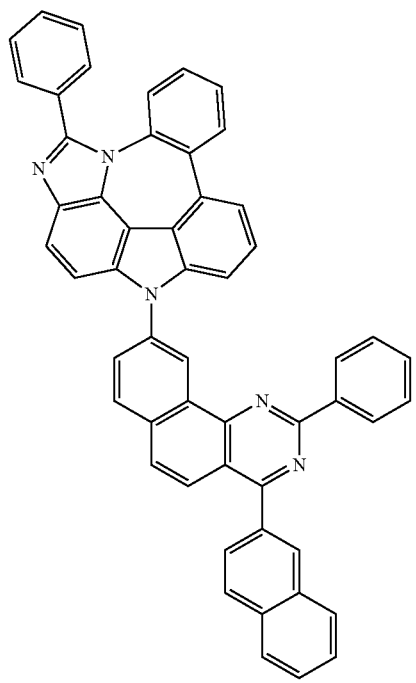
C-149
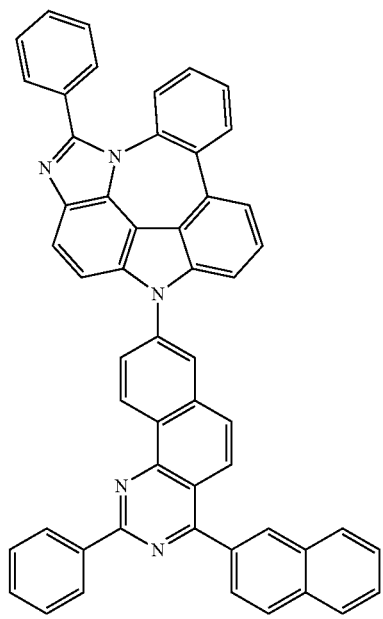

-continued
C-150
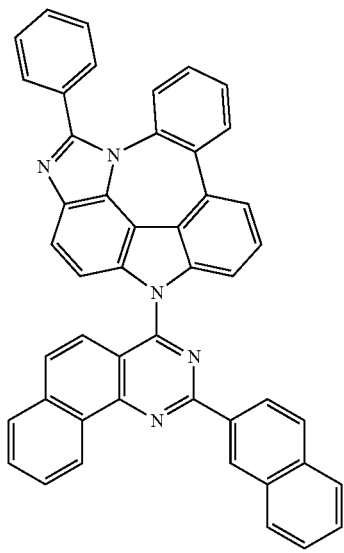
C-151
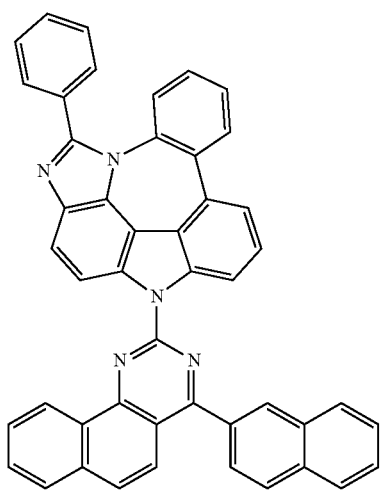
C-152
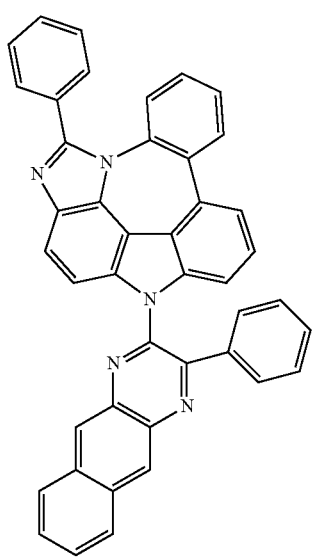
-continued
C-153
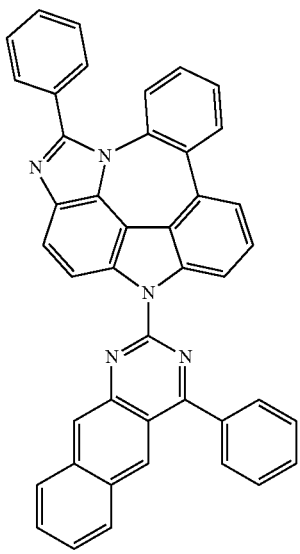
C-154
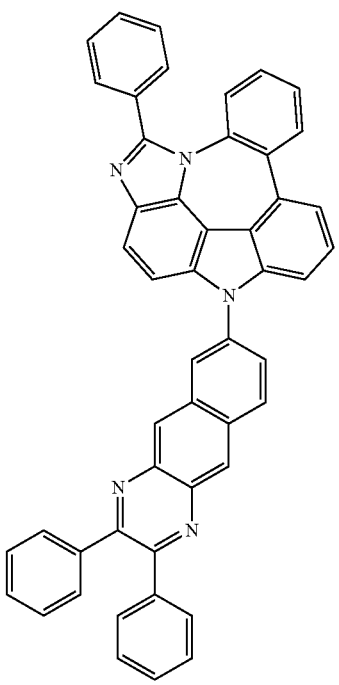
and -continued

C-155

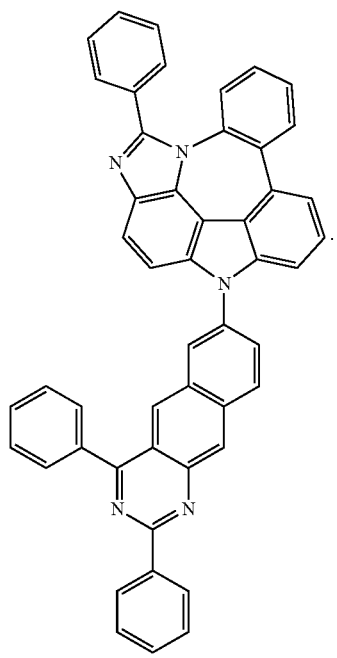

7. An organic electroluminescent material comprising the organic electroluminescent compound according to claim 1.

8. An organic electroluminescent device comprising the organic electroluminescent compound according to claim 1.

9. The organic electroluminescent device according to claim 8, wherein the organic electroluminescent compound is comprised in a light-emitting layer.

\* \* \* \* \*